(12) United States Patent
Cao et al.

(10) Patent No.: US 11,424,418 B2
(45) Date of Patent: Aug. 23, 2022

(54) METAL COMPLEX ORGANIC ELECTROLUMINESCENT MATERIAL AND ORGANIC ELECTROLUMINESCENT DEVICE

(71) Applicant: SHIJIAZHUANG CHENGZHI YONGHUA DISPLAY MATERIAL CO., LTD., Hebei (CN)

(72) Inventors: Jianhua Cao, Hebei (CN); Zhe Shao, Hebei (CN); Yan Sui, Hebei (CN); Minhui Jia, Hebei (CN); Shibo Wang, Hebei (CN); Weizhuang He, Hebei (CN)

(73) Assignee: SHIJIAZHUANG CHENGZHI YONGHUA DISPLAY MATERIAL CO., LTD., Hebei (CN)

(*) Notice: Subject to any disclaimer, the term of this patent is extended or adjusted under 35 U.S.C. 154(b) by 134 days.

(21) Appl. No.: 16/848,392

(22) Filed: Apr. 14, 2020

(65) Prior Publication Data
US 2020/0381633 A1  Dec. 3, 2020

(30) Foreign Application Priority Data
May 31, 2019  (CN) .......................... 201910470842.6

(51) Int. Cl.
*H01L 51/00* (2006.01)
*H01L 51/50* (2006.01)
*H01L 51/56* (2006.01)

(52) U.S. Cl.
CPC ...... *H01L 51/0085* (2013.01); *H01L 51/0004* (2013.01); *H01L 51/0008* (2013.01); *H01L 51/5016* (2013.01); *H01L 51/56* (2013.01)

(58) Field of Classification Search
CPC ............ H01L 51/0085; H01L 51/0004; H01L 51/0008; H01L 51/5016; H01L 51/56; H01L 51/0067; H01L 51/0072; H01L 2251/55; H01L 2251/552; H01L 51/5012; H01L 51/0003; H01L 51/001; C07F 15/0033; C09K 11/06; C09K 2211/185
See application file for complete search history.

(56) References Cited

U.S. PATENT DOCUMENTS

| 4,539,507 A | 9/1985 | VanSlyke et al. |
| 5,151,629 A | 9/1992 | VanSlyke |
| 2006/0097227 A1* | 5/2006 | Okajima ............. C07D 471/04 252/301.16 |

(Continued)

FOREIGN PATENT DOCUMENTS

| EP | 0676461 A2 | 10/1995 |
| WO | WO9827136 A1 | 6/1998 |

*Primary Examiner* — Ermias T Woldegeorgis
(74) *Attorney, Agent, or Firm* — Muncy, Geissler, Olds & Lowe, P.C.

(57) ABSTRACT

The present invention relates to an organic electroluminescent material, an organic electroluminescent device, and a method for preparing the organic electroluminescent device. Due to comprising an organic compound A with 3.0 eV>ET≥2.0 eV and a compound B of M(LA)x(LB)y(LC)z, the organic electroluminescent material of the present invention has the advantages of an increased luminescence lifetime and/or a reduced operating voltage on the basis of maintaining other electronic properties at a certain level.

11 Claims, 1 Drawing Sheet

(56) References Cited

U.S. PATENT DOCUMENTS

2007/0020237 A1* 1/2007 Yoon .................. A61K 48/0058
　　　　　　　　　　　　　　　　　　　　　　424/93.2
2007/0290610 A1* 12/2007 Park .................... C07D 265/38
　　　　　　　　　　　　　　　　　　　　　　313/504

* cited by examiner

Light

Light

METAL COMPLEX ORGANIC ELECTROLUMINESCENT MATERIAL AND ORGANIC ELECTROLUMINESCENT DEVICE

TECHNICAL FIELD

The present invention relates to the field of organic electroluminescent devices. More particularly, the present invention relates to an organic electroluminescent device comprising a mixture of at least two materials.

BACKGROUND ART

The structures of organic electroluminescent devices in which an organic semiconductor is used as a functional material are described in U.S. Pat. Nos. 4,539,507, 5,151,629, EP 0676461, and WO 9827136, for example. Luminescent materials used here more tend to be organometallic complexes that exhibit phosphorescence rather than fluorescence (M. A. Baldo et al., Appl. Phys. Lett. 1999, 75, 4-6). For quantum mechanical reasons, the use of an organometallic compound as a phosphorescence emitter can achieve up to a four-fold increase in energy and power efficiency. However, in general, triplet-emitting organic electroluminescent devices still need to be improved, for example, they still need to be improved in terms of efficiency, operating voltage, lifetime etc. This applies in particular to OLEDs that emit light in relatively long wave regions, such as red light.

The properties of phosphorescent OLEDs are not only determined by triplet light emitters used, other materials used, particularly matrix materials, are also particularly important here.

Therefore, it is an urgent problem to find an organic luminescent material with improved luminous efficiency, operating voltage, lifetime etc. achieved by a good synergy between a doping material and a matrix.

SUMMARY OF THE INVENTION

In order to solve one of the problems present in the prior art, the inventors have found after intensive research that by using the organic electroluminescent material of the present invention, which contains at least one organic compound A with $3.0 \text{ eV} > E_T \geq 2.0 \text{ eV}$ and compound B represented by formula $M(LA)_x(LB)_y(LC)_z$, in an organic electroluminescent device, an organic electroluminescent device with an improved lifetime and/or a reduced operating voltage can be obtained.

The absolute value of $E_T[B] - E_T[A]$ is $\leq 0.5$ eV, in which $E_T[B]$ represents the triplet energy level of the compound B, and $E_T[A]$ represents the triplet energy level of the organic compound A;

in the formula $M(LA)_x(LB)_y(LC)_z$,

M represents a metal element with an atomic weight greater than 40;

x represents an integer of 1, 2 or 3, y represents an integer of 0, 1 or 2, z represents an integer of 0, 1 or 2, and the sum of x, y and z is equal to the oxidation state of metal M;

LA is LA1 or LA2:

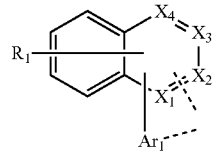

LA1

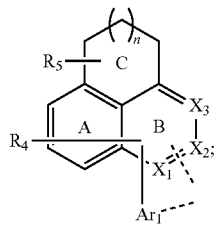

LA2

$R_1$ is selected from the group consisting of $C(R_a)_3$, trans-cyclohexyl having a 1-8 carbon atom substituent, and a 1,1'-bis(trans-cyclohexyl)-4-substituent having a 1-8 carbon atom substituent;

$R_4$ and $R_5$ are each independently selected from the group consisting of a hydrogen atom, a deuterium atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group;

there is one or two or more substituents $R_1$;

there is one or two or more substituents $R_4$ on ring A and ring B;

there is one or two or more substituents $R_5$ on ring C;

$X_1$, $X_2$, $X_3$ and $X_4$ are each independently carbon or nitrogen, and $X_1$, $X_2$ and $X_3$ are not nitrogen at the same time;

n represents an integer $\geq 0$;

each $R_a$ is independently selected from the group consisting of a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, and a $C_2$-$C_{40}$ alkenyl or alkynyl group, with these groups being optionally substituted with one or more $R_6$, one or more non-adjacent —$CH_2$— groups being optionally replaced by —$R_6C$=$CR_6$—, —C≡C—, —$Si(R_6)_2$—, —$Ge(R_6)_2$—, —$Sn(R_6)_2$—, —C(=O)—, —C(=S)—, —C(=Se)—, —C(=$NR_6$)—, —P(=O)($R_6$)—, —S(O)—, —$S(O_2)$—, —$N(R_6)$—, —O—, —S— or —C(O$NR_6$)—, and one or more hydrogen atoms in $R_a$ being optionally replaced by a deuterium atom, a halogen atom, a nitrile group or a nitro group, wherein two or more adjacent substituents $R_a$ are optionally joined or fused to form a monocyclic or polycyclic aliphatic, aromatic or heteroaromatic ring system optionally substituted with one or more groups $R_6$;

each $R_6$ is independently selected from the group consisting of a hydrogen atom, a deuterium atom, a halogen atom, a nitrile group, a nitro group, a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, a $C_2$-$C_{40}$ alkenyl group, and an alkynyl group, with the $R_6$ being optionally substituted with one or more groups $R_m$, one or more non-adjacent —$CH_2$— groups in $R_6$ being optionally replaced by —$R_mC$≡$CR_m$—, —C≡C—, —$Si(R_m)_2$—, —$Ge(R_m)_2$—, —$Sn(R_m)_2$—, —C(=O)—, —C(=S)—, —C(=Se)—, —C(=$NR_m$)—, —P(=O)($R_m$)—, —S(O)—, —$S(O_2)$—, —$N(R_m)$—, O, S or $CONR_m$, and one or more hydrogen atoms in $R_6$ being optionally replaced by a deuterium atom, a halogen atom, a nitrile group or a nitro group, wherein two or more adjacent substituents $R_6$ are optionally joined or fused to form a monocyclic or polycyclic aliphatic, aromatic or heteroaromatic ring system optionally substituted with one or more groups $R_m$;

$R_m$ is selected from the group consisting of a hydrogen atom, a deuterium atom, a fluorine atom, a nitrile group, and a $C_1$-$C_{20}$ aliphatic hydrocarbon group, wherein one or more hydrogen atoms can be replaced by a deuterium atom, a halogen atom, or a nitrile group, and two or more adjacent substituents $R_m$ optionally form a monocyclic or polycyclic aliphatic, aromatic or heteroaromatic ring system with each other;

$Ar_1$ is selected from the group consisting of the following groups:

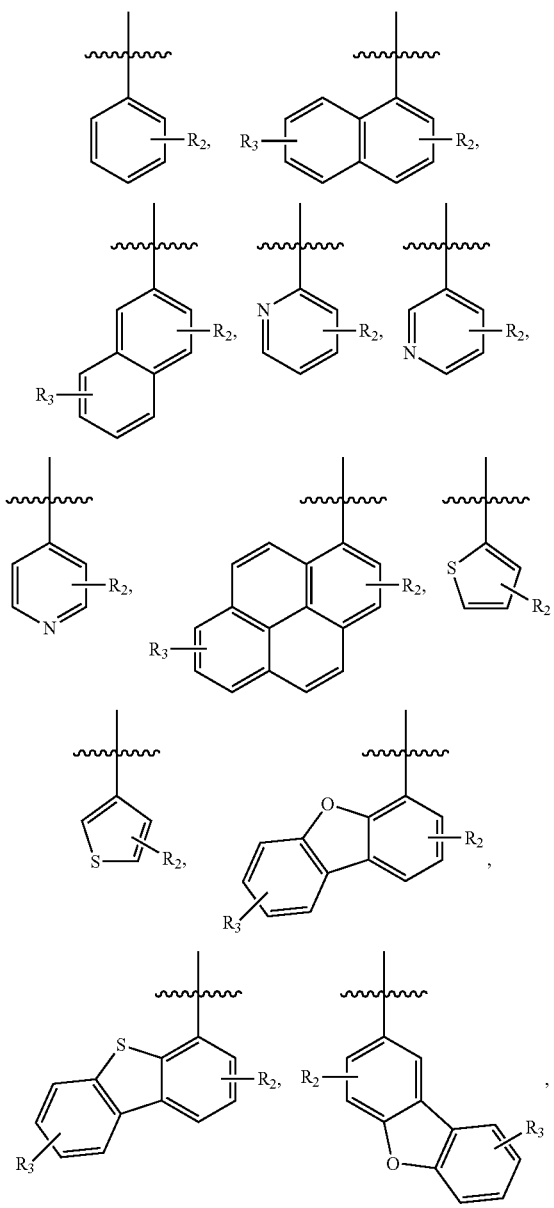

-continued

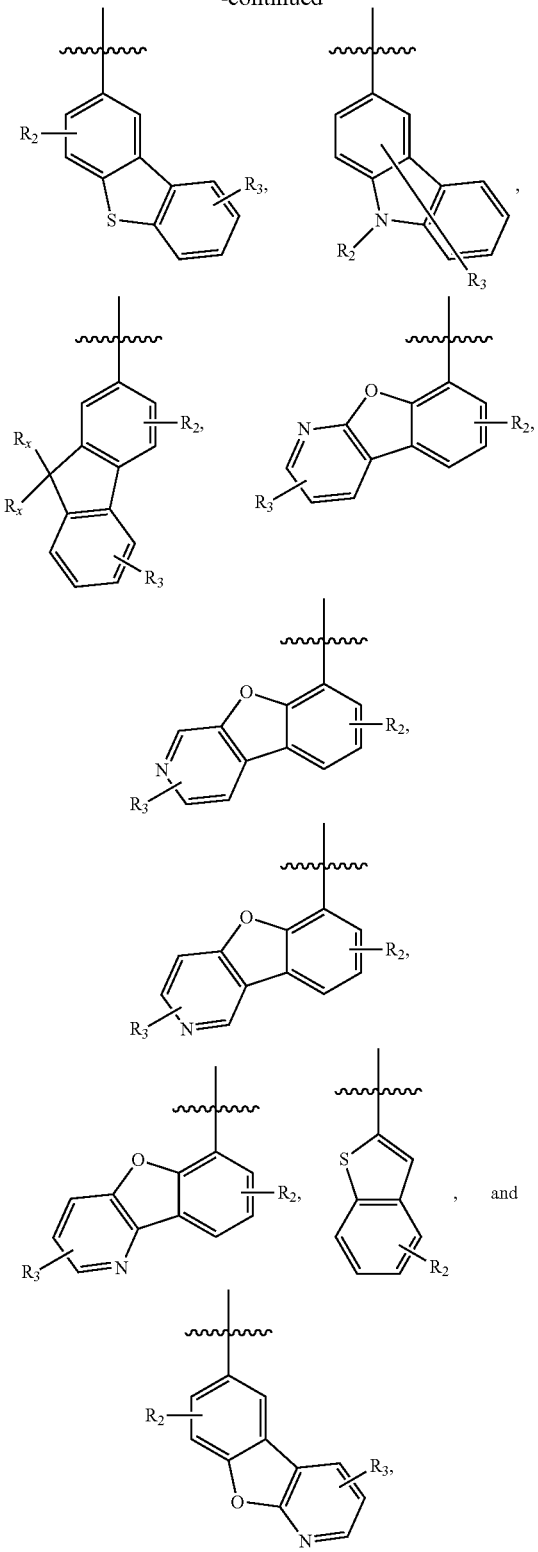

and $R_2$, $R_3$ and $R_x$ are each independently selected from the group consisting of a hydrogen atom, a deuterium atom, a halogen atom, a cyano group, an alkyl group with a total carbon atom number of 1-40, a cycloalkyl group with a total carbon atom number of 3-40, an alkoxy group with a total carbon atom number of 1-40, a linear alkenyl group with a total carbon atom number of 2-40, a heteroalkyl group with a total carbon atom number of 1-40, and a cycloalkenyl group with a total carbon atom number of 2-40;

$L_B$ is:

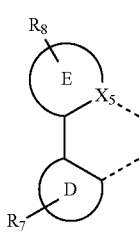

wherein $R_7$ and $R_8$ are each independently selected from the group consisting of a hydrogen atom, a deuterium atom, a halogen atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; adjacent groups in $R_7$ and $R_8$ are optionally joined or fused to form a five-membered ring, a six-membered ring or a fused polycyclic ring; and independently for each of $R_7$ and $R_8$, there is one or two or more such groups;

ring D and ring E are each independently selected from the group consisting of a five-membered carbocyclic ring, a five-membered heterocyclic ring, a six-membered carbocyclic ring, and a six-membered heterocyclic ring;

$X_5$ is nitrogen or carbon; and $L_C$ is:

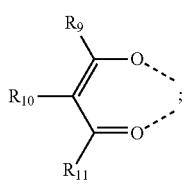

formula $L_C$ wherein $R_9$, $R_{10}$ and $R_{11}$ are each independently selected from the group consisting of a hydrogen atom, a deuterium atom, a halogen atom, an alkyl group, a cycloalkyl group, heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; and adjacent groups in $R_9$, $R_{10}$ and $R_{11}$ are optionally joined or fused to form a five-membered ring, a six-membered ring, or a fused polycyclic ring.

The present invention has the following beneficial effects:

Due to comprising an organic compound A with 3.0 eV>ET≥2.0 eV and a compound B of M(LA)x(LB)y(LC)z, the organic electroluminescent material of the present invention has the advantages of an increased luminescence lifetime and/or a reduced operating voltage on the basis of maintaining other electronic properties at a certain level. The organic electroluminescent device of the present invention which is obtained by using the organic electroluminescent material of the present invention thus also has the advantages of an increased luminescence lifetime and/or a reduced operating voltage.

BRIEF DESCRIPTION OF THE DRAWINGS

The specific embodiments of the present invention will be further described in detail below in conjunction with the drawings.

In FIGS. 1 and 2, the organic electroluminescent element comprises a substrate 1, an anode 2, and a cathode 8, and layers 3-7 disposed between the anode 2 and the cathode 8. In the figures, a hole blocking/electron transport layer 6 and an electron injection layer 7 are arranged between the cathode 8 and a light-emitting layer 5, and a hole injection 3 and a hole transport/electron blocking layer 4 are arranged between the light-emitting layer 5 and the anode 2.

DETAILED DESCRIPTION OF EMBODIMENTS

Figure 1:
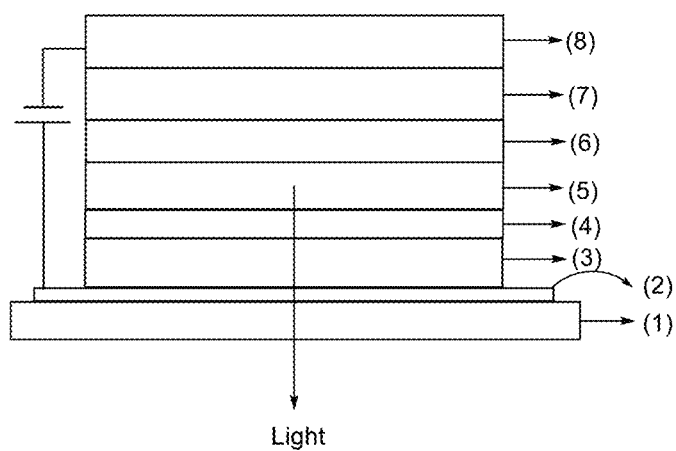
FIG. 1 shows a schematic composition diagram of a bottom light emission example of an organic electroluminescent element of the present invention.
Figure 2:
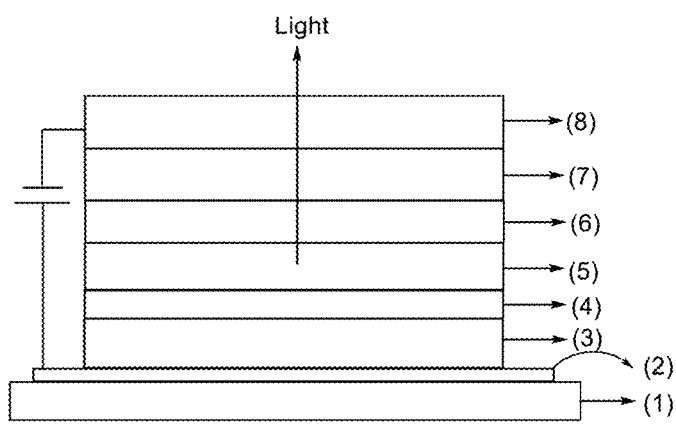
FIG. 2 shows a schematic composition diagram of a top light emission example of an organic electroluminescent element of the present invention.

In order to illustrate the present invention more clearly, the present invention is further described below in conjunction with preferred examples and the drawings. Like parts are indicated by like reference signs throughout the drawings. A person skilled in the art should understand that the content specifically described below is illustrative and not restrictive, and is not intended to limit the scope of protection of the present invention.

Numerical ranges in the present invention should be understood as specifically disclosing the upper and lower limits of the ranges and each intermediate value therebetween. Each smaller range between any stated values or intermediate values within a stated range and any other stated values or intermediate values within that stated range is also included in the present invention. The upper and lower limits of such smaller ranges may be independently included in or excluded from a range.

Unless otherwise indicated, all technical and scientific terms used herein have the same meanings as commonly understood by one of ordinary skill in the art to which the present invention belongs. Although the present invention describes only preferred methods and materials, any methods and materials similar or equivalent to those described herein may also be used in the practice or testing of the present invention. All documents mentioned in the description are incorporated by reference to disclose and describe methods and/or materials associated with the documents. In case of conflict with any incorporated document, the content of the description shall prevail. Unless otherwise indicated, "%" is a percentage based on weight.

[Organic Electroluminescent Material]

The organic electroluminescent material of the present invention comprises the following compounds:

1) at least one organic compound A with 3.0 eV>$E_T$≥2.0 eV; and 2) at least one compound B represented by M(LA)$_x$(LB)$_y$(LC)$_z$, with the absolute value of $E_T$[B]−$E_T$[A]≤0.5 eV, in which $E_T$[B] is the triplet energy level of the compound B, and $E_T$[A] represents the triplet energy level of the compound A.

The following apply to the symbols and signs used:

M represents a metal element with an atomic weight greater than 40;

x represents an integer of 1, 2 or 3, y represents an integer of 0, 1 or 2, z represents an integer of 0, 1 or 2, and the sum of x, y and z is equal to the oxidation state of metal M;

LA is LA1 or LA2:

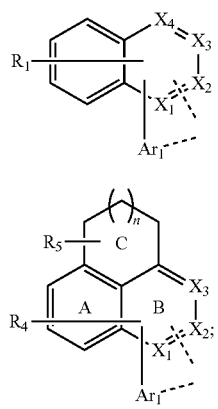

$R_1$ is selected from the group consisting of $C(R_a)_3$, trans-cyclohexyl having a 1-8 carbon atom substituent, and a 1,1'-bis(trans-cyclohexyl)-4-substituent having a 1-8 carbon atom substituent;

$R_4$ and $R_5$ are each independently selected from the group consisting of a hydrogen atom, a deuterium atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group;

there is one or two or more substituents $R_1$;

there is one or two or more substituents $R_4$ on ring A and ring B;

there is one or two or more substituents $R_5$ on ring C;

$X_1$, $X_2$, $X_3$ and $X_4$ are each independently carbon or nitrogen, and $X_1$, $X_2$ and $X_3$ are not nitrogen at the same time;

n represents an integer $\geq 0$;

each $R_a$ is independently selected from the group consisting of a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, and a $C_2$-$C_{40}$ alkenyl or alkynyl group, with these groups being optionally substituted with one or more $R_6$, one or more non-adjacent —CH$_2$— groups being optionally replaced by —R$_6$C=CR$_6$—, —C≡C—, —Si(R$_6$)$_2$—, —Ge(R$_6$)$_2$—, —Sn(R$_6$)$_2$—, —C(=O)—, —C(=S)—, —C(=Se)—, —C(=NR$_6$)—, —P(=O)(R$_6$)—, —S(O)—, —S(O$_2$)—, —N(R$_6$)—, —O—, —S— or —C(ONR$_6$)—, and one or more hydrogen atoms in $R_a$ being optionally replaced by a deuterium atom, a halogen atom, a nitrile group or a nitro group, wherein two or more adjacent substituents $R_a$ are optionally joined or fused to form a monocyclic or polycyclic aliphatic, aromatic or heteroaromatic ring system optionally substituted with one or more groups $R_6$;

each $R_6$ is independently selected from the group consisting of a hydrogen atom, a deuterium atom, a halogen atom, a nitrile group, a nitro group, a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, a $C_2$-$C_{40}$ alkenyl group, and an alkynyl group, with the $R_6$ being optionally substituted with one or more groups $R_m$, one or more non-adjacent —CH$_2$— groups in $R_6$ being optionally replaced by —R$_m$C=CR$_m$—, —C≡C—, —Si(R$_m$)$_2$—, —Ge(R$_m$)$_2$—, —Sn(R$_m$)$_2$—, —C(=O)—, —C(=S)—, —C(=Se)—, —C(=NR$_m$)—, —P(=O)(R$_m$)—, —S(O)—, —S(O$_2$)—, —N(R$_m$)—, O, S or CONR$_m$, and one or more hydrogen atoms in $R_6$ being optionally replaced by a deuterium atom, a halogen atom, a nitrile group or a nitro group, wherein two or more adjacent substituents $R_6$ are optionally joined or fused to form a monocyclic or polycyclic aliphatic, aromatic or heteroaromatic ring system optionally substituted with one or more groups $R_m$;

$R_m$ is selected from the group consisting of a hydrogen atom, a deuterium atom, a fluorine atom, a nitrile group, and a $C_1$-$C_{20}$ aliphatic hydrocarbon group, wherein one or more hydrogen atoms can be replaced by a deuterium atom, a halogen atom, or a nitrile group, and two or more adjacent substituents $R_m$ optionally form a monocyclic or polycyclic aliphatic, aromatic or heteroaromatic ring system with each other;

$Ar_1$ is selected from any of the following groups:

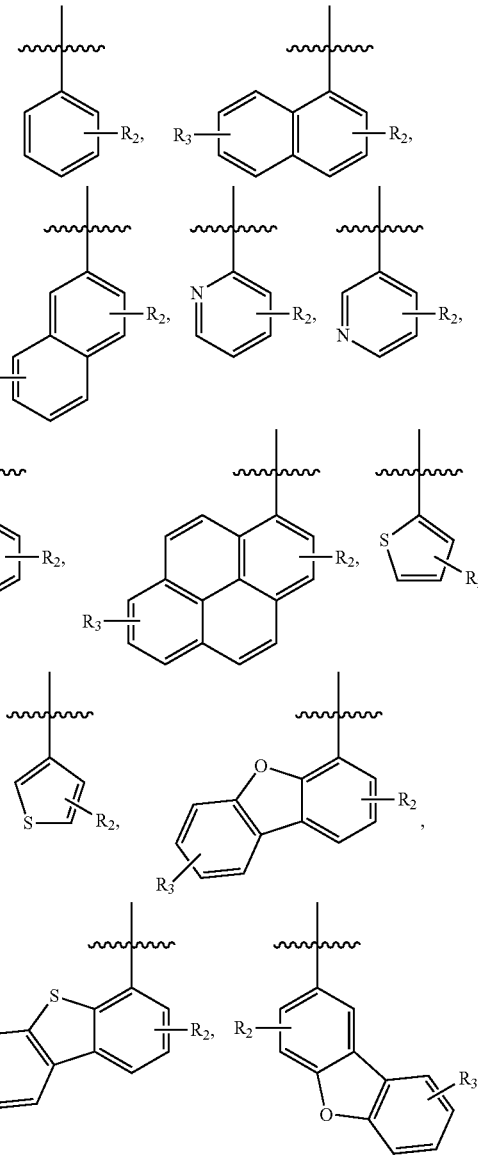

-continued

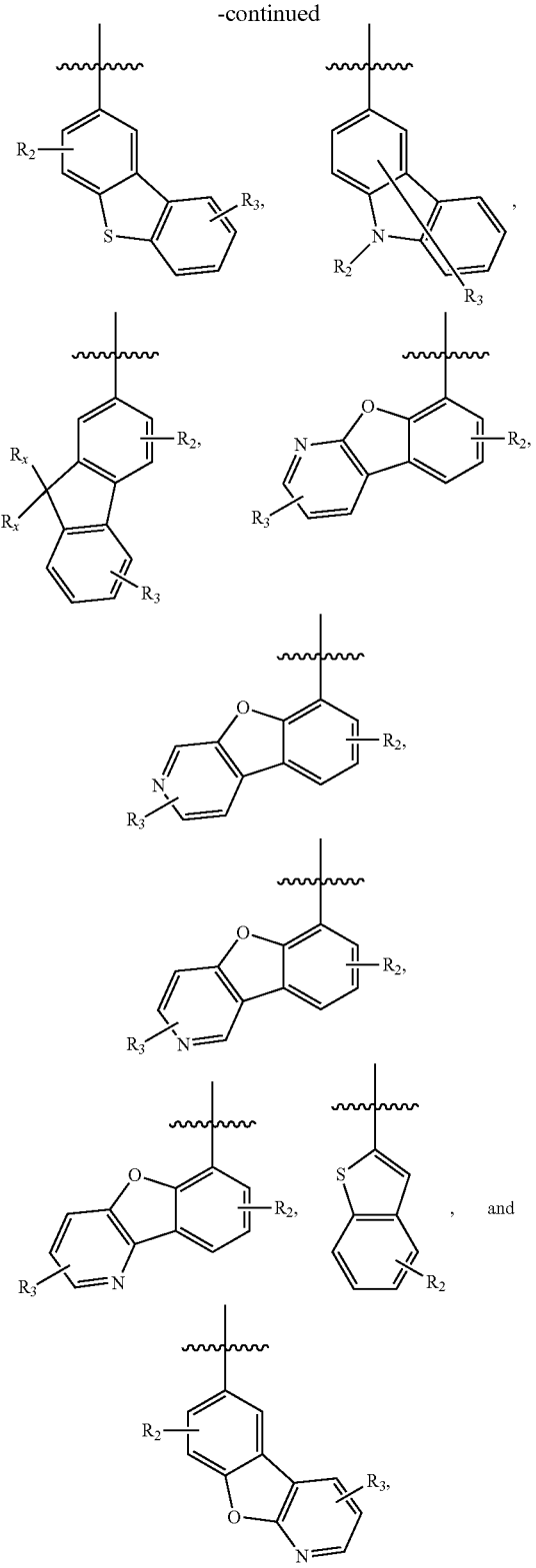

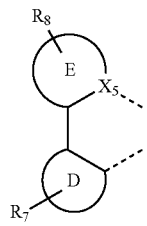

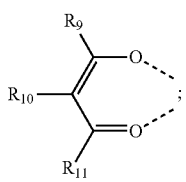

R₂, R₃ and Rₓ are each independently selected from the group consisting of a hydrogen atom, a deuterium atom, a halogen atom, a cyano group, an alkyl group with a total carbon atom number of 1-40, a cycloalkyl group with a total carbon atom number of 3-40, an alkoxy group with a total carbon atom number of 1-40, a linear alkenyl group with a total carbon atom number of 2-40, a heteroalkyl group with a total carbon atom number of 1-40, and a cycloalkenyl group with a total carbon atom number of 2-40;

$L_B$ is:

$$L_B$$

wherein $R_7$ and $R_8$ are each independently selected from the group consisting of a hydrogen atom, a deuterium atom, a halogen atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; adjacent groups in $R_7$ and $R_8$ are optionally joined or fused to form a five-membered ring, a six-membered ring or a fused polycyclic ring; and independently for each of $R_7$ and $R_8$, there is one or two or more such groups;

ring D and ring E are each independently selected from the group consisting of a five-membered carbocyclic ring, a five-membered heterocyclic ring, a six-membered carbocyclic ring, and a six-membered heterocyclic ring;

$X_5$ is nitrogen or carbon; and $L_C$ is:

$$\text{formula } L_C$$

wherein $R_9$, $R_{10}$ and $R_{11}$ are each independently selected from the group consisting of a hydrogen atom, a deuterium atom, a halogen atom, an alkyl group, a cycloalkyl group, heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; and adjacent groups in $R_9$, $R_{10}$ and $R_{11}$ are optionally joined or fused to form a five-membered ring, a six-membered ring, or a fused polycyclic ring.

In the case of an aryl group among the groups in the present invention, it contains 6 to 60 carbon atoms. The heteroaryl group in the present invention is an aromatic group containing 2-60 carbon atoms and at least one heteroatom with the total of carbon atoms and heteroatoms being at least 5. The heteroatom is preferably selected from N, O or S. The aryl or heteroaryl group here is considered to refer to a simple aromatic ring, i.e., benzene, naphthalene, etc., or a simple heteroaromatic ring, such as pyridine, pyrimidine or thiophene, or a fused aryl or heteroaryl group, such as anthracene, phenanthrene, quinoline or isoquinoline. Aromatic rings connected to each other via a single bond, such as biphenyl, on the contrary, are not within the scope of the aryl or heteroaryl group of the present invention, but belong to the aromatic ring systems of the present invention.

In the present invention, an aromatic ring system or a heteroaromatic ring system refers to a ring system group in which a plurality of aryl or heteroaryl groups and optionally a non-aromatic unit such as C, N, O, or S are connected. For example, a system in which two or more aryl groups are connected by, for example, a short alkyl group. In addition, systems such as fluorene, 9,9'-spirobifluorene, 9,9-diarylfluorene, triarylamine and diaryl ethers are also considered as aromatic ring systems in the sense of the present invention.

Examples of aliphatic hydrocarbon groups or alkyl groups or alkenyl groups or alkynyl groups in the sense of the present invention, which contain 1-40 carbon atoms and in which an individual hydrogen atom or —$CH_2$— group is optionally substituted with a substituent, include, for example, the following groups: methyl, ethyl, n-propyl, isopropyl, n-butyl, isobutyl, sec-butyl, tert-butyl, 2-methylbutyl, n-pentyl, sec-pentyl, neopentyl, cyclopentyl, n-hexyl, neohexyl, cyclohexyl, n-heptyl, cycloheptyl, n-octyl, cyclooctyl, 2-ethylhexyl, cyclohexenyl, heptenyl, cycloheptenyl, octenyl, cyclooctenyl, ethynyl, propynyl, butynyl, pentynyl, hexynyl, heptynyl or octynyl. As alkoxy groups, preference is given to alkoxy groups having 1-40 carbon atoms, and examples of such a group include methoxy, trifluoromethoxy, ethoxy, n-propoxy, isopropoxy, n-butoxy, isobutoxy, sec-butoxy, tert-butoxy, n-pentoxy, sec-pentyloxy, 2-methylbutoxy, n-hexyloxy, cyclohexyloxy, n-heptyloxy, cycloheptyloxy, n-octyloxy, cyclooctyloxy, 2-ethylhexyloxy, pentafluoroethoxy 2,2,2-trifluoroethoxy etc. As heteroalkyl groups, preference is given to alkyl groups having 1-40 carbon atoms, in which an individual hydrogen atom or —$CH_2$— group is optionally substituted with an oxygen, sulfur, or halogen atom, and examples of such a group include an alkoxy group, an alkylthio group, a fluorinated alkoxy group, and a fluorinated alkylthio group. Among these groups, methoxy, ethoxy, n-propoxy, isopropoxy, n-butoxy, isobutoxy, sec-butoxy, t-butoxy, methylthio, ethylthio, n-propylthio, isopropylthio, n-butylthio, isobutylthio, sec-butylthio, tert-butylthio, trifluoromethylthio, trifluoromethoxy, pentafluoroethoxy, pentafluoroethylthio, 2,2,2-trifluoroethoxy, 2,2,2-trifluoroethylthio, ethyleneoxy, ethylenethio, propyleneoxy, propylenethio, butenethio, butenyloxy, pentenyloxy, pentenylthio, cyclopentenyloxy, cyclopentenylthio, hexenyloxy, hexenylthio, cyclohexenyloxy, cyclohexenethio, ethynyloxy, ethynylthio, propynyloxy, propynylthio, butynyloxy, butynylthio, pentynyloxy, pentynylthio, hexynyloxy, and hexynylthio are preferred.

As the cycloalkyl group of the present invention, examples include cyclopropyl, cyclobutyl, cyclopentyl, and cyclohexyl; and as the cycloalkenyl group of the present invention, examples include cyclobutenyl, cyclopentenyl, and cyclohexenyl, cycloheptyl, and cycloheptenyl, wherein one or more —$CH_2$— groups are optionally replaced by the above-mentioned groups; moreover, one or more hydrogen atoms are optionally replaced by a deuterium atom, a halogen atom or a nitrile group.

The aromatic or heteroaromatic ring system of the present invention, in which an aromatic or heteroaromatic ring atom may in each case also be substituted with the above-mentioned groups R1, R4 or R5, refers in particular to groups derived from the following substances: benzene, naphthalene, anthracene, benzoanthracene, phenanthrene, pyrene, chrysene, perylene, fluoranthene, tetracene, pentacene, benzopyrene, biphenyl, diphenyl, terphenyl, trimeric benzene, fluorene, spirobifluorene, dihydrophenanthrene, dihydropyrene, tetrahydropyrene, cis- or trans-indenofluorene, cis- or trans-indenocarbazole, cis- or trans-indolocarbazole, trimeric indene, trimeric indene, spirotrimeric indene, spiroisotrimeric indene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo[5,6]quinoline, benzo[6,7]quinoline, benzo[7,8]quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthoxazole, anthraxazole, phenanthroxazole, isoxazole, 1,2-thiazole, 1,3-thiazole, benzothiazole, pyridazine, hexaazabenzophenanthrene, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, carboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or groups derived from a combination of these systems.

For the organic compound A with 3.0 eV>ET≥2.0 eV in the present invention, ET refers to the triplet energy level of the compound. The $E_T$ value of the compound is determined by quantum chemical calculation as described in the examples section below.

[Compound B represented by M(LA)$_x$(LB)$_y$(LC)$_z$] Preferred embodiments of the compound B represented by the formula M(LA)$_x$(LB)$_y$(LC)$_z$ are described below.

In a preferred embodiment of the present invention, the metal M is preferably Ir or Pt, that is, the compound B represented by M(LA)$_x$(LB)$_y$(LC)$_z$ is preferably Ir(LA)(LB)(LC), Ir(LA)$_2$(LB), Ir(LA)(LB)$_2$, Ir(LA)$_2$(LC), Ir(LA)$_3$, Pt(LA)(LB) or Pt(LA)(LC).

The LA is preferably selected from the group consisting of LA-1 to LA-17:

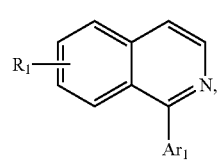

LA-1

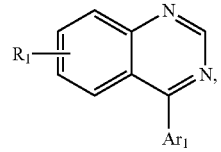

LA-2

LA-3 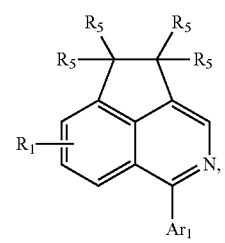
LA-4 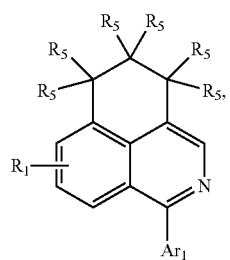
LA-5 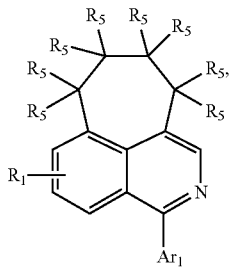
LA-6 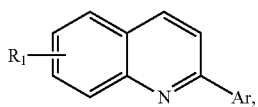
LA-7 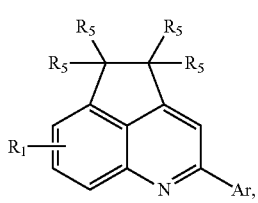
LA-8 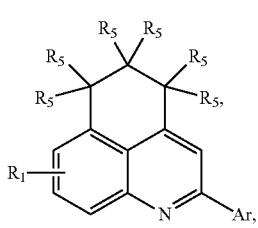
LA-9 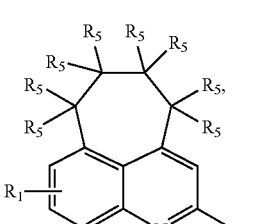
LA-10 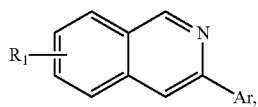
LA-11 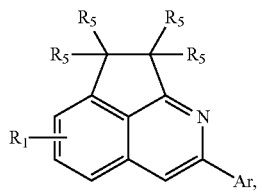
LA-12 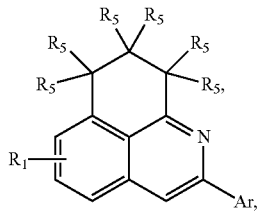
LA-13 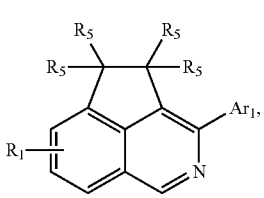
LA-14 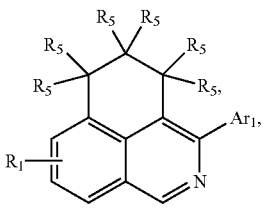
LA-15 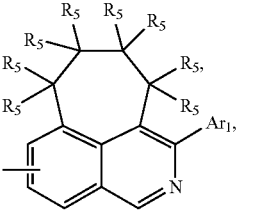
LA-16 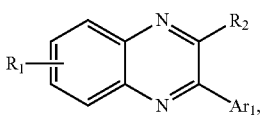
LA-17 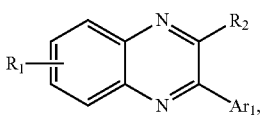
wherein $R_1$, $R_2$, $R_4$, $R_5$ and $Ar_1$ used have the meanings given above, and $R_1$, $R_2$, $R_4$, $R_5$ and $Ar_1$ are the same or different from each other.

In a preferred embodiment of the present invention, the LA is particularly preferably selected from the group consisting of the following compounds represented by L1 to L104:
L1
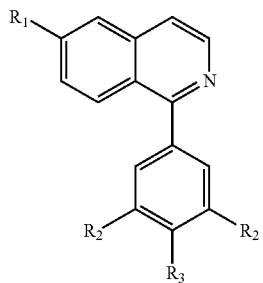
L2
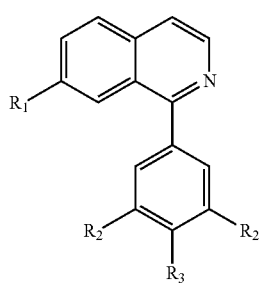
L3
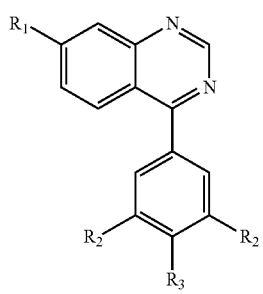
L4
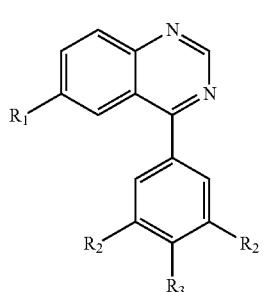
L5
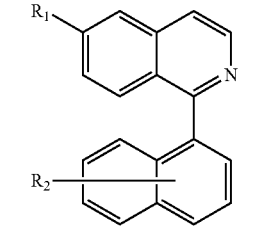
-continued
L6
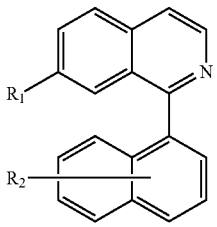
L7
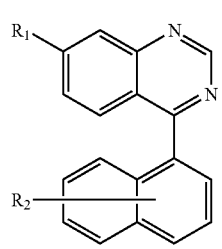
L8
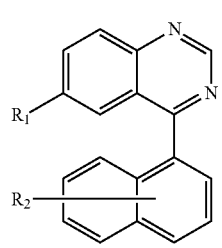
L9
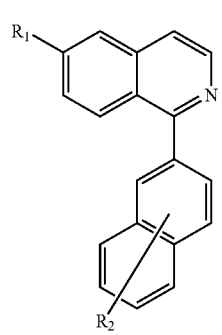
L10
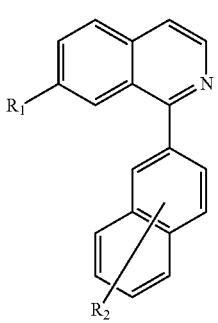

L11
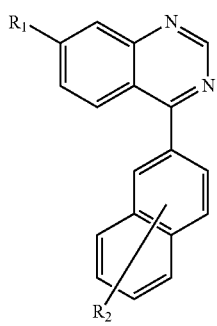
L12
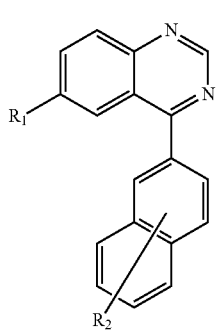
L13
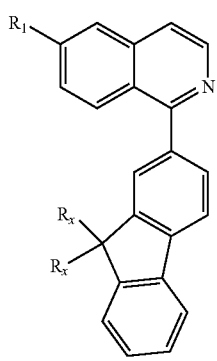
L14
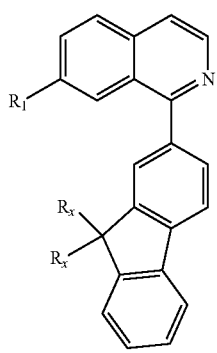
L15
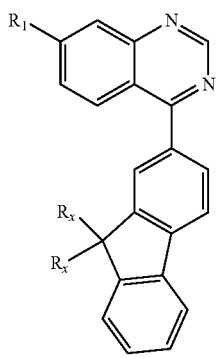
L16
L17
L18
L19
L20

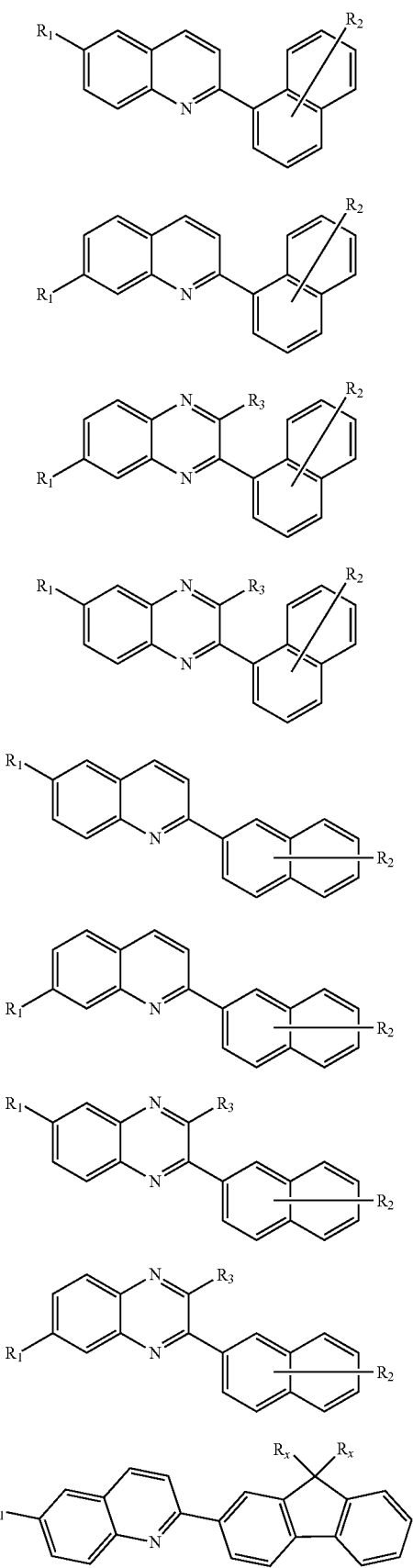

L36 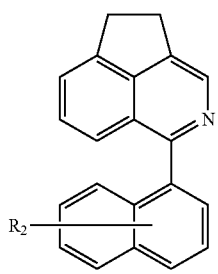
L37 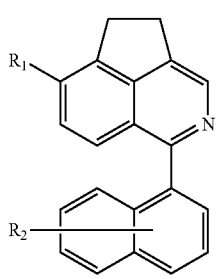
L38 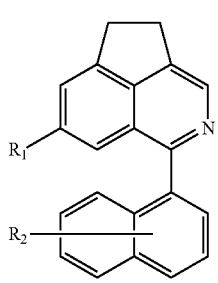
L39 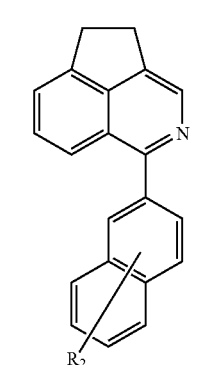
L40 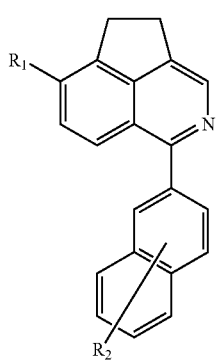
L41 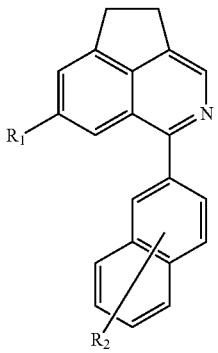
L42 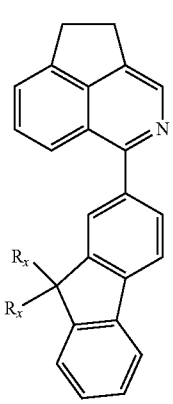
L43 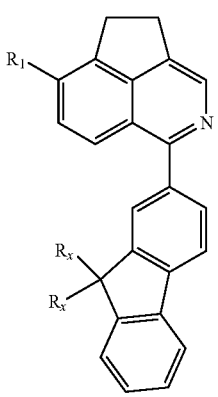
L44 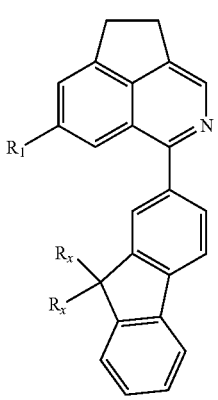

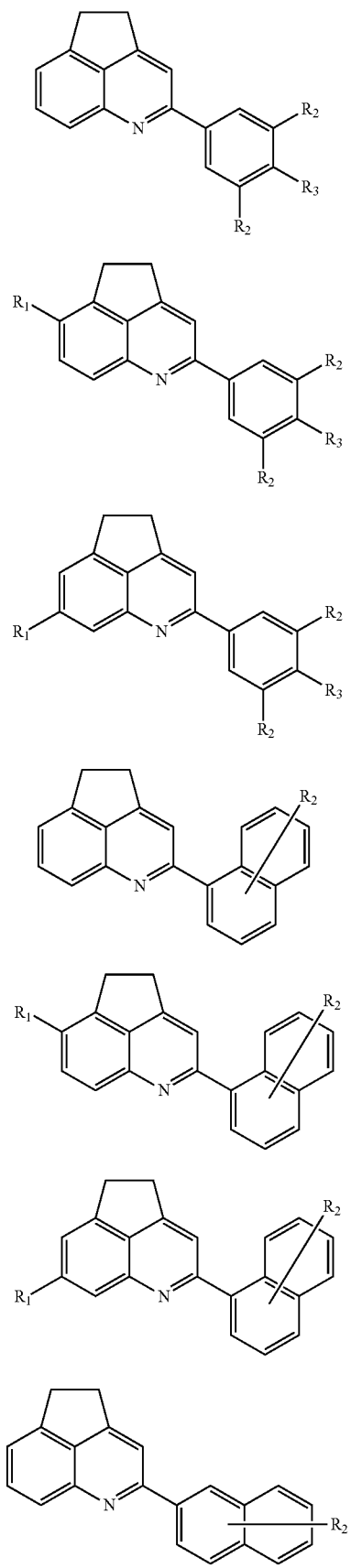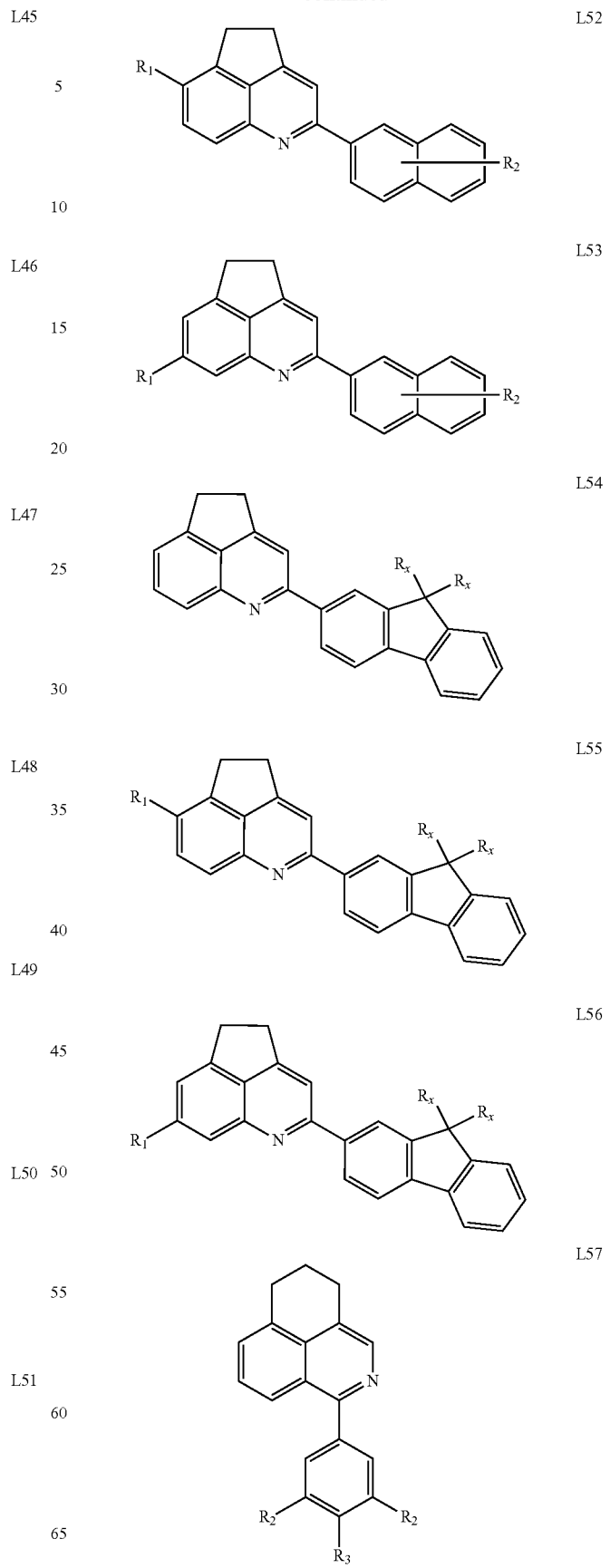

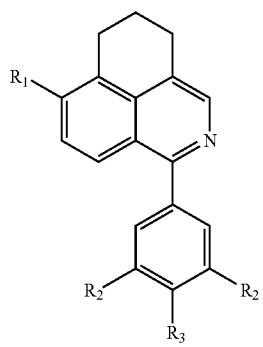
L58
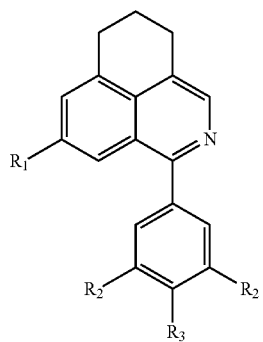
L59
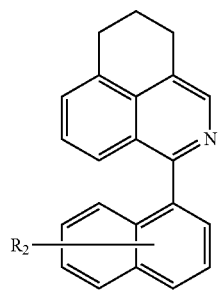
L60
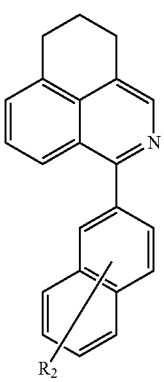
L63
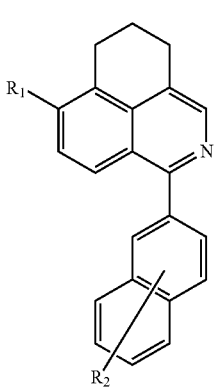
L64
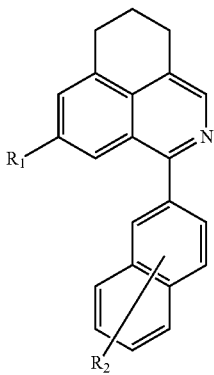
L65
L61
L62
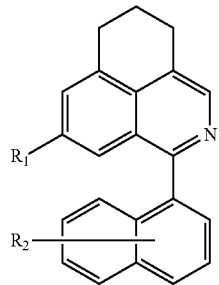
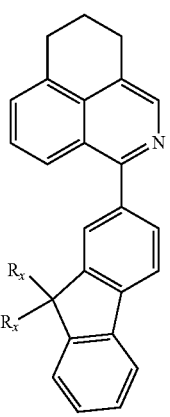
L66

L67
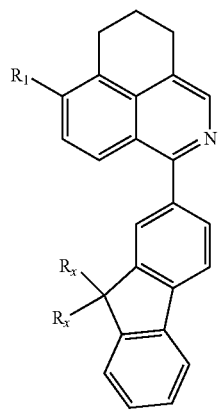
L68
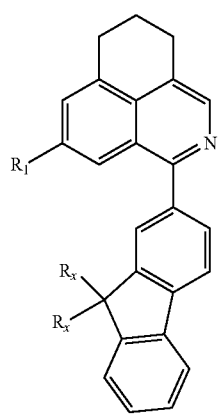
L69
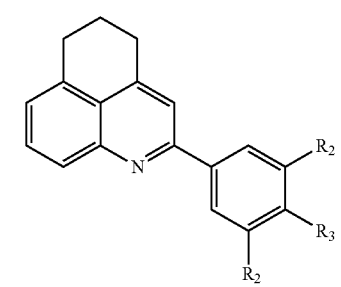
L70
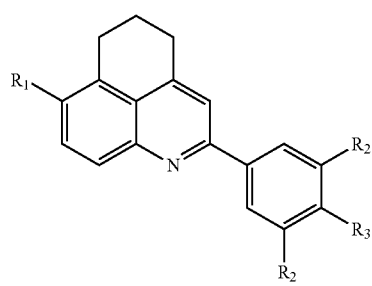
L71
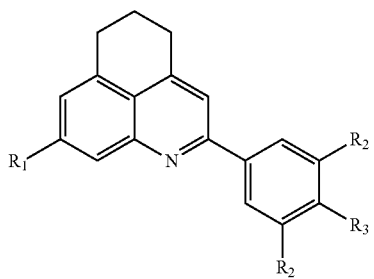
L72
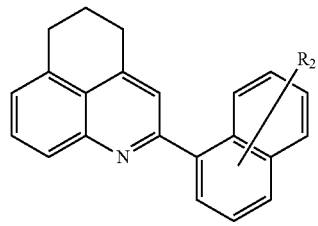
L73
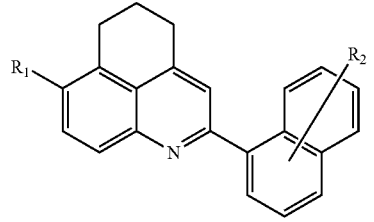
L74
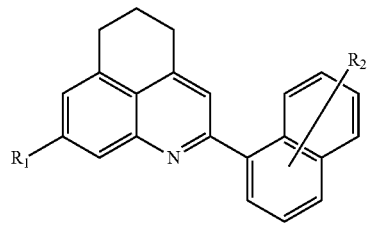
L75
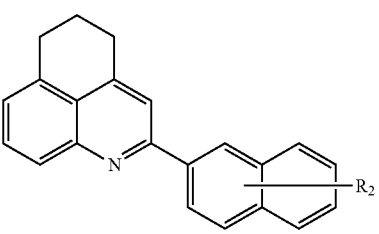
L76

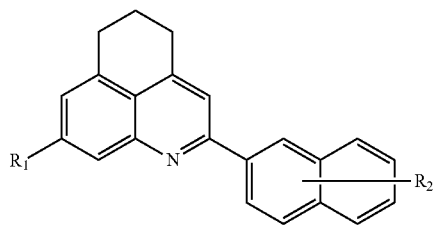 L77
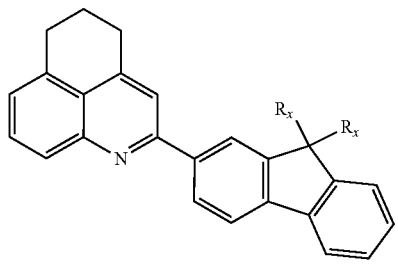 L78
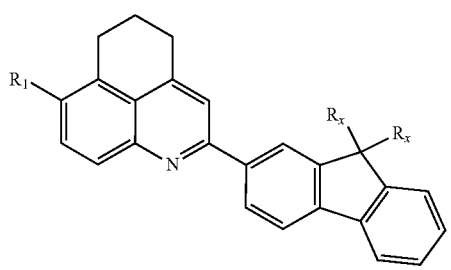 L79
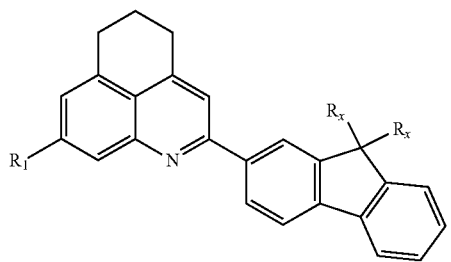 L80
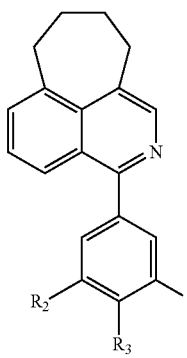 L81
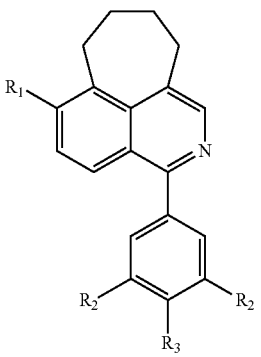 L82
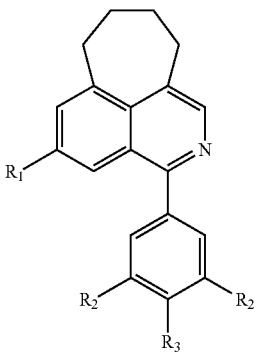 L83
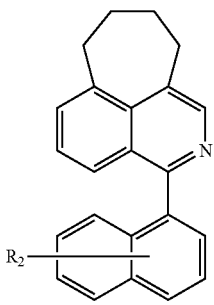 L84
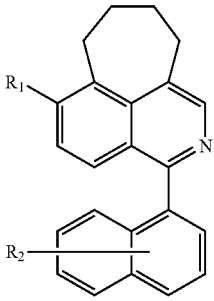 L85
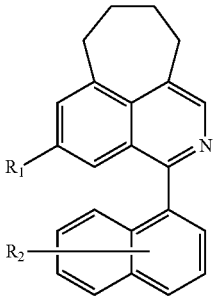 L86

-continued
L87 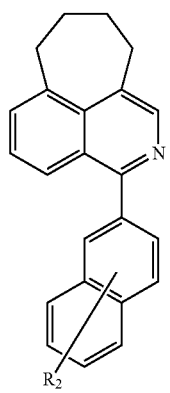
L88 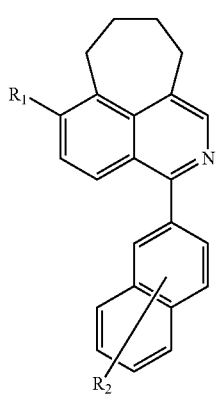
L89 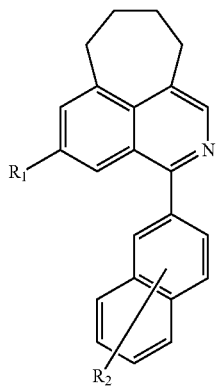
L90 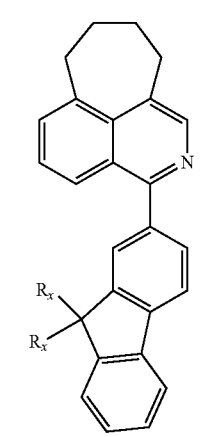
L91 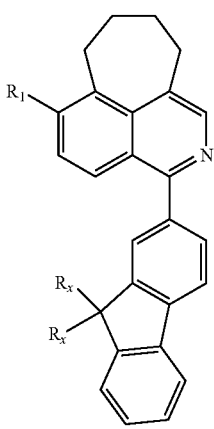
L92 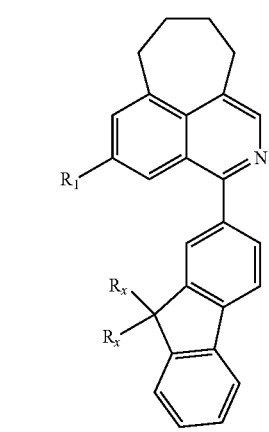
L93 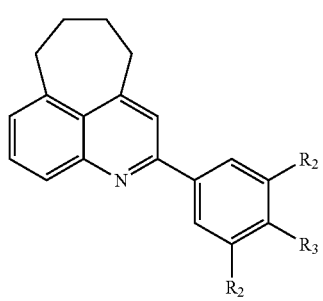
L94 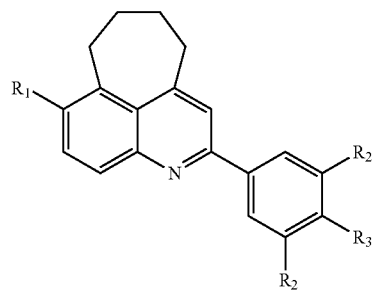

L95 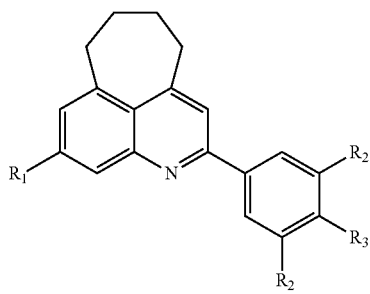
L96 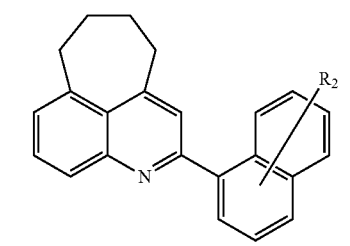
L97 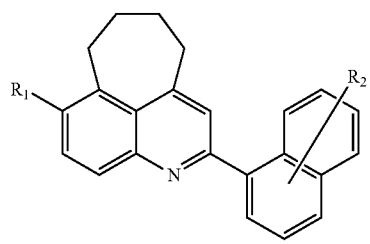
L98 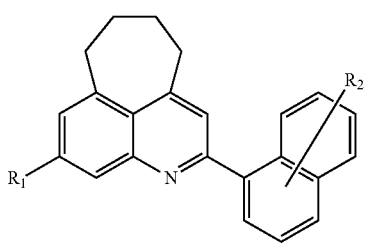
L99 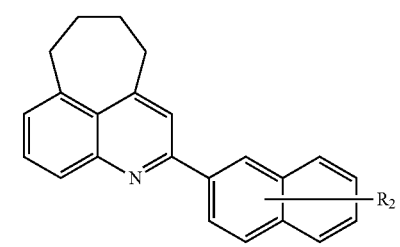
L100 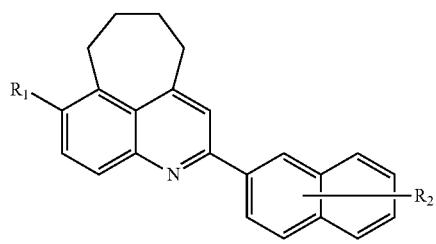
L101 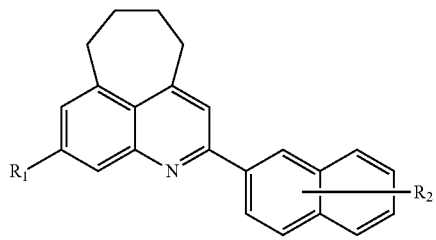
L102 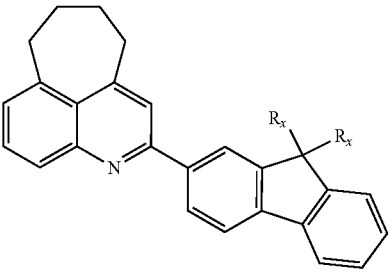
L103 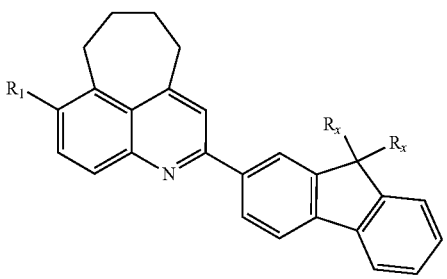
L104 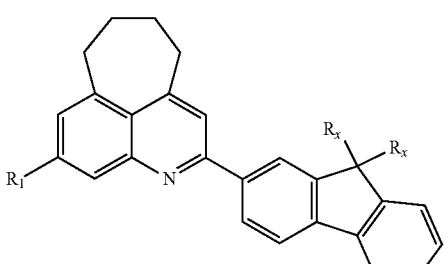
wherein $R_1$, $R_2$, $R_3$ and $R_x$ used herein have the meanings given above, and the above-mentioned $R_1$, $R_2$, $R_3$ and $R_x$ are the same or different from each other.
In a preferred embodiment of the present invention, the LB is selected from the group consisting of the following compounds represented by LB1 to LB44:
LB1 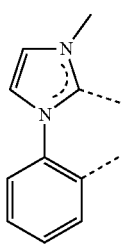

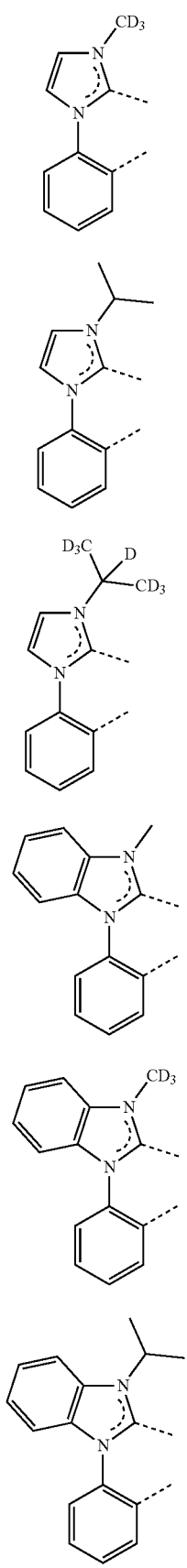
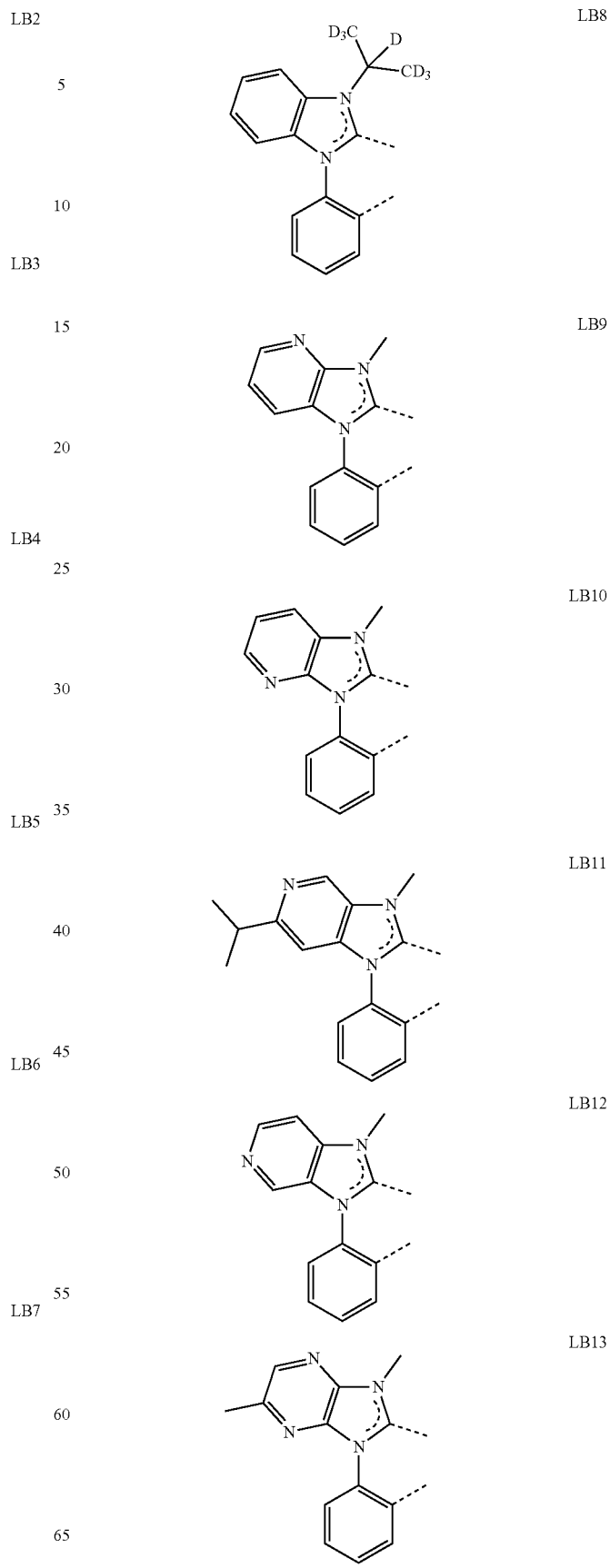

LB14
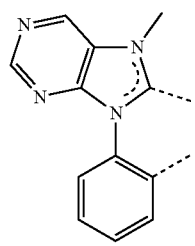
LB15
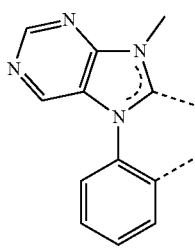
LB16
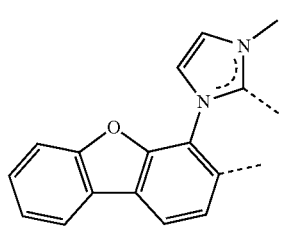
LB17
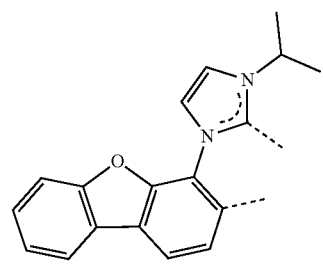
LB18
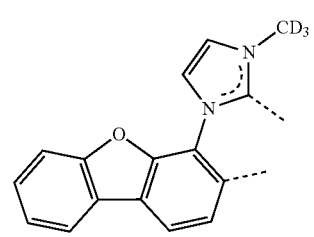
LB19
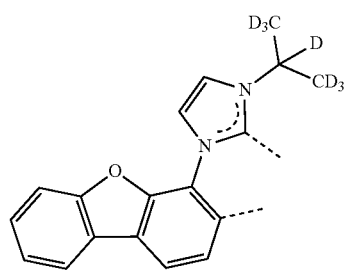
LB20
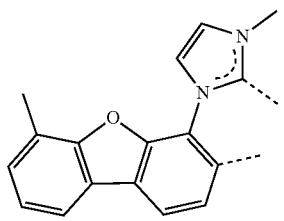
LB21
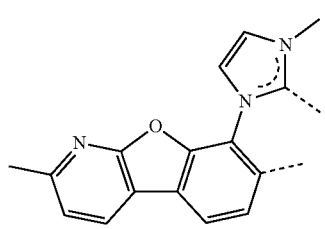
LB22
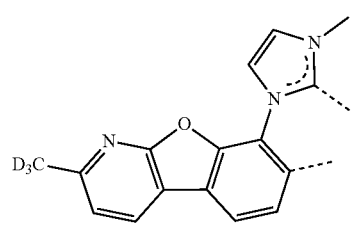
LB23
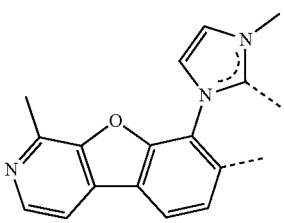
LB24
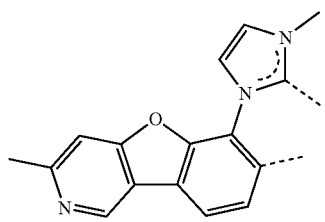
LB25
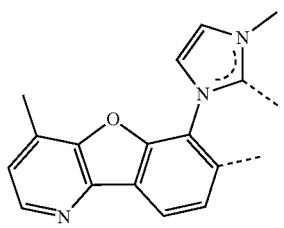
LB26
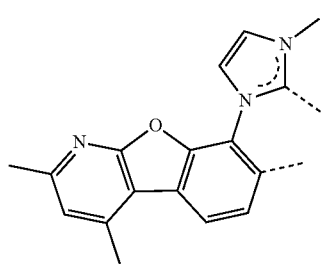

LB27 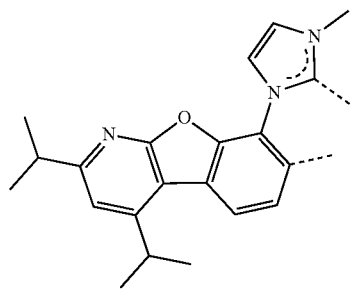
LB28 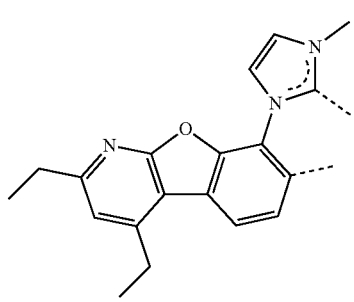
LB29 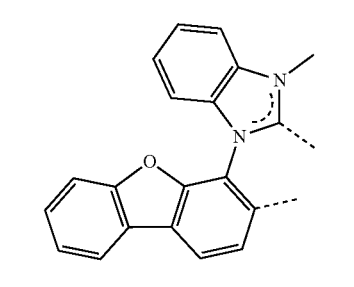
LB30 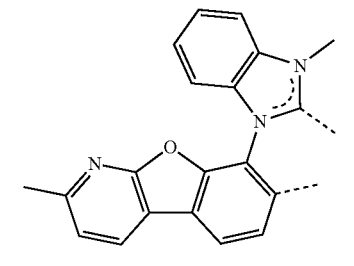
LB31 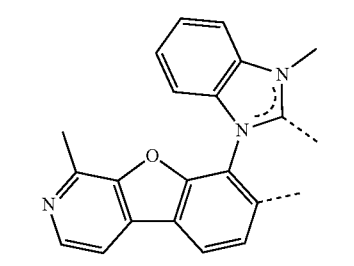
LB32 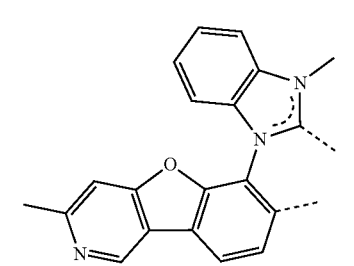
LB33 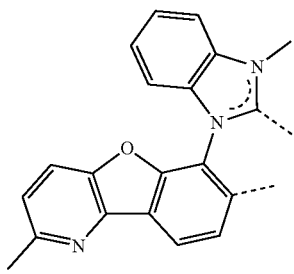
LB34 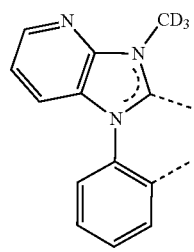
LB35 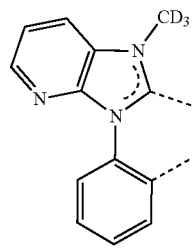
LB36 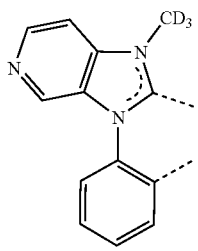
LB37 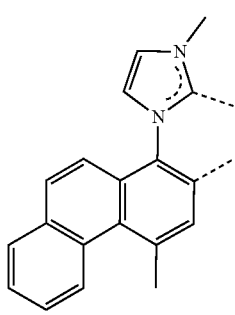

LB38 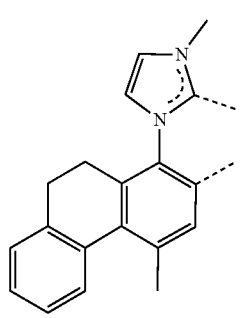
LB39 
LB40 
LB41
LB42 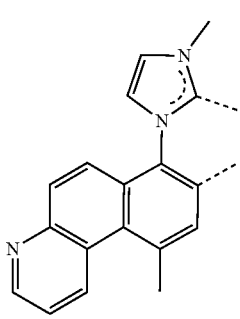
LB43 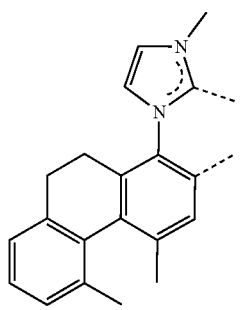
LB44 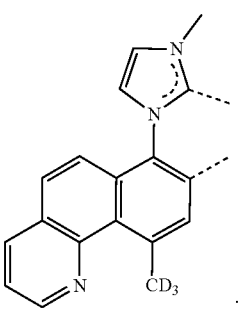
In a preferred embodiment of the present invention, the LC is selected from the group consisting of the following compounds represented by LC1 to LC48:
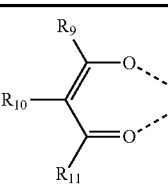
| Compound $L_C$ | $R_9$ | $R_{10}$ | $R_{11}$ |
|---|---|---|---|
| LC1 | —CH$_3$ | H | —CH$_3$ |

-continued

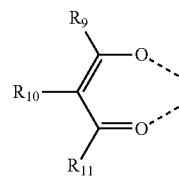

| Compound $L_C$ | $R_9$ | $R_{10}$ | $R_{11}$ |
| --- | --- | --- | --- |
| LC2 | isopropyl | H | isopropyl |
| LC3 | tert-butyl | H | tert-butyl |
| LC4 | isobutyl | H | isobutyl |
| LC5 | sec-butyl (1-methylpropyl/ethyl branched) | H | sec-butyl |
| LC6 | cyclopentyl | H | cyclopentyl |
| LC7 | cyclohexyl | H | cyclohexyl |
| LC8 | 2,4-dimethyl-3-pentyl | H | 2,4-dimethyl-3-pentyl |
| LC9 | 4-methylcyclohexyl | H | 4-methylcyclohexyl |
| LC10 | 4-cyclopentylcyclohexyl | H | 4-cyclopentylcyclohexyl |
| LC11 | 4-cyclohexylcyclohexyl | H | 4-cyclohexylcyclohexyl |
| LC12 | 4,4-dimethylcyclohexyl | H | 4,4-dimethylcyclohexyl |

-continued

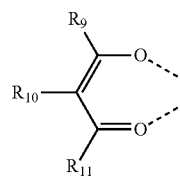

| Compound $L_C$ | $R_9$ | $R_{10}$ | $R_{11}$ |
|---|---|---|---|
| LC13 | 4,4-diethylcyclohexyl | H | 4,4-diethylcyclohexyl |
| LC14 | CH(CF$_3$)$_2$ | H | CH(CF$_3$)$_2$ |
| LC15 | 4-(CF$_3$)cyclohexyl | H | 4-(CF$_3$)cyclohexyl |
| LC16 | 4,4-bis(CF$_3$)cyclohexyl | H | 4,4-bis(CF$_3$)cyclohexyl |
| LC17 | CH$_3$ | CH$_3$ | CH$_3$ |
| LC18 | CH(CH$_3$)$_2$ | CH$_3$ | CH(CH$_3$)$_2$ |
| LC19 | C(CH$_3$)$_3$ | CH$_3$ | C(CH$_3$)$_3$ |
| LC20 | CH$_2$CH(CH$_3$)$_2$ | CH$_3$ | CH$_2$CH(CH$_3$)$_2$ |
| LC21 | CH(CH$_2$CH$_3$)$_2$ | CH$_3$ | CH(CH$_2$CH$_3$)$_2$ |
| LC22 | cyclopentyl | CH$_3$ | cyclopentyl |
| LC23 | cyclohexyl | CH$_3$ | cyclohexyl |

-continued

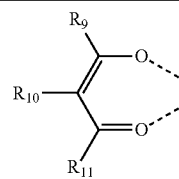

| Compound $L_C$ | $R_9$ | $R_{10}$ | $R_{11}$ |
|---|---|---|---|
| LC24 | isopropyl-CH- with methyl branch | —CH$_3$ | isopropyl-CH- with methyl branch |
| LC25 | -cyclohexyl-CH$_3$ | —CH$_3$ | -cyclohexyl-CH$_3$ |
| LC26 | -cyclohexyl-cyclopentyl | —CH$_3$ | -cyclohexyl-cyclopentyl |
| LC27 | -cyclohexyl-cyclohexyl | —CH$_3$ | -cyclohexyl-cyclohexyl |
| LC28 | -cyclohexyl(CH$_3$)$_2$ | —CH$_3$ | -cyclohexyl(CH$_3$)$_2$ |
| LC29 | -cyclohexyl(C$_2$H$_5$)$_2$ | —CH$_3$ | -cyclohexyl(C$_2$H$_5$)$_2$ |
| LC30 | -CH(CF$_3$)$_2$ | —CH$_3$ | -CH(CF$_3$)$_2$ |
| LC31 | -cyclohexyl-CF$_3$ | —CH$_3$ | -cyclohexyl-CF$_3$ |
| LC32 | -cyclohexyl(CF$_3$)$_2$ | —CH$_3$ | -cyclohexyl(CF$_3$)$_2$ |
| LC33 | —CH$_3$ | -phenyl | —CH$_3$ |
| LC34 | -isopropyl | -phenyl | -isopropyl |
| LC35 | -tert-butyl | -phenyl | -tert-butyl |

-continued
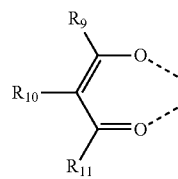
| Compound $L_C$ | $R_9$ | $R_{10}$ | $R_{11}$ |
|---|---|---|---|
| LC36 | 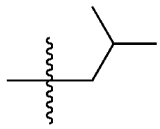 [SMILES: *CC(C)C] | 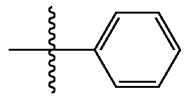 | 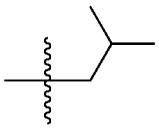 [SMILES: *CC(C)C] |
| LC37 | 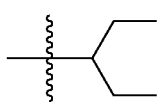 | 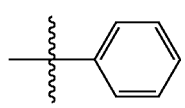 | 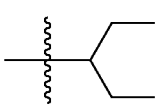 |
| LC38 | 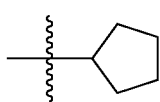 [SMILES: *C1CCCC1] | 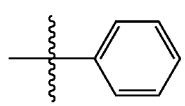 | 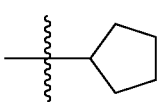 [SMILES: *C1CCCC1] |
| LC39 | 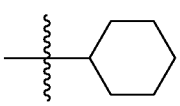 [SMILES: *C1CCCCC1] | 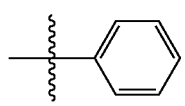 | 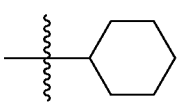 [SMILES: *C1CCCCC1] |
| LC40 | 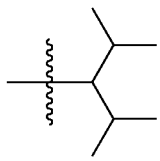 [SMILES: *C(C(C)C)C(C)C] | 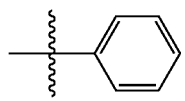 [SMILES: *c1ccccc1] | 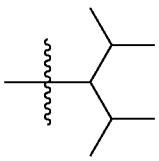 [SMILES: *C(C(C)C)C(C)C] |
| LC41 | 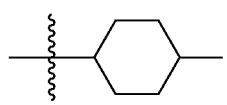 [SMILES: *C1CCC(C)CC1] | 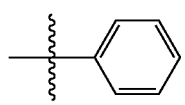 [SMILES: *c1ccccc1] | 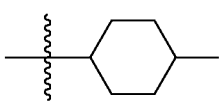 [SMILES: *C1CCC(C)CC1] |
| LC42 | 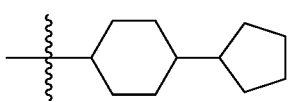 [SMILES: *C1CCC(C2CCCC2)CC1] | 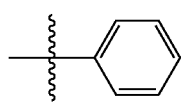 | 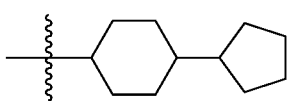 |
| LC43 | 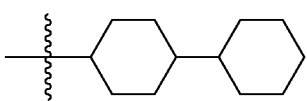 | 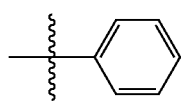 | 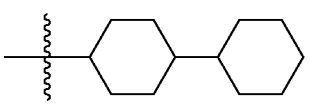 |
| LC44 | 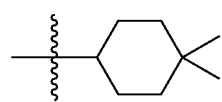 | 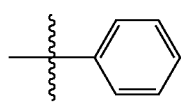 [SMILES: *c1ccccc1] | 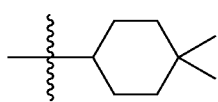 |
| LC45 | 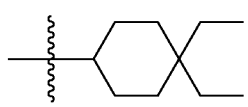 | 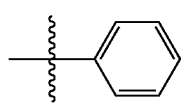 [SMILES: *c1ccccc1] | 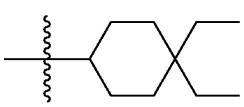 |
| LC46 | 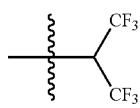 | 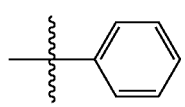 [SMILES: *c1ccccc1] | 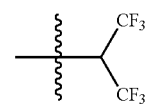 |

-continued
| Compound L$_C$ | R$_9$ | R$_{10}$ | R$_{11}$ |
|---|---|---|---|
| LC47 | cyclohexyl-CF$_3$ | phenyl | cyclohexyl-CF$_3$ |
| LC48 | cyclohexyl-(CF$_3$)$_2$ | phenyl | cyclohexyl-(CF$_3$)$_2$ |
Examples of the preferred compounds M(LA)$_x$(LB)$_y$(LC)$_z$ according to the above-mentioned embodiment are compounds shown in the following table:
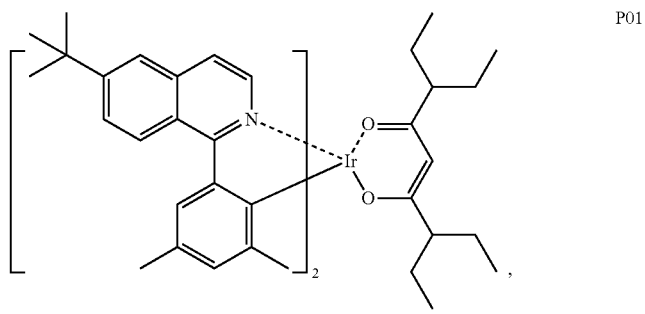
P01
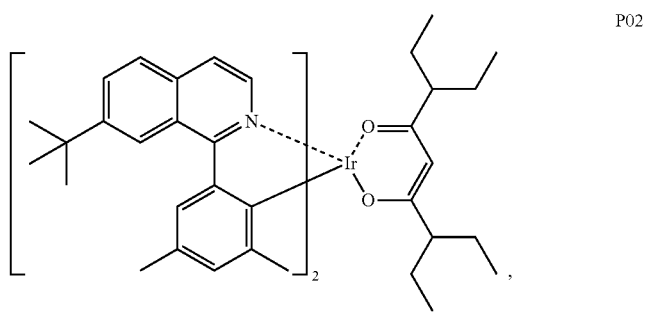
P02
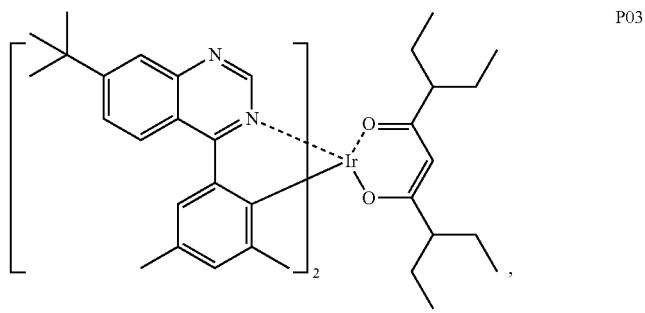
P03

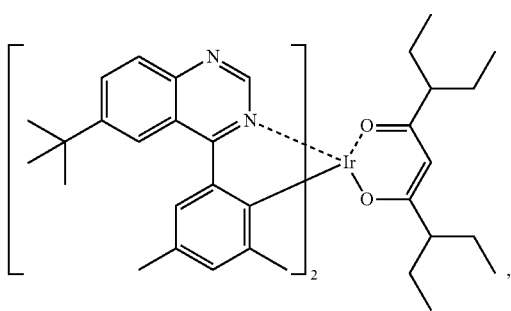
P04
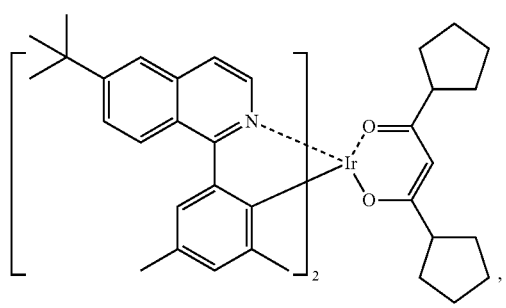
P05
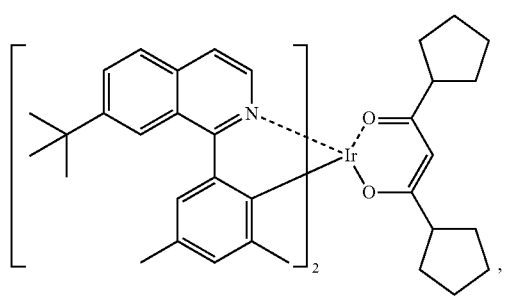
P06
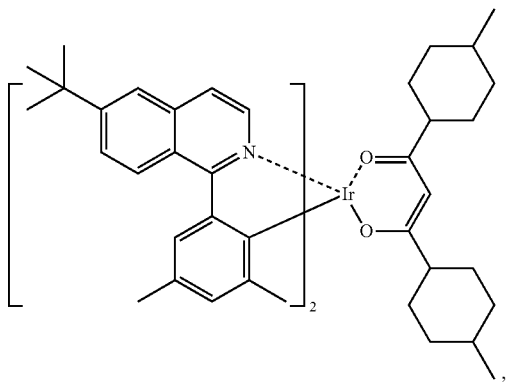
P07

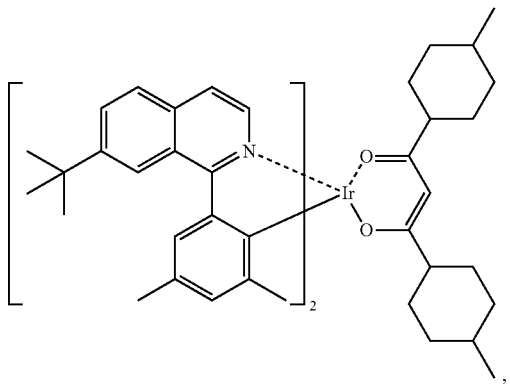
P08
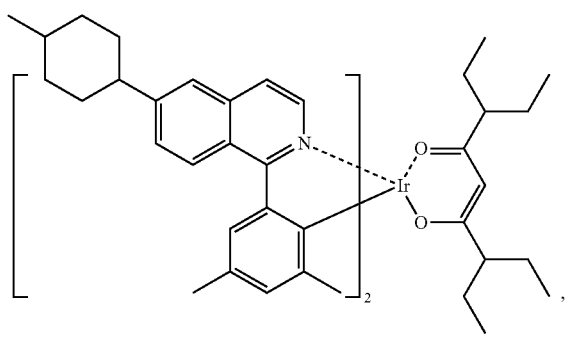
P09
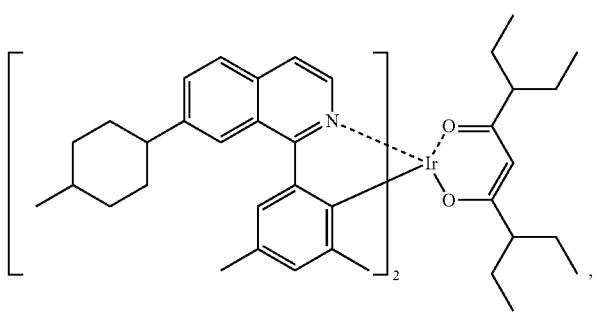
P10
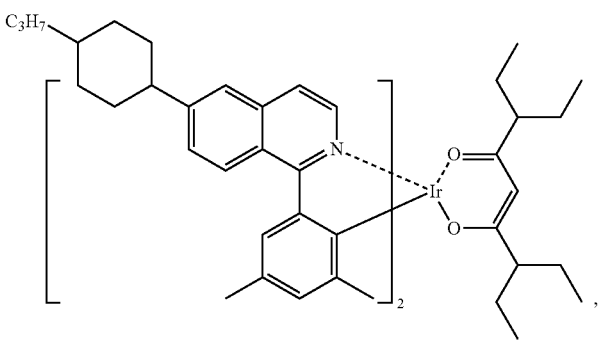
P11

-continued
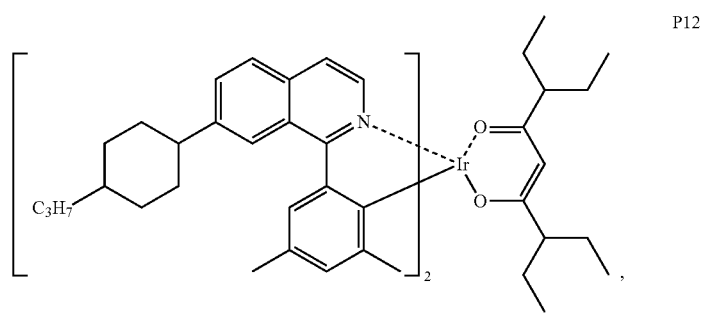
P12
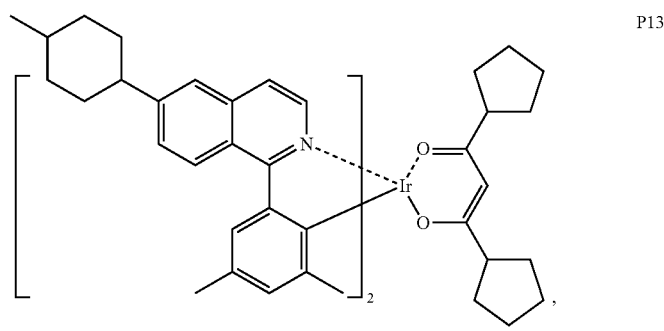
P13
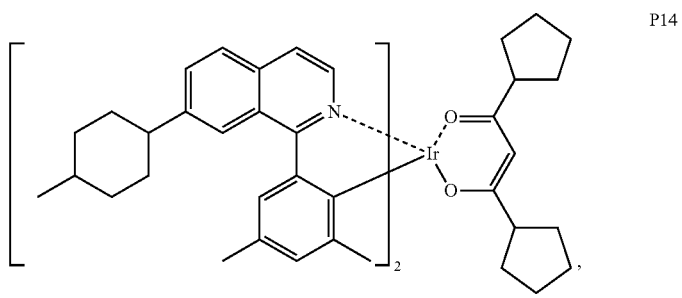
P14
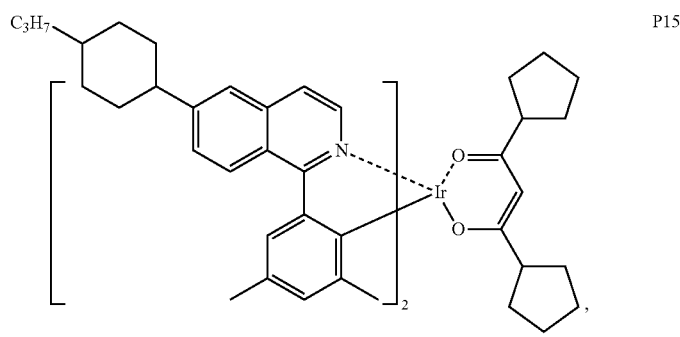
P15
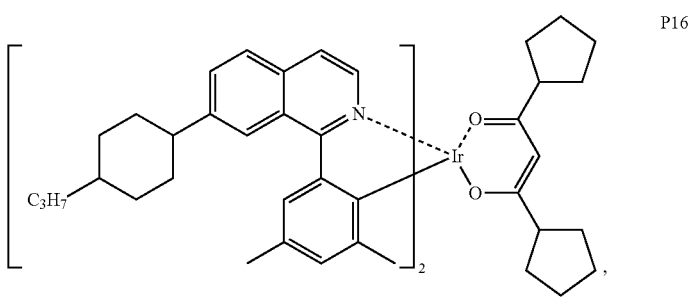
P16

-continued
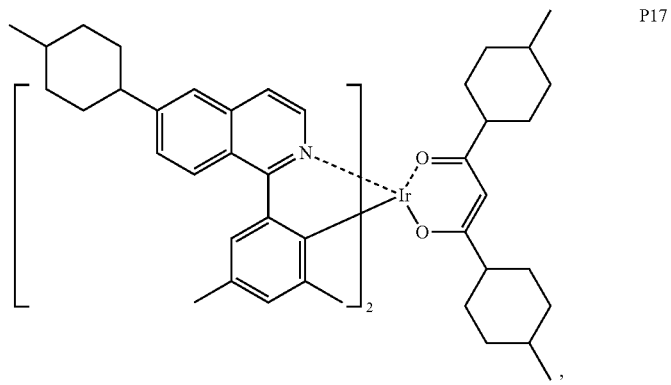
P17
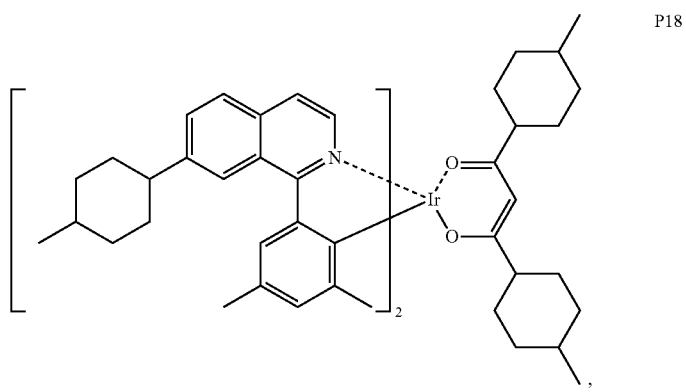
P18
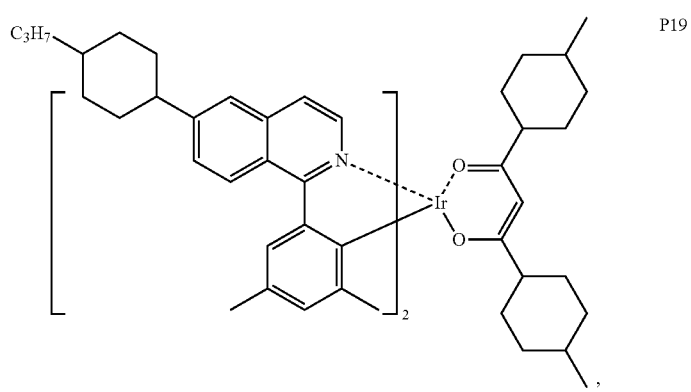
P19
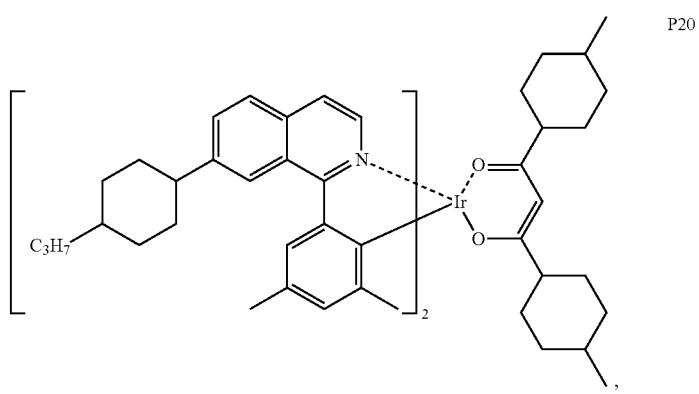
P20

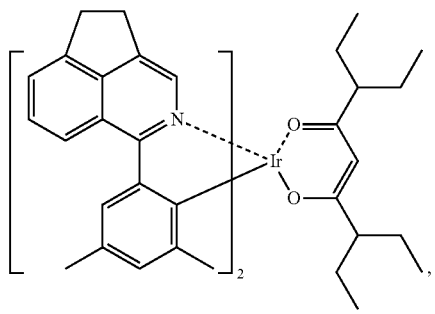
P21
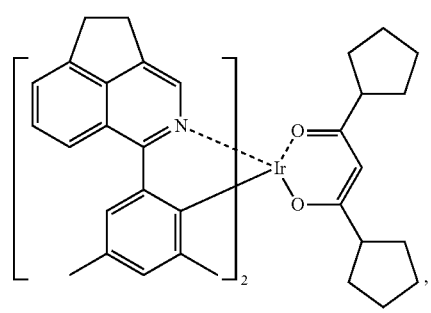
P22
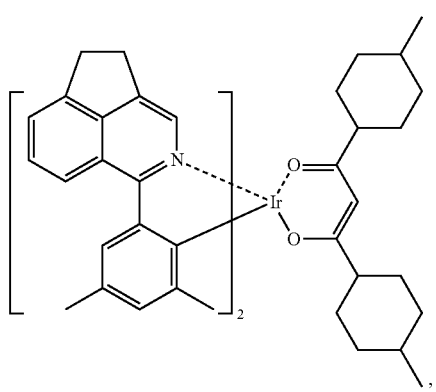
P23
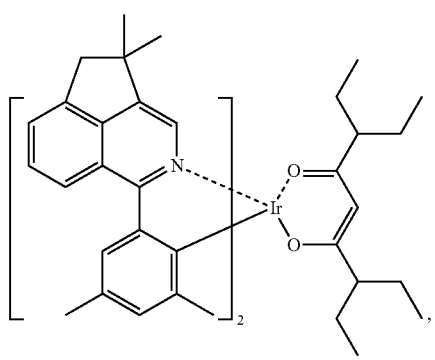
P24

-continued
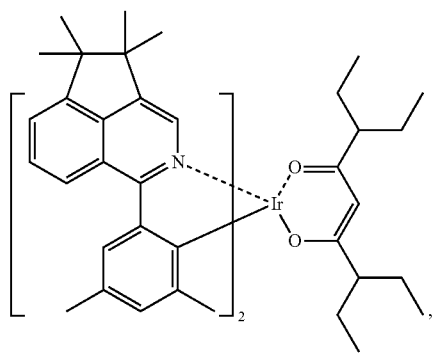
P25
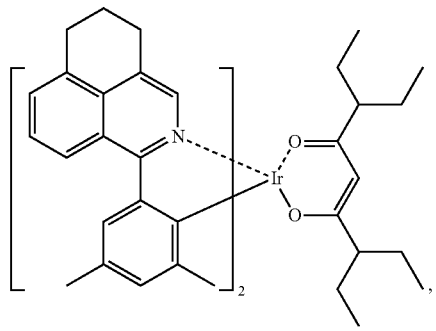
P26
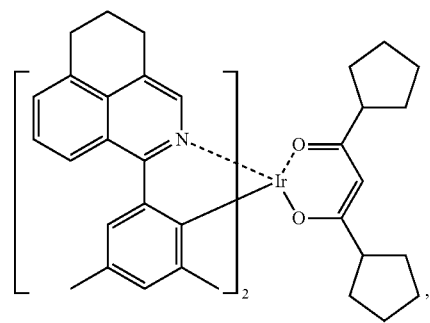
P27
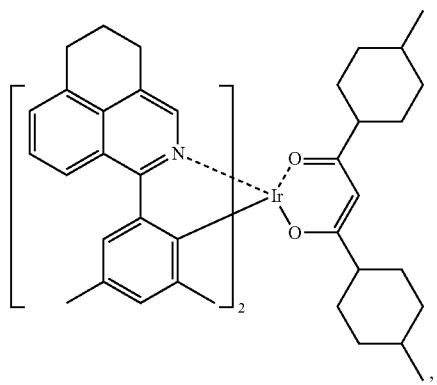
P28

-continued
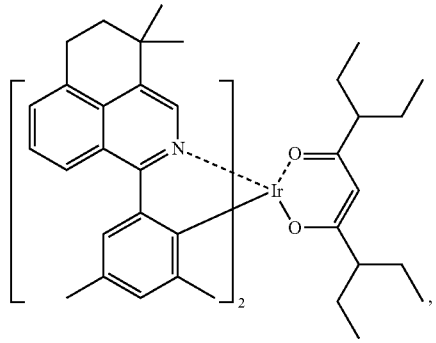
P29
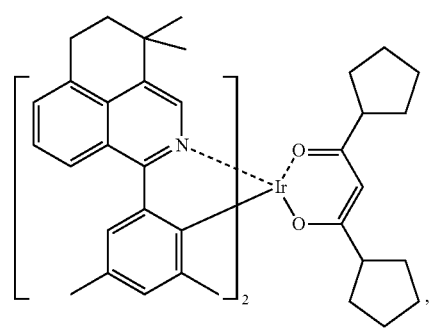
P30
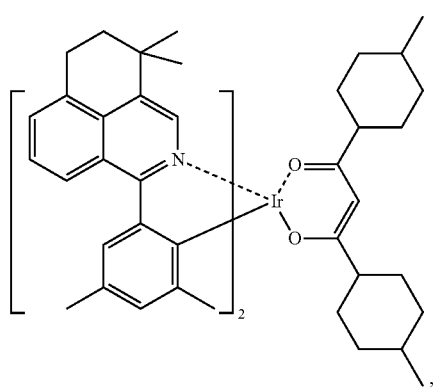
P31
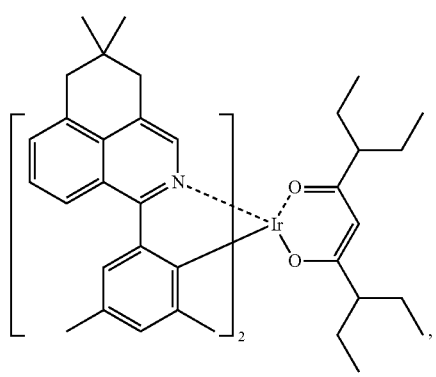
P32

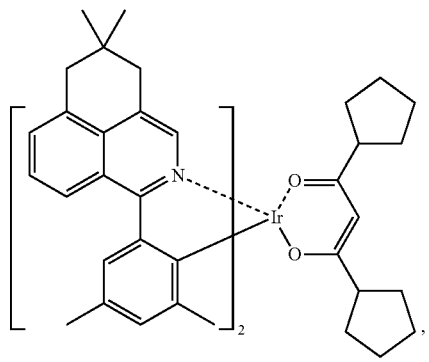
P33
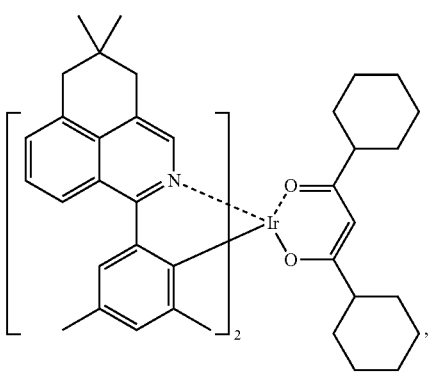
P34
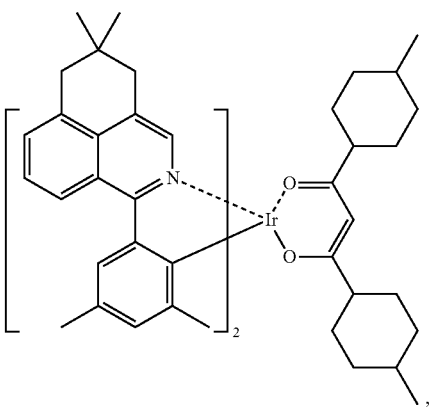
P35
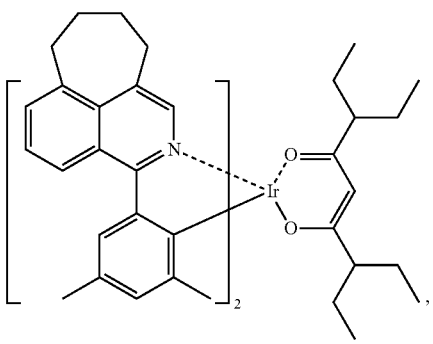
P36

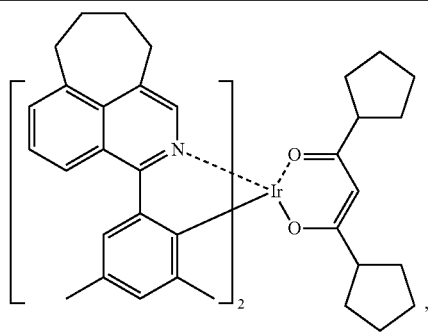
P37
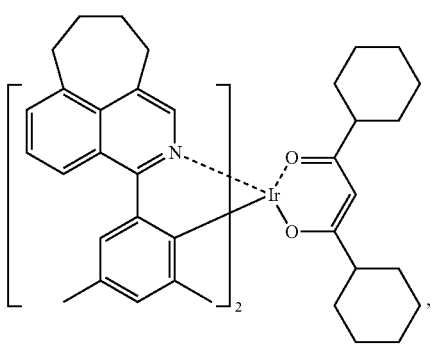
P38
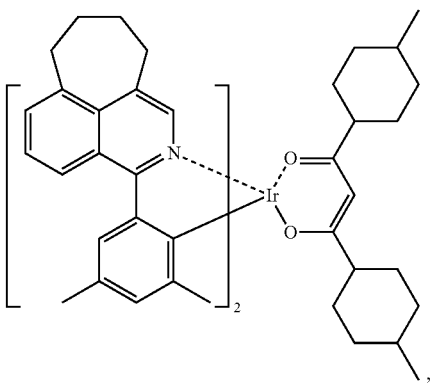
P39
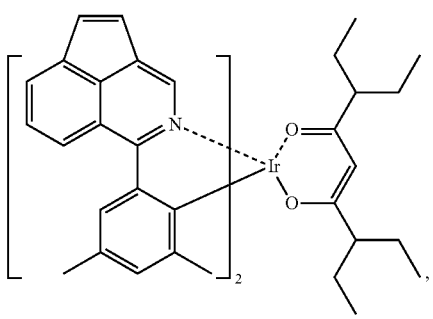
P40

-continued
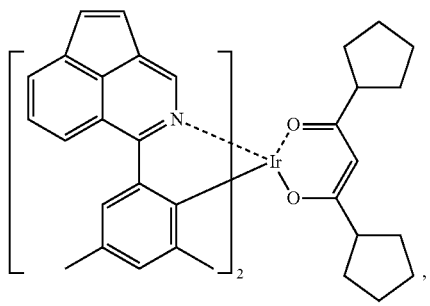
P41
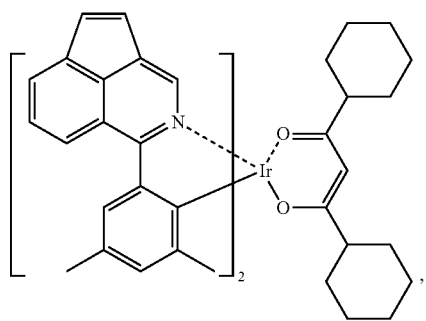
P42
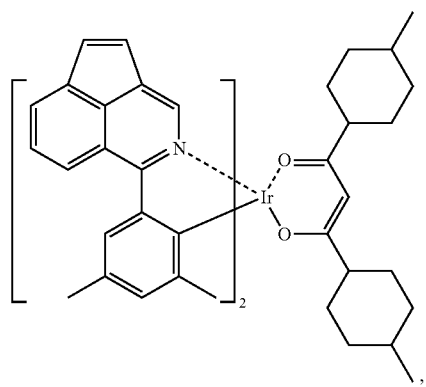
P43
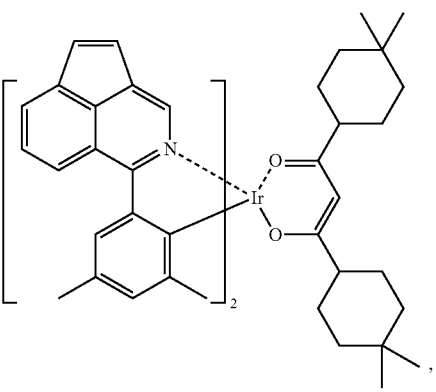
P44

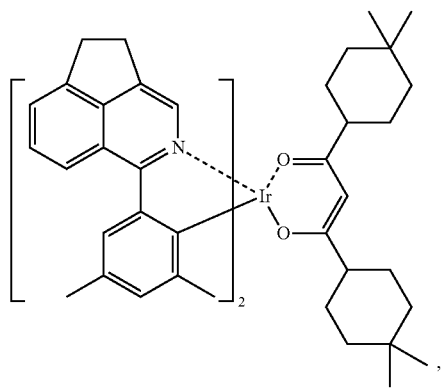
P45
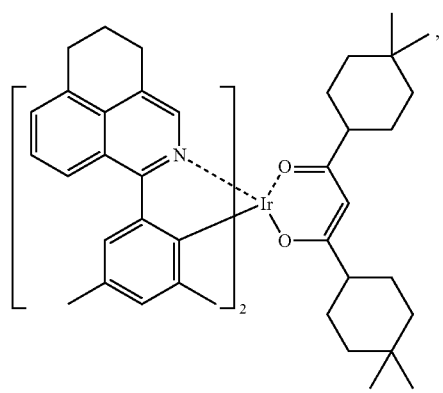
P46
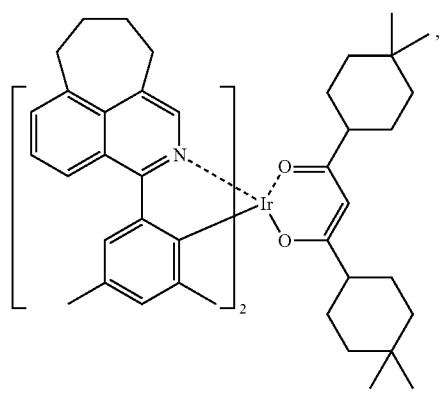
P47
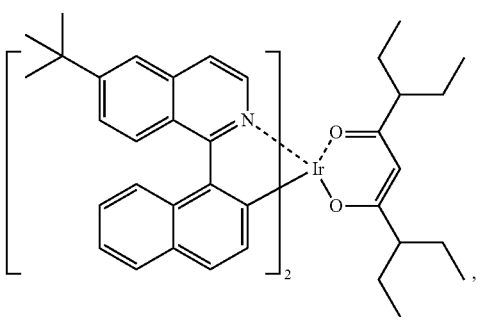
P48

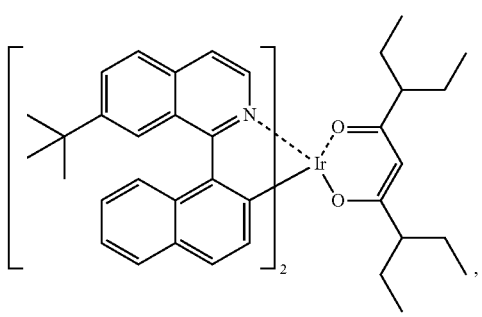
P49
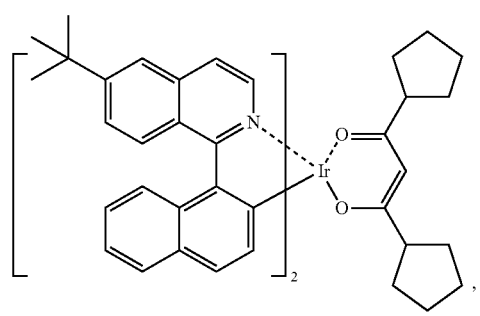
P50
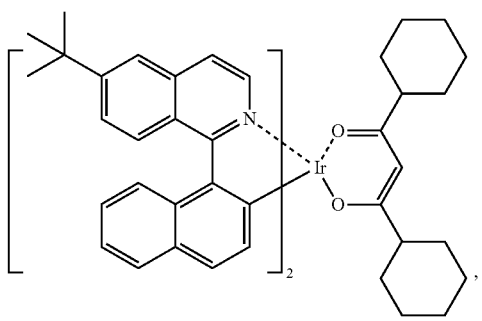
P51
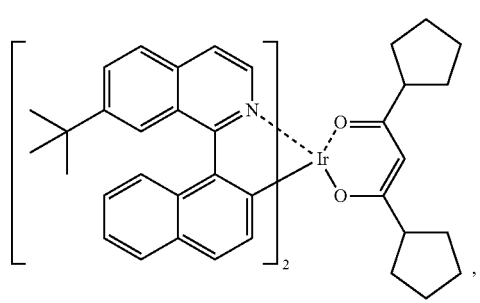
P52
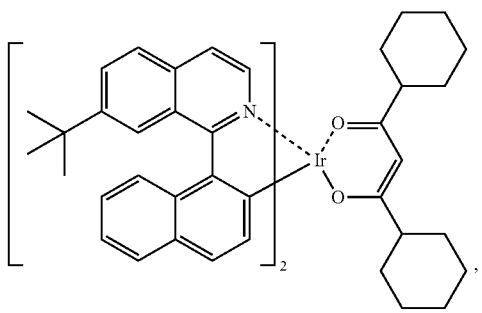
P53

-continued
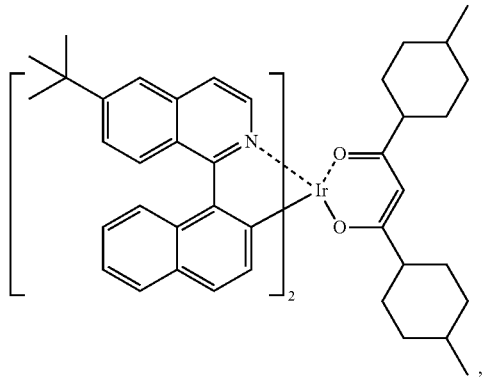
P54
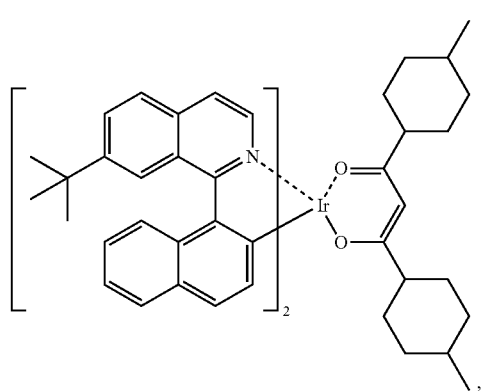
P55
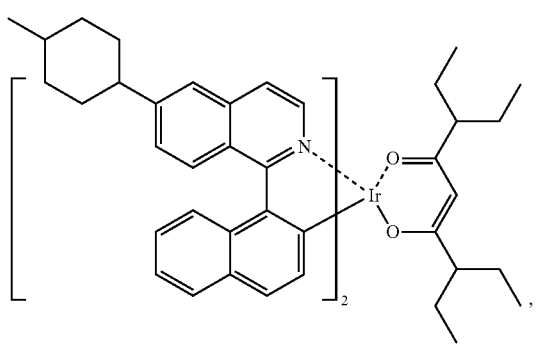
P56
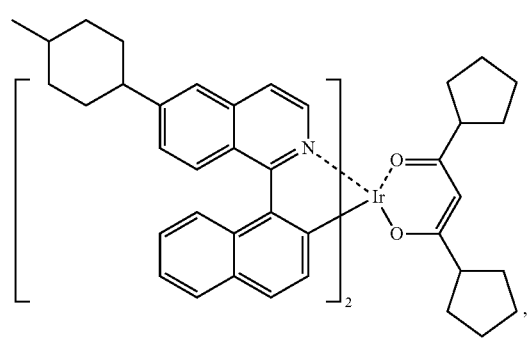
P57

-continued
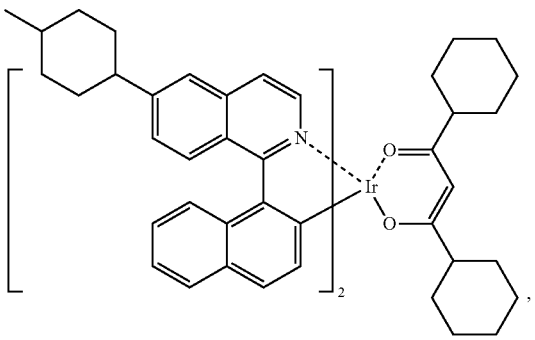
P58
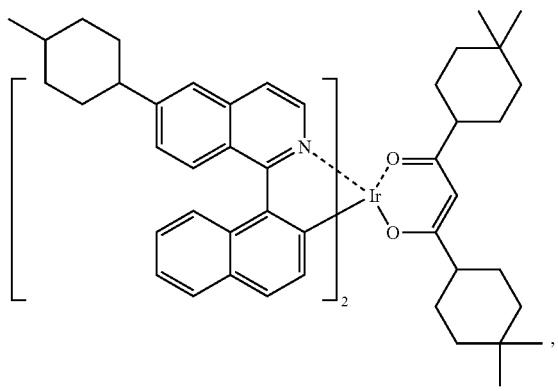
P59
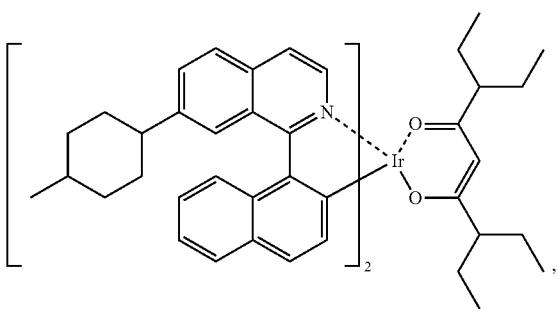
P60
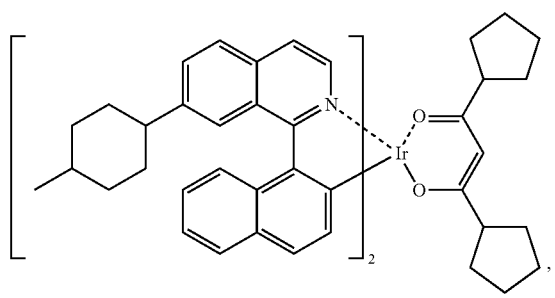
P61
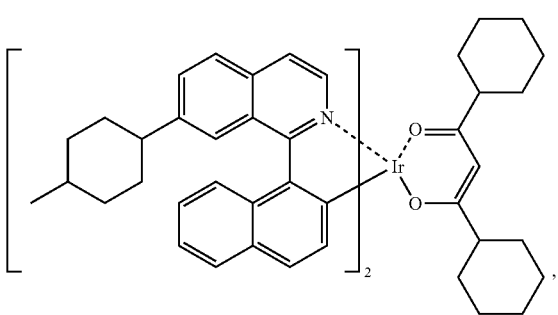
P62

-continued
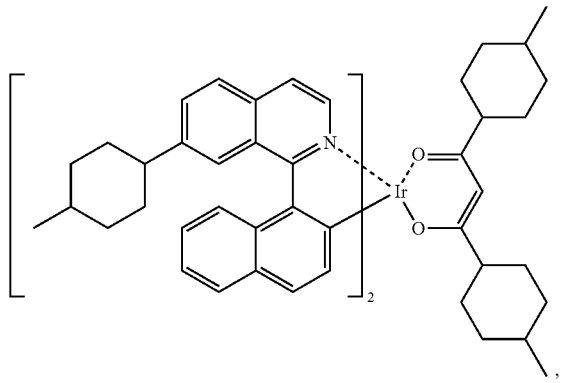
P63
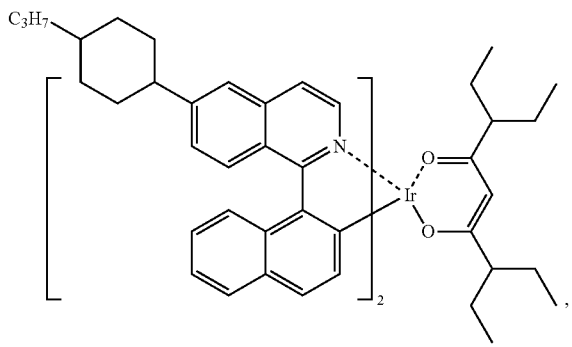
P64
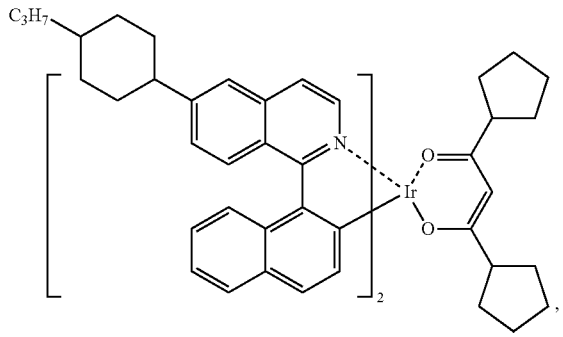
P65
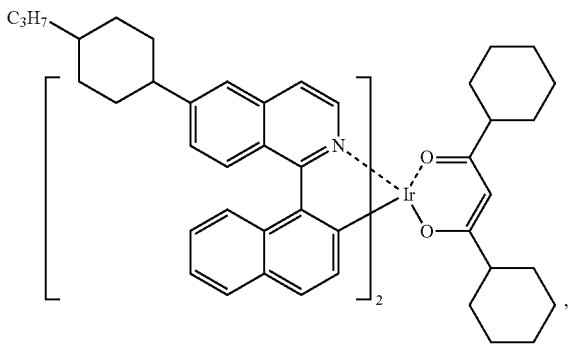
P66

-continued
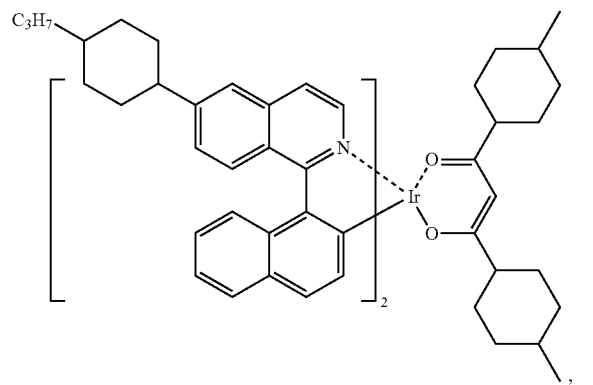
P67
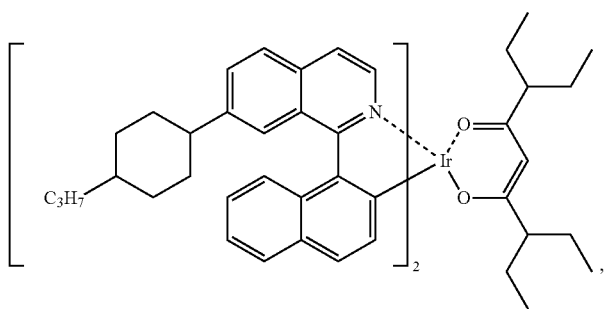
P68
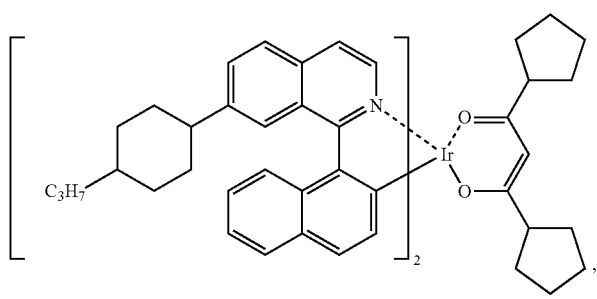
P69
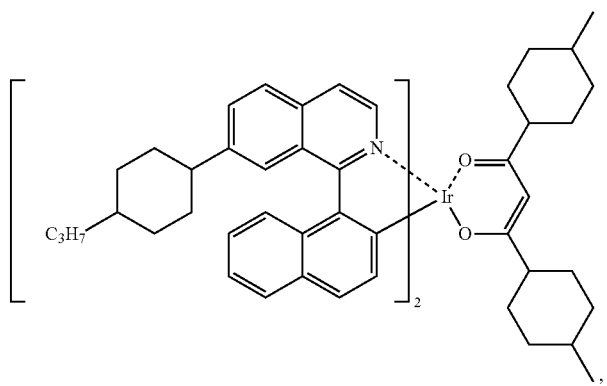
P70

-continued
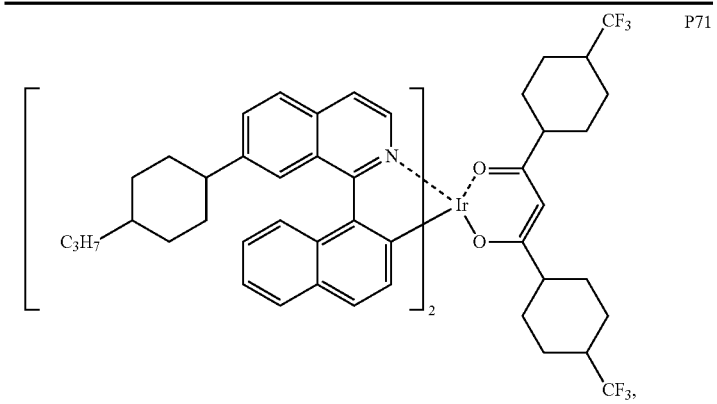
P71
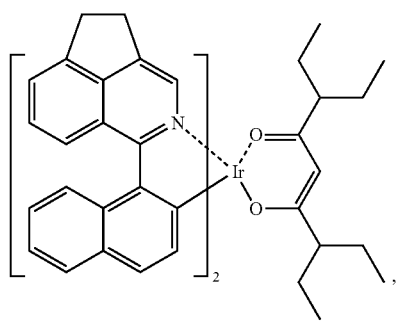
P72
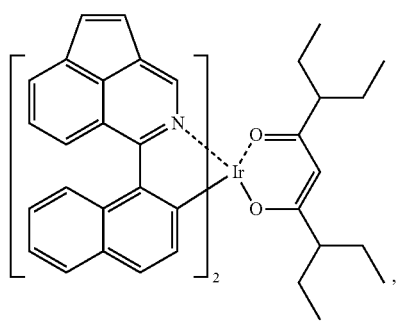
P73
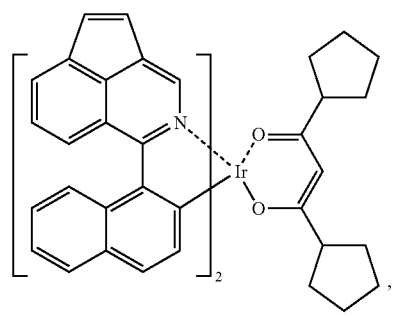
P74

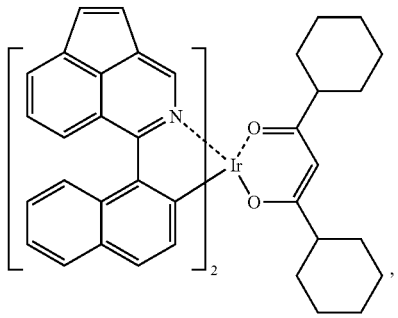
P75
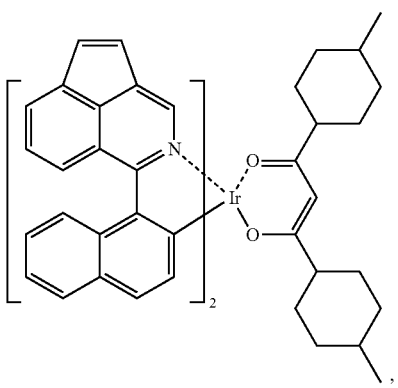
P76
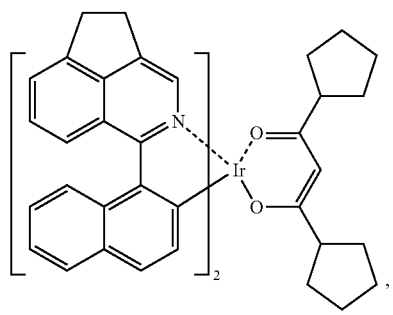
P77
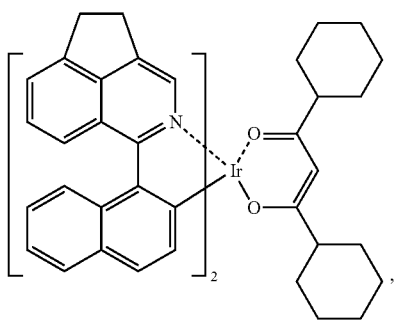
P78

-continued
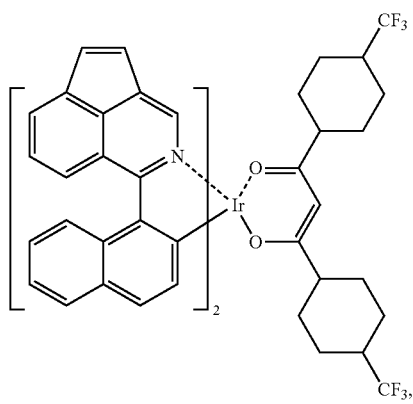
P79
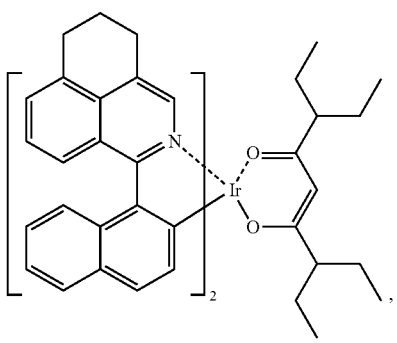
P80
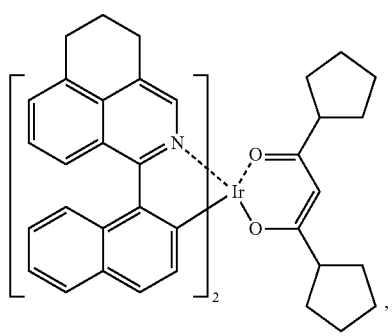
P81
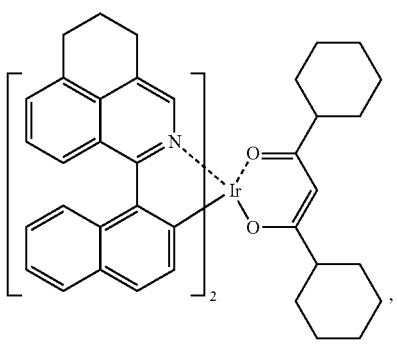
P82

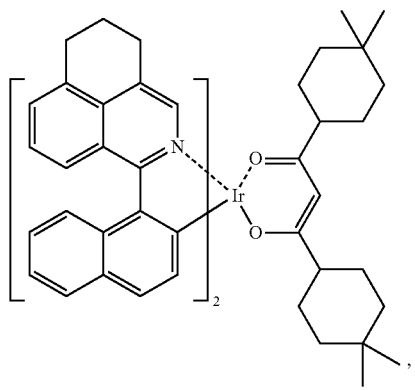
P83
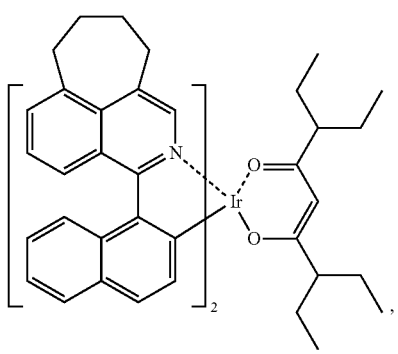
P84
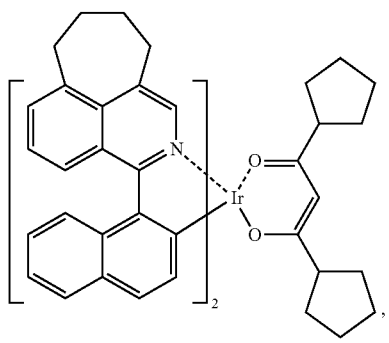
P85
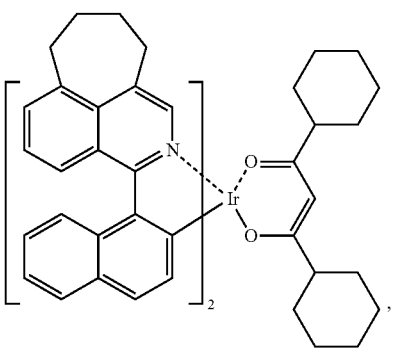
P86

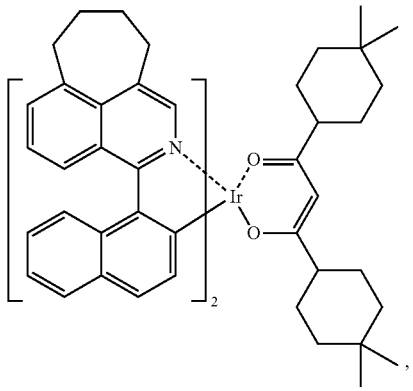
P87
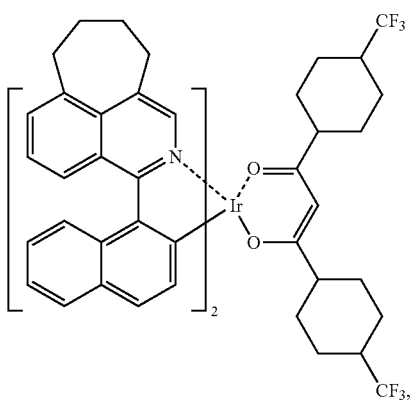
P88
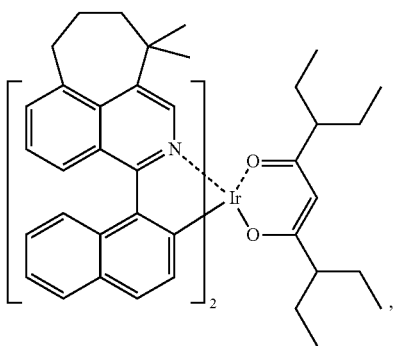
P89
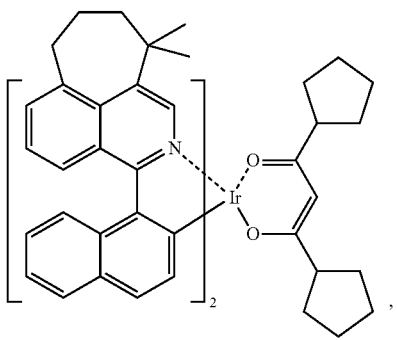
P90

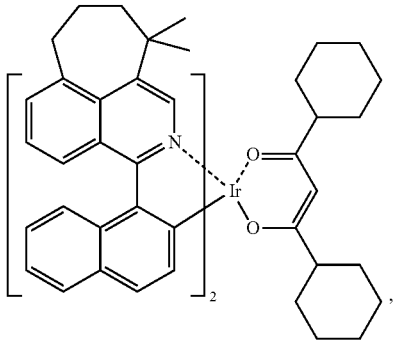
P91
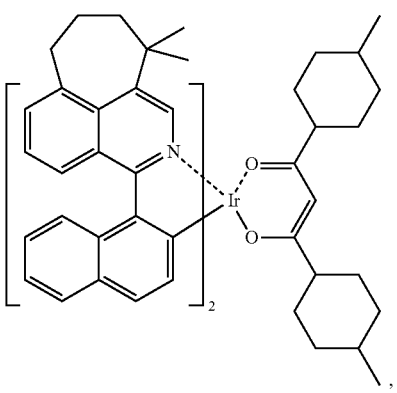
P92
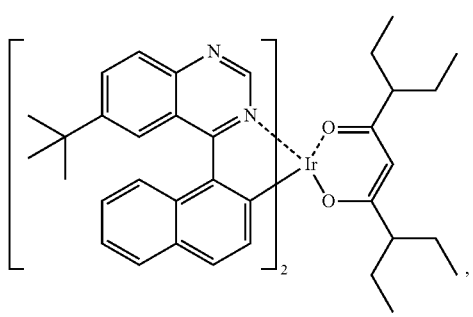
P93
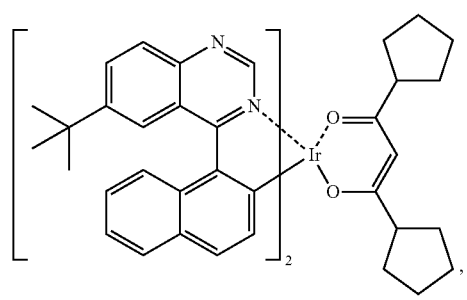
P94

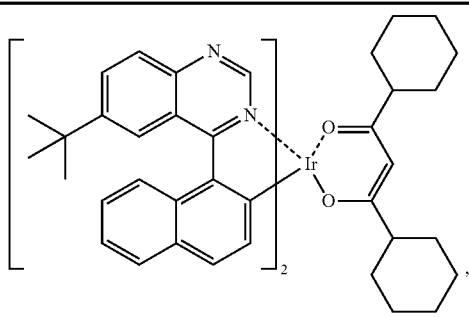
P95
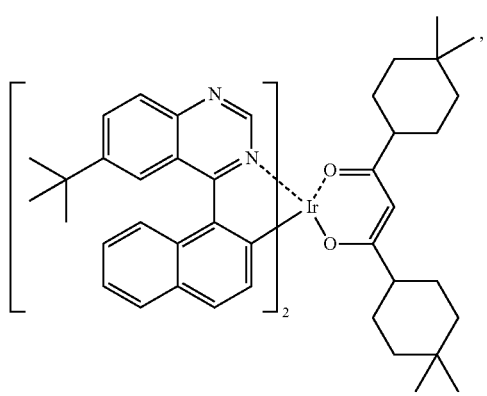
P96
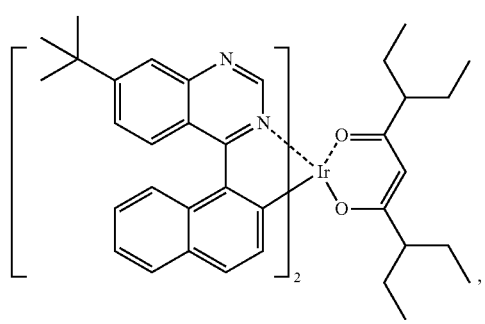
P97
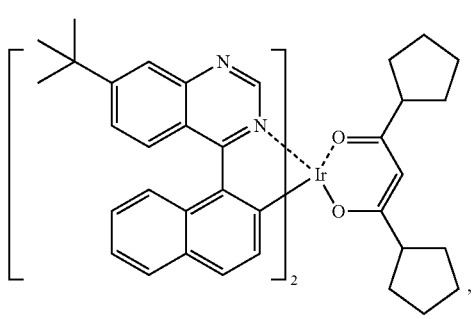
P98
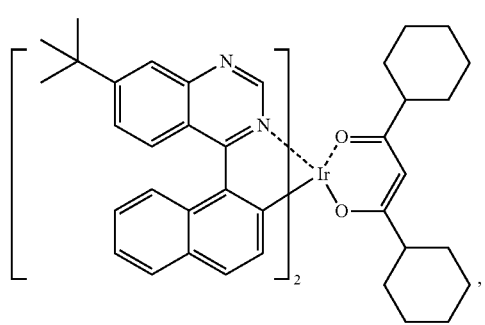
P99

-continued
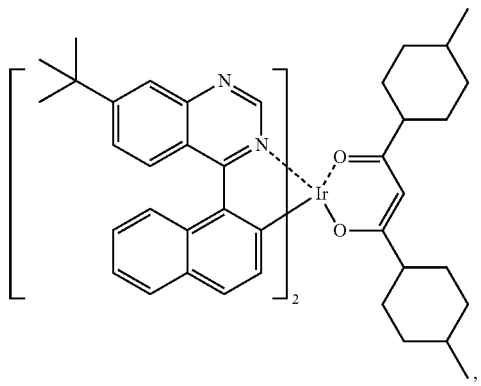
P100
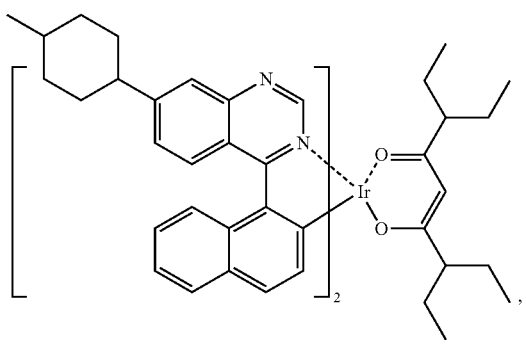
P101
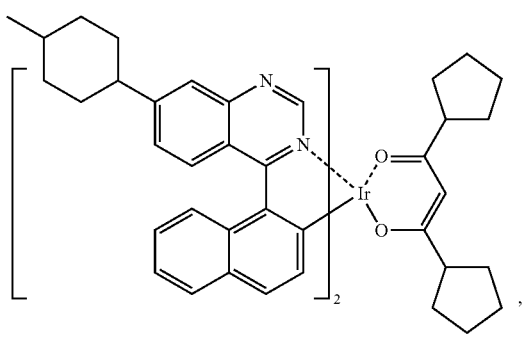
P102
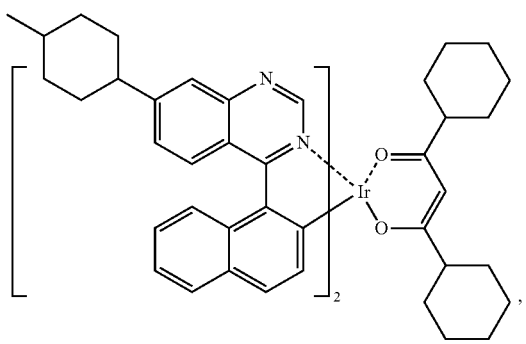
P103

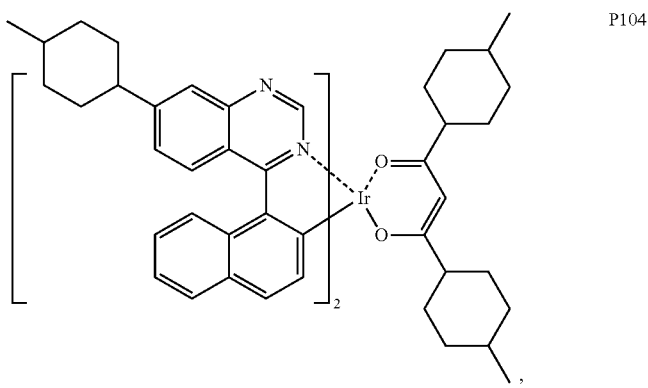
P104
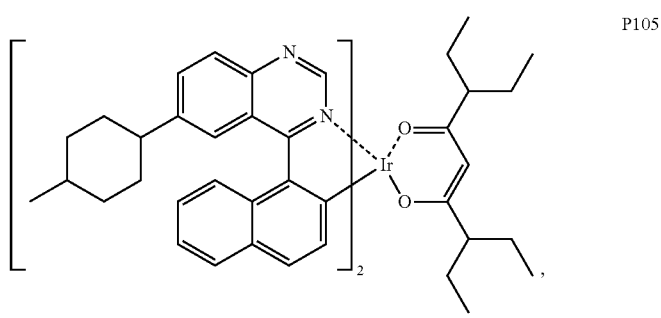
P105
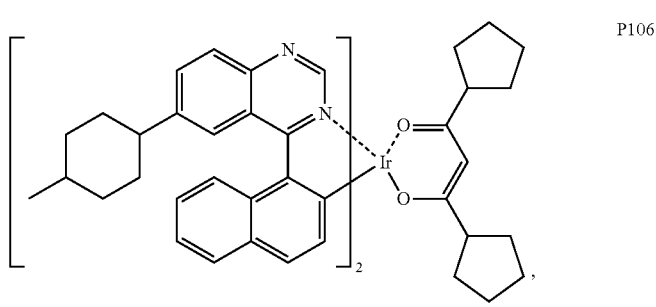
P106
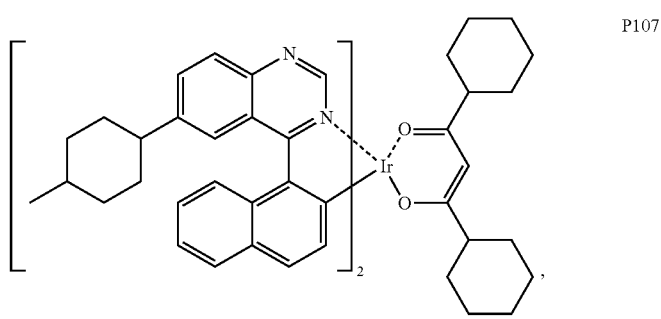
P107

-continued
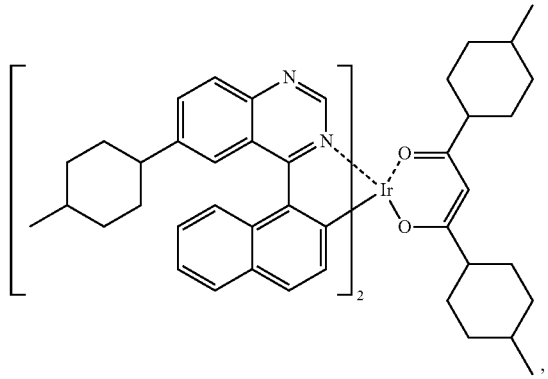
P108
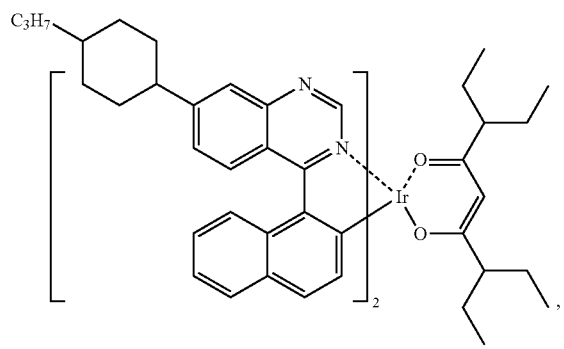
P109
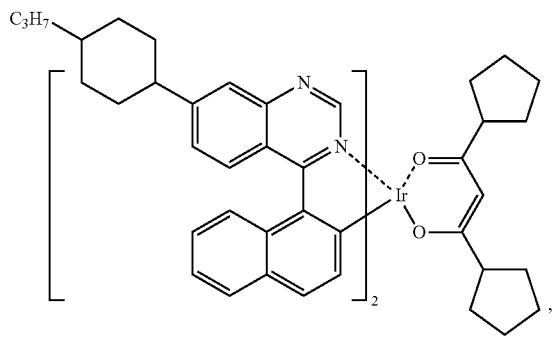
P110
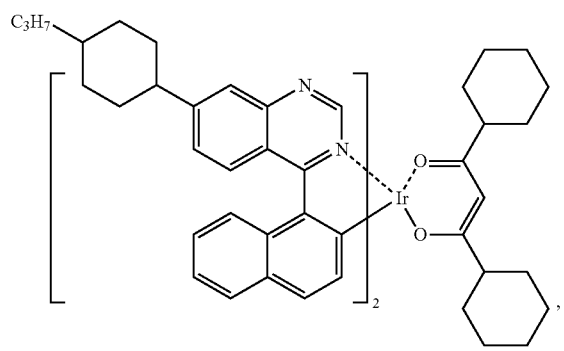
P111

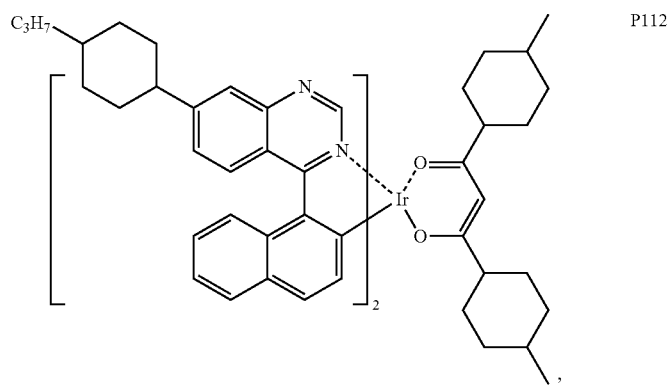
P112
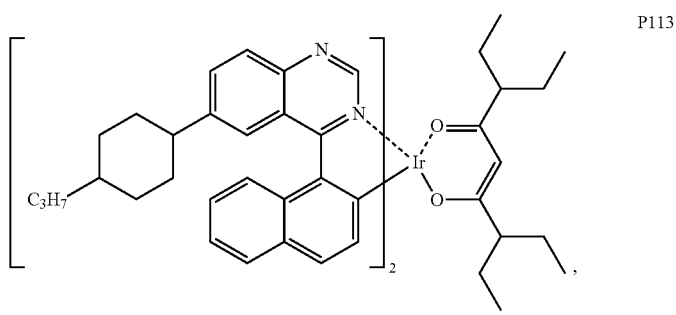
P113
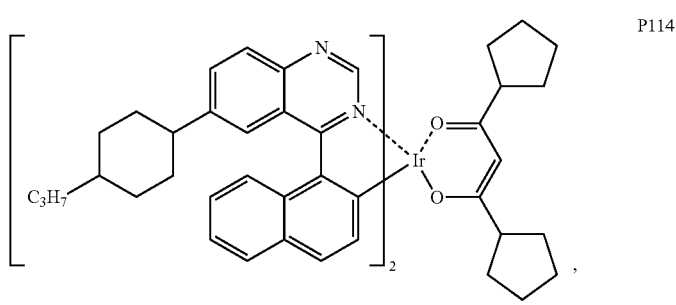
P114
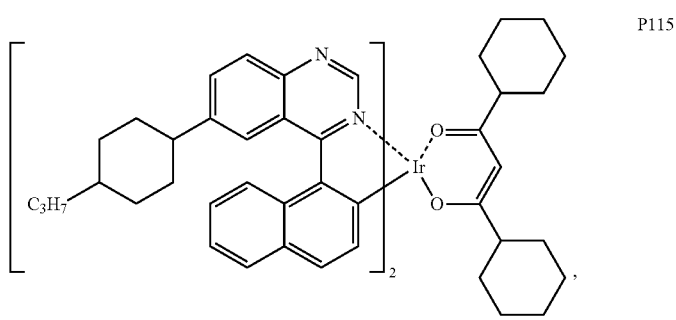
P115

-continued
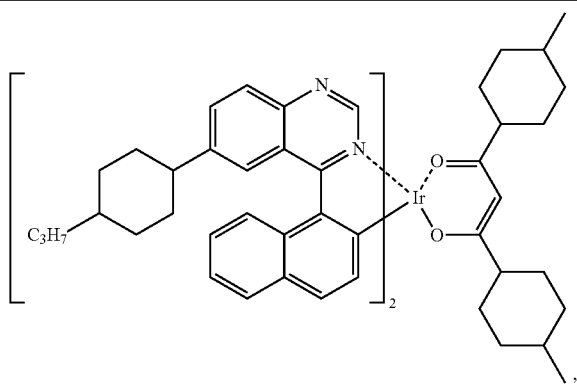
P116
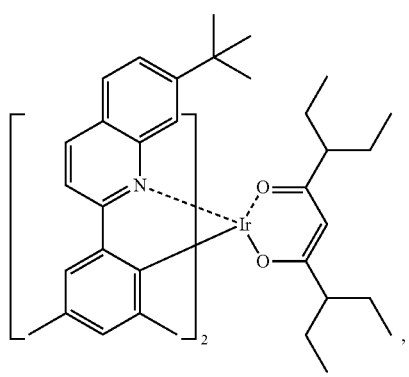
P117
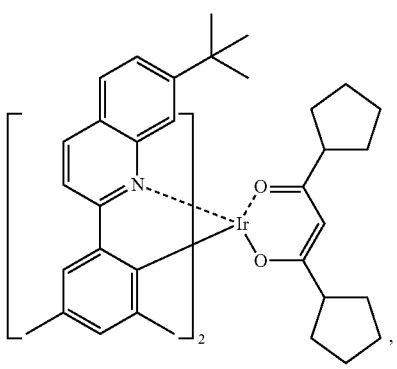
P118
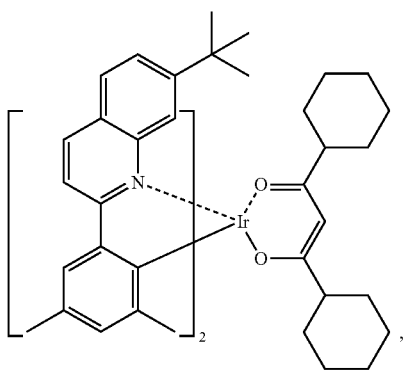
P119

-continued
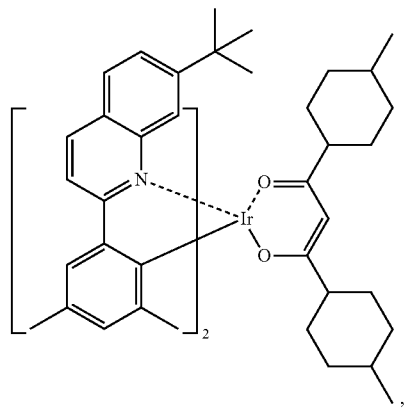
P120
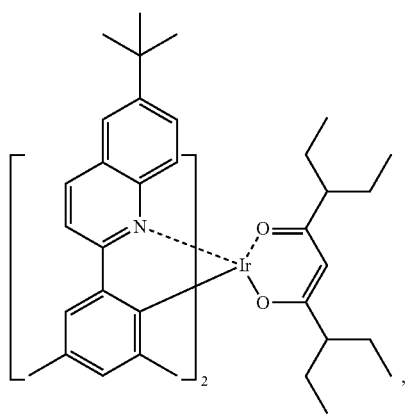
P121
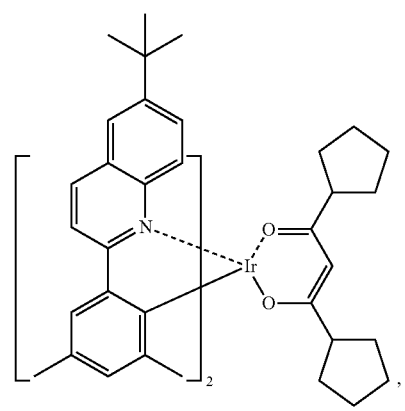
P122
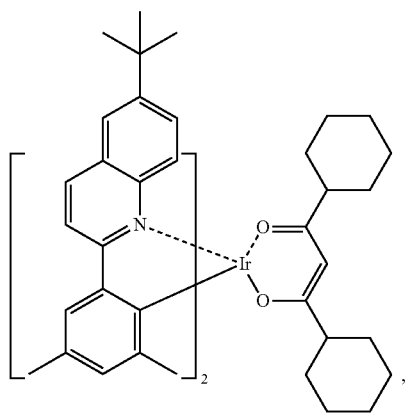
P123

-continued
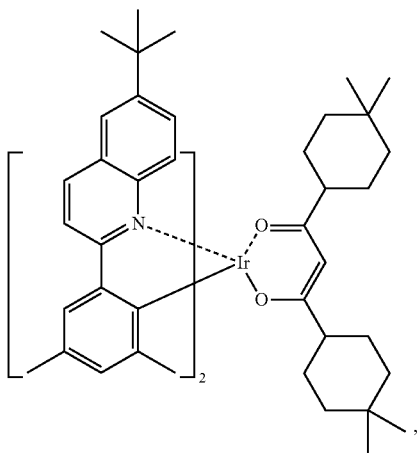
P124
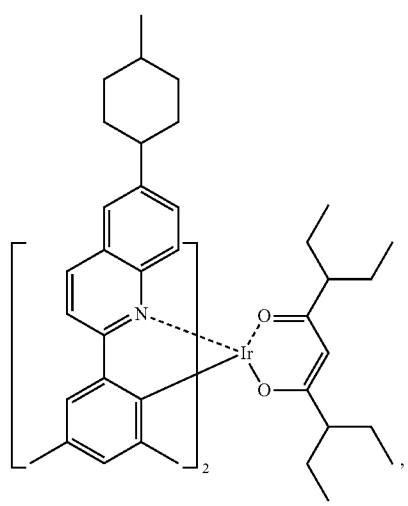
P125
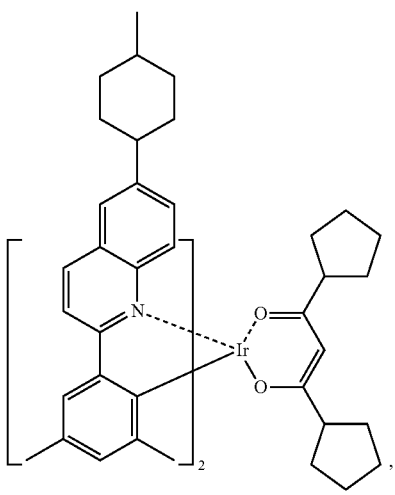
P126

P127
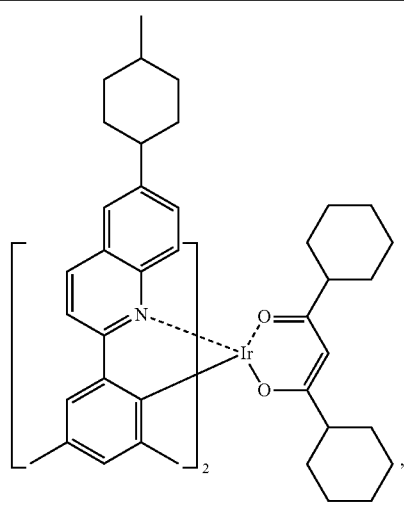
P128
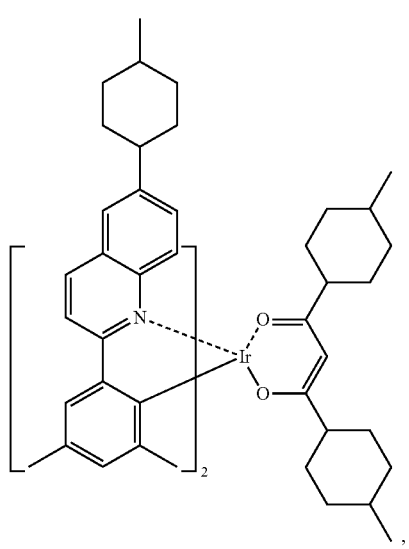
P129
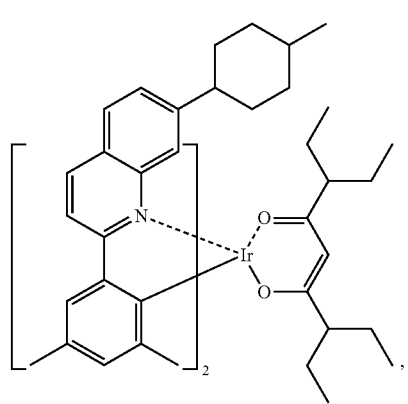

P130
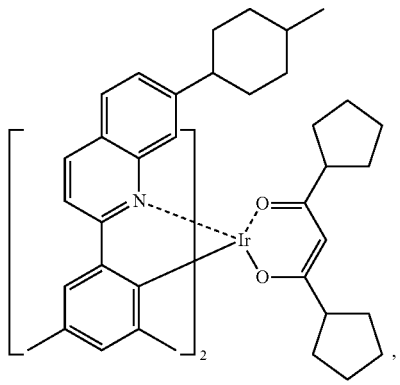
P131
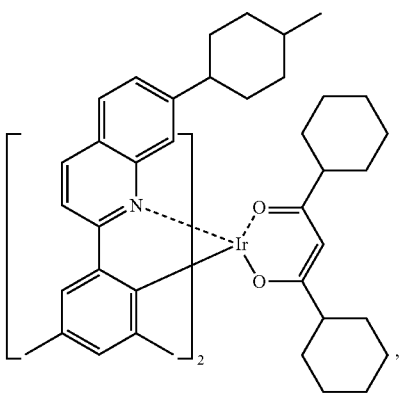
P132
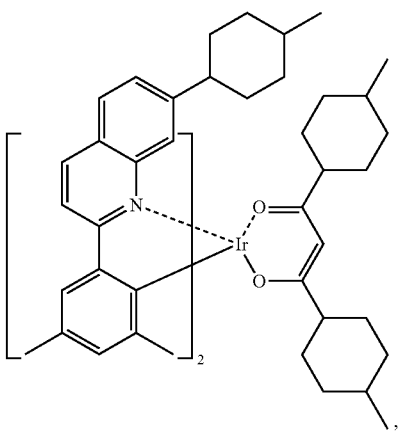
P133
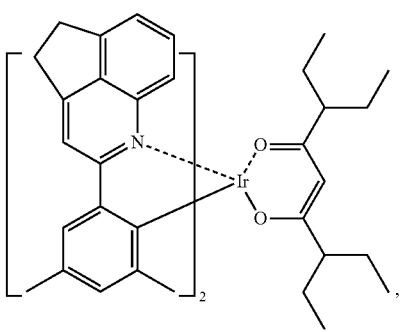

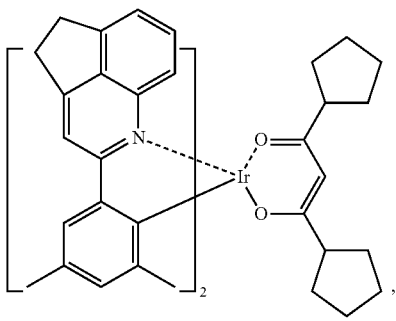
P134
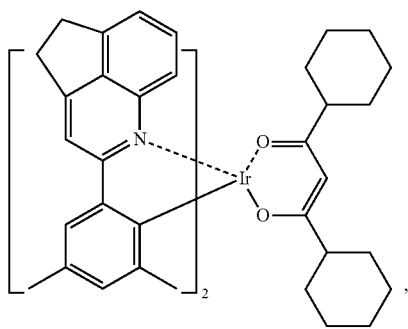
P135
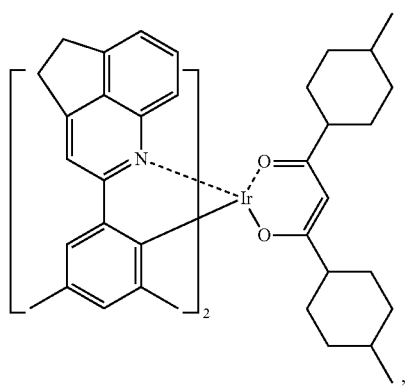
P136
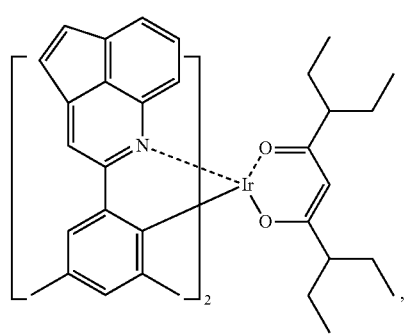
P137

-continued
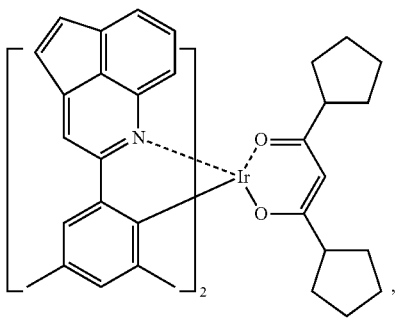
P138
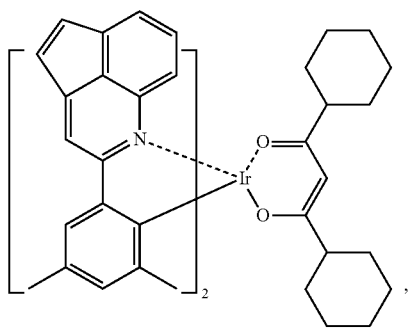
P139
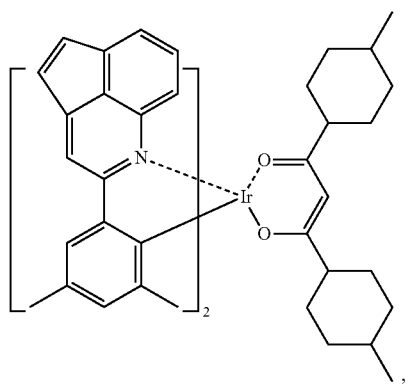
P140
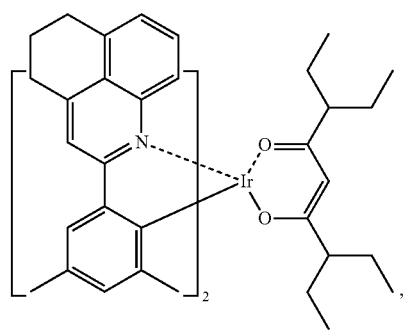
P141

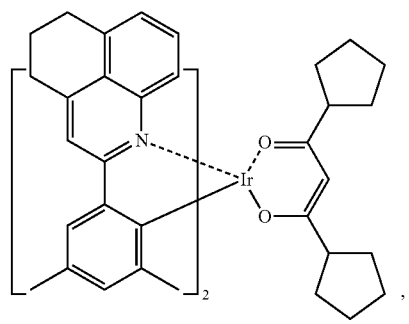
P142
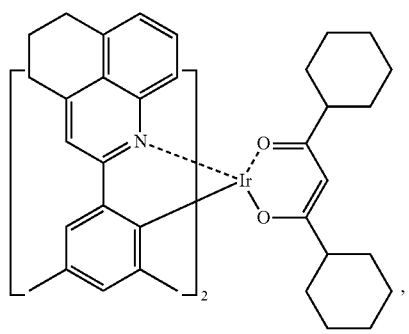
P143
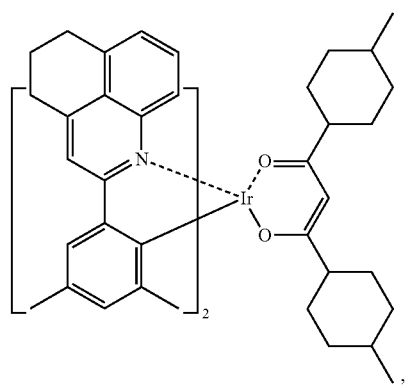
P144
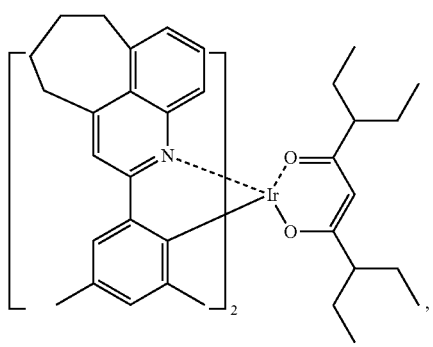
P145

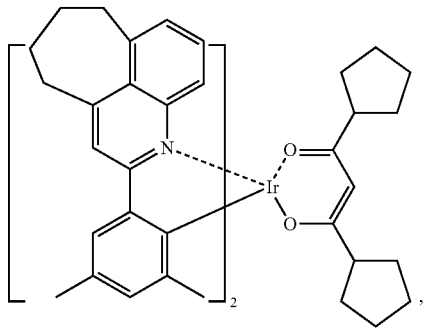
P146
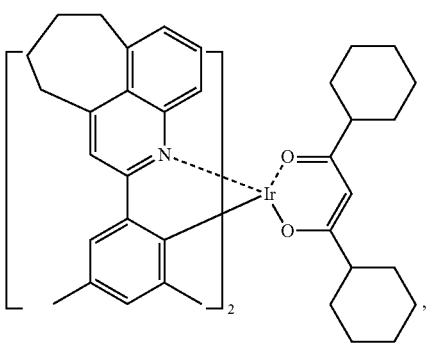
P147
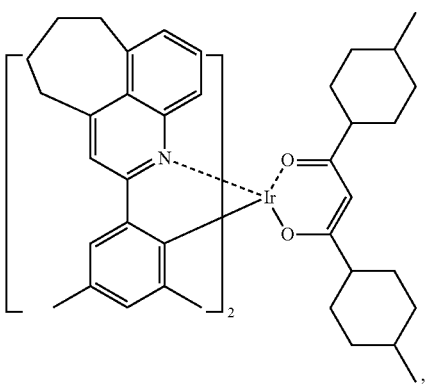
P148
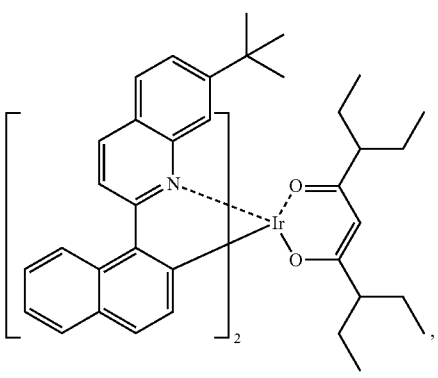
P149

P150
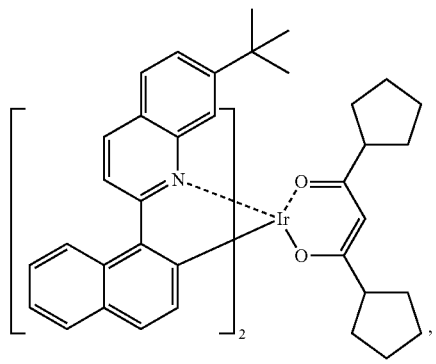
P151
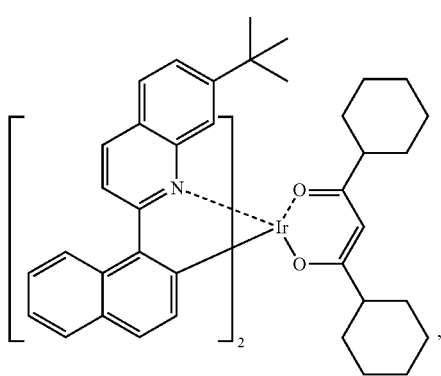
P152
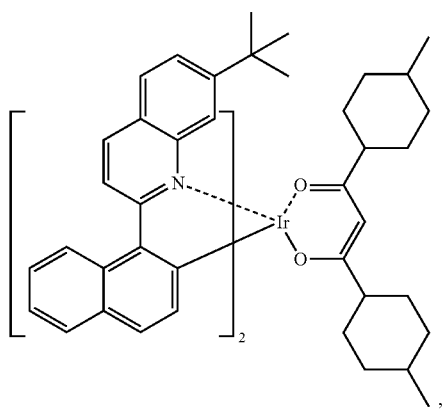
P153
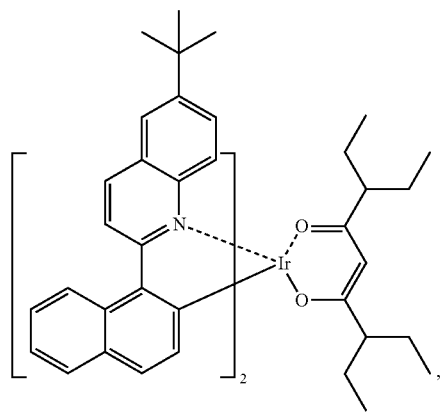

-continued
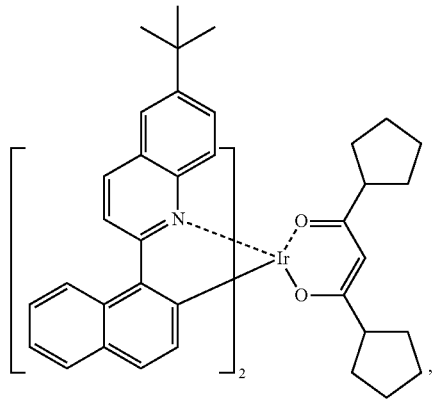
P154
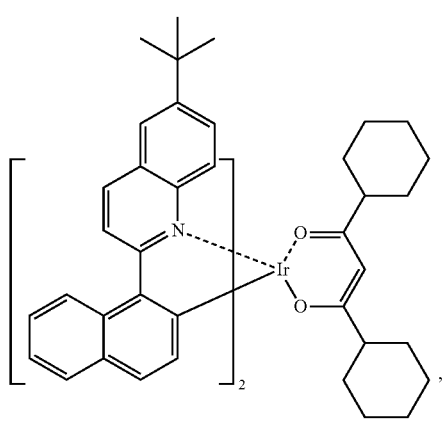
P155
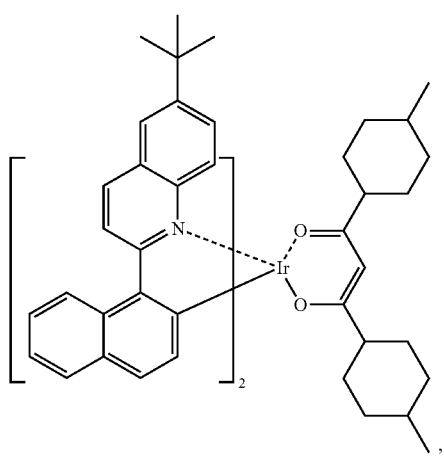
P156

-continued
P157
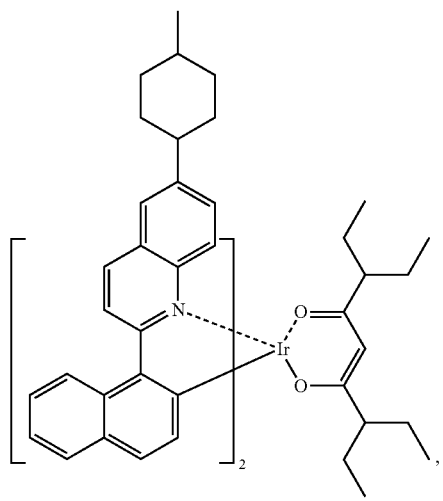
P158
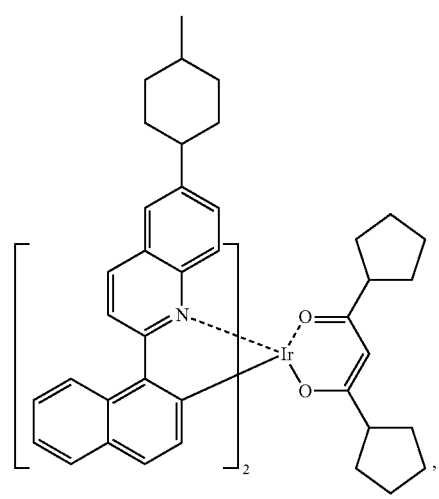
P159
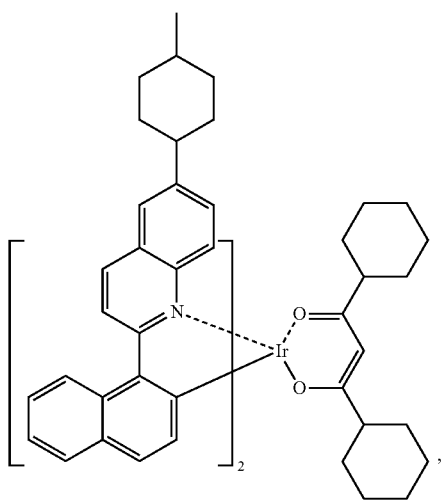

-continued
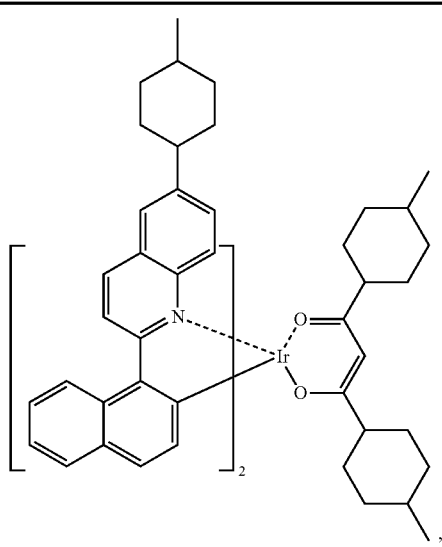
P160
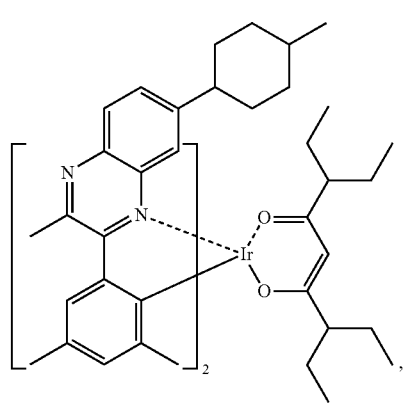
P161
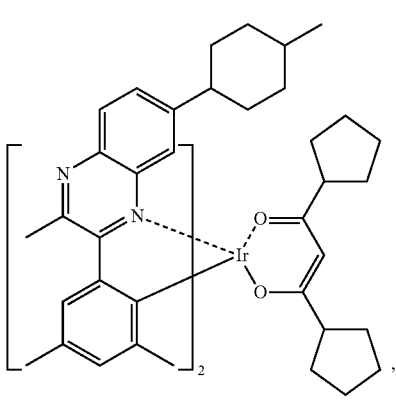
P162

-continued
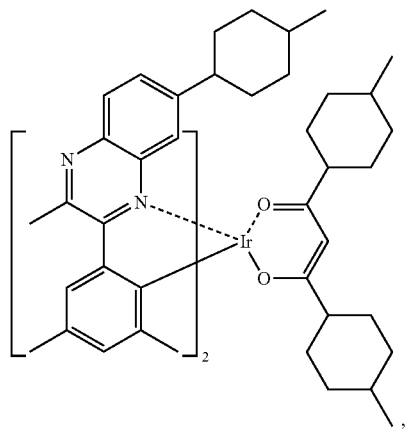
P163
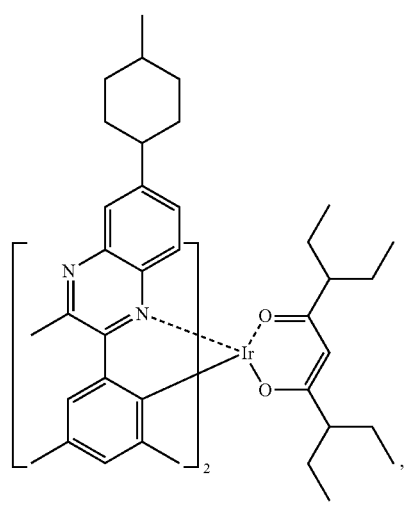
P164
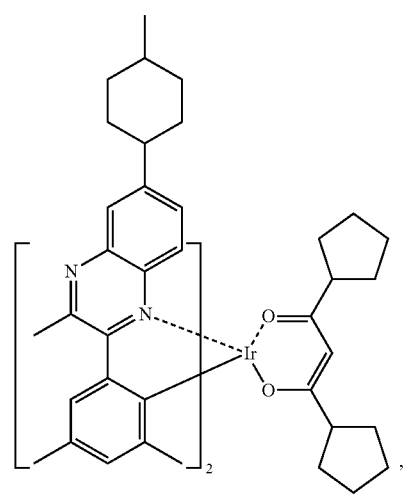
P165

P166
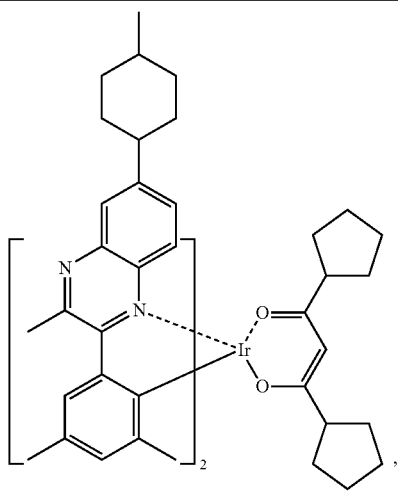
P167
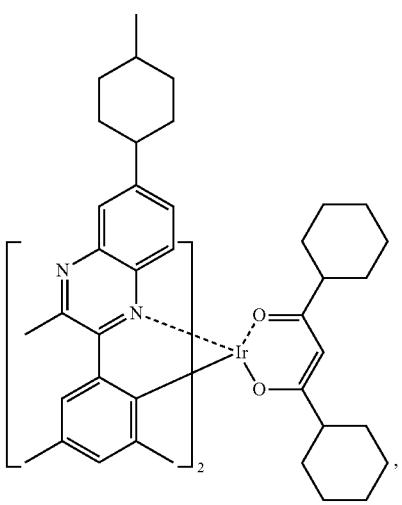
P168
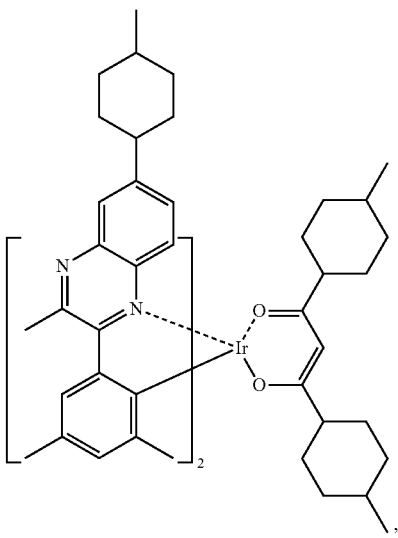

P169
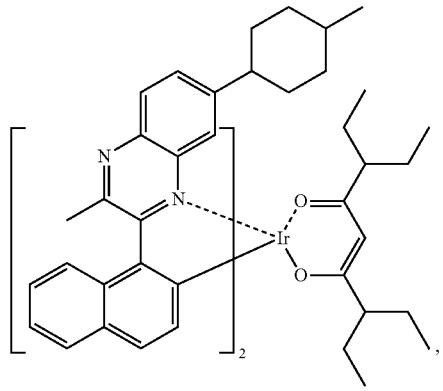
P170
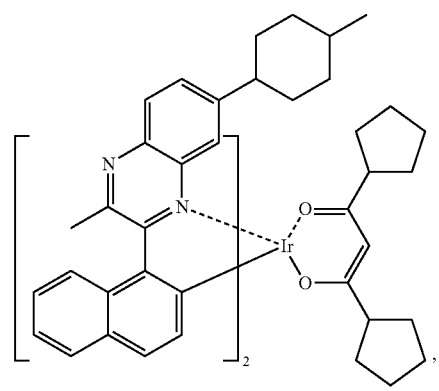
P171
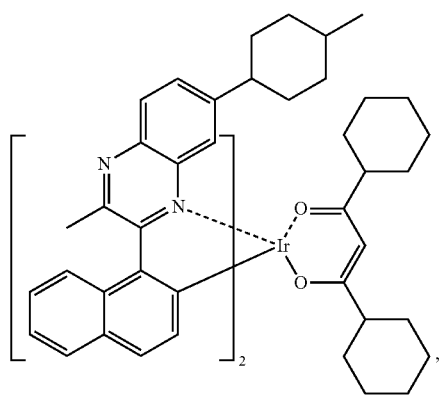
P172
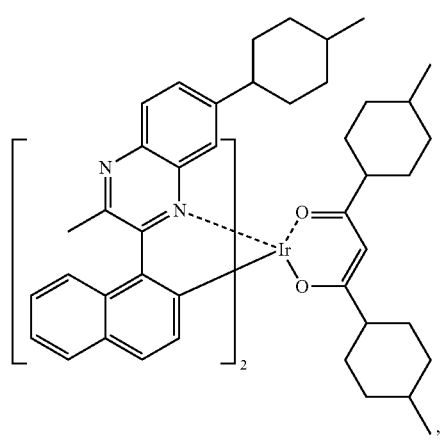

P173
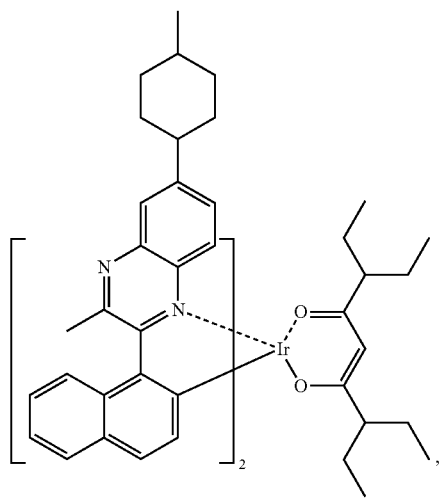
P174
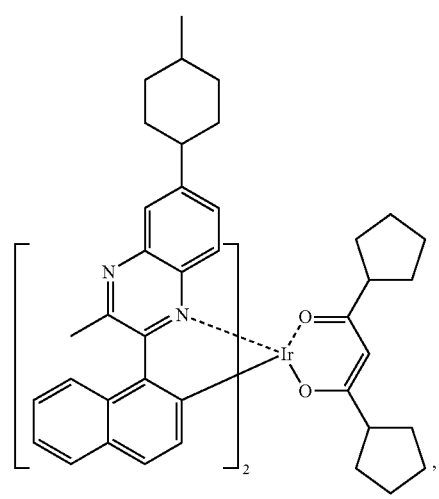
P175
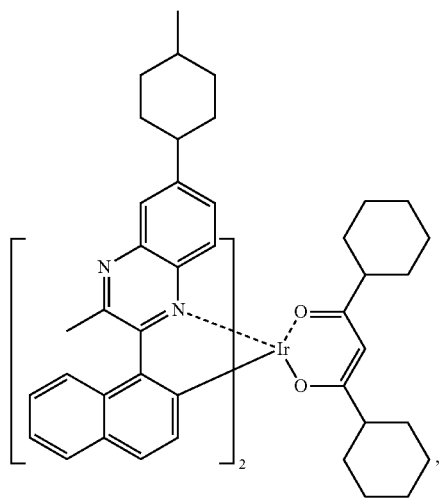

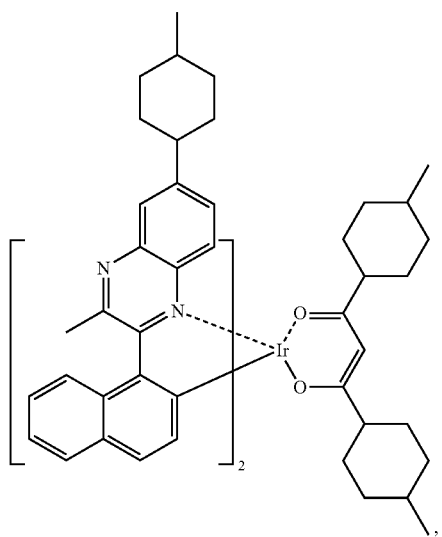
P176
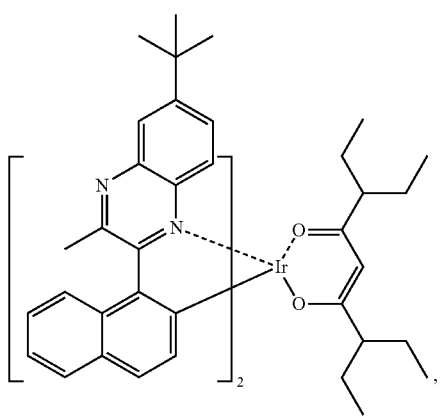
P177
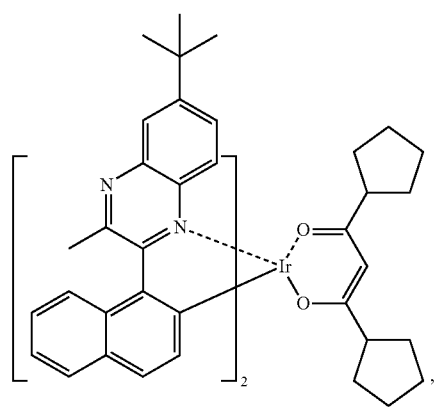
P178

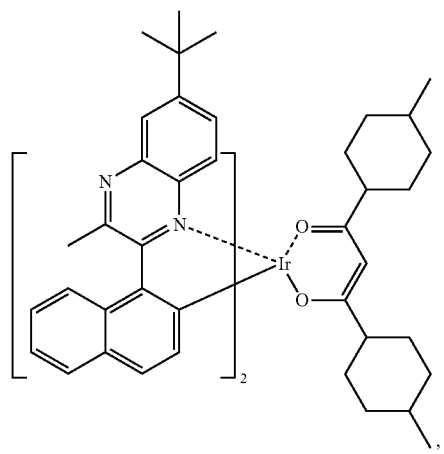
P179
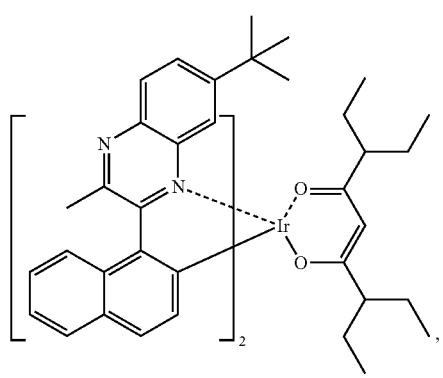
P180
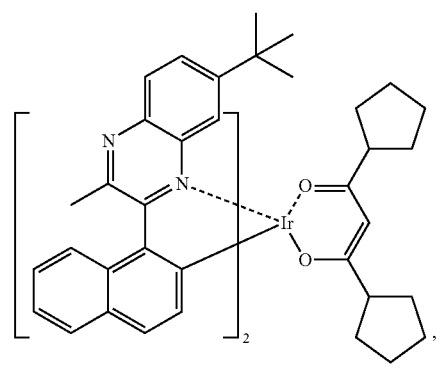
P181
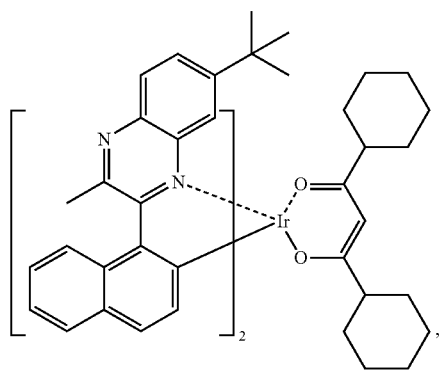
P182

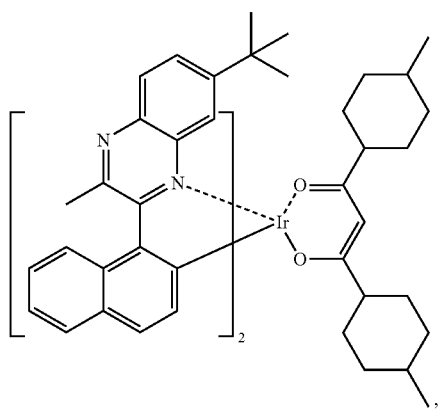
P183
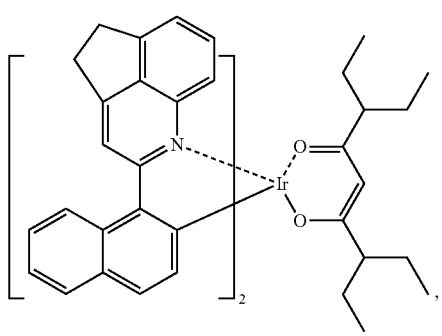
P184
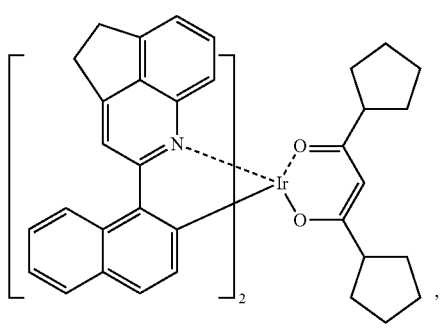
P185
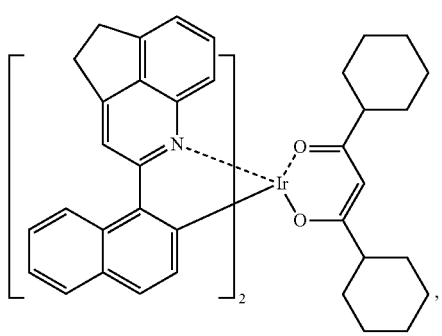
P186

-continued
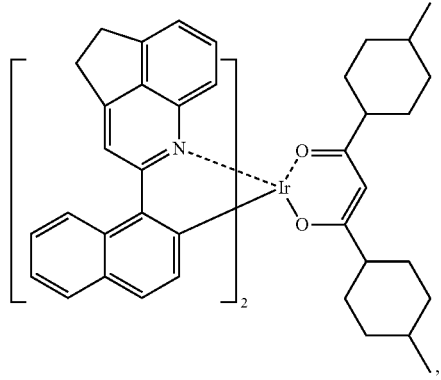
P187
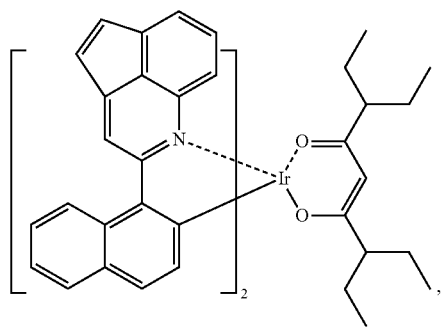
P188
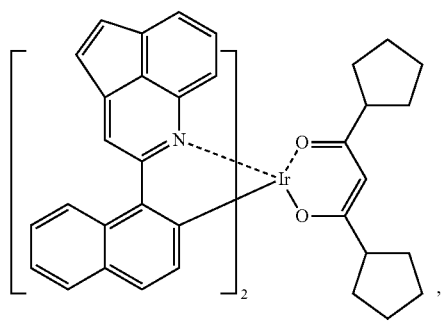
P189
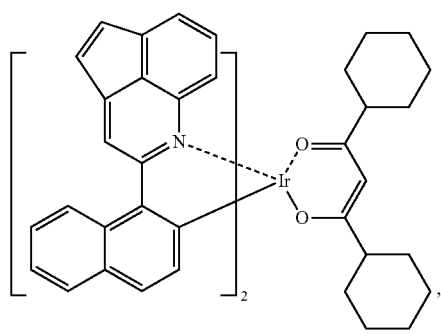
P190

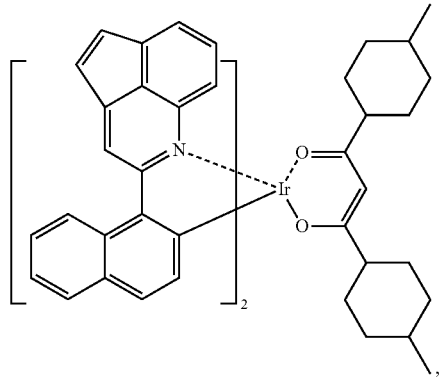
P191
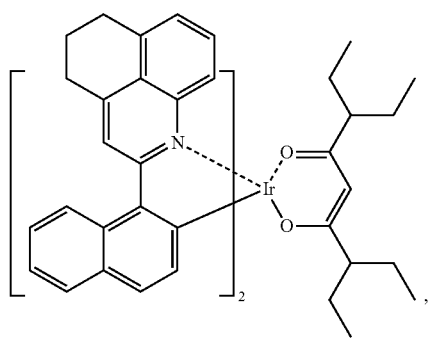
P192
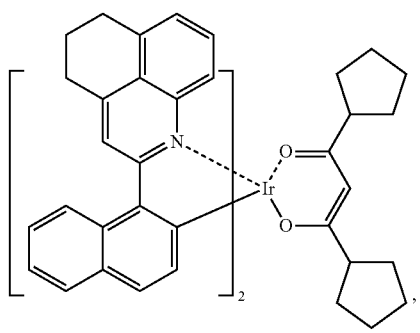
P193
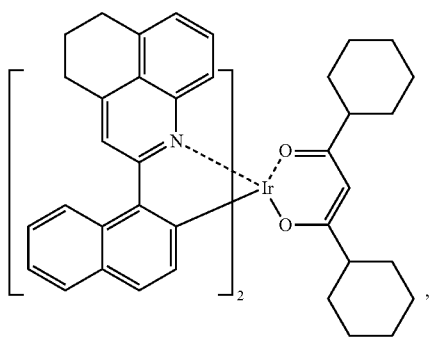
P194

-continued
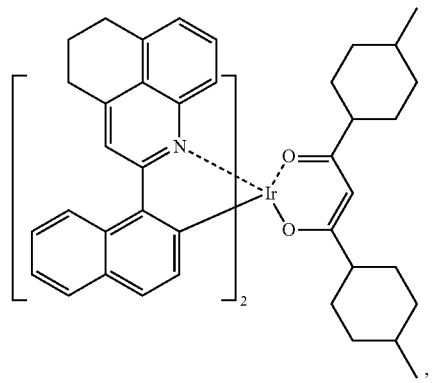
P195
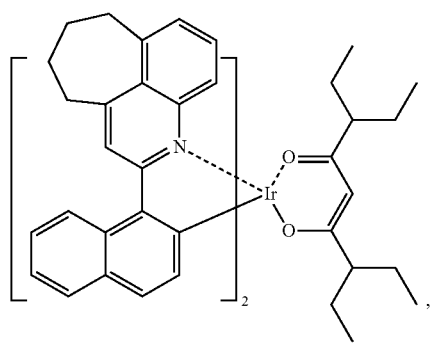
P196
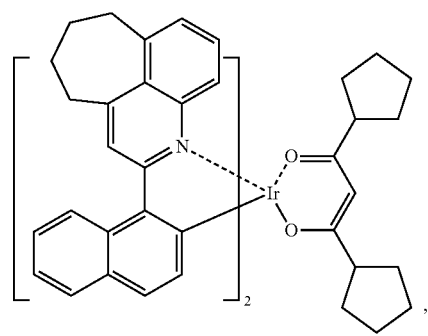
P197
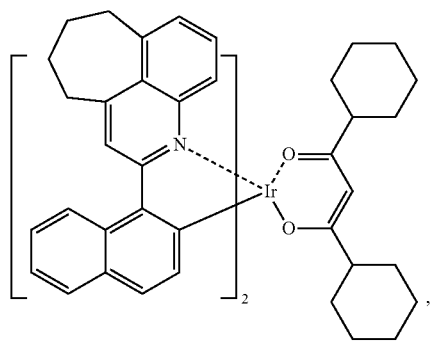
P198

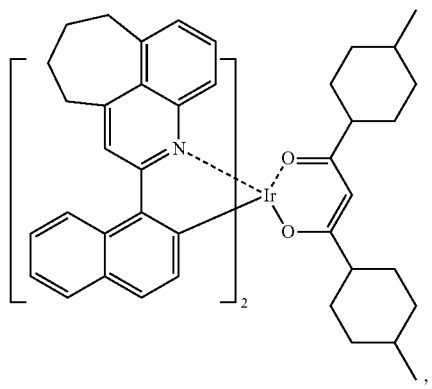
P199
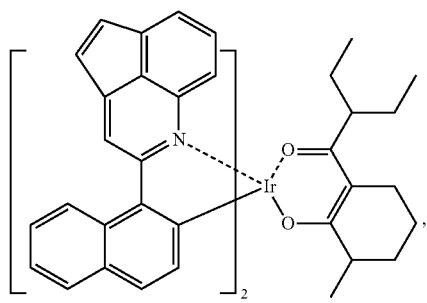
P200
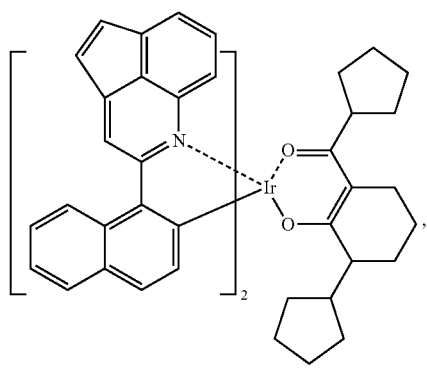
P201
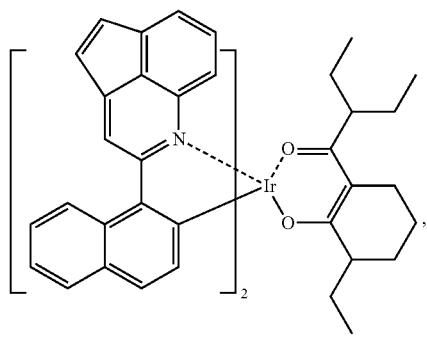
P202

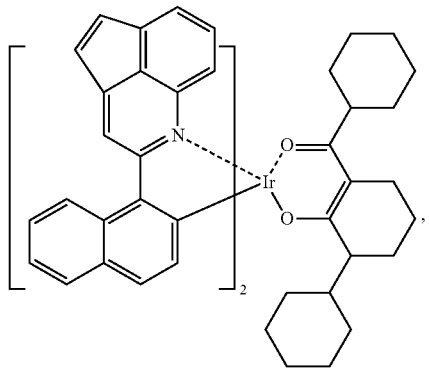
P203
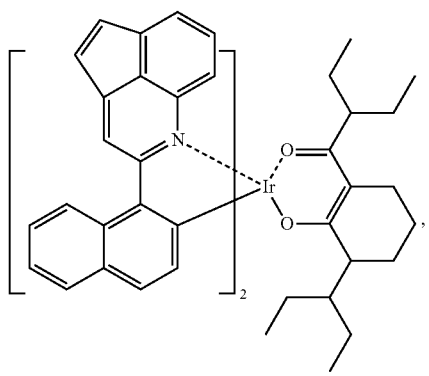
P204
[Organic compound A with 3.0 eV>$E_T$≥2.0 eV]
Embodiments of the organic compound A with 3.0 eV>$E_T$≥2.0 eV according to the present invention are described below.
In the present invention, it is preferable that the organic compound A with 3.0 eV>$E_T$≥2.0 eV contains at least one from the group consisting of groups of formulas X-1 to X-13.
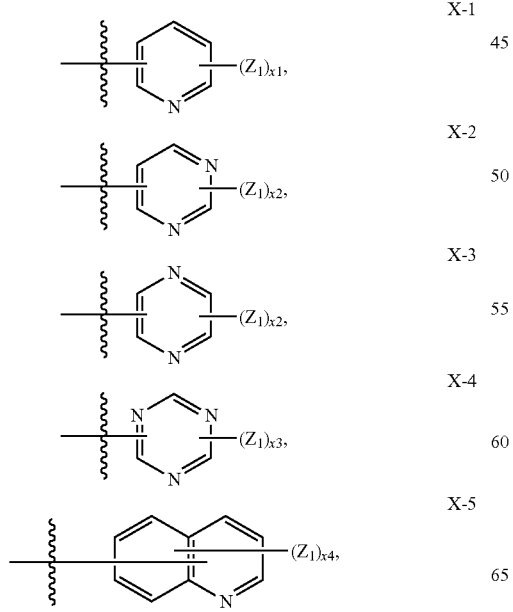
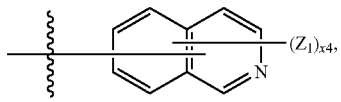
X-6
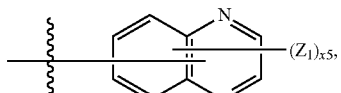
X-7
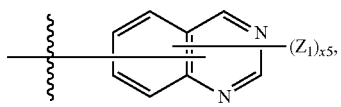
X-8
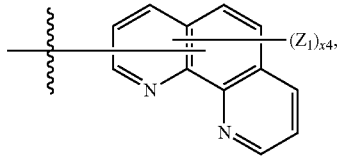
X-9
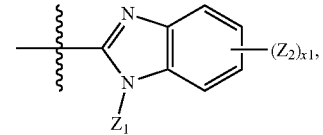
X-10

-continued

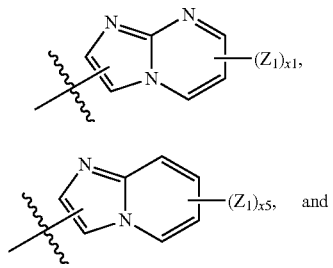
X-11

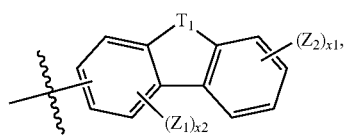
X-12, and

X-13

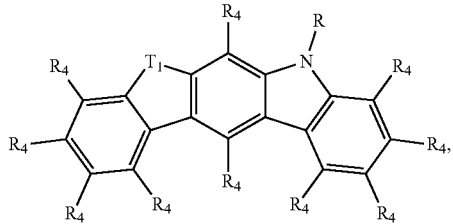
X-14

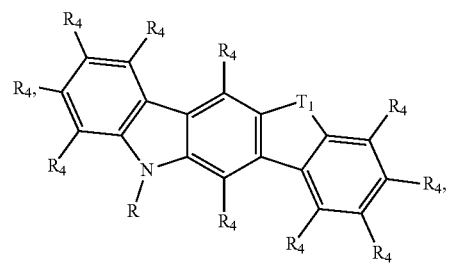
X-15

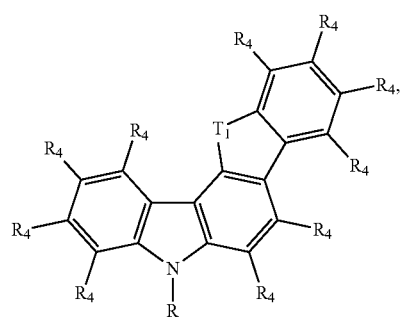
X-16

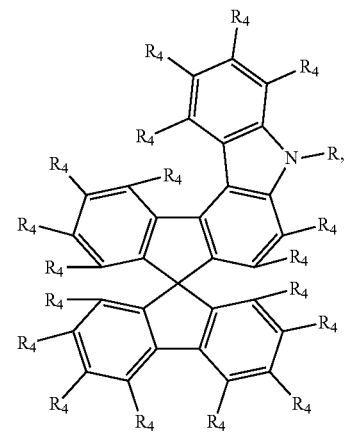
X-17 wherein $Z_1$ and $Z_2$ each independently represent one selected from the group consisting of deuterium, a halogen atom, a hydroxy group, a nitrile group, a nitro group, an amino group, an amidine group, a hydrazine group, a hydrazone group, a carboxy group, a carboxylate group, a sulfonic acid group, a sulfonate group, a phosphoric acid group, a phosphate group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_6$-$C_{60}$ aryl group, a $C_6$-$C_{60}$ fused ring aryl group, a $C_6$-$C_{60}$ aryloxy group, a $C_6$-$C_{60}$ arylsulfide group, and a $C_2$-$C_{60}$ heterocyclic aryl group;

x1 represents an integer of 1-4, x2 represents an integer of 1-3, x3 represents 1 or 2, x4 represents an integer of 1-6, and x5 represents an integer of 1-5;

$T_1$ is selected from —B(R')—, —N(R')—, —P(R')—, —O—, —S—, —Se—, —S(=O)—, —S(O$_2$)—, —C(R'R")—, —Si(R'R")— or —Ge(R'R")—, wherein R' and R" are each independently selected from the group consisting of a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_6$-$C_{60}$ aryl group, a $C_1$-$C_{10}$ alkyl-containing $C_6$-$C_{60}$ aryl group, a $C_1$-$C_{10}$ alkyl-containing $C_6$-$C_{60}$ aryloxy group, and a $C_1$-$C_{10}$ alkyl-containing $C_6$-$C_{60}$ arylthio group; and R' and R" are optionally fused or joined to form a ring; and represents the connection of a substituent to the main structure.

In a preferred embodiment of the present invention, the organic compound A with 3.0 eV>$E_T$≥2.0 eV contains a group formed by bonding at least one group selected from the group consisting of the groups represented by formulas X-1 to X-13 to an indenocarbazolyl group, an indolocarbazolyl group or a carbazolyl group directly or via a bridging group, wherein the indenocarbazolyl group or indolocarbazolyl group or carbazolyl group is optionally substituted with one or more $Ar_1$ groups, with the $Ar_1$ having the meaning as defined above;

the indenocarbazolyl group, indolocarbazolyl group or carbazolyl group is preferably selected from the group consisting of the following structures represented by formulas X-14 to X-21:

X-18
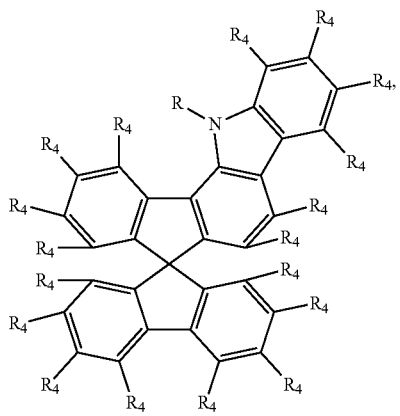

X-19
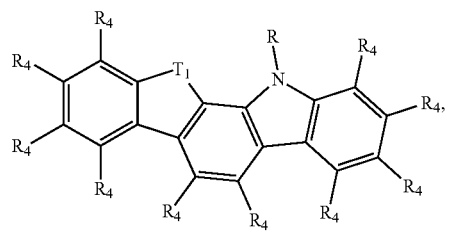

X-20
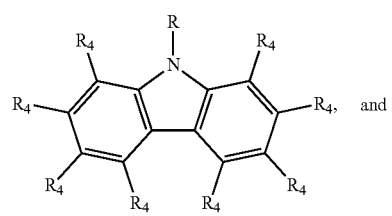, and

X-21
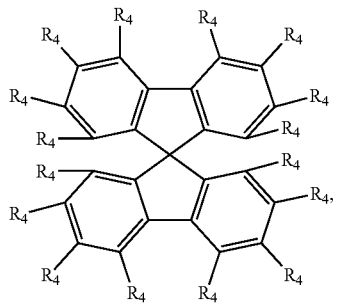

wherein each $R_4$ is independently selected from the group consisting of a hydrogen atom, a deuterium atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group. R represents a bridge bond or bridging group connected to X-1 to X-13, and the bridge bond or bridging group is connected to the X-1 to X-13; and $T_1$ has the same meaning as that given above.

Examples of the organic compound A with 3.0 eV>$E_T$≥2.0 eV include the following compounds represented by P205 to P380.

P205
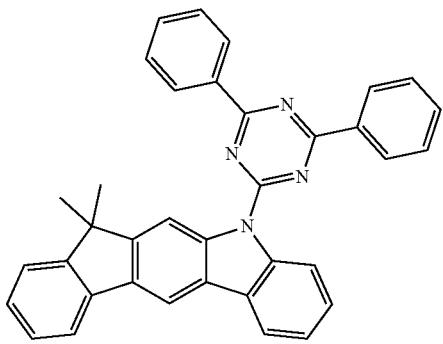

P206
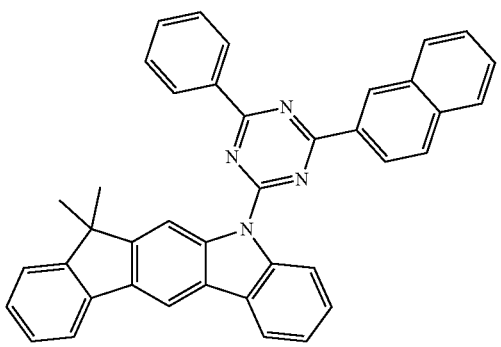

P207
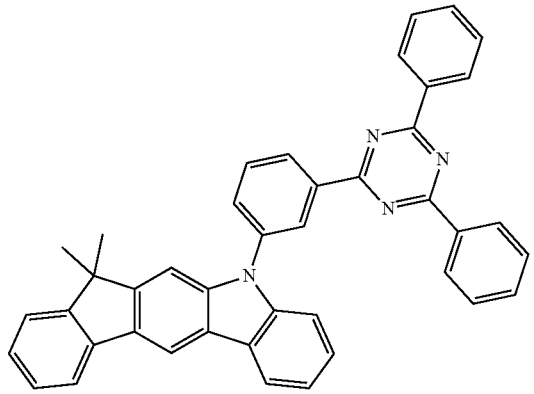

P208
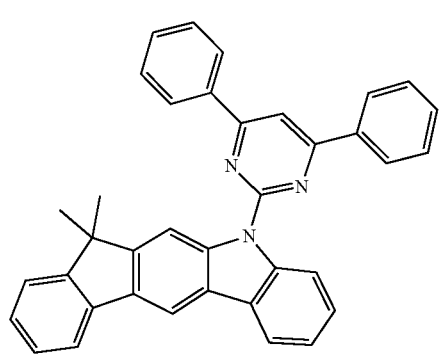

P209
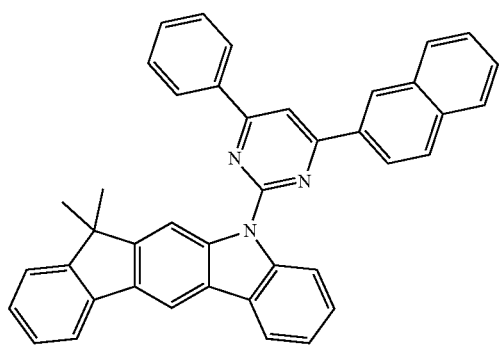
P213
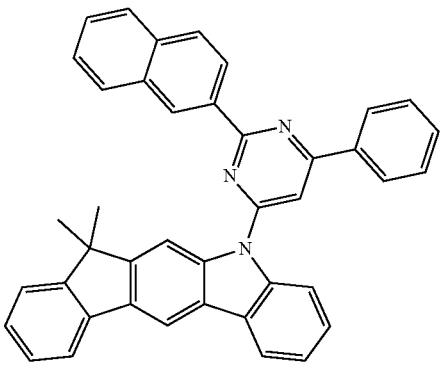
P210
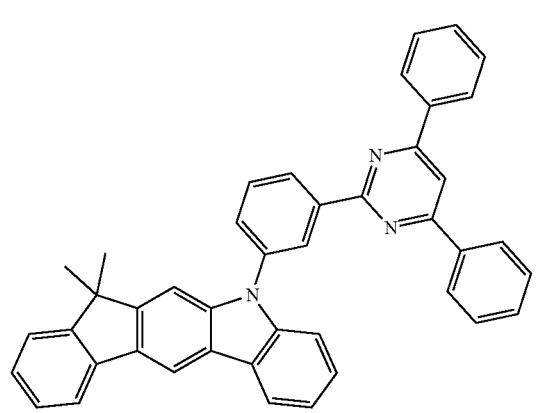
P214
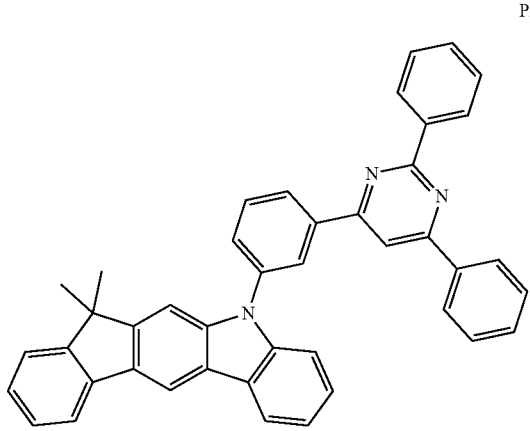
P211
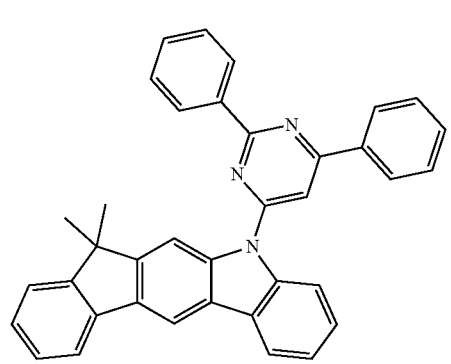
P215
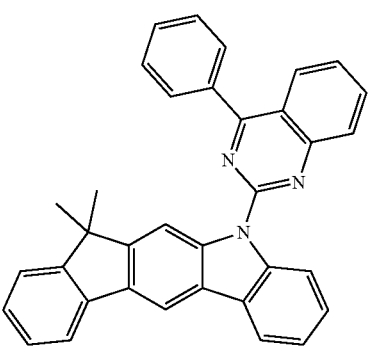
P212
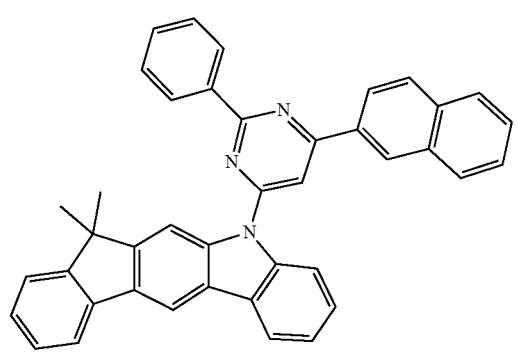
P216
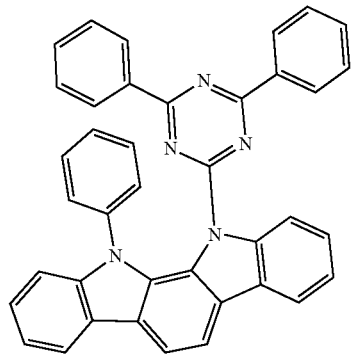

P217
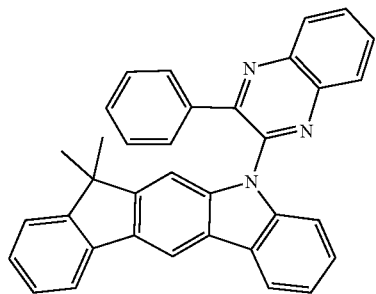
P218
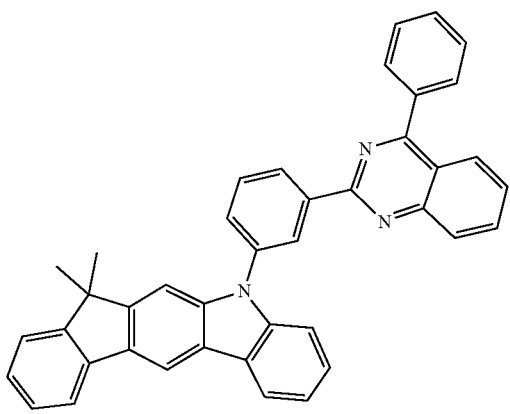
P219
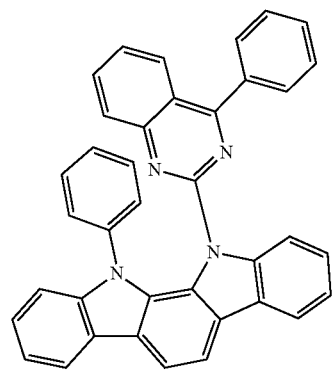
P220
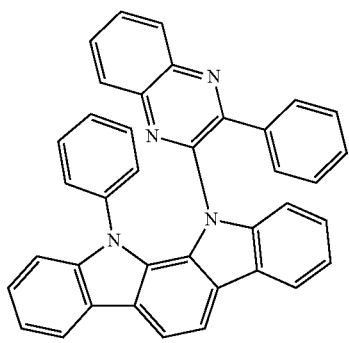
P221
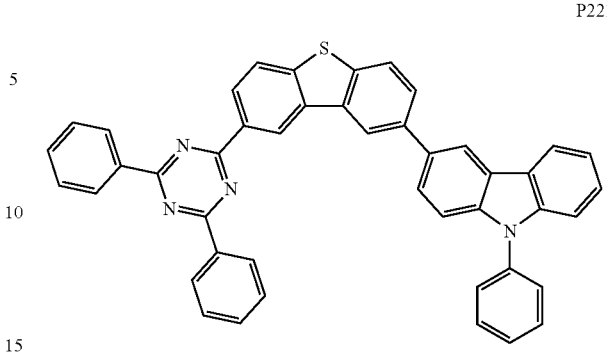
P222
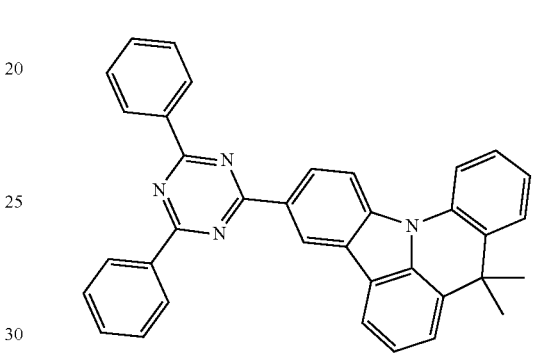
P223
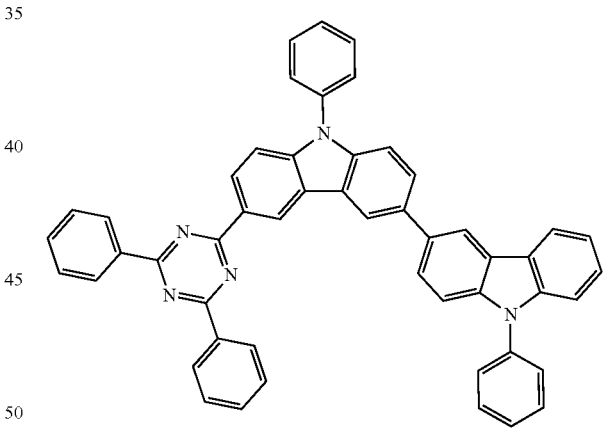
P224
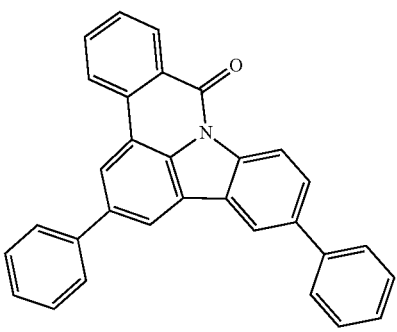

P225
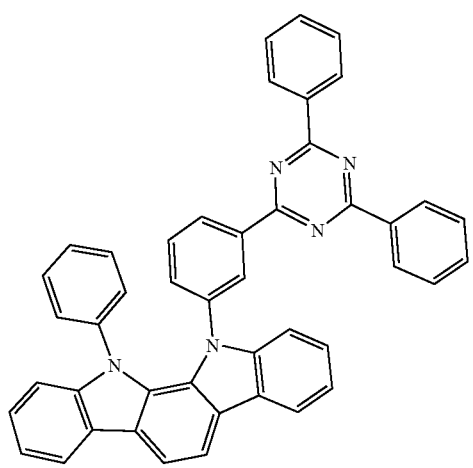
P226
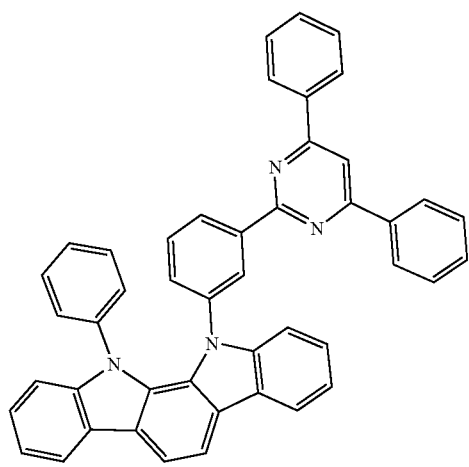
P227
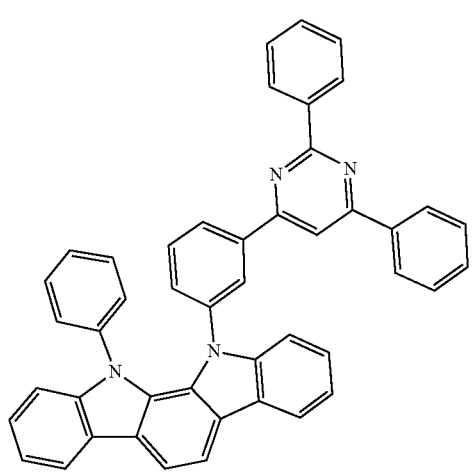
P228
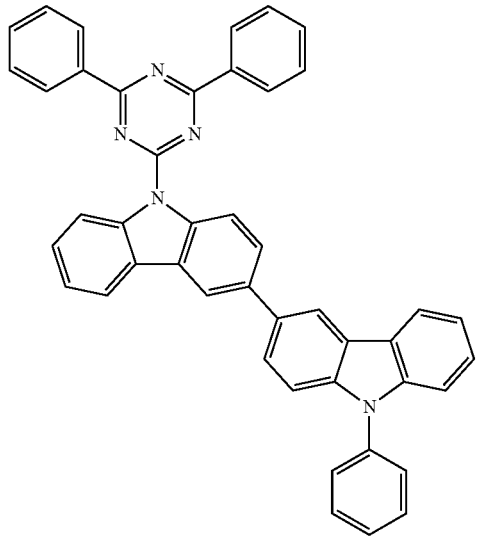
P229
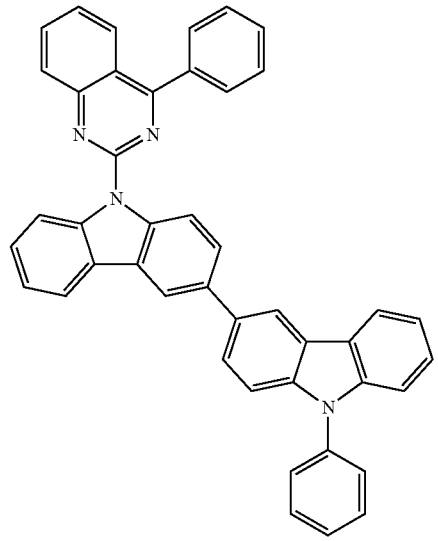

P230
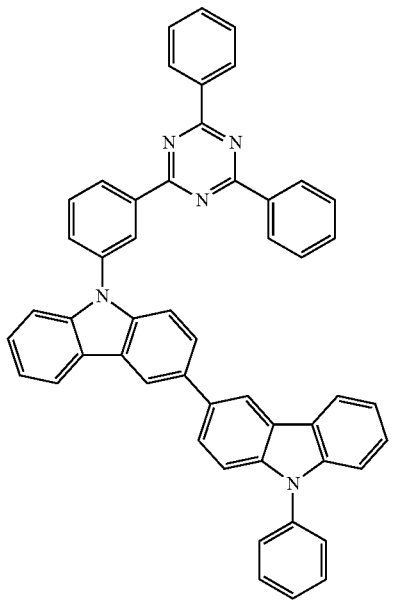
P231
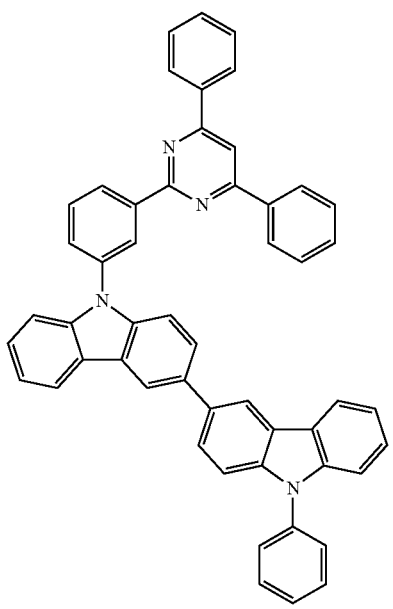
P232
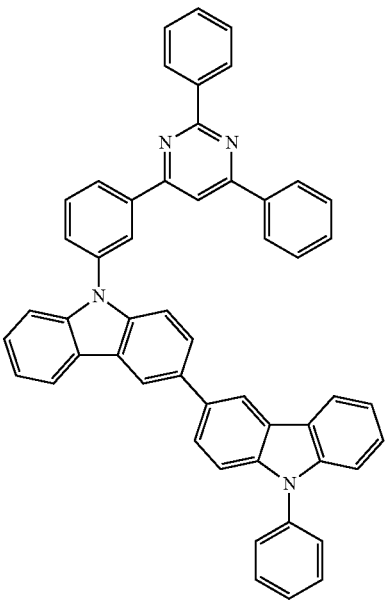
P233
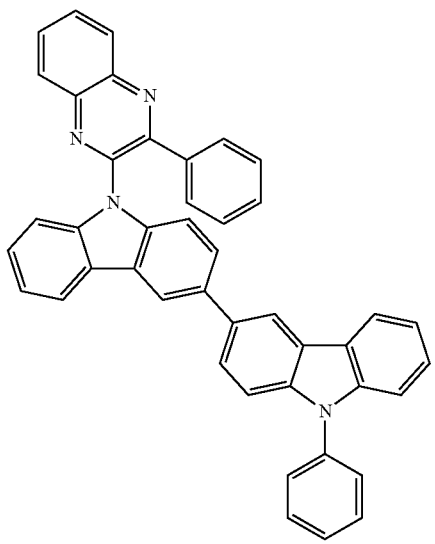

P234 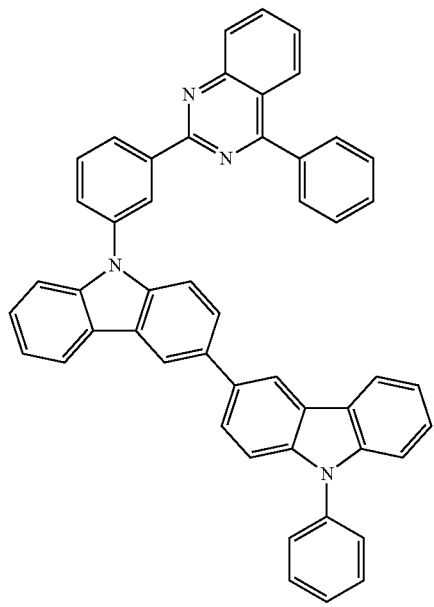
P235 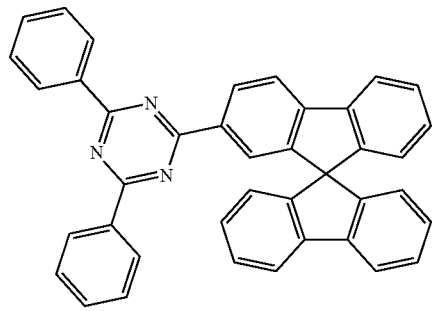
P236 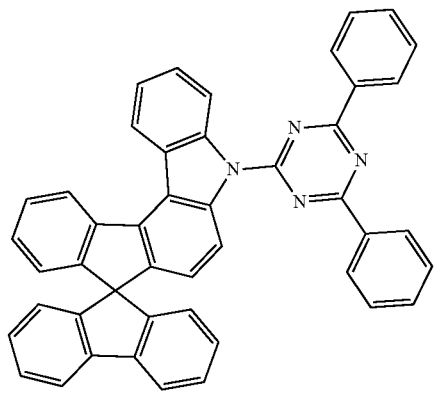
P237 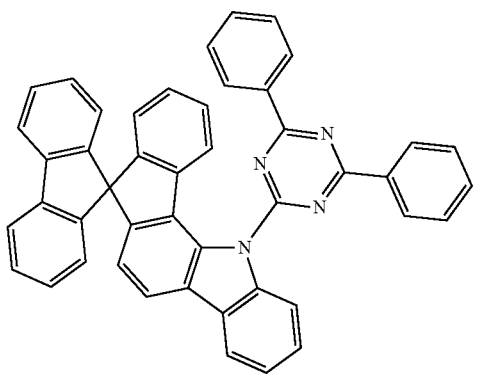
P238 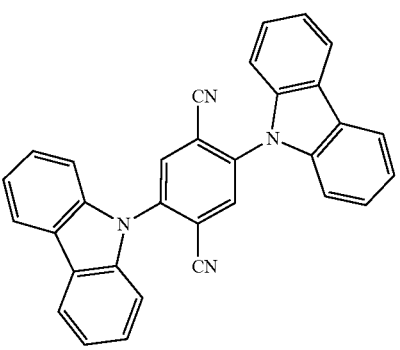
P239 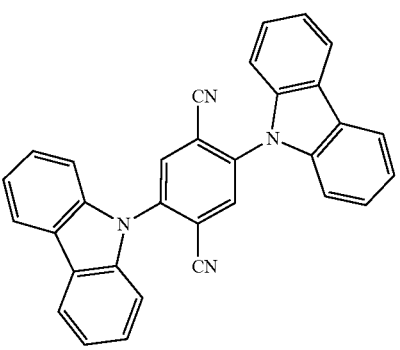
P240 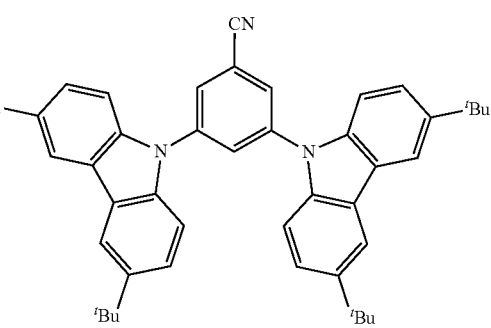
P241 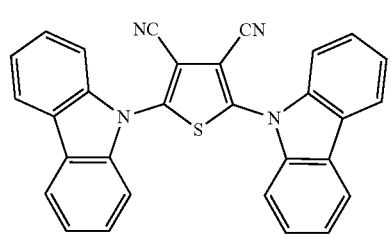

P242
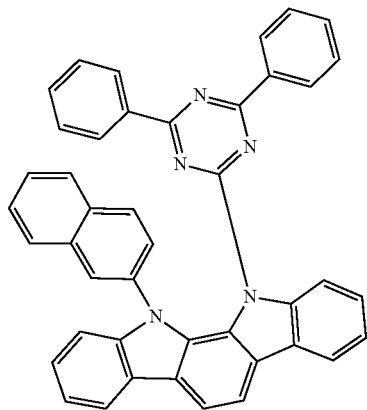
P243
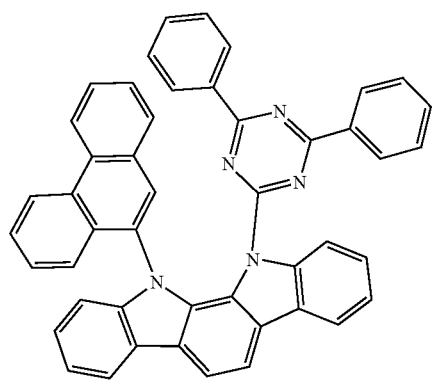
P244
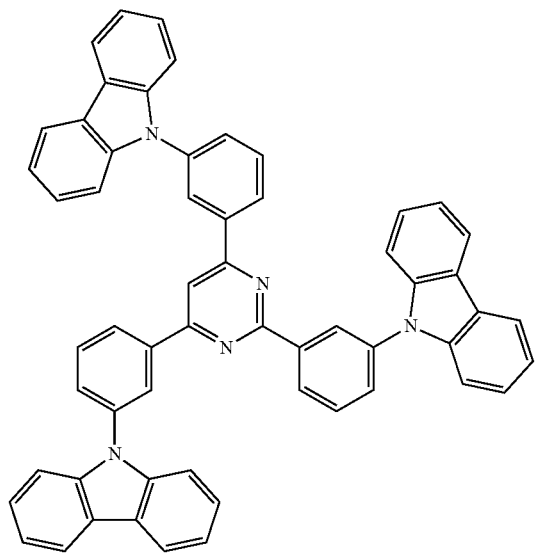
P245
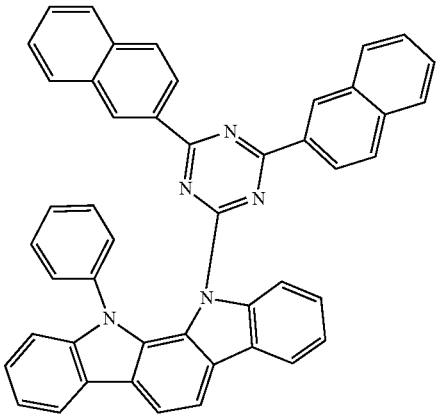
P246
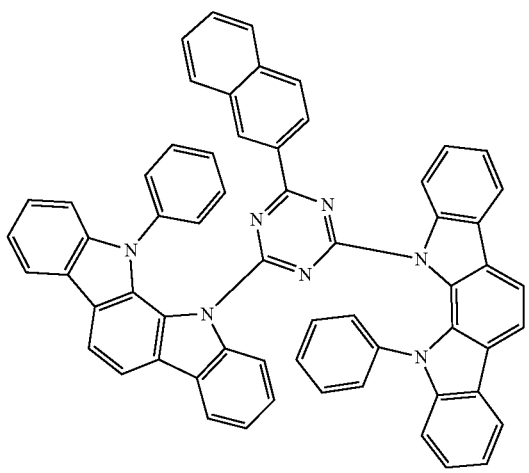
P247
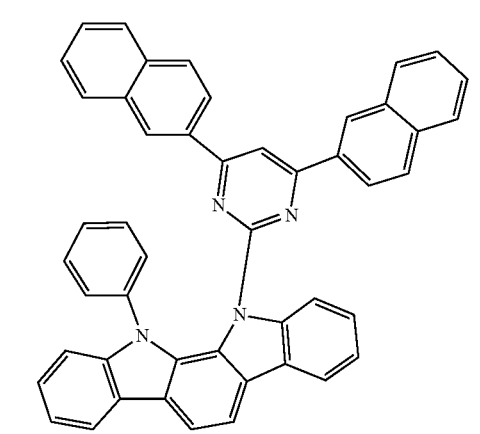
P248
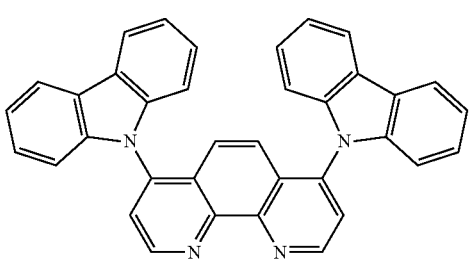

-continued
P249
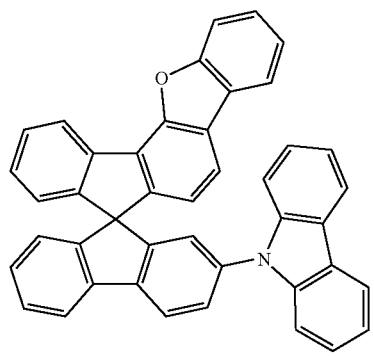
P250
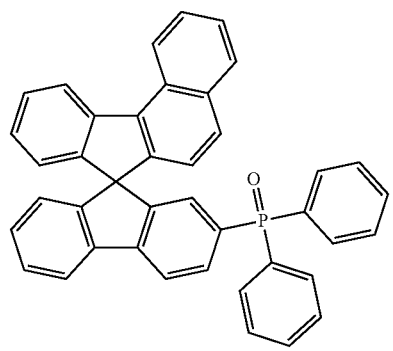
P251
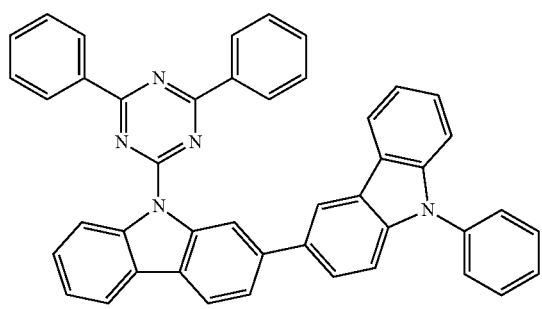
P252
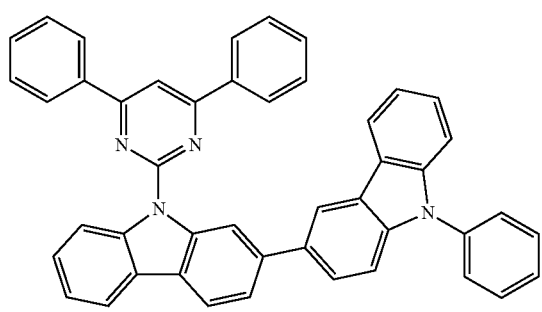
-continued
P253
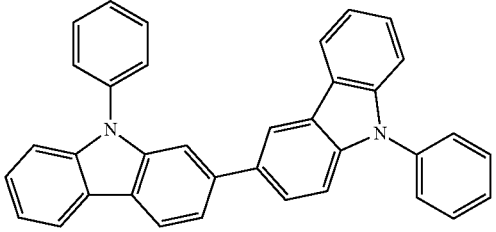
P254
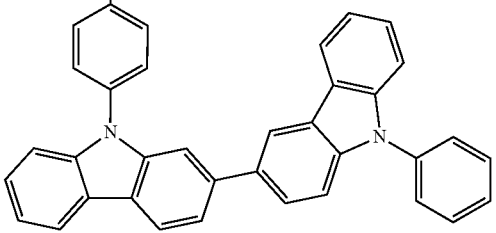
P255
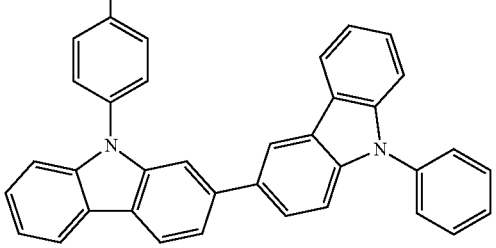

P256
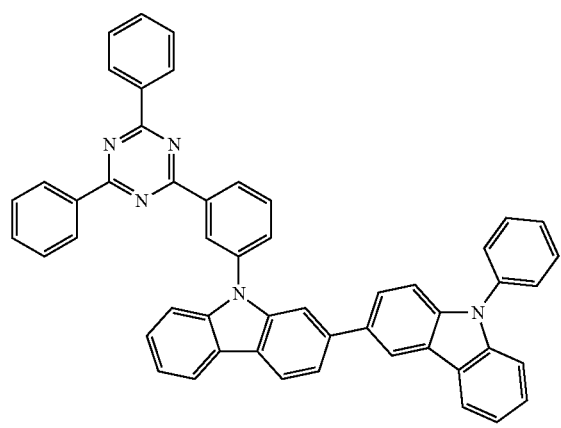
P257
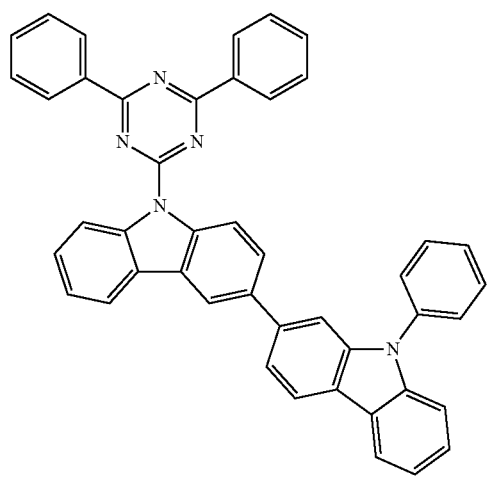
P258
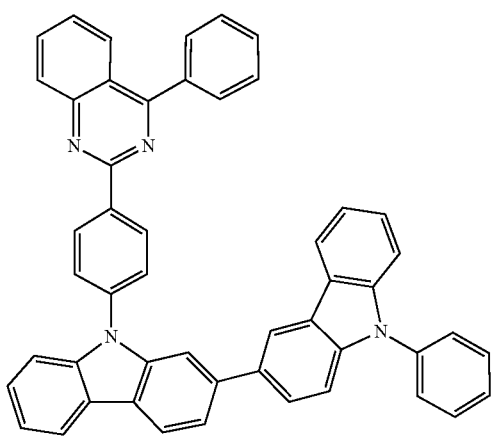
P259
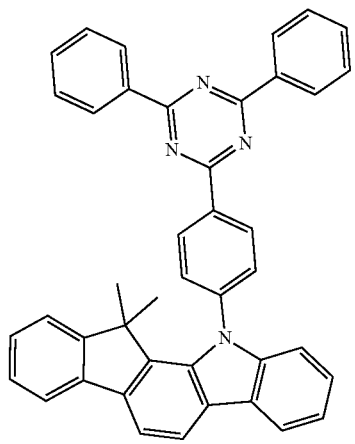
P260
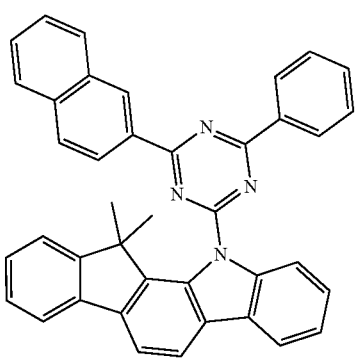
P261
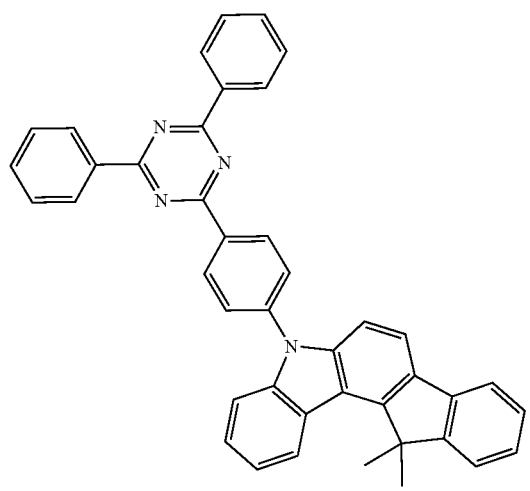

P262
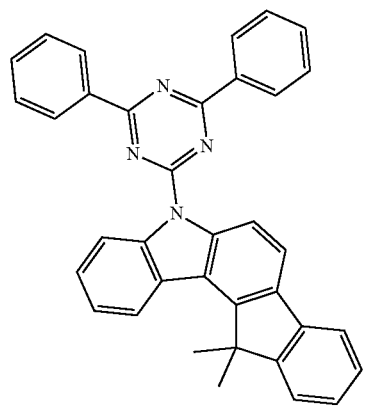
P263
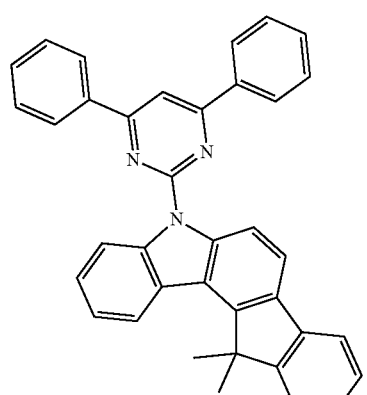
P264
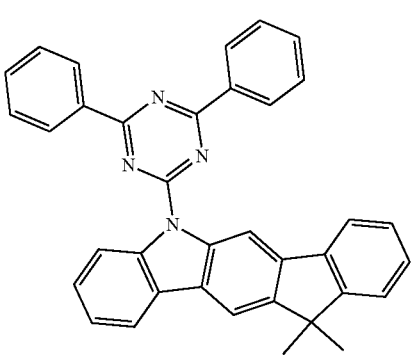
P265
P266
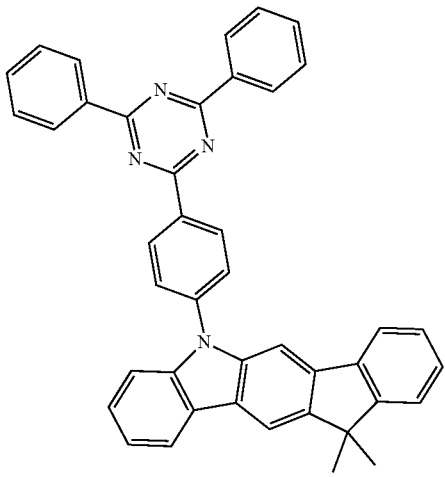
P267
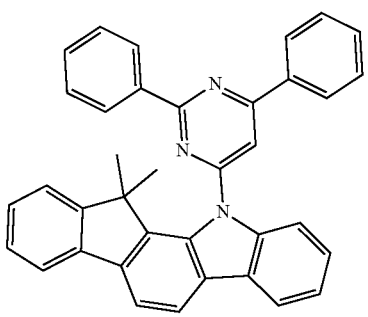
P268
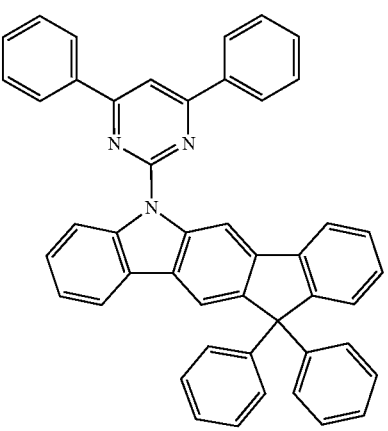

-continued
P269
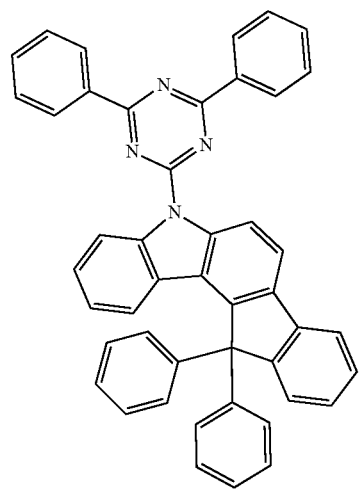
P270
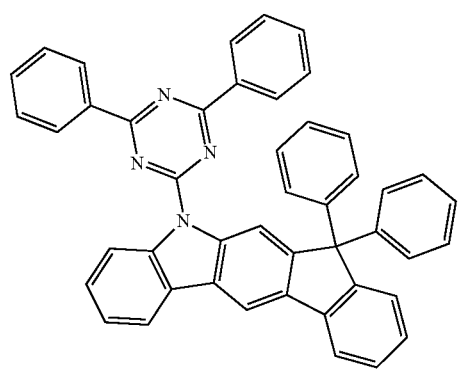
P271
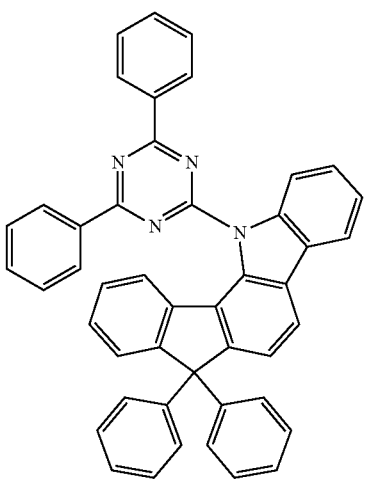
-continued
P272
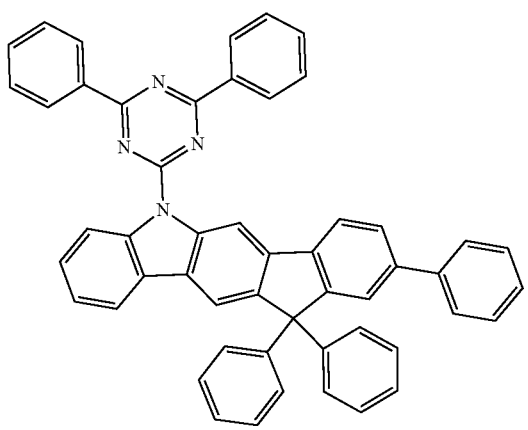
P273
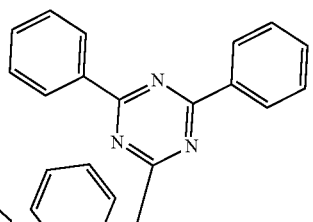
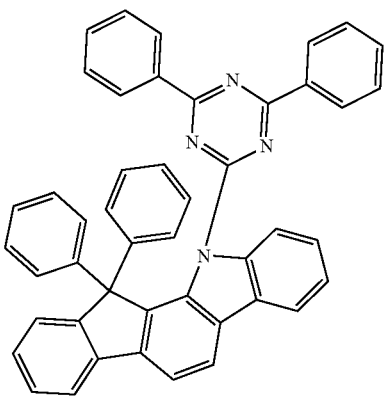
P274
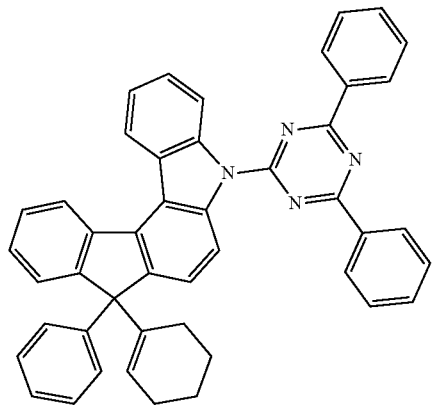
P275
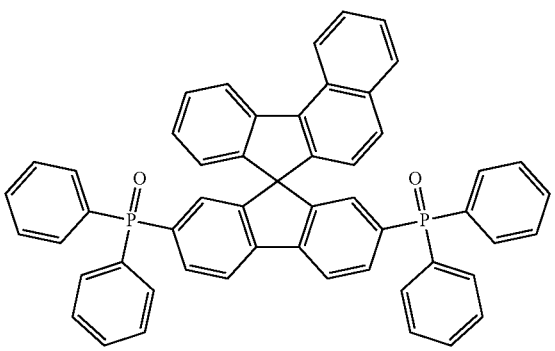

P276
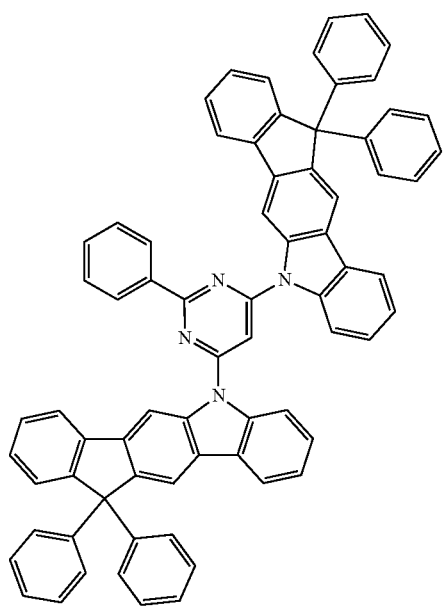
P279
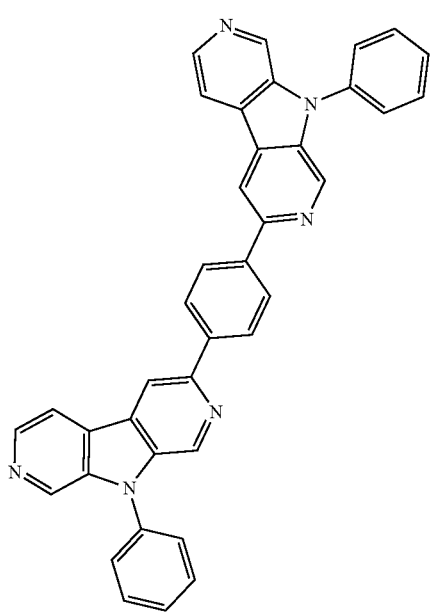
P277
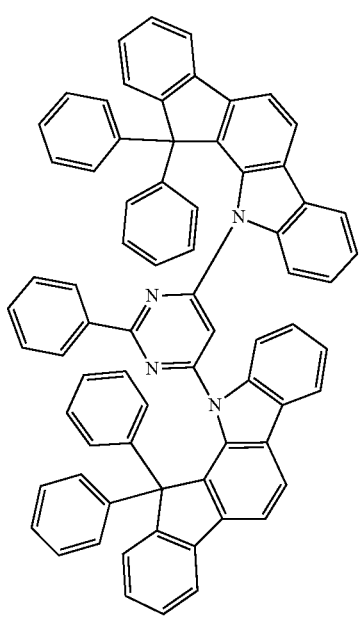
P280
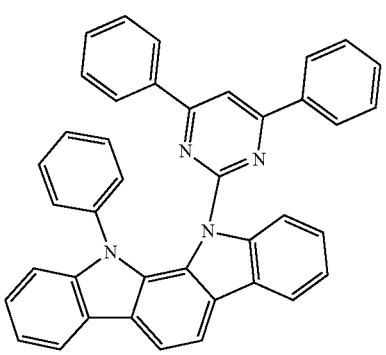
P278
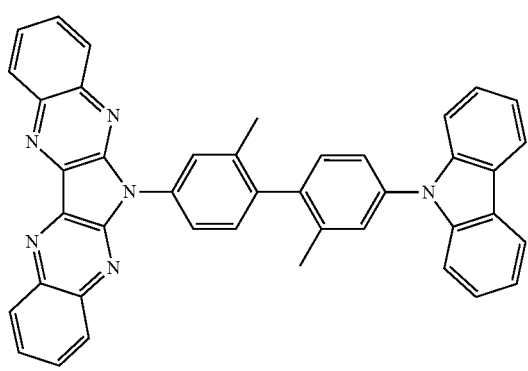
P281
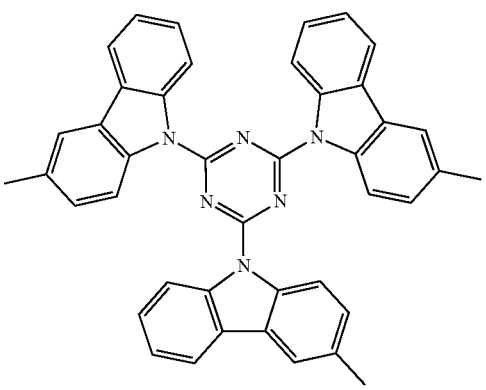

P282
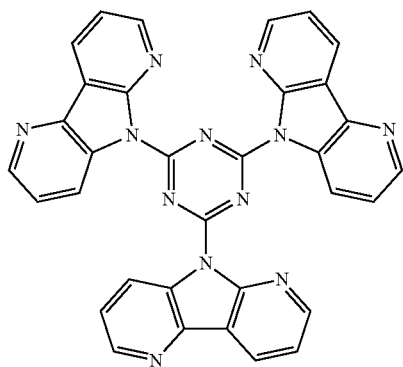
P283
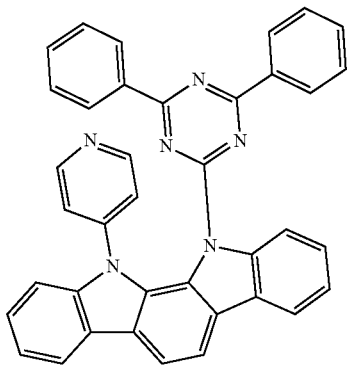
P284
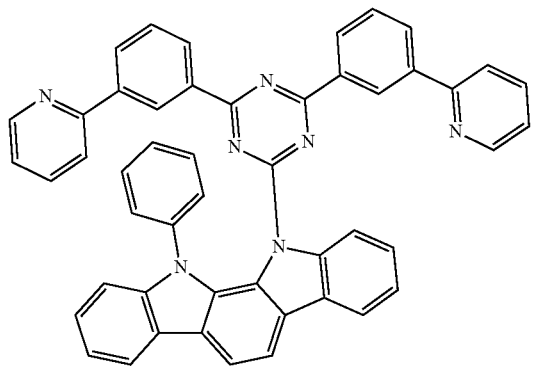
P285
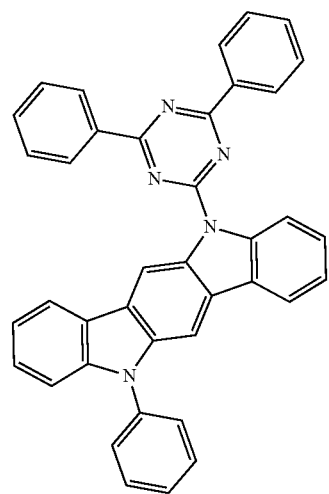
P286
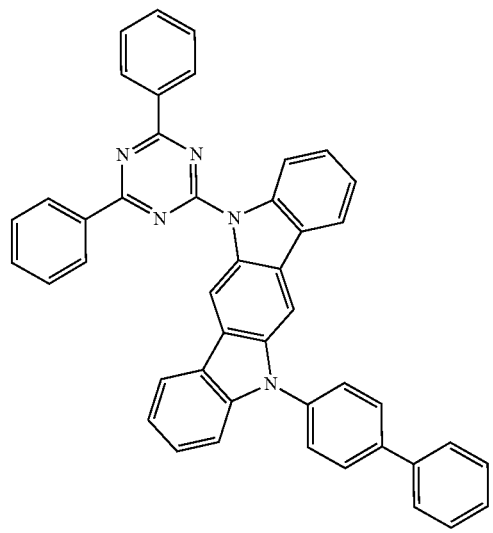
P287
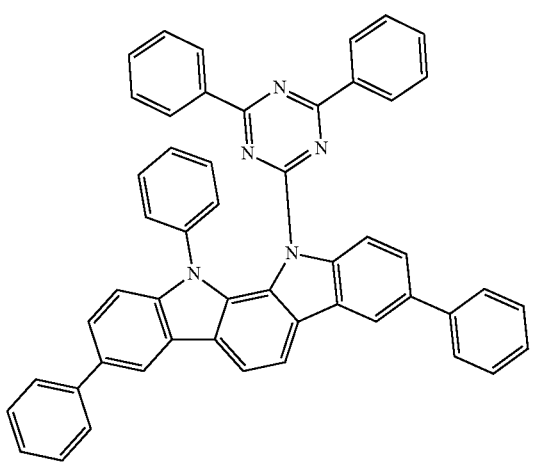
P288
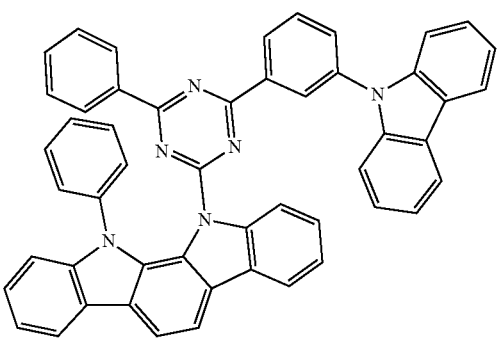

P289
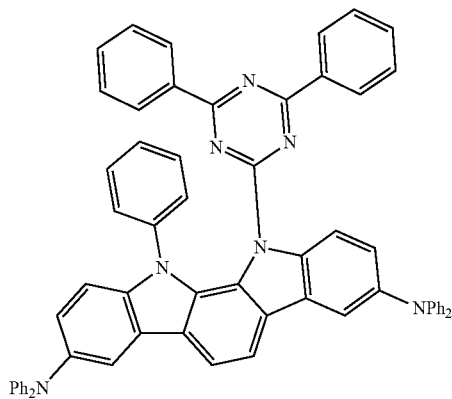
P292
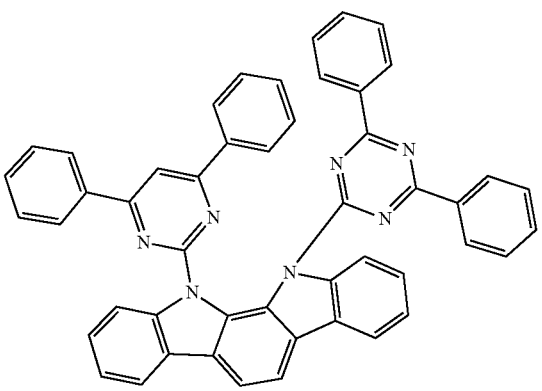
P290
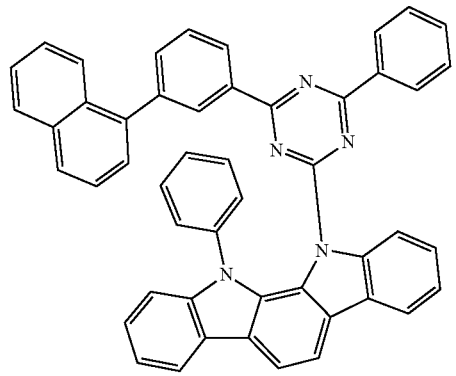
P293
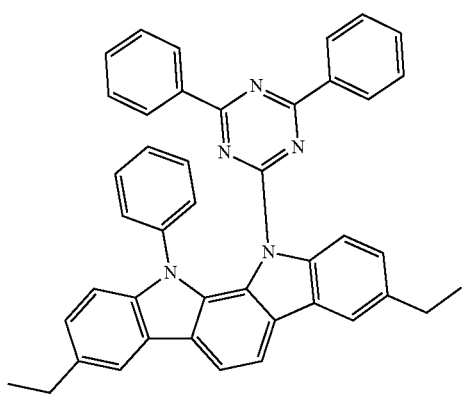
P291
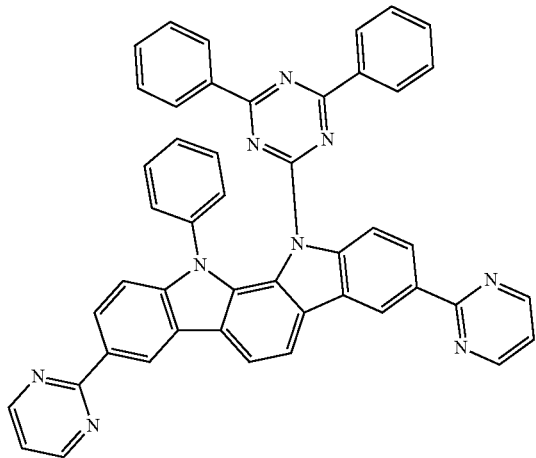
P294
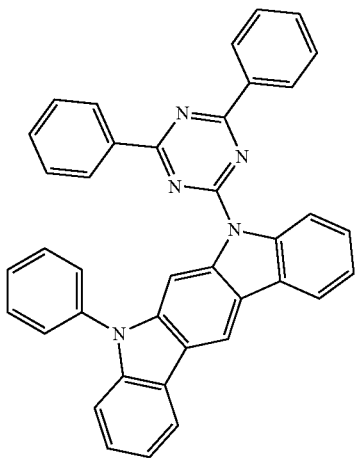

-continued
P295
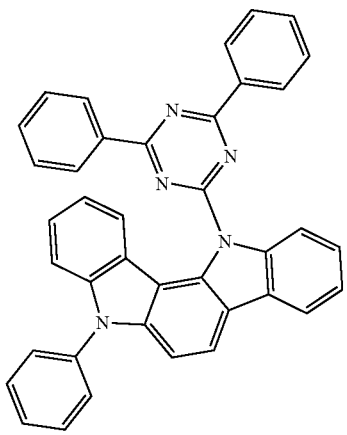
P296
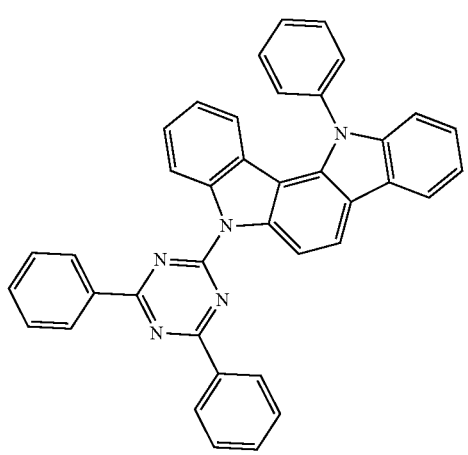
P297
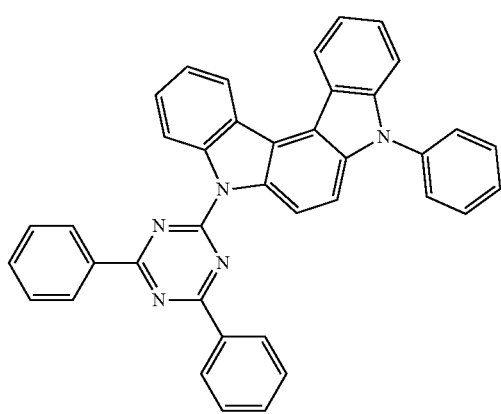
-continued
P298
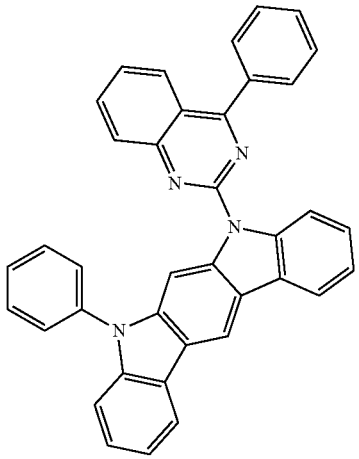
P299
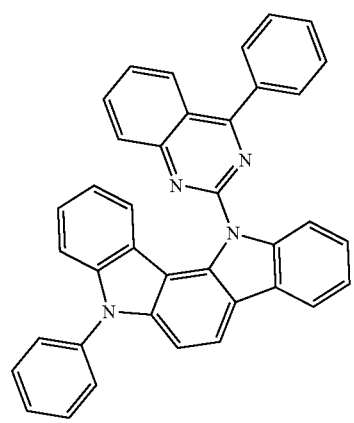
P300
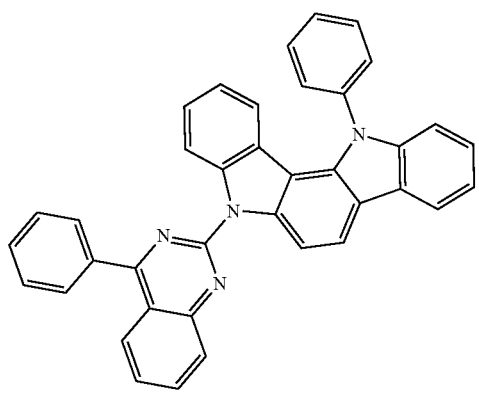

P301
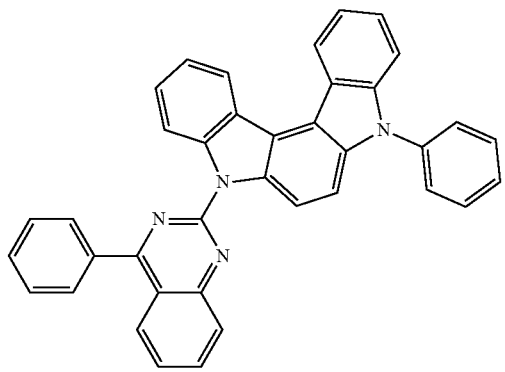
P302
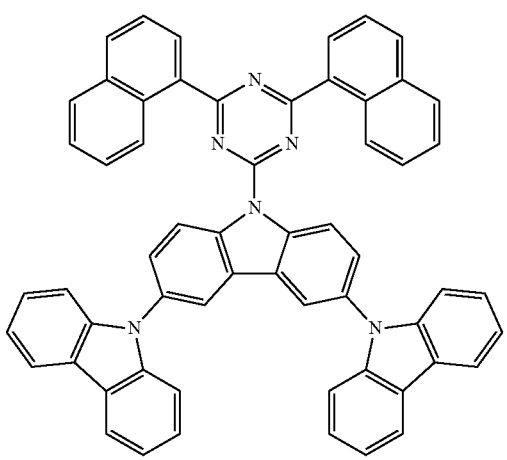
P303
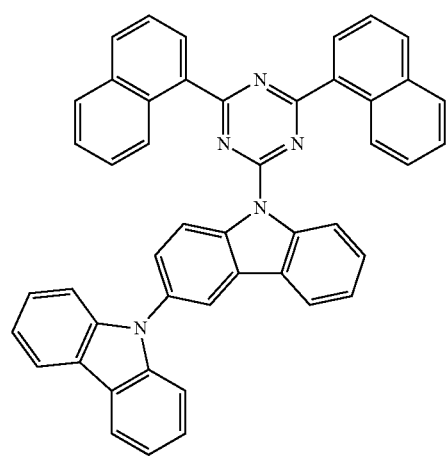
P304
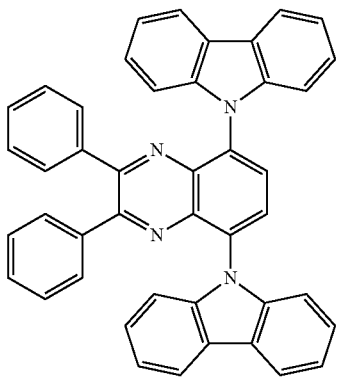
P305
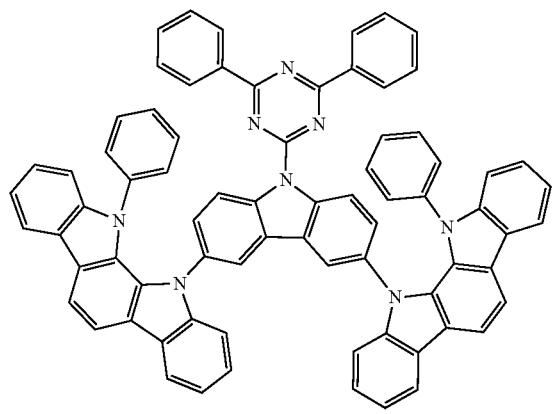
P306
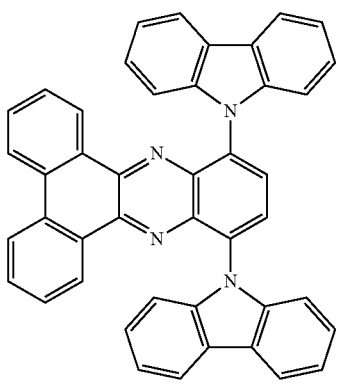

-continued
P307
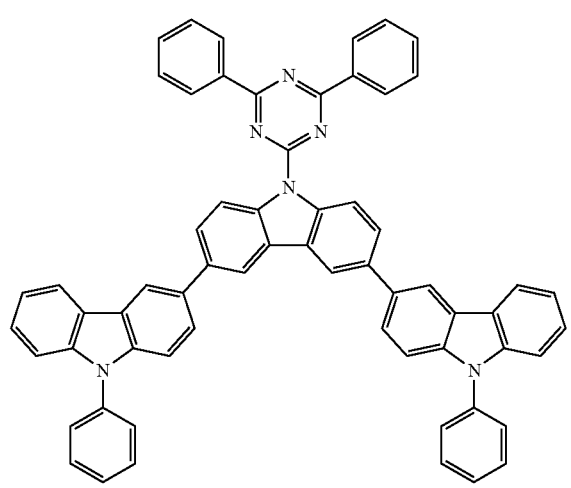
P308
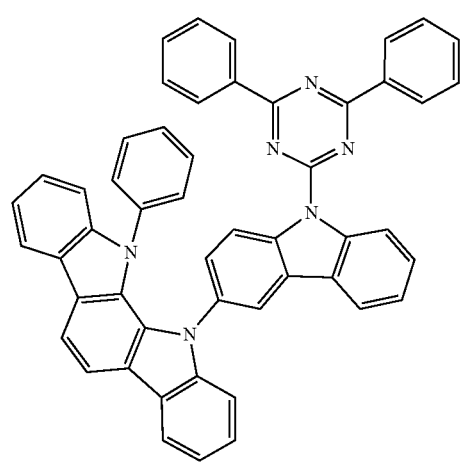
P309
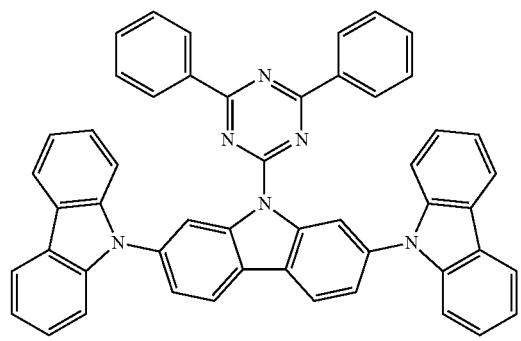
-continued
P310
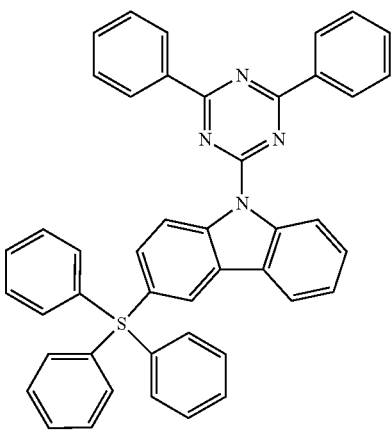
P311
P312
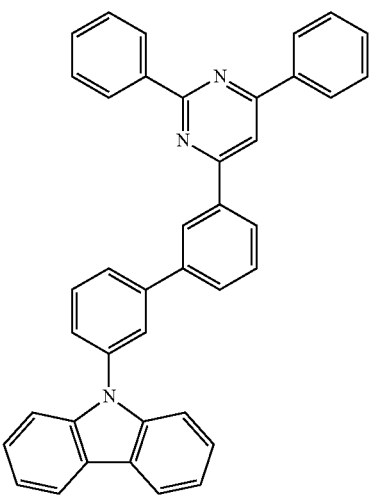

-continued
P313
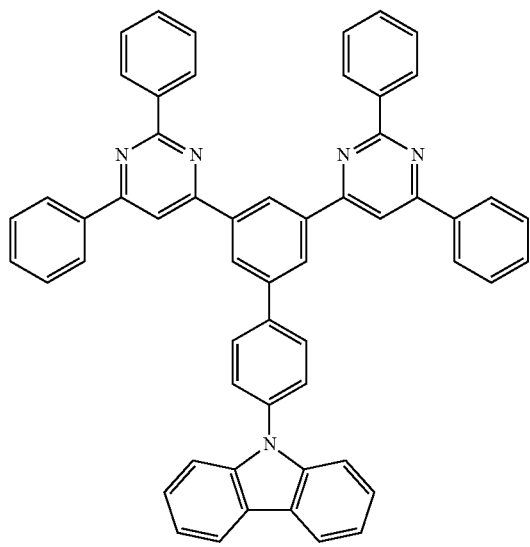
P314
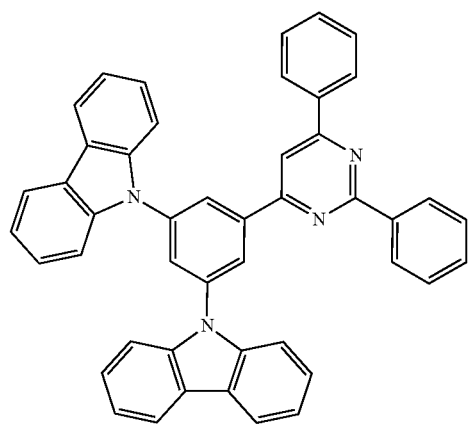
P315
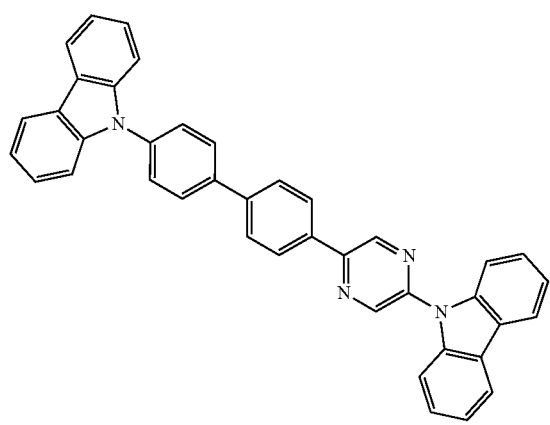
-continued
P316
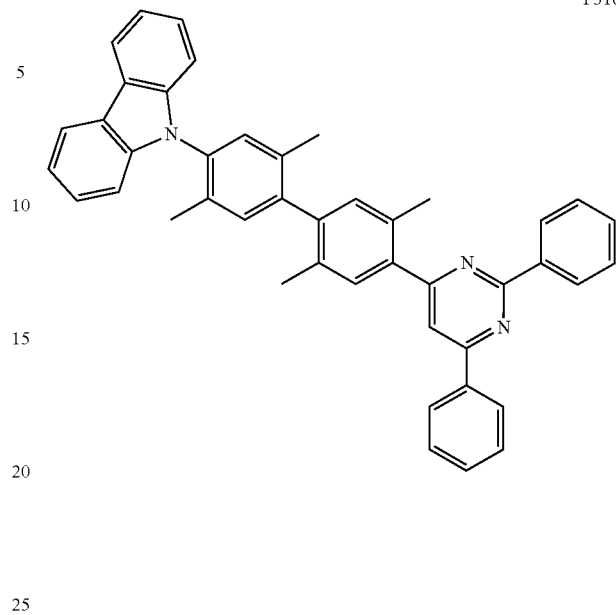
P317
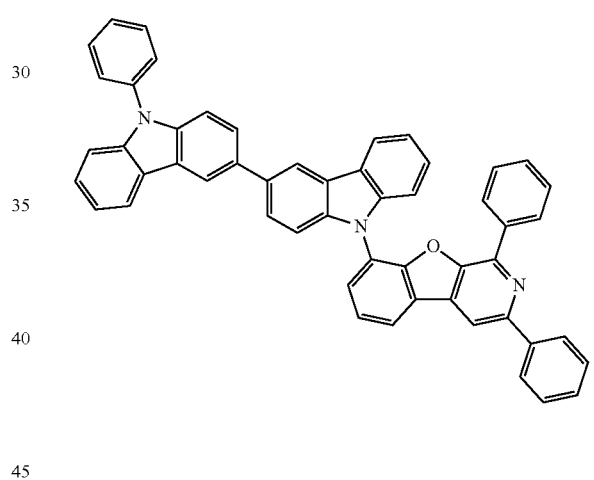
P318
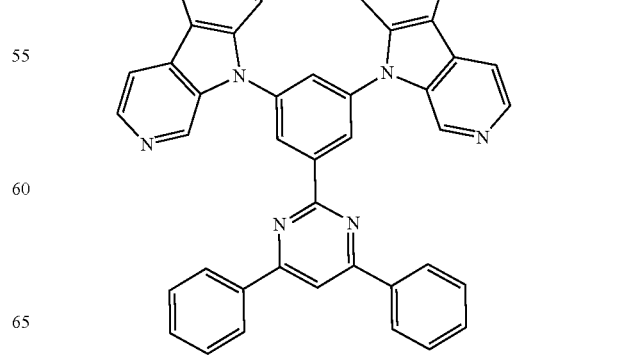

P319
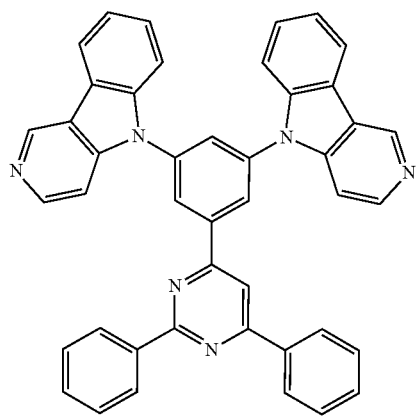
P320
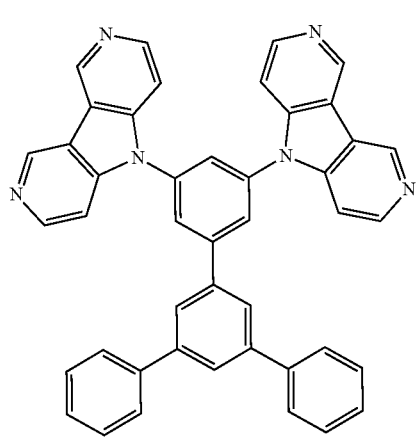
P321
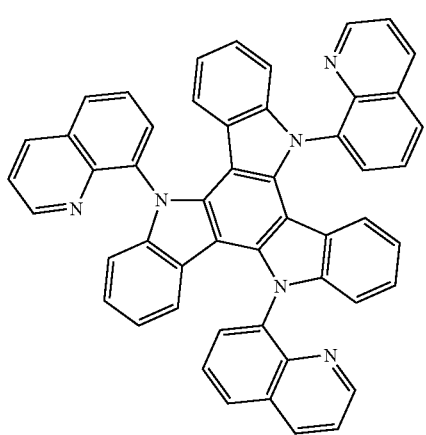
P322
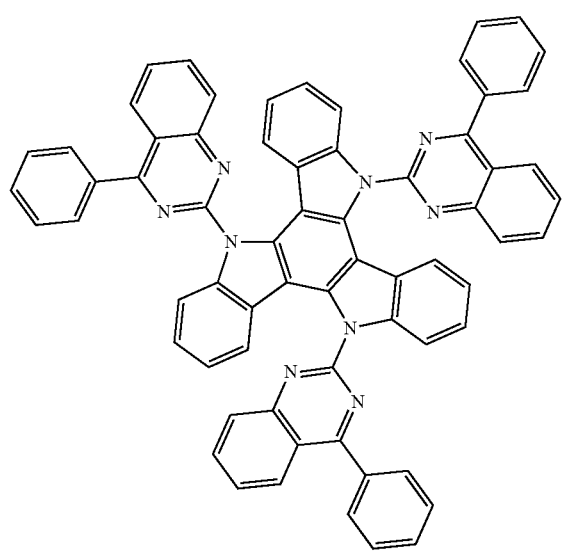
P323
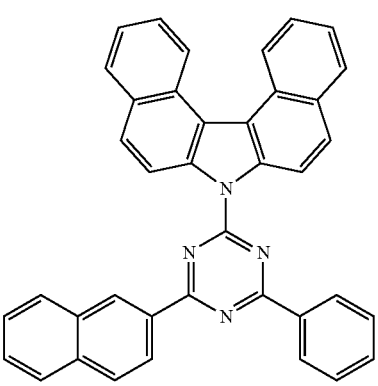
P324
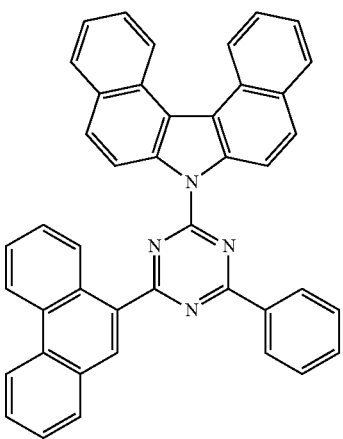

-continued
P325
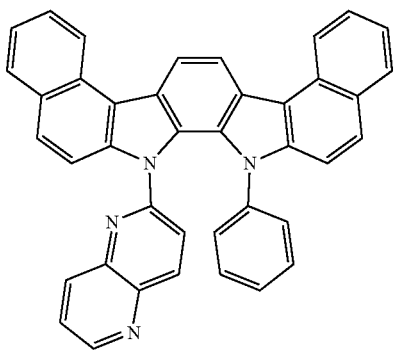
P326
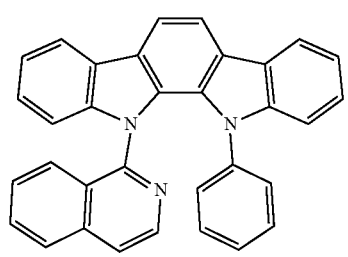
P327
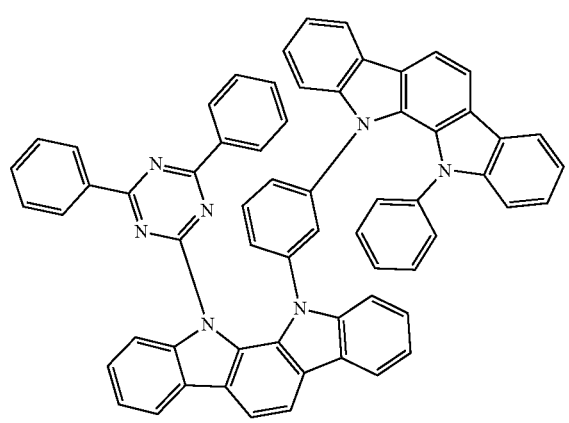
P328
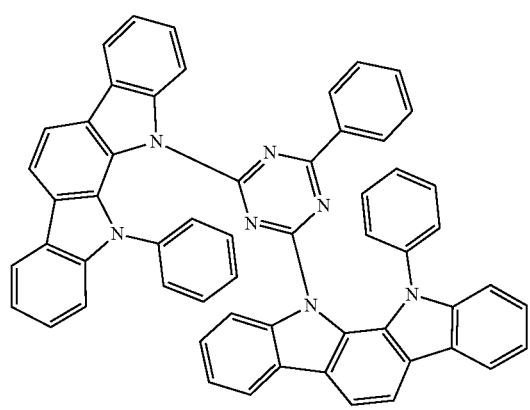
-continued
P329
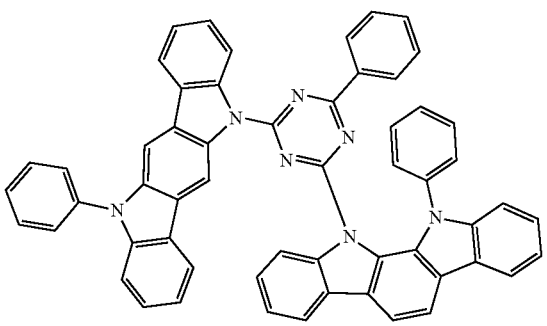
P330
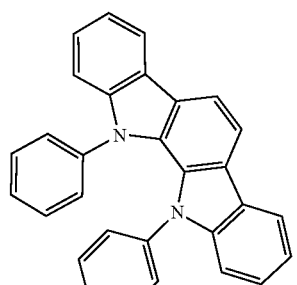
P331
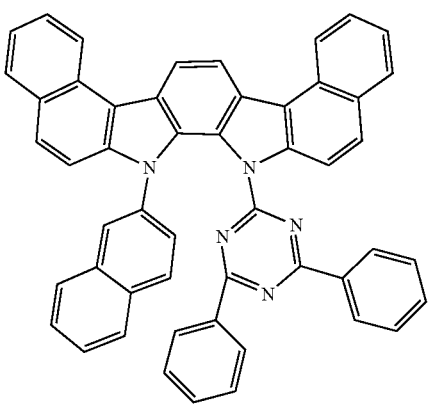

P332
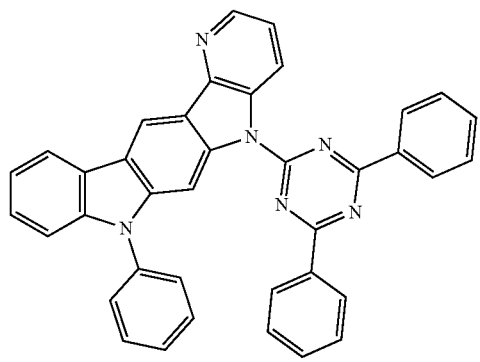
P335
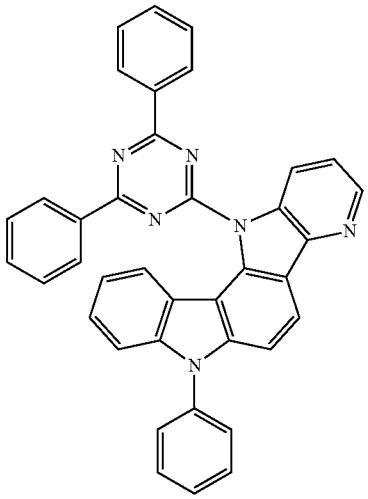
P333
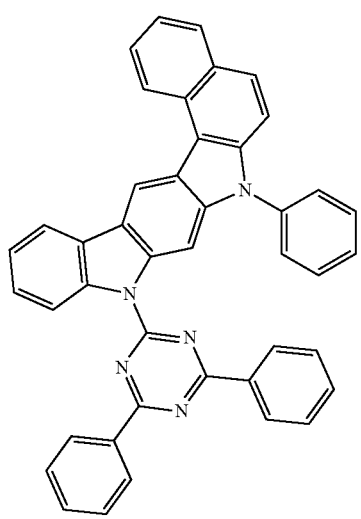
P336
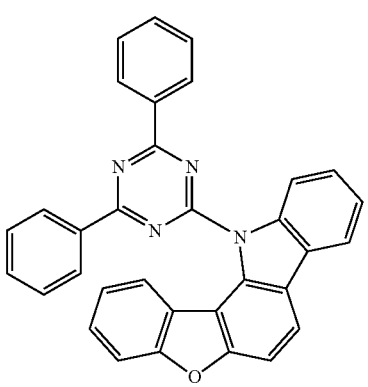
P334
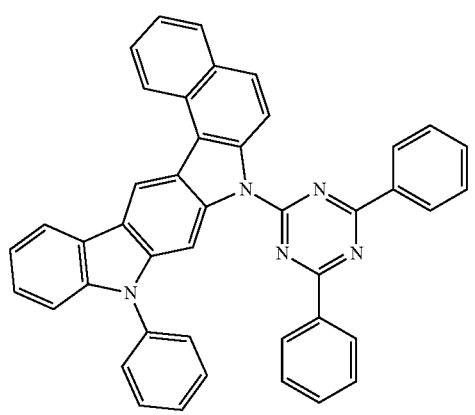
P337
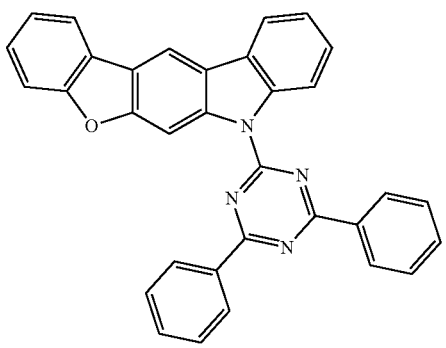

P338
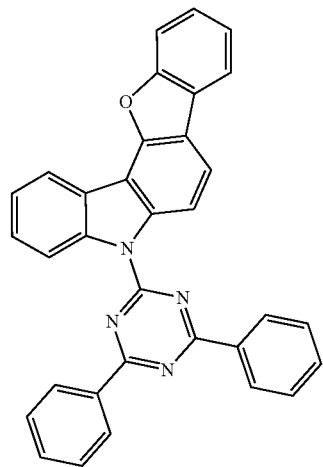
P339
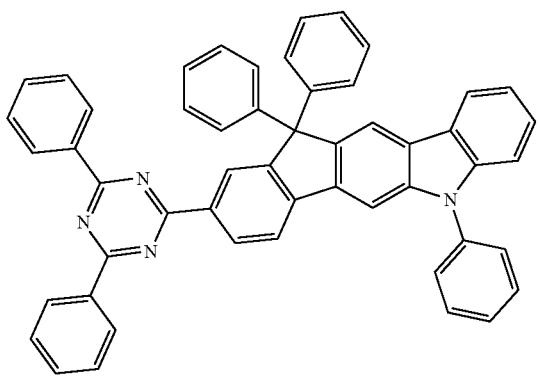
P340
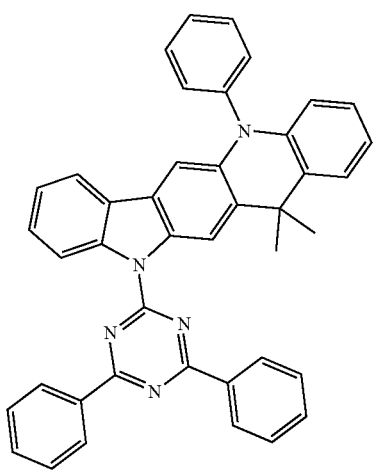
P341
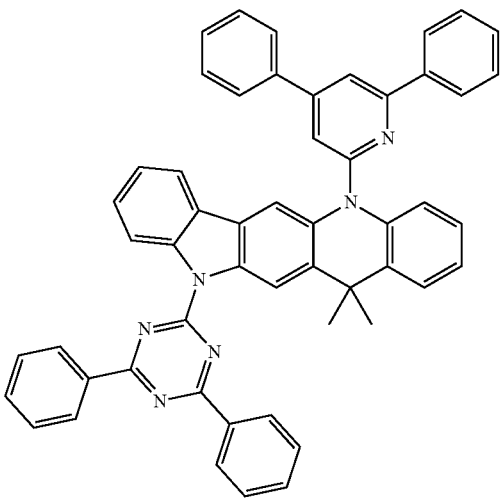
P342
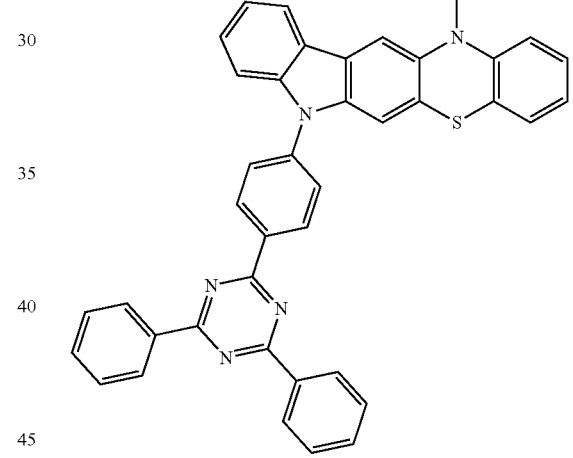
P343
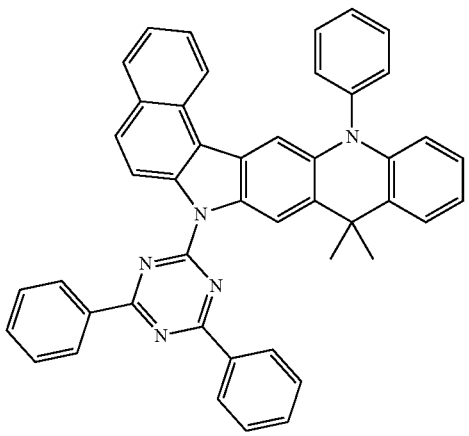

P344
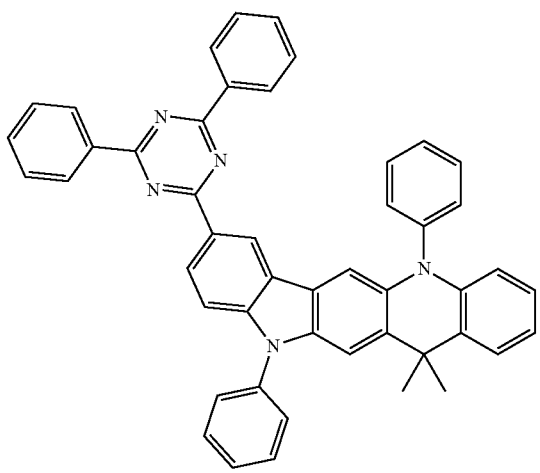
P345
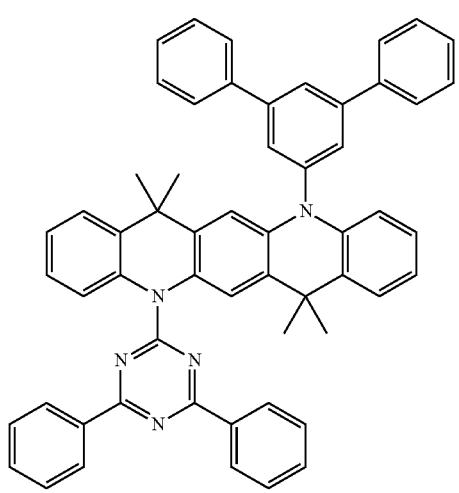
P346
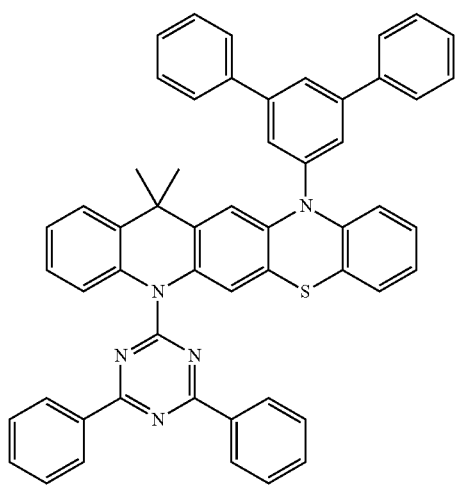
P347
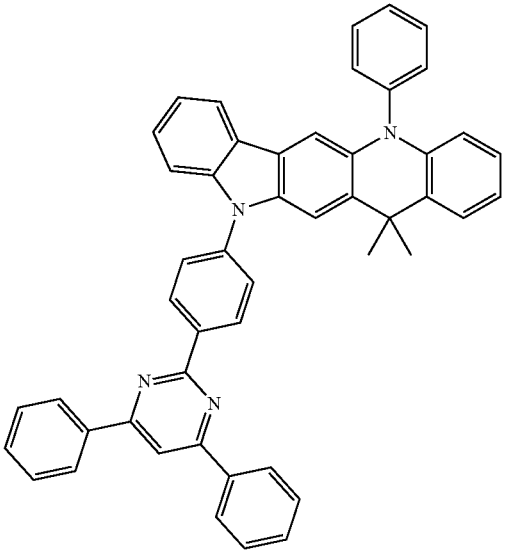
P348
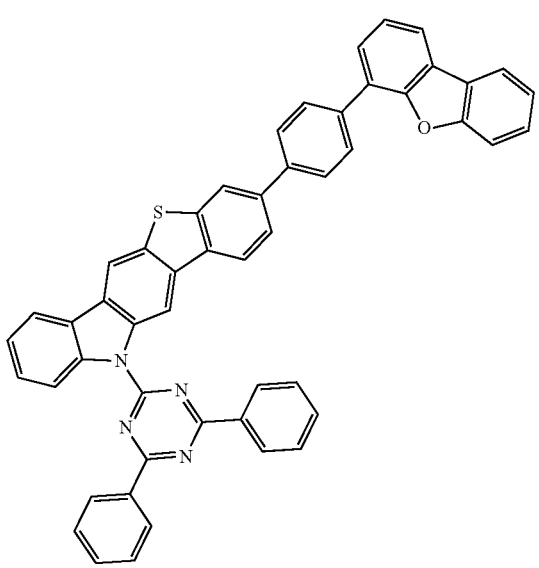
P349
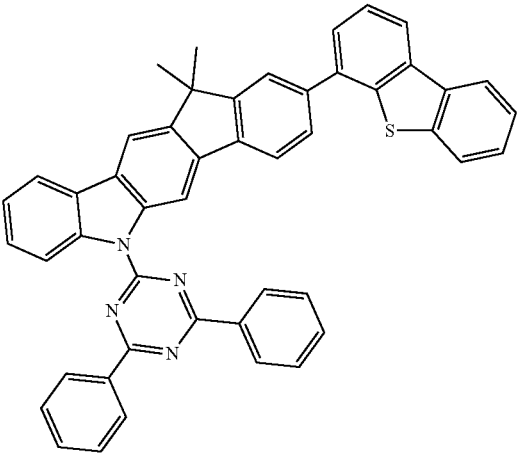

P350
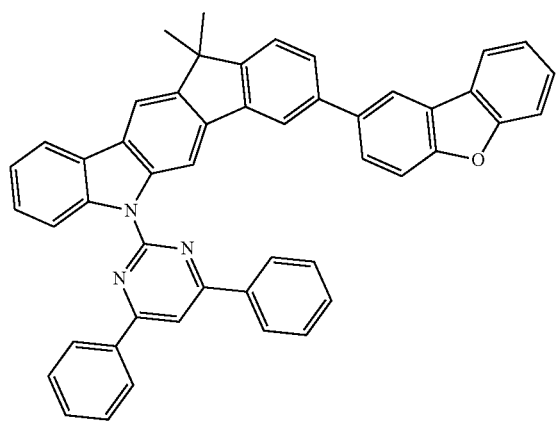
P353
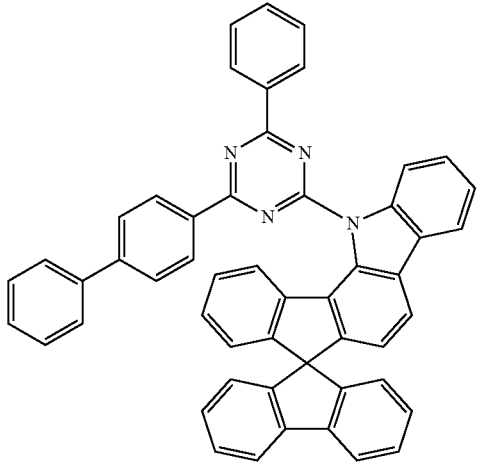
P351
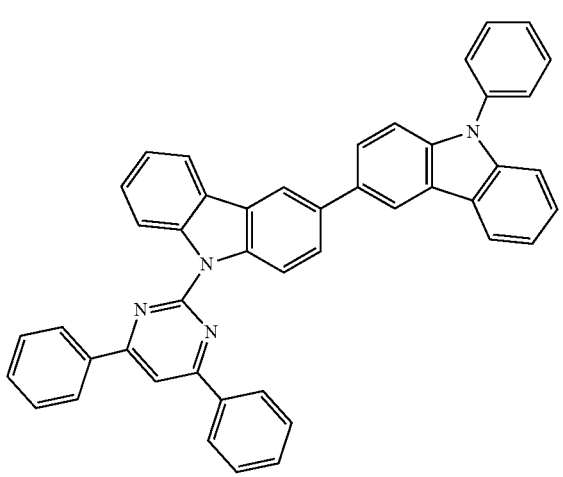
P354
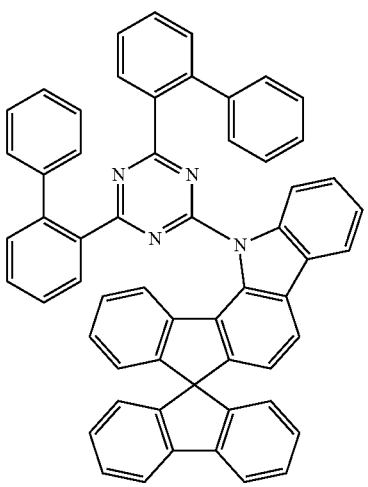
P352
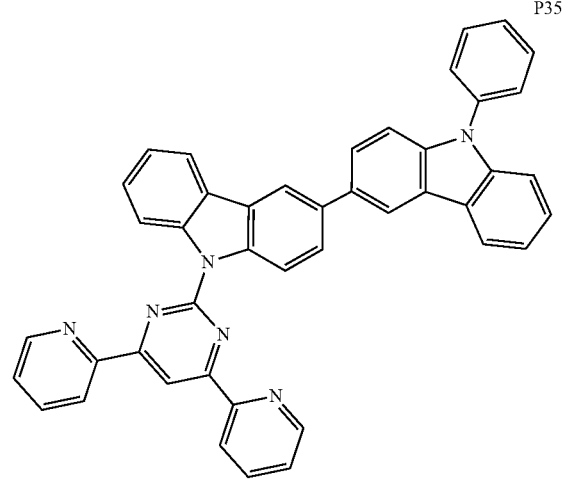
P355
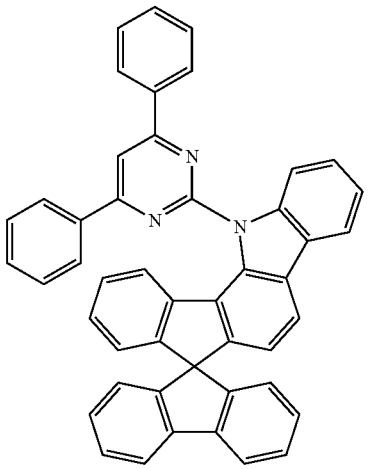

P356
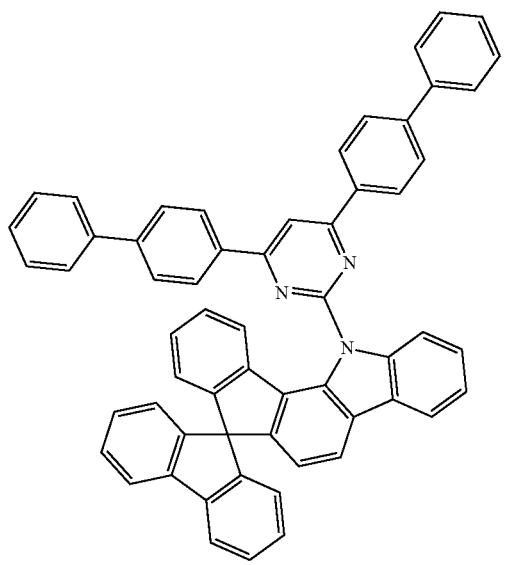
P357
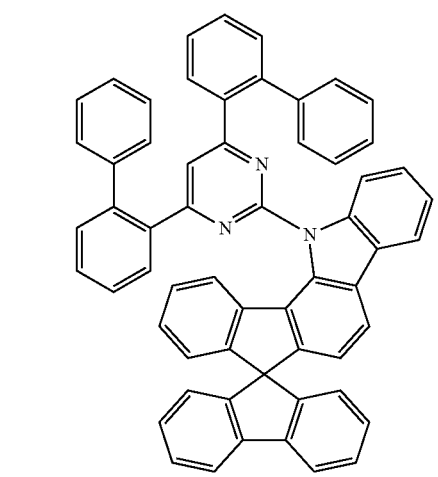
P358
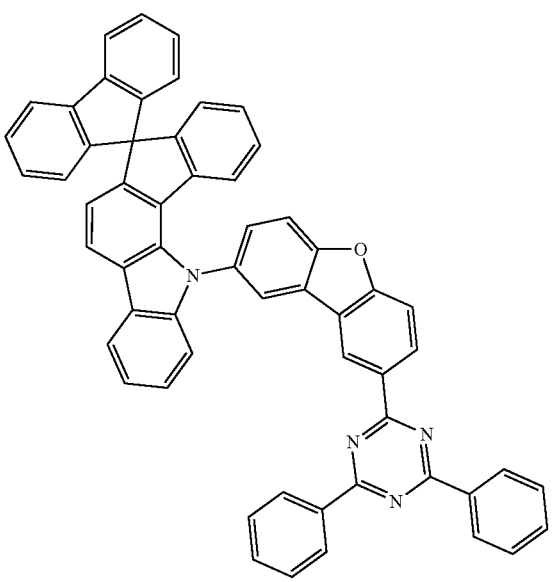
P359
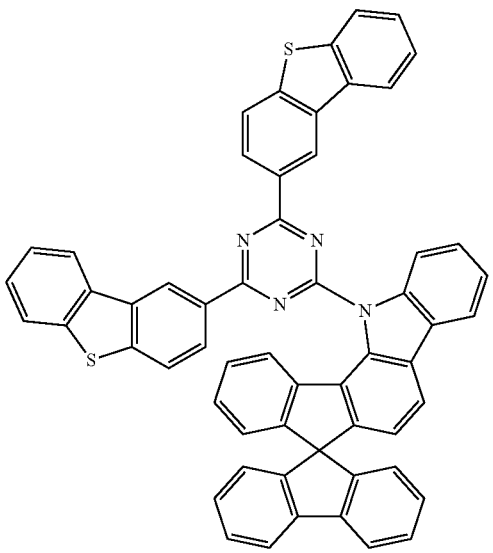
P360
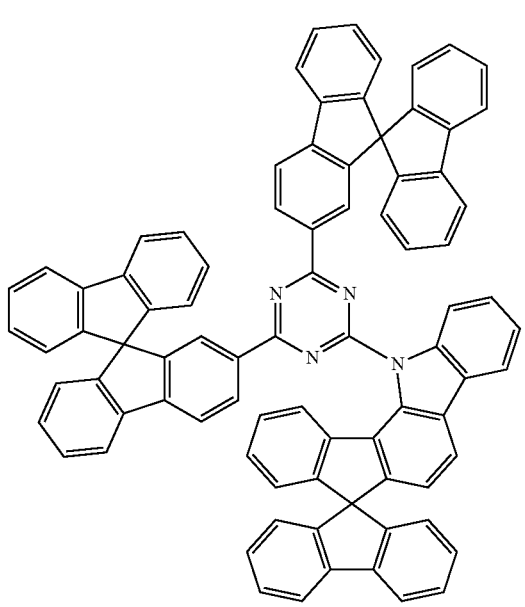
P361
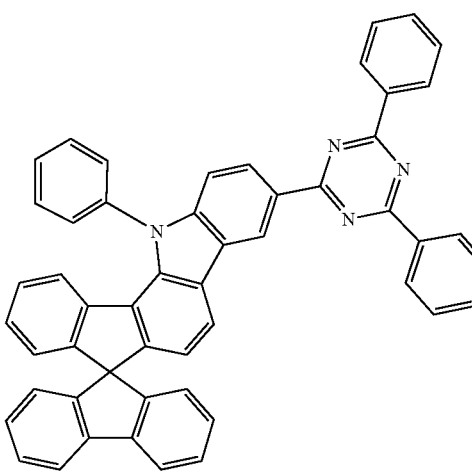

P362
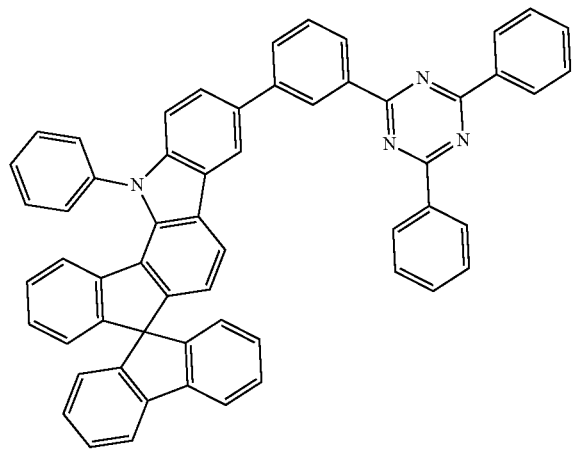
P363
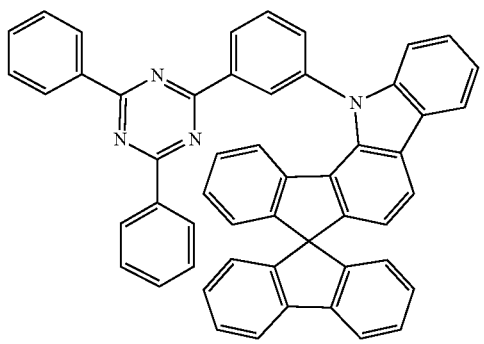
P364
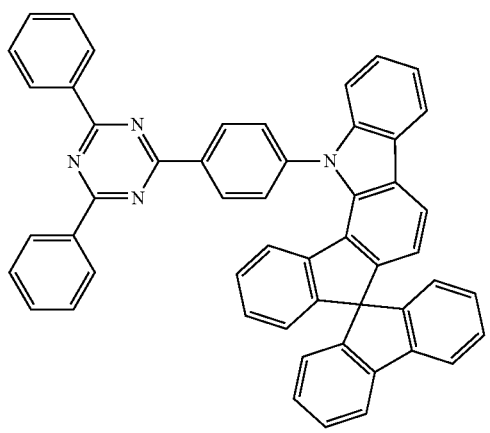
P365
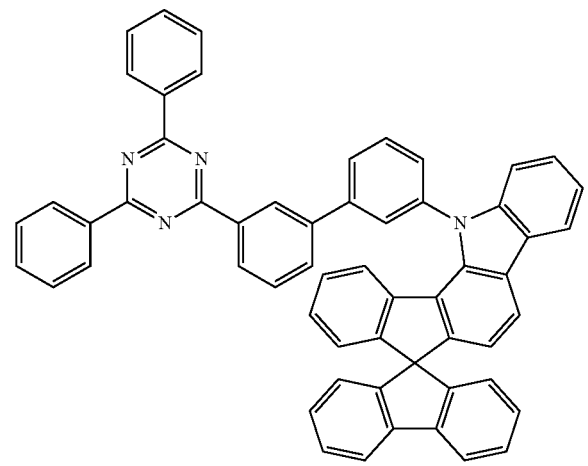
P366
P367
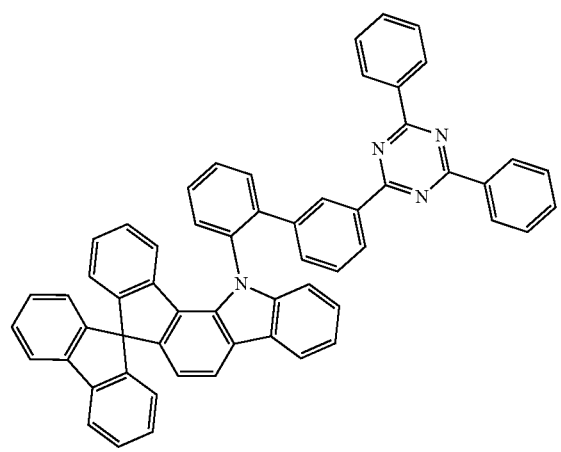

P368
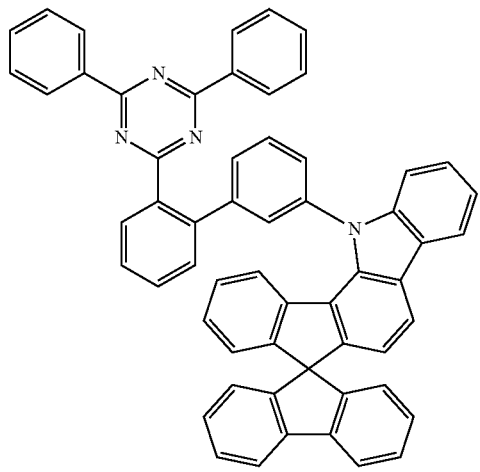
P371
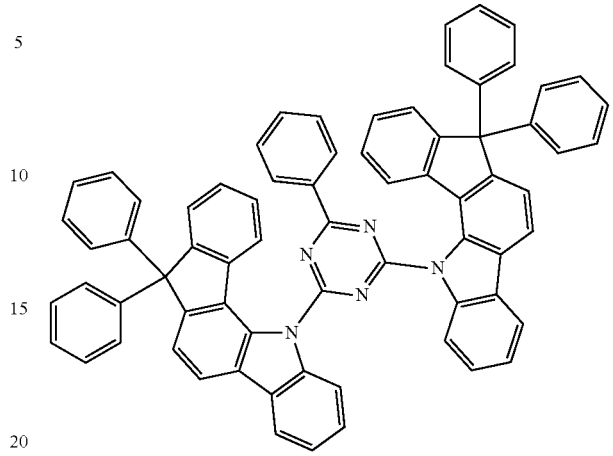
P369
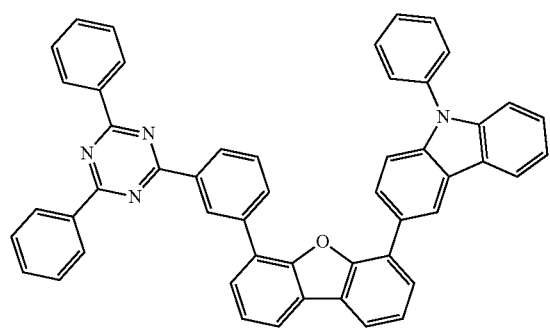
P372
P370
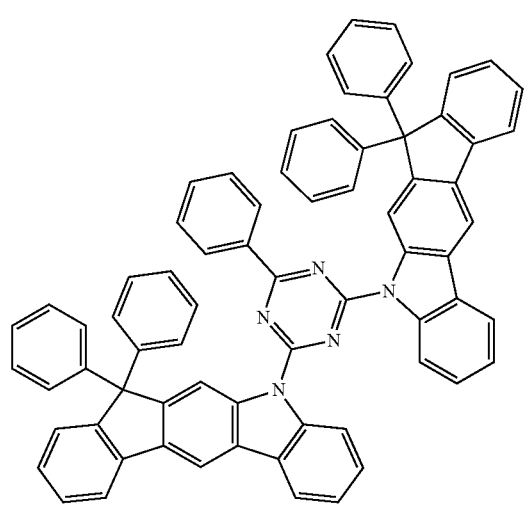
P373
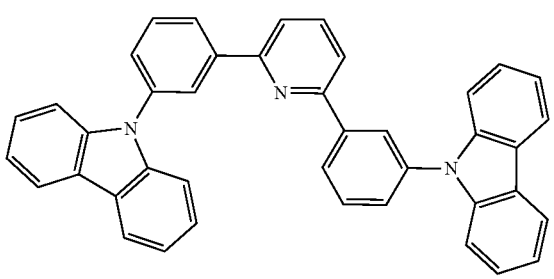

-continued
P374
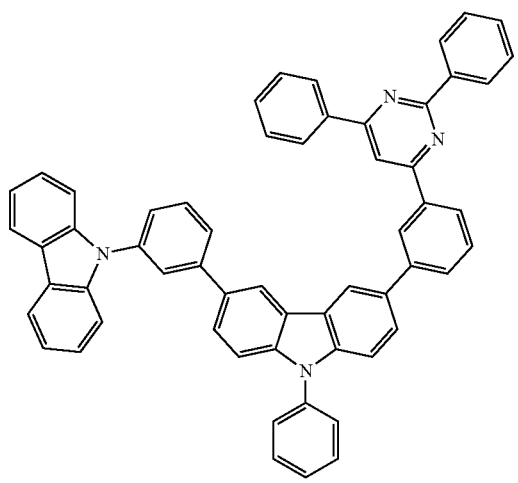
P375
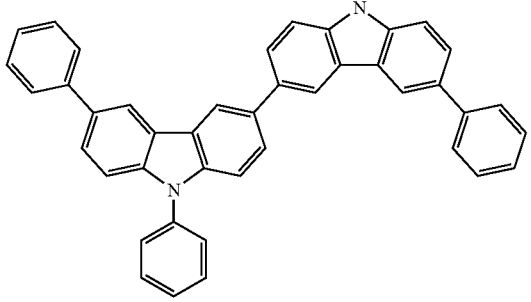
P376
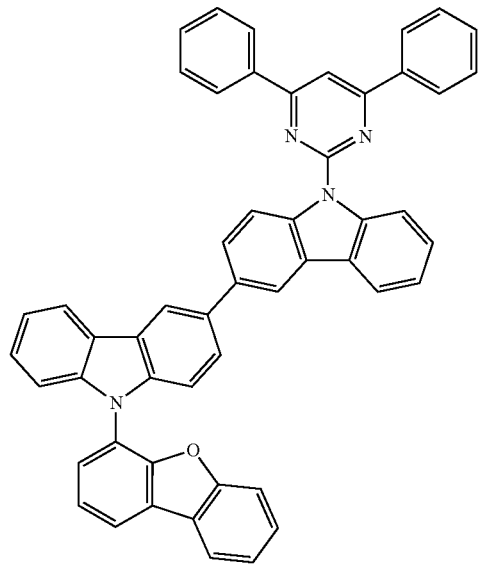
-continued
P377
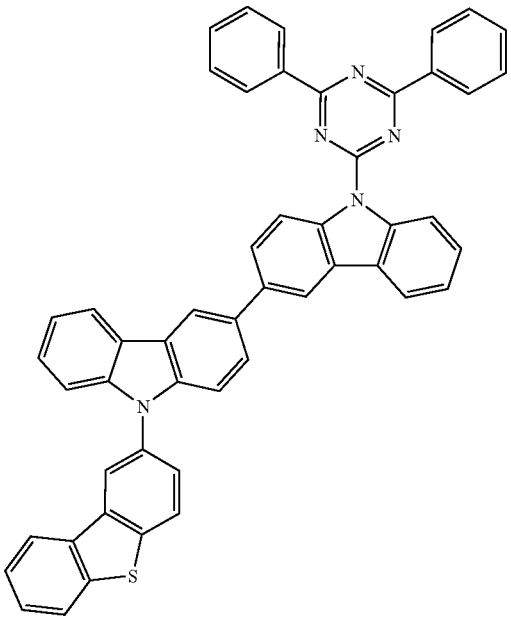
P378
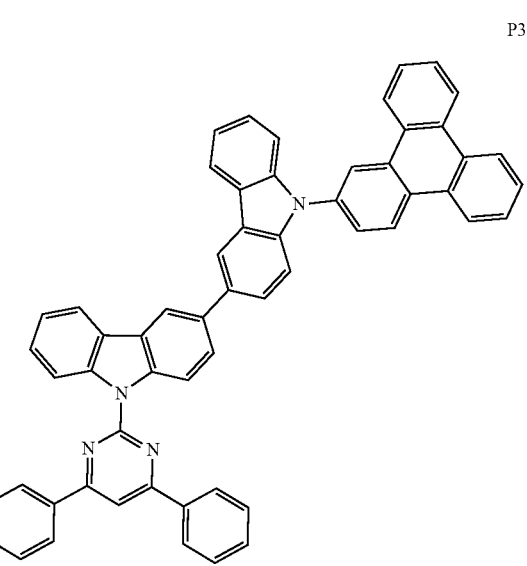

P379

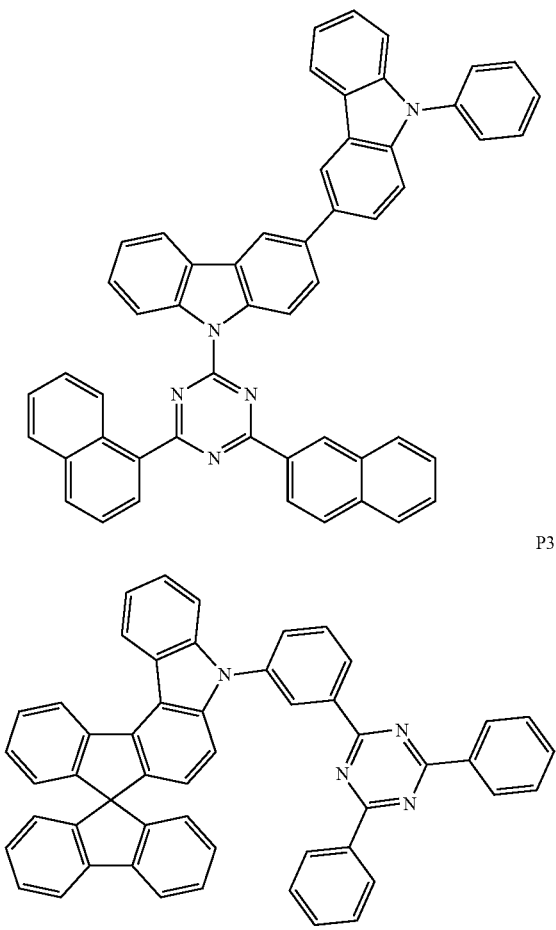

P380

The organic electroluminescent material comprising an organic compound A with 3.0 eV>$E_T$≥2.0 eV and a compound B represented by M(LA)$_x$(LB)$_y$(LC)$_z$ of the present invention may be used as, for example, a hole injection material, a hole transport material, or a packaging layer material in an organic electroluminescent device, and is preferably used as a light-emitting layer in an organic electroluminescent device. In the case of serving as a light-emitting layer, preference is given to a phosphorescent light-emitting layer, wherein the organic compound A with 3.0 eV>$E_T$≥2.0 eV is used as a matrix material, the compound B represented by M(LA)$_x$(LB)$_y$(LC)$_z$ is used as a doping material, and with the joint participation of both, phosphorescence is emitted.

In the case where the compound B represented by M(LA)$_x$(LB)$_y$(LC)$_z$ as a doping material and the organic compound A with 3.0 eV>$E_T$≥2.0 eV as a matrix material work together as a phosphorescent light-emitting layer, the triplet energy level of the organic compound A with 3.0 eV>$E_T$≥2.0 eV is preferably not significantly lower than or greater than the triplet energy level of the compound of M(LA)$_x$(LB)$_y$(LC)$_z$, and the absolute value of the triplet energy levels $E_T$[A]−$E_T$[B] is preferably ≤0.2 eV, particularly preferably ≤0.15 eV, very particularly preferably ≤0.1 eV. The $E_T$[B] is the triplet energy level of the metal complex of M(LA)$_x$(LB)$_y$(LC)$_z$, and the $E_T$[A] is the triplet energy level of the compound with 3.0 eV>$E_T$≥2.0 eV as the matrix material. If more than two matrix materials are contained in the light-emitting layer, the above-mentioned relationship is preferably also applicable to other matrix materials.

With regard to the ratio between the organic compound A with 3.0 eV>$E_T$≥2.0 eV and the compound B represented by M(LA)$_x$(LB)$_y$(LC)$_z$, the ratio of the organic compound A with 3.0 eV>$E_T$≥2.0 eV to the compound represented by M(LA)$_x$(LB)$_y$(LC)$_z$ is preferably between 99:1 and 80:20, preferably between 99:1 and 90:10, particularly preferably between 99:1 and 95:5.

The organic electroluminescent device comprises a cathode, an anode, and at least one light-emitting layer. In addition to these layers, it may further comprise other layers, for example, in one embodiment, it may comprise one or more hole injection layers, hole transport layers, hole blocking layers, electron transport layers, electron injection layers, exciton blocking layers, electron blocking layers and/or charge generation layers. An intermediate layer having, for example, an exciton blocking function may also be introduced between two light-emitting layers. However, it should be noted that the presence of all these layers is not necessary. The organic electroluminescent device here may comprise one light-emitting layer, or may comprise a plurality of light-emitting layers. That is, a plurality of luminescent compounds capable of emitting phosphorescence are used in the light-emitting layers. A system having three light-emitting layers is particularly preferred, wherein the three layers respectively emit blue light, green light, and red light. If more than one light-emitting layer is present, according to the invention, at least one of these layers comprises the organic electroluminescent material containing an organic compound A with 3.0 eV>ET≥2.0 eV and a compound represented by the formula M(LA)$_x$(LB)$_y$(LC)$_z$ of the present invention.

In another embodiment of the present invention, the organic electroluminescent device of the present invention does not comprise an individual hole injection layer and/or hole transport layer and/or hole blocking layer and/or electron transport layer, i.e. the case where the light-emitting layer is directly adjacent to the hole injection layer or anode, and/or the light-emitting layer is directly adjacent to the electron transport layer or electron injection layer or cathode, as described in, for example, WO 2005053051.

In the other layers of organic electroluminescent device of the present invention, particularly in the hole injection and hole transport layers and in the electron injection and electron transport layers, all materials can be used in a manner generally used according to the prior art. A person of ordinary skill in the art will therefore be able to use all materials known for organic electroluminescent devices in combination with the light-emitting layer according to the present invention without involving any inventive effort.

Furthermore, preference is given to the following organic electroluminescent device in which one or more layers are applied by means of a sublimation method, wherein the material is applied by means of vapor deposition in a vacuum sublimation device at an initial pressure below $10^{-5}$ mbar, preferably below $10^{-6}$ mbar. The initial pressure may also be even lower, for example below $10^{-7}$ mbar.

Furthermore, preference is given to the following organic electroluminescent device in which one or more layers are applied by means of an organic vapor deposition method or by means of carrier gas sublimation, wherein the material is applied at a pressure between $10^{-5}$ mbar and 1 bar. A particular example of this method is an organic vapor jet printing method, in which the material is applied directly through a nozzle and is therefore structured.

Furthermore, preference is given to the following organic electroluminescent device in which one or more layers are produced by using a solution by means of, for example, spin coating, or by means of any desired printing method such as screen printing, flexography, lithography, photo-initiated thermal imaging, heat transfer printing, inkjet printing, or nozzle printing. Soluble compounds are obtained, for example, by means of appropriate substitution. These methods are also particularly suitable for oligomers, dendrimers and polymers. In addition, a hybrid method is feasible, in which for example one or more layers are applied from a solution and one or more additional layers are applied by means of vapor deposition.

These methods are generally known to a person of ordinary skill in the art, and they can be applied to an organic electroluminescent device containing the compound according to the present invention without involving any inventive effort.

The present invention also relates to a method for manufacturing the organic electroluminescent device according to the present invention, in which at least one layer is applied by means of a sublimation method, and/or at least one layer is applied by means of an organic vapor deposition method or carrier gas sublimation, and/or at least one layer is applied from a solution by means of spin coating or by means of a printing method.

The organic electroluminescent material of the present invention may further optionally comprise other compounds. The organic electroluminescent material of the present invention may be, for example, a liquid phase, which is processed by means of spin coating or by means of a printing method. As such a liquid phase, it may be in the form of, for example, a solution, a dispersion, or an emulsion. As the solvent used for forming the liquid phase, a mixture of two or more solvents may be preferably used. Suitable and preferred solvents are, for example, toluene, anisole, o-xylene, m-xylene or p-xylene, methyl benzoate, mesitylene, tetralin, o-dimethoxybenzene, tetrahydrofuran, methyl tetrahydrofuran, tetrahydropyran, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indan, methyl benzoate, 1-methylpyrrolidone, p-methylisopropylbenzene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, or mixtures of these solvents, etc.

The test instrument and method for testing the performances of OLED materials and elements in the following examples are as follows:

OLED element performance testing conditions:
Luminance and chromaticity coordinates: tested using spectral scanner PhotoResearch PR-715;
Current density and lighting voltage: tested using digital source meter Keithley 2420;
Power efficiency: tested using NEWPORT 1931-C;
Lifetime test: using LTS-1004AC lifetime test device.

Example 1

Method for determining the triplet energy level $E_T$ of a compound

The triplet energy level of the material is determined via quantum chemical calculation. To do this, "Gaussian09W" software is used. In order to calculate the $E_T$ of the organic compound A with 3.0 eV>$E_T$≥2.0 eV, geometric structure optimization is first carried out using a "ground state/semi-empirical/default spin/AM1/charge 0/spin singlet" method, an energy calculation is subsequently carried out on the basis of the ground state-optimized geometry. A method of "TD-SCF/DFT/default spin/B3LYP with a 6-31G(d) base set" (charge 0, spin singlet) is used here. For the compound B represented by $M(LA)_x(LB)_y(LC)_z$, geometric structure optimization is carried out via a "ground state/Hartree-Fock/default spin/LanL2 MB/charge 0/spin singlet" method. An energy calculation is carried out analogously to the method described above for matrix organic substances, with the difference that a "LanL2DZ" base set is used for the metal atom and the "6-31G(d)" base set is used for the ligands. The triplet energy level T1 of the material obtained by the energy calculation is defined as the energy of the lowest energy triplet as generated by quantum chemical calculation. The triplet energy level $E_T$ value of the compound is thus determined. For the purposes of the present application, this value is regarded as the $E_T$ value of the material.

Table 1 below lists the triplet energy levels $E_T(A)$ of some compounds A as shown with 3.0 eV>$E_T$≥2.0 eV:

TABLE 1

Triplet energy level $E_T(A)$ of some compounds A as shown with 3.0 eV > $E_T$ ≥ 2.0 eV

| Material | $T_1$ (eV) | Material | $T_1$ (eV) |
|---|---|---|---|
| P205 | 2.69 | P244 | 2.64 |
| P207 | 2.72 | P248 | 2.40 |
| P221 | 2.84 | P249 | 2.69 |
| P223 | 2.80 | P250 | 2.40 |
| P224 | 2.71 | P275 | 2.32 |
| P229 | 2.94 | P280 | 2.79 |
| P230 | 2.72 | P281 | 2.61 |
| P237 | 2.72 | P317 | 2.70 |
| P369 | 2.83 | P363 | 2.72 |

Table 2 below lists the triplet energy levels $E_T(B)$ of some compounds represented by $M(LA)_x(LB)_y(LC)_z$:

TABLE 2

Triplet energy levels $E_T(B)$ of some compounds represented by $M(LA)_x(LB)_y(LC)_z$

| Material | $T_1$ (eV) | Material | $T_1$ (eV) |
|---|---|---|---|
| P01 | 2.35 | P11 | 2.24 |
| P02 | 2.37 | P12 | 2.26 |
| P05 | 2.39 | P21 | 2.14 |
| P07 | 2.40 | P26 | 2.28 |
| P09 | 2.28 | P36 | 2.29 |
| P10 | 2.29 | P40 | 1.98 |

Example 2

OLED Device Manufacturing:
Pretreatment of Examples R1 to R25: In order to improve the processing, a clean glass plate coated with structured ITO with a thickness of 50 nm is coated with PEDOT:PSS at 20 nm, which is applied from an aqueous solution by means of spin coating. The sample is then dried by means of heating at 180° C. for 10 minutes. These coated glass plates form substrates to which an OLED is applied.

Pretreatment of Examples R26 to R63: A clean glass plate coated with structured ITO with a thickness of 50 nm is treated with an oxygen plasma for 130 seconds. These plasma-treated glass plates form substrates to which an OLED is applied. The substrate is kept under vacuum before coating. Coating is started within 10 minutes after the plasma treatment.

Pretreatment of Examples R64 to R101: A clean glass plate coated with structured ITO with a thickness of 50 nm is treated with an oxygen plasma for 130 seconds and subsequently with an argon plasma for 150 seconds. These plasma-treated glass plates form substrates to which an OLED is applied. The substrate is kept under vacuum before coating. Coating is started within 10 minutes after the plasma treatment.

The OLED basically has a structure of the following layers: a substrate/a hole transport layer (HTL)/an optional intermediate layer (IL)/an electron blocking layer (EBL)/a light-emitting layer (EML)/an optional hole blocking layer (HBL)/an electron transport layer (ETL)/an optional electron injection layer (EIL) and a final cathode. The cathode is formed of an aluminum layer having a thickness of 100 nm. The exact structure of the OLED is shown in Table 3. Materials required for manufacturing the OLED are shown in Table 5.

All the materials are applied by means of thermal vapor deposition in a vacuum chamber. The light-emitting layer here is composed of at least one matrix material (host material) formed of organic compound A with 3.0 eV>ET≥2.0 eV and compound B (luminous dopant) represented by $M(LA)_x(LB)_y(LC)_z$, wherein the luminous dopant and the one or more host materials are mixed at a specific mass ratio by means of co-evaporation. For example, the expression of P323:P01 (95%:5%) here means that the material P323 is present in this layer at a mass proportion of 95%, and P01 is present in this layer at a mass proportion of 5%. Similarly, the electron transport layer may also be composed of a mixture of two materials.

The OLED is characterized by standard methods. For this purpose, the electroluminescence spectrum, current efficiency (cd/A), power efficiency (lm/W), external quantum efficiency (EQE, %) calculated as a luminous density function according to a current/voltage/luminous density profile (I-V-L) exhibiting Lambertian emission characteristics, and lifetime are determined. The electroluminescence spectrum is measured at a luminous density of 1000 cd/m², and the color coordinates CIE (1931) x and y values are calculated. The expression T95 in Table 3 refers to the time in the lifetime of a luminescent device, which corresponds to the luminosity having been reduced to 95% of the initial value thereof.

Data for various OLEDs are summarized in Table 4. Examples R1 to R101 show the data of the OLED of the present invention.

Some examples are explained in more detail below to illustrate the advantages of the OLED of the present invention.

With regard to the use of the organic electroluminescent material of the present invention in a light-emitting layer of a phosphorescent OLED, the combined use of the composition according to the present invention can achieve a good external quantum efficiency. In addition, an excellent improvement of more than twice is obtained in terms of lifetime. In particular, an excellent lifetime is obtained using a combination of compounds P242 and P02 (Example R65), and an excellent efficiency is obtained using P323 and P11 (Example R70).

In addition, excellent performance data is obtained using various compositions of a compound with 3.0 eV>ET≥2.0 eV and a phosphorescence emitter of $M(LA)_x(LB)_y(LC)_z$, which indicates the broad applicability of the layer according to the present invention.

TABLE 3

Structure of OLED device

| Example | HIL Thickness | HTL Thickness | EBL Thickness | EML Thickness | HBL Thickness | ETL Thickness | EIL Thickness |
|---|---|---|---|---|---|---|---|
| R1 | HATCN 2 nm | HT1 100 Å | HT2 100 Å | P205: P01 (98%: 2%) 300 Å | — | ET1: LiQ (50%: 50%) 300 Å | — |
| R2 | HATCN 2 nm | HT1 100 Å | HT2 100 Å | P205: P01 (98%: 2%) 300 Å | P205 100 Å | ET1: LiQ (50%: 50%) 300 Å | — |
| R3 | HATCN 2 nm | HT1 100 Å | HT2 100 Å | P205: P01 (98%: 2%) 300 Å | — | ET1: LiQ (50%: 50%) 300 Å | LiF 10 Å |
| R4 | HATCN 2 nm | HT1 100 Å | HT2 100 Å | P216: P02 (98%: 2%) 300 Å | — | ET1: LiQ (50%: 50%) 300 Å | — |
| R5 | HATCN 2 nm | HT1 100 Å | HT2 100 Å | P219: P05 (98%: 2%) 300 Å | P205 100 Å | ET1: LiQ (50%: 50%) 300 Å | — |
| R6 | HATCN 2 nm | HT1 100 Å | HT2 100 Å | P219: P07 (98%: 2%) 300 Å | — | ET1: LiQ (50%: 50%) 300 Å | LiF 10 Å |
| R7 | HATCN 2 nm | HT1 100 Å | HT2 100 Å | P219: P09 (98%: 2%) 300 Å | — | ET1: LiQ (50%: 50%) 300 Å | — |
| R8 | HATCN 2 nm | HT1 100 Å | HT2 100 Å | P220: P10 (98%: 2%) 300 Å | P205 100 Å | ET1: LiQ (50%: 50%) 300 Å | — |
| R9 | HATCN 2 nm | HT1 100 Å | HT2 100 Å | P236: P11 (98%: 2%) 300 Å | — | ET1: LiQ (50%: 50%) 300 Å | LiF 10 Å |
| R10 | HATCN 2 nm | HT1 100 Å | HT2 100 Å | P237: P12 (98%: 2%) 300 Å | — | ET1: LiQ (50%: 50%) 300 Å | — |
| R11 | HATCN 2 nm | HT1 100 Å | HT2 100 Å | P242: P21 (98%: 2%) 300 Å | P205 100 Å | ET1: LiQ (50%: 50%) 300 Å | — |
| R12 | HATCN 2 nm | HT1 100 Å | HT2 100 Å | P247: P26 (98%: 2%) 300 Å | — | ET1: LiQ (50%: 50%) 300 Å | LiF 10 Å |

TABLE 3-continued

| Example | \multicolumn{7}{c|}{Structure of OLED device} |
| | HIL Thickness | HTL Thickness | EBL Thickness | EML Thickness | HBL Thickness | ETL Thickness | EIL Thickness |
|---|---|---|---|---|---|---|---|
| R13 | HATCN 2 nm | HT1 100 Å | HT2 100 Å | P257:P36 (98%:2%) 300 Å | — | ET1:LiQ (50%:50%) 300 Å | — |
| R14 | HATCN 2 nm | HT1 100 Å | HT2 100 Å | P260:P40 (98%:2%) 300 Å | P205 100 Å | ET1:LiQ (50%:50%) 300 Å | — |
| R15 | HATCN 2 nm | HT1 100 Å | HT2 100 Å | P260:P47 (98%:2%) 300 Å | — | ET1:LiQ (50%:50%) 300 Å | LiF 10 Å |
| R16 | HATCN 2 nm | HT1 100 Å | HT2 100 Å | P266:P49 (98%:2%) 300 Å | — | ET1:LiQ (50%:50%) 300 Å | — |
| R17 | HATCN 2 nm | HT1 100 Å | HT2 100 Å | P274:P56 (98%:2%) 300 Å | P205 100 Å | ET1:LiQ (50%:50%) 300 Å | — |
| R18 | HATCN 2 nm | HT1 100 Å | HT2 100 Å | P283:P60 (98%:2%) 300 Å | — | ET1:LiQ (50%:50%) 300 Å | LiF 10 Å |
| R19 | HATCN 2 nm | HT1 100 Å | HT2 100 Å | P285:P64 (98%:2%) 300 Å | — | ET1:LiQ (50%:50%) 300 Å | — |
| R20 | HATCN 2 nm | HT1 100 Å | HT2 100 Å | P317:P68 (98%:2%) 300 Å | P205 100 Å | ET1:LiQ (50%:50%) 300 Å | — |
| R21 | HATCN 2 nm | HT1 100 Å | HT2 100 Å | P317:P70 (98%:2%) 300 Å | — | ET1:LiQ (50%:50%) 300 Å | LiF 10 Å |
| R22 | HATCN 2 nm | HT1 100 Å | HT2 100 Å | P323:P77 (98%:2%) 300 Å | — | ET1:LiQ (50%:50%) 300 Å | — |
| R23 | HATCN 2 nm | HT1 100 Å | HT2 100 Å | P334:P80 (98%:2%) 300 Å | P205 100 Å | ET1:LiQ (50%:50%) 300 Å | — |
| R24 | HATCN 2 nm | HT1 100 Å | HT2 100 Å | P351:P89 (98%:2%) 300 Å | — | ET1:LiQ (50%:50%) 300 Å | LiF 10 Å |
| R25 | HATCN 2 nm | HT1 100 Å | HT2 100 Å | P380:P101 (98%:2%) 300 Å | — | ET1:LiQ (50%:50%) 300 Å | — |
| R26 | HT1 + F4 (97%:3%) 2 nm | HT1 100 Å | HT2 100 Å | P219:P01 (98%:2%) 300 Å | P205 100 Å | ET2:LiQ (50%:50%) 300 Å | — |
| R27 | HT1 + F4 (97%:3%) 2 nm | HT1 100 Å | HT3 100 Å | P220:P02 (98%:2%) 300 Å | — | ET2:LiQ (50%:50%) 300 Å | LiF 10 Å |
| R28 | HT1 + F4 (97%:3%) 2 nm | HT1 100 Å | HT2 100 Å | P236:P05 (98%:2%) 300 Å | — | ET2:LiQ (50%:50%) 300 Å | LiF 10 Å |
| R29 | HT1 + F4 (97%:3%) 2 nm | HT1 100 Å | HT2 100 Å | P242:P07 (98%:2%) 300 Å | — | ET2:LiQ (50%:50%) 300 Å | LiF 10 Å |
| R30 | HT1 + F4 (97%:3%) 2 nm | HT1 100 Å | HT2 100 Å | P247:P09 (98%:2%) 300 Å | — | ET2:LiQ (50%:50%) 300 Å | LiF 10 Å |
| R31 | HT1 + F4 (97%:3%) 2 nm | HT1 100 Å | HT2 100 Å | P257:P10 (98%:2%) 300 Å | — | ET2:LiQ (50%:50%) 300 Å | LiF 10 Å |
| R32 | HT1 + F4 (97%:3%) 2 nm | HT1 100 Å | HT2 100 Å | P260:P11 (98%:2%) 300 Å | — | ET2:LiQ (50%:50%) 300 Å | LiF 10 Å |
| R33 | HT1 + F4 (97%:3%) 2 nm | HT1 100 Å | HT2 100 Å | P266:P12 (98%:2%) 300 Å | — | ET2:LiQ (50%:50%) 300 Å | LiF 10 Å |
| R34 | HT1 + F4 (97%:3%) 2 nm | HT1 100 Å | HT2 100 Å | P274:P21 (98%:2%) 300 Å | — | ET2:LiQ (50%:50%) 300 Å | LiF 10 Å |
| R35 | HT1 + F4 (97%:3%) 2 nm | HT1 100 Å | HT2 100 Å | P283:P26 (98%:2%) 300 Å | — | ET2:LiQ (50%:50%) 300 Å | LiF 10 Å |
| R36 | HT1 + F4 (97%:3%) 2 nm | HT1 100 Å | HT2 100 Å | P285:P36 (98%:2%) 300 Å | — | ET2:LiQ (50%:50%) 300 Å | LiF 10 Å |
| R37 | HT1 + F4 (97%:3%) 2 nm | HT1 100 Å | HT2 100 Å | P317:P40 (98%:2%) 300 Å | — | ET2:LiQ (50%:50%) 300 Å | LiF 10 Å |
| R38 | HT1 + F4 (97%:3%) 2 nm | HT1 100 Å | HT2 100 Å | P205:P47 (98%:2%) 300 Å | ET2 100 Å | ET2:LiQ (50%:50%) 300 Å | LiF 10 Å |
| R39 | HT1 + F4 (97%:3%) 2 nm | HT1 100 Å | HT2 100 Å | P216:P49 (98%:2%) 300 Å | ET2 100 Å | ET2:LiQ (50%:50%) 300 Å | LiF 10 Å |
| R40 | HT1 + F4 (97%:3%) 2 nm | HT1 100 Å | HT2 100 Å | P219:P56 (98%:2%) 300 Å | ET2 100 Å | ET2:LiQ (50%:50%) 300 Å | LiF 10 Å |

TABLE 3-continued

| Example | Structure of OLED device | | | | | | |
|---|---|---|---|---|---|---|---|
| | HIL Thickness | HTL Thickness | EBL Thickness | EML Thickness | HBL Thickness | ETL Thickness | EIL Thickness |
| R41 | HT1 + F4 (97%: 3%) 2 nm | HT1 100 Å | HT2 100 Å | P220: P60 (98%: 2%) 300 Å | ET2 100 Å | ET2: LiQ (50%: 50%) 300 Å | LiF 10 Å |
| R42 | HT1 + F4 (97%: 3%) 2 nm | HT1 100 Å | HT2 100 Å | P236: P64 (98%: 2%) 300 Å | ET2 100 Å | ET2: LiQ (50% 50%) 300 Å | LiF 10 Å |
| R43 | HT1 + F4 (97%: 3%) 2 nm | HT1 100 Å | HT2 100 Å | P237: P68 (98%: 2%) 300 Å | ET2 100 Å | ET2: LiQ (50% 50%) 300 Å | LiF 10 Å |
| R44 | HT1 + F4 (97%: 3%) 2 nm | HT1 100 Å | HT2 100 Å | P242: P70 (98%: 2%) 300 Å | ET2 100 Å | ET2: LiQ (50% 50%) 300 Å | LiF 10 Å |
| R45 | HT1 + F4 (97%: 3%) 2 nm | HT1 100 Å | HT2 100 Å | P247: P77 (98%: 2%) 300 Å | ET2 100 Å | ET2: LiQ (50% 50%) 300 Å | LiF 10 Å |
| R46 | HT1 + F4 (97%: 3%) 2 nm | HT1 100 Å | HT2 100 Å | P257: P80 (98%: 2%) 300 Å | ET2 100 Å | ET2: LiQ (50% 50%) 300 Å | LiF 10 Å |
| R47 | HT1 + F4 (97%: 3%) 2 nm | HT1 100 Å | HT2 100 Å | P260: P89 (98%: 2%) 300 Å | ET2 100 Å | ET2: LiQ (50% 50%) 300 Å | LiF 10 Å |
| R48 | HT1 + F4 (97%: 3%) 2 nm | HT1 100 Å | HT2 100 Å | P266: P101 (98%: 2%) 300 Å | ET2 100 Å | ET2: LiQ (50% 50%) 300 Å | LiF 10 Å |
| R49 | HT1 + F4 (97%: 3%) 2 nm | HT1 100 Å | HT2 100 Å | P274: P109 (98%: 2%) 300 Å | ET2 100 Å | ET2: LiQ (50% 50%) 300 Å | LiF 10 Å |
| R50 | HT1 + F4 (97%: 3%) 2 nm | HT1 100 Å | HT2 100 Å | P283: P117 (98%: 2%) 300 Å | ET2 100 Å | ET2: LiQ (50%: 50%) 300 Å | LiF 10 Å |
| R51 | HT1 + F4 (97%: 3%) 2 nm | HT1 100 Å | HT2 100 Å | P285: P121 (98%: 2%) 300 Å | ET2 100 Å | ET2: LiQ (50% 50%) 300 Å | LiF 10 Å |
| R52 | HT1 + F4 (97%: 3%) 2 nm | HT1 100 Å | HT2 100 Å | P317: P125 (98%: 2%) 300 Å | ET2 100 Å | ET2: LiQ (50% 50%) 300 Å | LiF 10 Å |
| R53 | HT1 + F4 (97%: 3%) 2 nm | HT1 100 Å | HT2 100 Å | P323: P129 (98%: 2%) 300 Å | ET2 100 Å | ET2: LiQ (50% 50%) 300 Å | LiF 10 Å |
| R54 | HT1 + F4 (97%: 3%) 2 nm | HT1 100 Å | HT2 100 Å | P334: P141 (98%: 2%) 300 Å | ET2 100 Å | ET2: LiQ (50% 50%) 300 Å | LiF 10 Å |
| R55 | HT1 + F4 (97%: 3%) 2 nm | HT1 100 Å | HT2 100 Å | P351: P145 (98%: 2%) 300 Å | ET2 100 Å | ET2: LiQ (50% 50%) 300 Å | LiF 10 Å |
| R56 | HT1 + F4 (97%: 3%) 2 nm | HT1 100 Å | HT2 100 Å | P380: P161 (98%: 2%) 300 Å | ET2 100 Å | ET2: LiQ (50% 50%) 300 Å | LiF 10 Å |
| R57 | HT1 + F4 (97%: 3%) 2 nm | HT1 100 Å | HT2 100 Å | P205: P164 (98%: 2%) 300 Å | ET2 100 Å | ET2: LiQ (50% 50%) 300 Å | LiF 10 Å |
| R58 | HT1 + F4 (97%: 3%) 2 nm | HT1 100 Å | HT2 100 Å | P216: P173 (98%: 2%) 300 Å | ET2 100 Å | ET2: LiQ (50% 50%) 300 Å | LiF 10 Å |
| R59 | HT1 + F4 (97%: 3%) 2 nm | HT1 100 Å | HT2 100 Å | P219: P180 (98%: 2%) 300 Å | ET2 100 Å | ET2: LiQ (50%: 50%) 300 Å | LiF 10 Å |
| R60 | HT1 + F4 (97%: 3%) 2 nm | HT1 100 Å | HT2 100 Å | P220: P184 (98%: 2%) 300 Å | ET2 100 Å | ET2: LiQ (50% 50%) 300 Å | LiF 10 Å |
| R61 | HT1 + F4 (97%: 3%) 2 nm | HT1 100 Å | HT2 100 Å | P236: P192 (98%: 2%) 300 Å | ET2 100 Å | ET2: LiQ (50% 50%) 300 Å | LiF 10 Å |
| R62 | HT1 + F4 (97%: 3%) 2 nm | HT1 100 Å | HT2 100 Å | P236: P196 (98%: 2%) 300 Å | ET2 100 Å | ET2: LiQ (50% 50%) 300 Å | LiF 10 Å |
| R63 | HT1 + F4 (97%: 3%) 2 nm | HT1 100 Å | HT2 100 Å | P237: P203 (98%: 2%) 300 Å | ET2 100 Å | ET2: LiQ (50% 50%) 300 Å | LiF 10 Å |
| R64 | HT1 + F4 (95%: 5%) 2 nm | HT1 100 Å | HT2 100 Å | P242: P01 (98%: 2%) 300 Å | ET2 100 Å | ET2: LiQ (50% 50%) 300 Å | LiF 10 Å |
| R65 | HT1 + F4 (95%: 5%) 2 nm | HT1 100 Å | HT3 100 Å | P242: P02 (98%: 2%) 300 Å | ET2 100 Å | ET2: LiQ (50% 50%) 300 Å | LiF 10 Å |
| R66 | HT1 + F4 (95%: 5%) 2 nm | HT1 100 Å | HT2 100 Å | P205: P05 (98%: 2%) 300 Å | ET2 100 Å | ET2: LiQ (50% 50%) 300 Å | LiF 10 Å |
| R67 | HT1 + F4 (95%: 5%) 2 nm | HT1 100 Å | HT2 100 Å | P216: P07 (98%: 2%) 300 Å | ET2 100 Å | ET2: LiQ (50% 50%) 300 Å | LiF 10 Å |
| R68 | HT1 + F4 (95%: 5%) 2 nm | HT1 100 Å | HT2 100 Å | P219: P09 (98%: 2%) 300 Å | ET2 100 Å | ET2: LiQ (50%: 50%) 300 Å | LiF 10 Å |

TABLE 3-continued

Structure of OLED device

| Example | HIL Thickness | HTL Thickness | EBL Thickness | EML Thickness | HBL Thickness | ETL Thickness | EIL Thickness |
|---|---|---|---|---|---|---|---|
| R69 | HT1 + F4 (95%: 5%) 2 nm | HT1 100 Å | HT2 100 Å | P220: P10 (98%: 2%) 300 Å | ET2 100 Å | ET2: LiQ (50%: 50%) 300 Å | LiF 10 Å |
| R70 | HT1 + F4 (95%: 5%) 2 nm | HT1 100 Å | HT3 100 Å | P323: P11 (98%: 2%) 300 Å | ET2 100 Å | ET2: LiQ (50%: 50%) 300 Å | LiF 10 Å |
| R71 | HT1 + F4 (95%: 5%) 2 nm | — | HT3 100 Å | P236: P12 (98%: 2%) 300 Å | ET2 | ET2: LiQ (50%: 50%) 300 Å | LiF 10 Å |
| R72 | HT1 + F4 (95%: 5%) 2 nm | HT3 100 Å | HT3 100 Å | P237: P21 (98%: 2%) 300 Å | ET2 100 Å | ET2: LiQ (50%: 50%) 300 Å | LiF 10 Å |
| R73 | HT3 + F4 (95%: 5%) 2 nm | HT1 100 Å | HT2 100 Å | P242: P26 (98%: 2%) 300 Å | ET2 100 Å | ET2: LiQ (50%: 50%) 300 Å | LiF 10 Å |
| R74 | HT1 + F4 (95%: 5%) 2 nm | HT3 100 Å | HT3 100 Å | P247: P36 (98%: 2%) 300 Å | ET2 100 Å | ET2: LiQ (50%: 50%) 300 Å | LiF 10 Å |
| R75 | HT1 + F4 (95%: 5%) 2 nm | HT1 100 Å | HT3 100 Å | P250: P40 (98%: 2%) 300 Å | ET2 100 Å | ET2: LiQ (50%: 50%) 300 Å | LiF 10 Å |
| R76 | HT1 + F4 (95%: 5%) 2 nm | HT1 100 Å | HT3 100 Å | P255: P47 (98%: 2%) 300 Å | ET2 100 Å | ET2: LiQ (50% 50%) 300 Å | LiF 10 Å |
| R77 | HT1 + F4 (95%: 5%) 2 nm | HT1 100 Å | HT3 100 Å | P260: P49 (98%: 2%) 300 Å | ET2 100 Å | ET2: LiQ (50%: 50%) 300 Å | LiF 10 Å |
| R78 | HT1 + F4 (95%: 5%) 2 nm | HT1 100 Å | HT3 100 Å | P265: P56 (98%: 2%) 300 Å | ET2 100 Å | ET2: LiQ (50% 50%) 300 Å | LiF 10 Å |
| R79 | HT1 + F4 (95%: 5%) 2 nm | HT1 100 Å | HT3 100 Å | P268: P60 (98%: 2%) 300 Å | ET2 100 Å | ET2: LiQ (50% 50%) 300 Å | LiF 10 Å |
| R80 | HT1 + F4 (95%: 5%) 2 nm | HT1 100 Å | HT3 100 Å | P282: P64 (98%: 2%) 300 Å | ET2 100 Å | ET2: LiQ (50% 50%) 300 Å | LiF 10 Å |
| R81 | HT1 + F4 (95%: 5%) 2 nm | HT1 100 Å | HT3 100 Å | P285: P68 (98%: 2%) 300 Å | ET2 100 Å | ET2: LiQ (50% 50%) 300 Å | LiF 10 Å |
| R82 | HT1 + F4 (95%: 5%) 2 nm | HT1 100 Å | HT3 100 Å | P287: P70 (98%: 2%) 300 Å | ET2 100 Å | ET2: LiQ (50% 50%) 300 Å | LiF 10 Å |
| R83 | HT1 + F4 (95%: 5%) 2 nm | HT1 100 Å | HT3 100 Å | P290: P77 (98%: 2%) 300 Å | ET2 100 Å | ET2: LiQ (50%: 50%) 300 Å | LiF 10 Å |
| R84 | HT1 + F4 (95%: 5%) 2 nm | HT1 100 Å | HT3 100 Å | P315: P80 (98%: 2%) 300 Å | ET2 100 Å | ET2: LiQ (50%: 50%) 300 Å | LiF 10 Å |
| R85 | HT1 + F4 (95%: 5%) 2 nm | HT1 100 Å | HT3 100 Å | P317: P89 (98%: 2%) 300 Å | ET2 100 Å | ET2: LiQ (50%: 50%) 300 Å | LiF 10 Å |
| R86 | HT1 + F4 (95%: 5%) 2 nm | HT1 100 Å | HT3 100 Å | P205: P101 (98%: 2%) 300 Å | ET2 100 Å | ET2: LiQ (50%: 50%) 300 Å | LiF 10 Å |
| R87 | HT1 + F4 (95%: 5%) 2 nm | HT1 100 Å | HT3 100 Å | P216: P109 (98%: 2%) 300 Å | ET2 100 Å | ET2: LiQ (50%: 50%) 300 Å | LiF 10 Å |
| R88 | HT1 + F4 (95%: 5%) 2 nm | HT1 100 Å | HT3 100 Å | P380: P117 (98%: 2%) 300 Å | ET2 100 Å | ET2: LiQ (50%: 50%) 300 Å | LiF 10 Å |
| R89 | HT1 + F4 (95%: 5%) 2 nm | HT1 100 Å | HT3 100 Å | P351: P121 (98%: 2%) 300 Å | ET2 100 Å | ET2: LiQ (50%: 50%) 300 Å | LiF 10 Å |
| R90 | HT1 + F4 (95%: 5%) 2 nm | HT1 100 Å | HT3 100 Å | P205: P125 (98%: 2%) 300 Å | ET2 100 Å | ET2: LiQ (50%: 50%) 300 Å | LiF 10 Å |
| R91 | HT1 + F4 (95%: 5%) 2 nm | HT1 100 Å | HT3 100 Å | P216: P129 (98%: 2%) 300 Å | ET2 100 Å | ET2: LiQ (50%: 50%) 300 Å | LiF 10 Å |
| R92 | HT1 + F4 (95%: 5%) 2 nm | HT1 100 Å | HT3 100 Å | P219: P141 (98%: 2%) 300 Å | ET2 100 Å | ET2: LiQ (50%: 50%) 300 Å | LiF 10 Å |
| R93 | HT1 + F4 (95%: 5%) 2 nm | HT1 100 Å | HT3 100 Å | P220: P145 (98%: 2%) 300 Å | ET2 100 Å | ET2: LiQ (50%: 50%) 300 Å | LiF 10 Å |
| R94 | HT1 + F4 (95%: 5%) 2 nm | HT1 100 Å | HT3 100 Å | P236: P161 (98%: 2%) 300 Å | ET2 100 Å | ET2: LiQ (50%: 50%) 300 Å | LiF 10 Å |
| R95 | HT1 + F4 (95%: 5%) 2 nm | HT1 100 Å | HT3 100 Å | P216: P164 (98%: 2%) 300 Å | ET2 100 Å | ET2: LiQ (50%: 50%) 300 Å | LiF 10 Å |
| R96 | HT1 + F4 (95%: 5%) 2 nm | HT1 100 Å | HT3 100 Å | P219: P173 (98%: 2%) 300 Å | ET2 100 Å | ET2: LiQ (50%: 50%) 300 Å | LiF 10 Å |

TABLE 3-continued

Structure of OLED device

| Example | HIL Thickness | HTL Thickness | EBL Thickness | EML Thickness | HBL Thickness | ETL Thickness | EIL Thickness |
|---|---|---|---|---|---|---|---|
| R97 | HT1 + F4 (95%: 5%) 2 nm | HT1 100 Å | HT3 100 Å | P220: P180 (98%: 2%) 300 Å | ET2 100 Å | ET2: LiQ (50% 50%) 300 Å | LiF 10 Å |
| R98 | HT1 + F4 (95%: 5%) 2 nm | HT1 100 Å | HT3 100 Å | P236: P184 (98%: 2%) 300 Å | ET2 100 Å | ET2: LiQ (50% 50%) 300 Å | LiF 10 Å |
| R99 | HT1 + F4 (95%: 5%) 2 nm | HT1 100 Å | HT3 100 Å | P237: P192 (98%: 2%) 300 Å | ET2 100 Å | ET2: LiQ (50% 50%) 300 Å | LiF 10 Å |
| R100 | HT1 + F4 (95%: 5%) 2 nm | HT1 100 Å | HT3 100 Å | P205: P196 (98%: 2%) 300 Å | ET2 100 Å | ET2: LiQ (50% 50%) 300 Å | LiF 10 Å |
| R101 | HT1 + F4 (95%: 5%) 2 nm | HT1 100 Å | HT3 100 Å | P216: P203 (98%: 2%) 300 Å | ET2 100 Å | ET2: LiQ (50% 50%) 300 Å | LiF 10 Å |

The performance test results of red light devices obtained are listed in Table 4.

TABLE 4

| | @ 1000 nits | | | | Chromaticity |
|---|---|---|---|---|---|
| Example | Voltage (V) | EQE (%) | CE (Cd/A) | T85 (h) | PE (lm/W) | coordinates 1931 CIE (x, y) |
| R1 | 4.8 | 22.4 | 20.60 | 305.5 | 7.9 | 0.679, 0.319 |
| R2 | 4.6 | 22.2 | 20.73 | 331.2 | 8.1 | 0.678, 0.320 |
| R3 | 4.2 | 23.4 | 20.89 | 353.0 | 7.8 | 0.679, 0.320 |
| R4 | 4.8 | 22.2 | 20.06 | 335.6 | 8.7 | 0.682, 0.319 |
| R5 | 4.9 | 22.4 | 20.60 | 305.0 | 7.9 | 0.679, 0.319 |
| R6 | 4.8 | 22.1 | 20.33 | 311.4 | 7.8 | 0.680, 0.319 |
| R7 | 4.7 | 22.6 | 20.40 | 317.9 | 8.2 | 0.681, 0.320 |
| R8 | 4.5 | 23.0 | 20.17 | 342.6 | 8.4 | 0.682, 0.317 |
| R9 | 4.4 | 22.5 | 20.63 | 298.5 | 9.2 | 0.681, 0.318 |
| R10 | 4.6 | 22.8 | 21.82 | 308.4 | 8.6 | 0.680, 0.317 |
| R11 | 4.5 | 22.6 | 20.66 | 306.2 | 8.8 | 0.681, 0.318 |
| R12 | 4.5 | 22.2 | 21.43 | 374.8 | 8.9 | 0.680, 0.319 |
| R13 | 4.7 | 22.9 | 20.27 | 391.0 | 8.7 | 0.679, 0.318 |
| R14 | 4.6 | 21.5 | 19.49 | 275.6 | 9.5 | 0.682, 0.317 |
| R15 | 4.4 | 19.1 | 22.06 | 395.3 | 8.3 | 0.681, 0.318 |
| R16 | 4.6 | 22.4 | 20.51 | 302.4 | 7.9 | 0.681, 0.317 |
| R17 | 4.8 | 21.6 | 20.47 | 280.5 | 8.0 | 0.681, 0.319 |
| R18 | 4.6 | 22.2 | 20.15 | 383.2 | 8.7 | 0.682, 0.319 |
| R19 | 4.5 | 22.7 | 21.79 | 355.0 | 9.4 | 0.682, 0.320 |
| R20 | 4.7 | 21.5 | 20.05 | 312.4 | 9.0 | 0.681, 0.319 |
| R21 | 4.6 | 22.0 | 21.38 | 378.4 | 7.8 | 0.680, 0.319 |
| R22 | 4.7 | 22.6 | 20.86 | 306.8 | 8.8 | 0.681, 0.320 |
| R23 | 4.8 | 21.4 | 19.92 | 294.3 | 8.0 | 0.679, 0.319 |
| R24 | 4.2 | 22.3 | 20.88 | 396.7 | 8.9 | 0.680, 0.319 |
| R25 | 4.6 | 21.9 | 20.73 | 374.0 | 9.6 | 0.682, 0.318 |
| R26 | 4.0 | 26.4 | 23.50 | 411.2 | 12.5 | 0.681, 0.319 |
| R27 | 3.9 | 25.8 | 22.92 | 317.9 | 11.4 | 0.682, 0.319 |
| R28 | 4.0 | 27.2 | 24.34 | 372.2 | 11.8 | 0.682, 0.318 |
| R29 | 3.8 | 25.9 | 23.06 | 355.0 | 11.9 | 0.681, 0.320 |
| R30 | 4.1 | 26.7 | 23.68 | 339.4 | 12.2 | 0.681, 0.319 |
| R31 | 3.7 | 28.3 | 25.24 | 375.2 | 12.9 | 0.681, 0.319 |
| R32 | 3.9 | 25.7 | 22.95 | 322.5 | 11.5 | 0.681, 0.320 |
| R33 | 3.6 | 27.9 | 24.72 | 259.5 | 11.0 | 0.682, 0.319 |
| R34 | 3.4 | 26.8 | 23.74 | 395.1 | 12.7 | 0.681, 0.320 |
| R35 | 3.6 | 26.5 | 23.42 | 308.8 | 11.6 | 0.682, 0.320 |
| R36 | 3.5 | 25.5 | 23.68 | 346.4 | 11.8 | 0.681, 0.319 |
| R37 | 3.9 | 25.9 | 23.05 | 306.5 | 11.6 | 0.682, 0.319 |
| R38 | 3.7 | 27.2 | 24.24 | 344.8 | 11.9 | 0.681, 0.319 |
| R39 | 3.5 | 26.4 | 23.55 | 297.6 | 11.4 | 0.682, 0.318 |
| R40 | 3.6 | 27.2 | 24.38 | 366.0 | 12.2 | 0.683, 0.320 |
| R41 | 3.8 | 26.9 | 23.76 | 362.3 | 12.0 | 0.681, 0.320 |
| R42 | 3.6 | 26.6 | 23.58 | 326.6 | 12.6 | 0.682, 0.320 |
| R43 | 3.5 | 27.6 | 24.68 | 322.3 | 13.2 | 0.682, 0.322 |
| R44 | 3.8 | 27.4 | 24.54 | 298.5 | 12.5 | 0.681, 0.319 |
| R45 | 4.0 | 26.8 | 23.64 | 325.8 | 11.6 | 0.682, 0.320 |
| R46 | 3.7 | 25.7 | 22.85 | 374.0 | 12.5 | 0.682, 0.321 |
| R47 | 4.0 | 26.9 | 23.70 | 320.6 | 11.8 | 0.682, 0.320 |
| R48 | 3.8 | 26.6 | 23.57 | 315.8 | 12.6 | 0.682, 0.319 |
| R49 | 3.5 | 27.7 | 24.72 | 318.0 | 13.6 | 0.682, 0.319 |
| R50 | 4.0 | 27.0 | 24.51 | 380.2 | 13.2 | 0.681, 0.319 |
| R51 | 3.8 | 26.8 | 23.60 | 355.3 | 11.5 | 0.682, 0.319 |
| R52 | 3.5 | 27.2 | 24.56 | 309.5 | 12.8 | 0.681, 0.320 |
| R53 | 3.9 | 26.4 | 23.46 | 387.1 | 12.0 | 0.682, 0.319 |
| R54 | 3.8 | 26.9 | 23.65 | 362.0 | 11.6 | 0.682, 0.320 |
| R55 | 4.0 | 25.8 | 22.90 | 320.8 | 12.7 | 0.681, 0.321 |
| R56 | 4.0 | 25.6 | 22.83 | 348.3 | 12.4 | 0.682, 0.320 |
| R57 | 3.7 | 27.0 | 24.57 | 353.5 | 13.5 | 0.682, 0.320 |
| R58 | 3.8 | 26.9 | 23.62 | 324.2 | 11.5 | 0.680, 0.319 |
| R59 | 4.0 | 26.2 | 23.33 | 375.0 | 11.8 | 0.682, 0.320 |
| R60 | 3.9 | 27.1 | 24.60 | 362.1 | 13.4 | 0.681, 0.322 |
| R61 | 3.7 | 27.5 | 24.68 | 350.6 | 13.6 | 0.682, 0.320 |
| R62 | 3.7 | 27.0 | 24.59 | 329.0 | 13.3 | 0.681, 0.319 |
| R63 | 3.8 | 27.4 | 24.66 | 376.8 | 11.6 | 0.682, 0.320 |
| R64 | 3.4 | 27.7 | 24.72 | 320.8 | 13.8 | 0.682, 0.318 |
| R65 | 3.5 | 27.8 | 24.86 | 418.3 | 13.9 | 0.681, 0.320 |
| R66 | 3.4 | 27.3 | 24.64 | 307.6 | 11.6 | 0.682, 0.320 |
| R67 | 3.4 | 27.6 | 24.70 | 326.5 | 14.2 | 0.681, 0.320 |
| R68 | 3.6 | 27.5 | 24.69 | 379.0 | 13.5 | 0.682, 0.320 |
| R69 | 3.5 | 27.4 | 24.86 | 307.6 | 13.9 | 0.681, 0.320 |
| R70 | 3.4 | 27.9 | 24.92 | 388.0 | 14.5 | 0.680, 0.320 |
| R71 | 3.6 | 26.8 | 23.48 | 297.8 | 11.7 | 0.682, 0.319 |
| R72 | 4.1 | 27.5 | 24.65 | 343.4 | 13.5 | 0.679, 0.319 |
| R73 | 3.5 | 27.4 | 24.82 | 227.9 | 13.7 | 0.681, 0.320 |
| R74 | 3.4 | 27.8 | 24.88 | 385.2 | 14.4 | 0.680, 0.319 |
| R75 | 3.5 | 27.7 | 24.73 | 377.8 | 13.9 | 0.679, 0.321 |
| R76 | 3.4 | 27.0 | 24.58 | 321.6 | 13.0 | 0.679, 0.320 |
| R77 | 3.5 | 27.5 | 24.67 | 369.0 | 13.9 | 0.680, 0.320 |
| R78 | 3.6 | 27.3 | 24.65 | 389.2 | 13.6 | 0.679, 0.319 |
| R79 | 3.5 | 27.2 | 24.67 | 319.0 | 13.1 | 0.681, 0.320 |
| R80 | 3.4 | 27.6 | 24.80 | 337.9 | 14.1 | 0.682, 0.320 |
| R81 | 3.4 | 27.8 | 24.89 | 265.4 | 14.4 | 0.681, 0.320 |
| R82 | 3.7 | 27.0 | 24.61 | 322.5 | 13.2 | 0.682, 0.320 |
| R83 | 3.5 | 27.4 | 24.70 | 375.0 | 13.8 | 0.681, 0.320 |
| R84 | 3.6 | 27.3 | 24.62 | 358.0 | 13.2 | 0.682, 0.320 |
| R85 | 3.4 | 27.7 | 24.76 | 329.7 | 14.0 | 0.681, 0.319 |
| R86 | 3.5 | 27.5 | 24.69 | 385.6 | 13.8 | 0.682, 0.319 |
| R87 | 3.6 | 27.4 | 24.68 | 309.0 | 13.7 | 0.680, 0.319 |
| R88 | 3.4 | 27.6 | 24.73 | 394.3 | 13.9 | 0.681, 0.319 |
| R89 | 3.5 | 27.2 | 24.62 | 302.7 | 13.1 | 0.682, 0.319 |
| R90 | 3.6 | 27.5 | 24.64 | 346.0 | 13.3 | 0.683, 0.319 |
| R91 | 3.6 | 27.4 | 24.67 | 342.1 | 13.7 | 0.681, 0.318 |
| R92 | 3.5 | 27.3 | 24.64 | 325.5 | 13.5 | 0.682, 0.319 |
| R93 | 3.6 | 27.2 | 24.67 | 307.6 | 13.2 | 0.681, 0.320 |
| R94 | 3.7 | 27.0 | 24.55 | 385.2 | 13.4 | 0.682, 0.320 |
| R95 | 3.6 | 26.8 | 23.60 | 317.4 | 11.5 | 0.681, 0.320 |
| R96 | 3.7 | 27.5 | 24.84 | 389.9 | 13.4 | 0.682, 0.319 |
| R97 | 3.6 | 26.7 | 23.58 | 302.7 | 11.2 | 0.681, 0.320 |
| R98 | 3.7 | 26.5 | 23.27 | 287.6 | 11.0 | 0.682, 0.320 |
| R99 | 3.6 | 27.6 | 24.73 | 382.0 | 13.2 | 0.681, 0.319 |
| R100 | 3.8 | 26.4 | 23.49 | 297.2 | 11.4 | 0.682, 0.319 |
| R101 | 3.9 | 25.8 | 22.31 | 246.5 | 9.8 | 0.683, 0.318 |

TABLE 5
Structural formulas of compounds used for OLED materials:
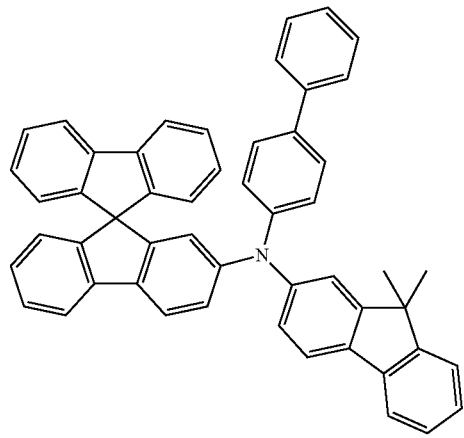 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]
HT1
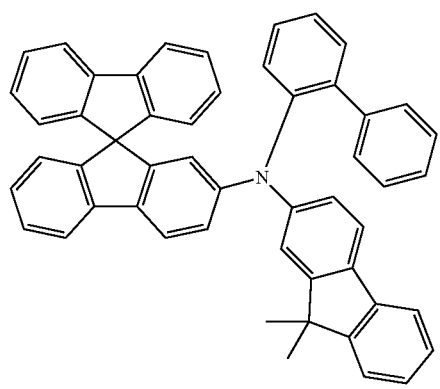 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
HT2
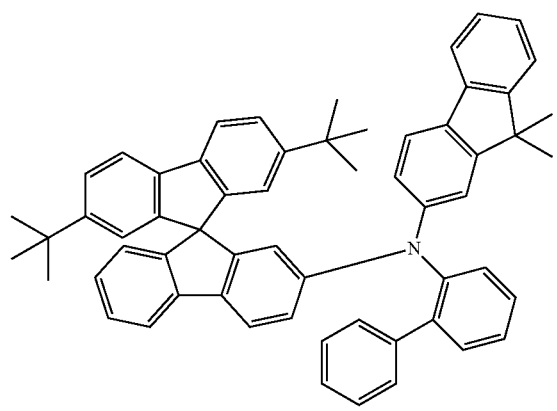 [SMILES: CC(C)(C)c1ccc2c(c1)C1(c3ccccc3-c3ccc(N(c4ccc5c(c4)C(C)(C)c4ccccc4-5)c4ccccc4-c4ccccc4)cc31)c1cc(C(C)(C)C)ccc1-2]
HT3
TABLE 5-continued
Structural formulas of compounds used for OLED materials:
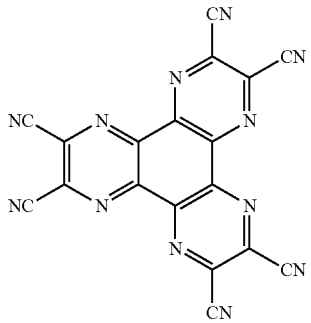 [SMILES: N#Cc1nc2c3nc(C#N)c(C#N)nc3c3nc(C#N)c(C#N)nc3c2nc1C#N]
HATCN
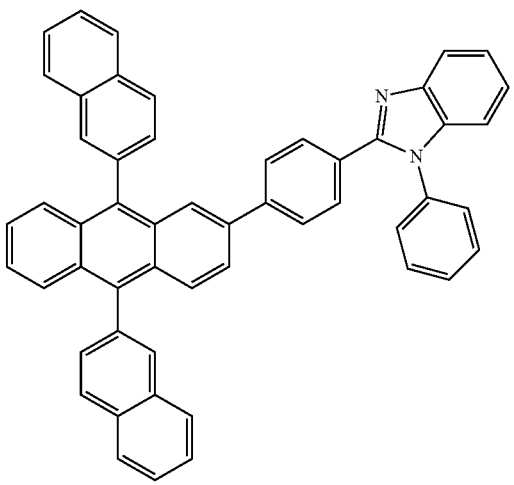 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]
ET1
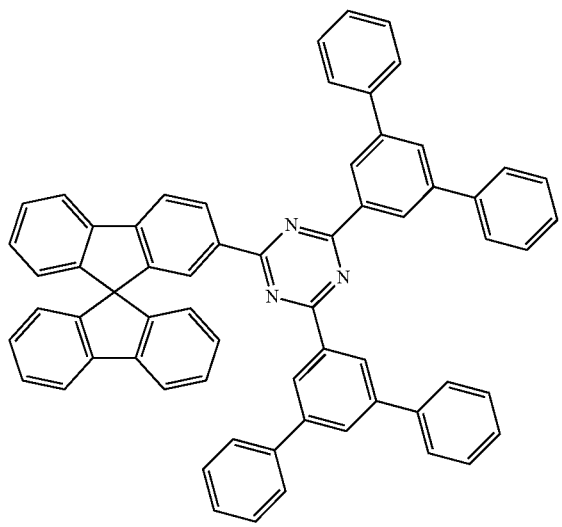 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ET2

TABLE 5-continued

Structural formulas of compounds used for OLED materials:

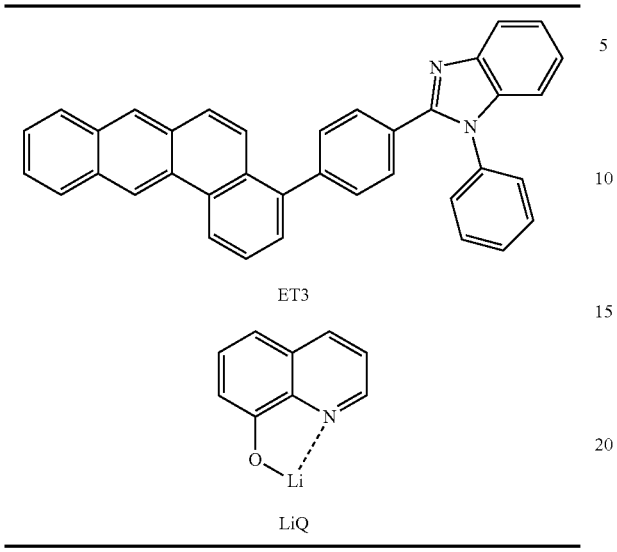

ET3

LiQ

It can be known from the above that a red light element manufactured by means of a combination of a compound having a triplet energy level of 3.0 eV>ET≥2.0 eV and a phosphorescence emitter of $M(LA)_x(LB)_y(LC)_z$, which are appropriately selected, has a low driving voltage and improved external quantum efficiency and current efficiency under the condition of an element luminous brightness of initially 1000 nits, and thus has a reduced power consumption and improved element lifetime.

Obviously, the above-mentioned examples of the present invention are merely examples for clearly explaining the present invention, and are not intended to limit the embodiments of the present invention. For a person of ordinary skill in the art, it would also be possible to make other different forms of changes or variations on the basis of the above description, and it is not possible to exhaust all embodiments here. Any obvious changes or variations derived from the technical solution of the present invention are still within the scope of protection of the present invention.

The invention claimed is:

1. An organic electroluminescent material, characterized by comprising the following compounds:

at least one organic compound A with 3.0 eV>$E_T$≥2.0 eV; and compound B represented by formula $M(LA)_x(LB)_y(LC)_z$, with the absolute value of $E_T[B]-E_T[A]$≤0.5 eV, in which $E_T[B]$ represents the triplet energy level of the compound B, and $E_T[A]$ represents the triplet energy level of the organic compound A, wherein in the formula $M(LA)_x(LB)_y(LC)_z$, M represents a metal element with an atomic weight greater than 40;

x represents an integer of 1, 2 or 3, y represents an integer of 0, 1 or 2, z represents an integer of 0, 1 or 2, and the sum of x, y and z is equal to the oxidation state of metal M;

LA is LA1 or LA2:

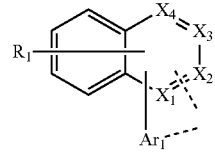

LA1

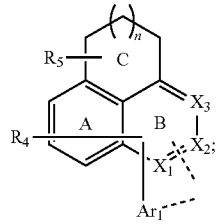

LA2

$R_1$ is selected from the group consisting of $C(R_a)_3$, trans-cyclohexyl having a 1-8 carbon atom substituent, and a 1,1'-bis(trans-cyclohexyl)-4-substituent having a 1-8 carbon atom substituent;

$R_4$ and $R_5$ are each independently selected from the group consisting of a hydrogen atom, a deuterium atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group;

there is one or two or more substituents $R_1$;

there is one or two or more substituents $R_4$ on ring A and ring B;

there is one or two or more substituents $R_5$ on ring C;

$X_1$, $X_2$, $X_3$ and $X_4$ are each independently carbon or nitrogen, and $X_1$, $X_2$ and $X_3$ are not nitrogen at the same time;

n represents an integer ≥0;

each $R_a$ is independently selected from the group consisting of a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, and a $C_2$-$C_{40}$ alkenyl or alkynyl group, with these groups being optionally substituted with one or more $R_6$, one or more non-adjacent —$CH_2$— groups being optionally replaced by —$R_6C$=$CR_6$—, —C≡C—, —Si($R_6$)$_2$—, —Ge($R_6$)$_2$—, —Sn($R_6$)$_2$—, —C(=O)—, —C(=S)—, —C(=Se)—, —C(=N$R_6$)—, —P(=O)($R_6$)—, —S(O)—, —S($O_2$)—, —N($R_6$)—, —O—, —S— or —C(ON$R_6$)—, and one or more hydrogen atoms in $R_a$ being optionally replaced by a deuterium atom, a halogen atom, a nitrile group or a nitro group, wherein two or more adjacent substituents $R_a$ are optionally joined or fused to form a monocyclic or polycyclic aliphatic, aromatic or heteroaromatic ring system optionally substituted with one or more groups $R_6$;

each $R_6$ is independently selected from the group consisting of a hydrogen atom, a deuterium atom, a halogen atom, a nitrile group, a nitro group, a $C_1$-$C_{40}$ linear alkyl group, a $C_1$-$C_{40}$ linear heteroalkyl group, a $C_3$-$C_{40}$ branched or cyclic alkyl group, a $C_3$-$C_{40}$ branched or cyclic heteroalkyl group, a $C_2$-$C_{40}$ alkenyl group, and an alkynyl group, with the $R_6$ being optionally substituted with one or more groups $R_m$, one or more non-adjacent —$CH_2$— groups in $R_6$ being optionally replaced by —$R_mC$=$CR_m$—, —C≡C—, —Si(R$_m$)$_2$—, —Ge(R$_m$)$_2$—, —Sn(R$_m$)$_2$—, —C(=O)—, —C(=S)—, —C(=Se)—, —C(=NR$_m$)—, —P(=O)(R$_m$)—, —S(O)—, —S(O$_2$)—, —N(R$_m$)—, —O—, —S— or —C(ONR$_m$)—, and one or more hydrogen atoms in R$_6$ being optionally replaced by a deuterium atom, a halogen atom, a nitrile group or a nitro group, wherein two or more adjacent substituents R$_6$ are optionally joined or fused to form a monocyclic or polycyclic aliphatic, aromatic or heteroaromatic ring system optionally substituted with one or more groups R$_m$;

R$_m$ is selected from the group consisting of a hydrogen atom, a deuterium atom, a fluorine atom, a nitrile group, and a C$_1$-C$_{20}$ aliphatic hydrocarbon group, wherein one or more hydrogen atoms can be replaced by a deuterium atom, a halogen atom, or a nitrile group, and two or more adjacent substituents R$_m$ optionally form a monocyclic or polycyclic aliphatic, aromatic or heteroaromatic ring system with each other;

Ar$_1$ is selected from the group consisting of the following groups:

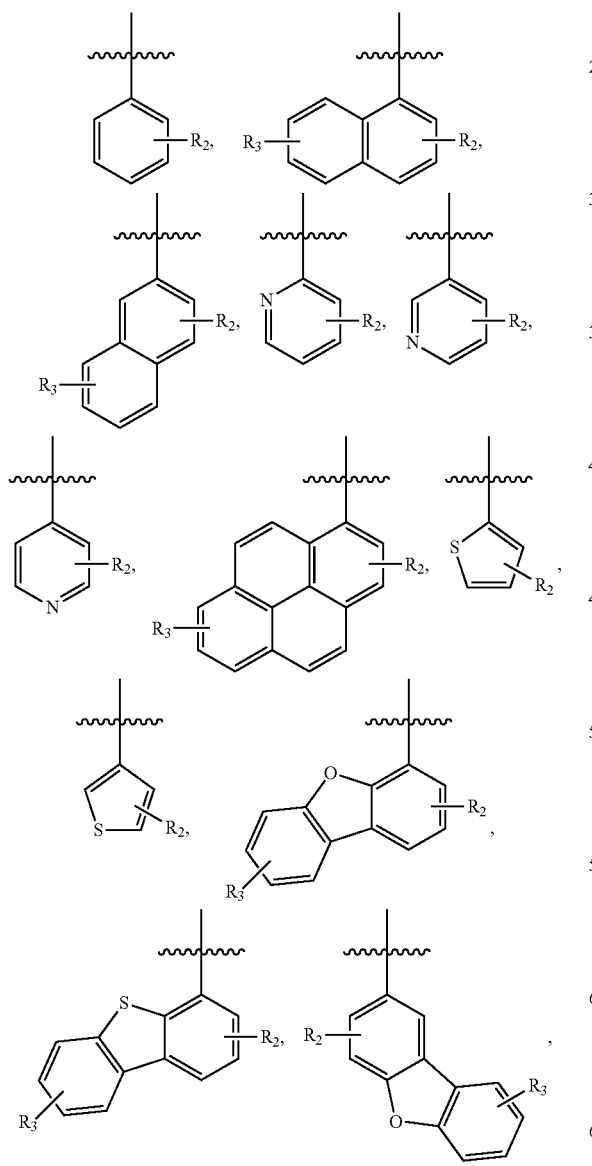
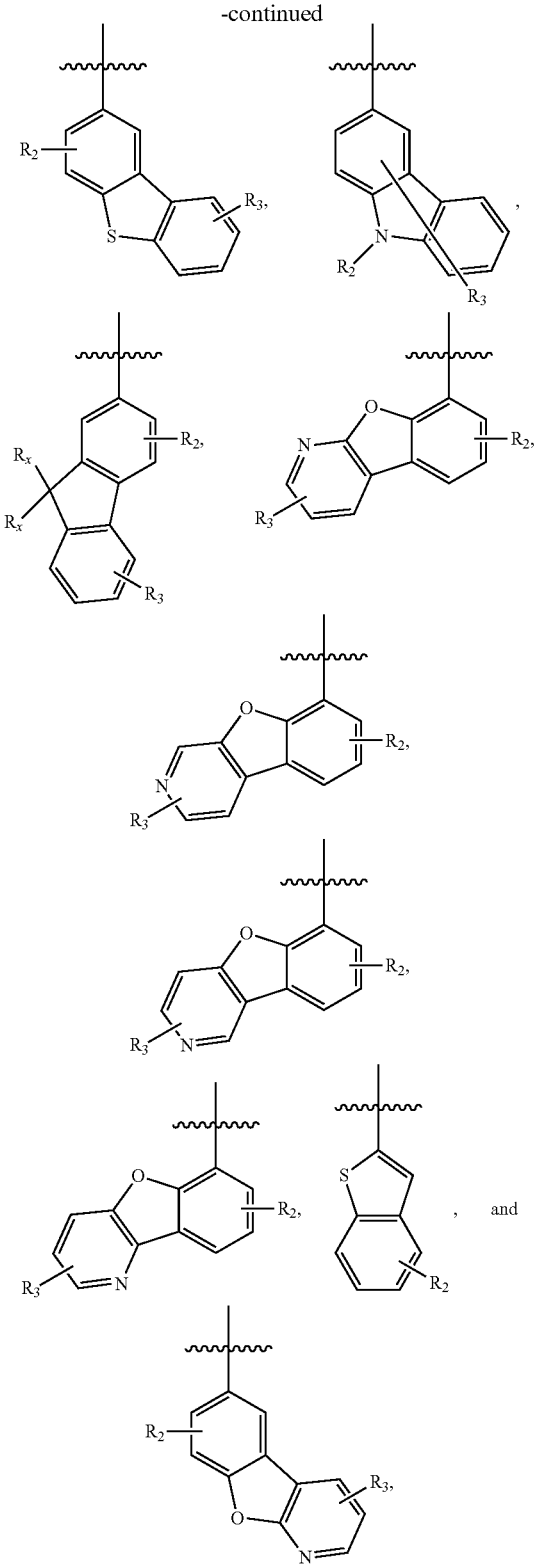

R$_2$, R$_3$ and R$_x$ are each independently selected from the group consisting of a hydrogen atom, a deuterium atom, a halogen atom, a cyano group, an alkyl group with a total carbon atom number of 1-40, a cycloalkyl group with a total carbon atom number of 3-40, an alkoxy group with a total carbon atom number of 1-40, a linear alkenyl group with a total carbon atom number of 2-40, a heteroalkyl group with a total carbon atom number of 1-40, and a cycloalkenyl group with a total carbon atom number of 2-40;

$L_B$ is:

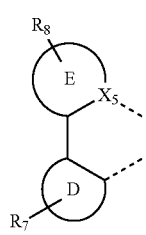

formula $L_B$ wherein $R_7$ and $R_8$ are each independently selected from the group consisting of a hydrogen atom, a deuterium atom, a halogen atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; adjacent groups in $R_7$ and $R_8$ are optionally joined or fused to form a five-membered ring, a six-membered ring or a fused polycyclic ring; and independently for each of $R_7$ and $R_8$, there is one or two or more such groups;

ring D and ring E are each independently selected from the group consisting of a five-membered carbocyclic ring, a five-membered heterocyclic ring, a six-membered carbocyclic ring, and a six-membered heterocyclic ring;

$X_5$ is nitrogen or carbon; and $L_C$ is:

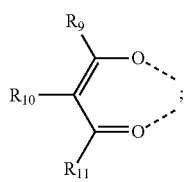

formula $L_C$ wherein $R_9$, $R_{10}$ and $R_{11}$ are each independently selected from the group consisting of a hydrogen atom, a deuterium atom, a halogen atom, an alkyl group, a cycloalkyl group, heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group; and adjacent groups in $R_9$, $R_{10}$ and $R_{11}$ are optionally joined or fused to form a five-membered ring, a six-membered ring, or a fused polycyclic ring.

2. The organic electroluminescent material according to claim 1, wherein the LA is selected from the group consisting of LA-1 to LA-17:

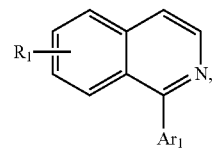

LA-1

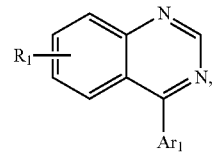

LA-2

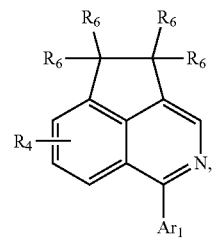

LA-3

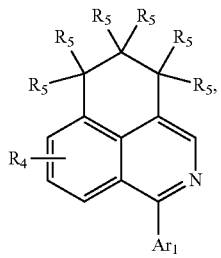

LA-4

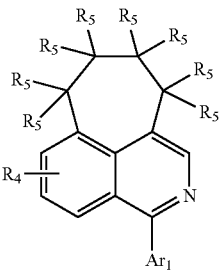

LA-5

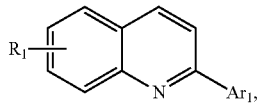

LA-6

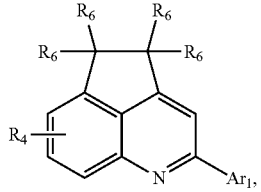

LA-7

-continued
LA-8
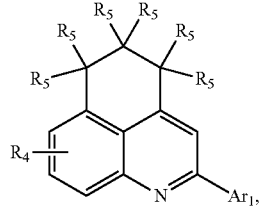
LA-9
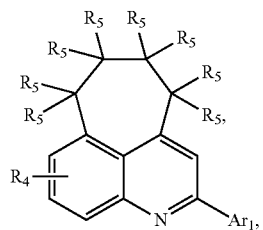
LA-10
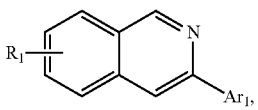
LA-11
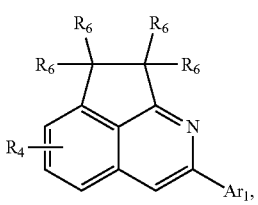
LA-12
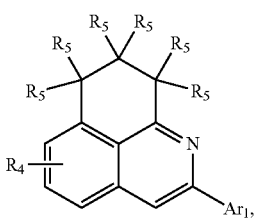
LA-13
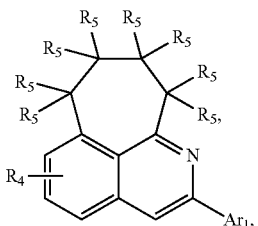
LA-14
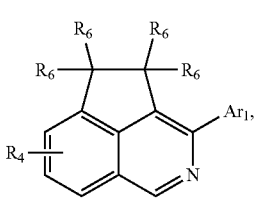
LA-15
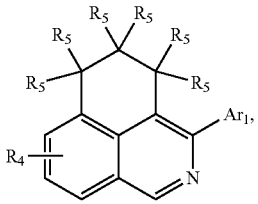
-continued
LA-16
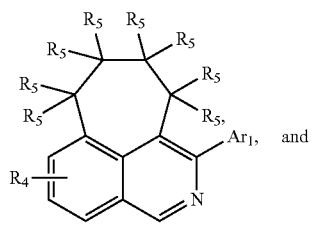
and
LA-17
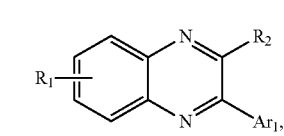
wherein $R_1$, $R_2$, $R_4$, $R_5$ and $Ar_1$ have the same meanings as those in claim 1.
3. The organic electroluminescent material according to claim 2, wherein the LA is selected from the group consisting of L1 to L104 below:
L1
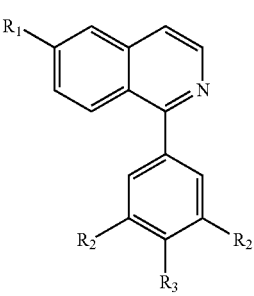
L2
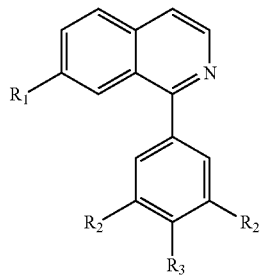
L3
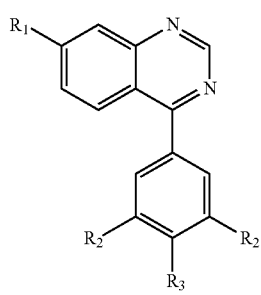

L4
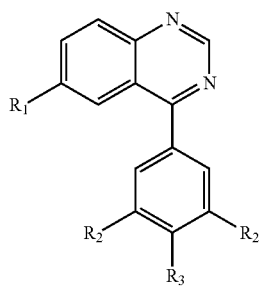
L5
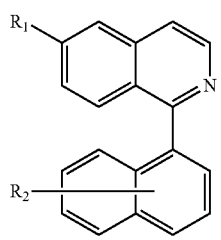
L6
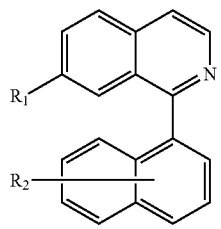
L7
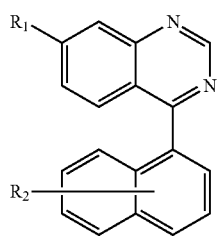
L8
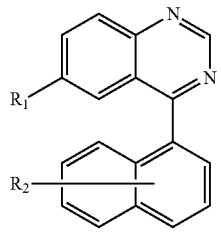
L9
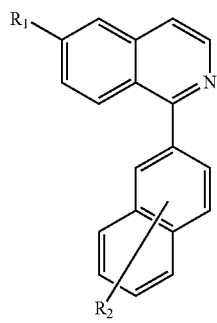
L10
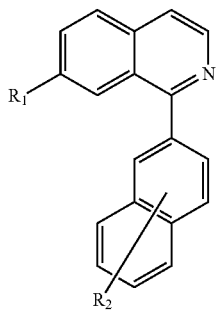
L11
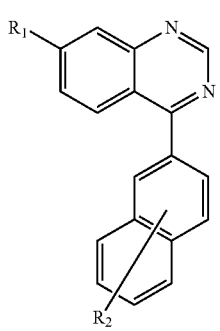
L12
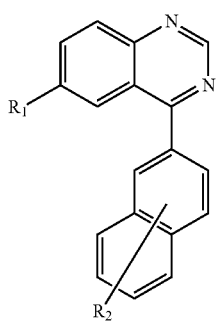
L13
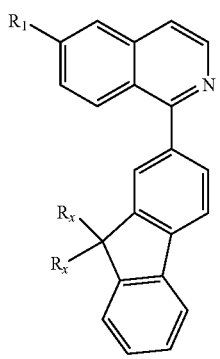

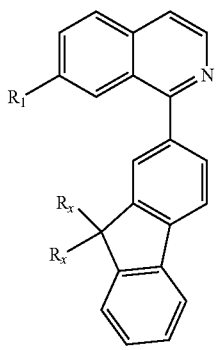 L14
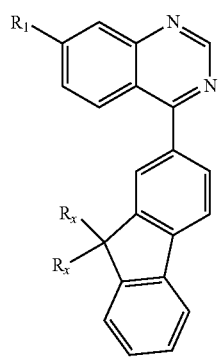 L15
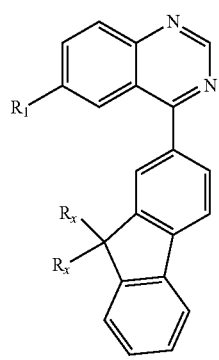 L16
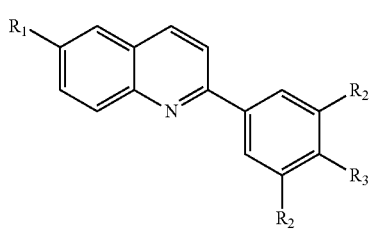 L17
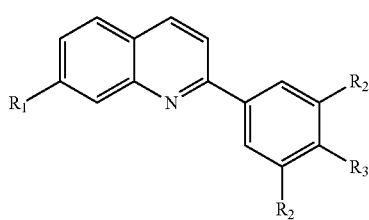 L18
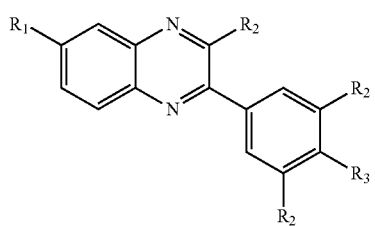 L19
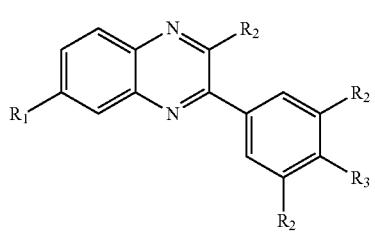 L20
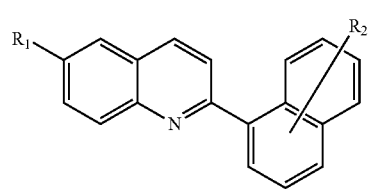 L21
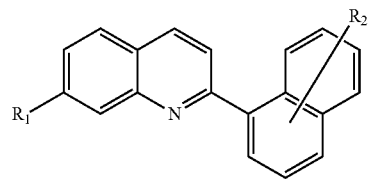 L22
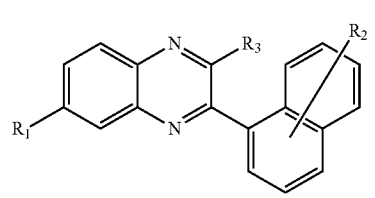 L23
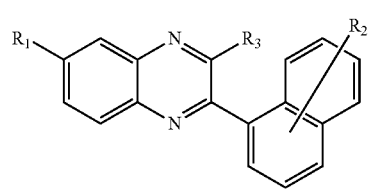 L24
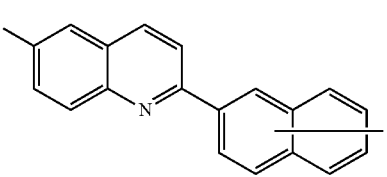 L25
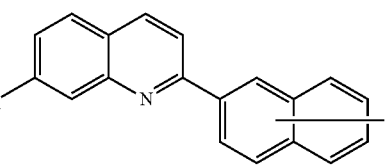 L26

| L27 |
| L28 |
| L29 |
| L30 |
| L31 |
| L32 |
| L33 |
| L34 |
| L35 |
| L36 |
| L37 |
| L38 |

L39 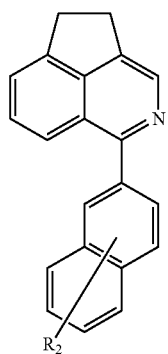
L40 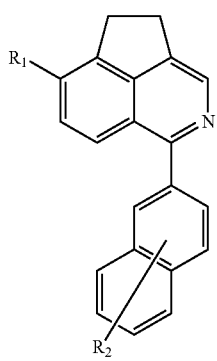
L41 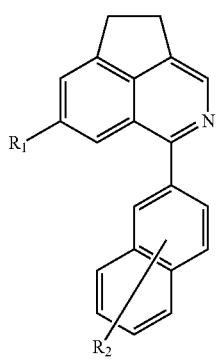
L42 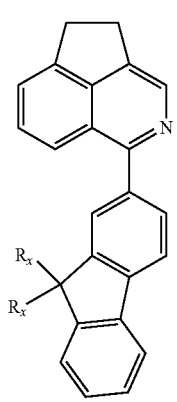
L43 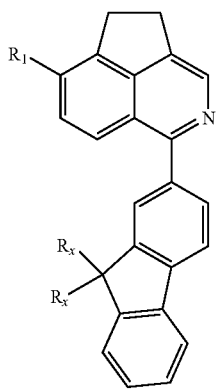
L44 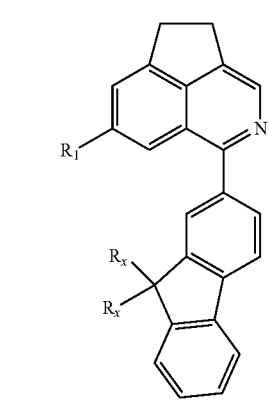
L45 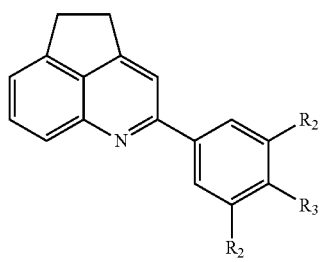
L46 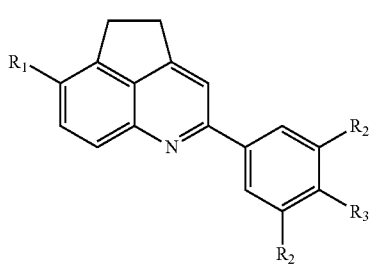
L47 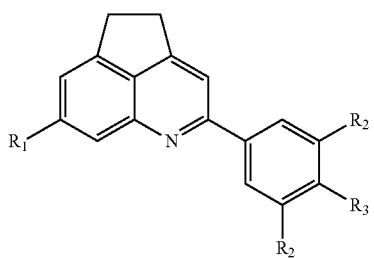

L48
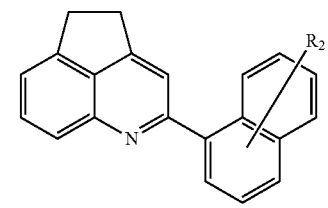
L49
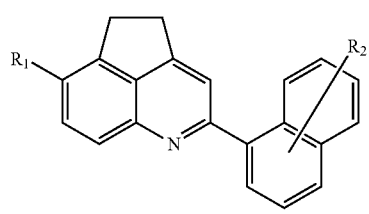
L50
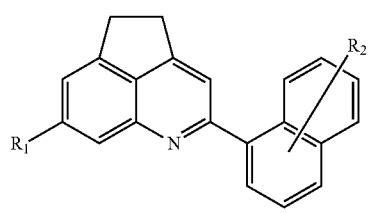
L51
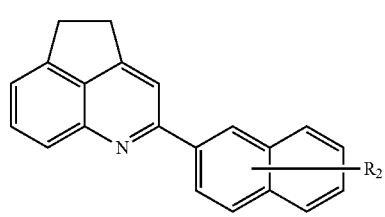
L52
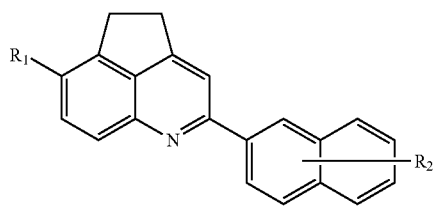
L53
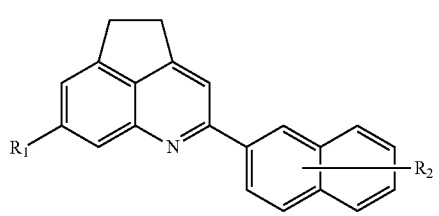
L54
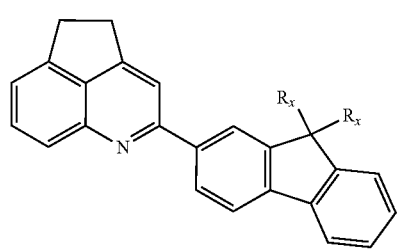
L55
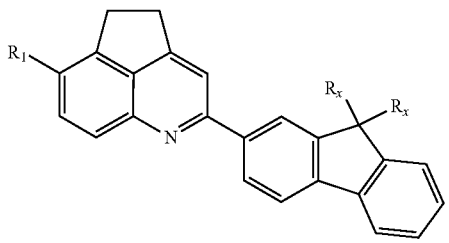
L56
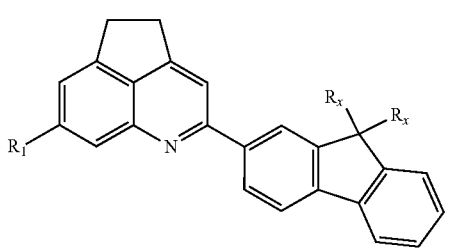
L57
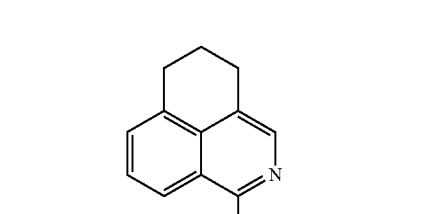
L58
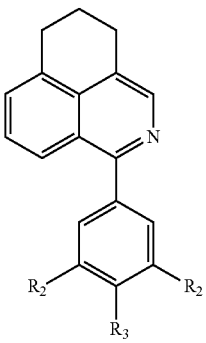
L59
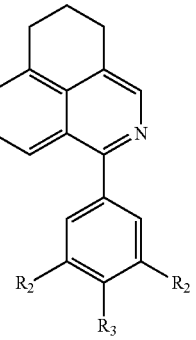
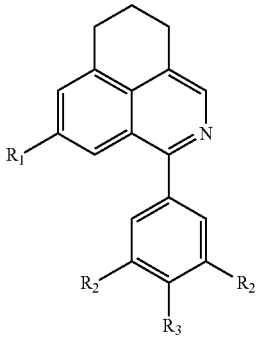

L60 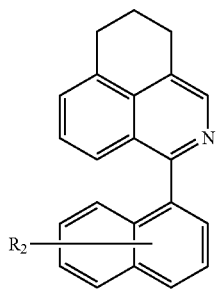
L61 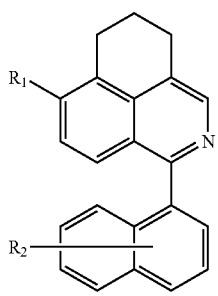
L62 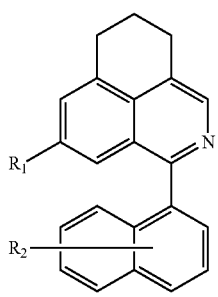
L63 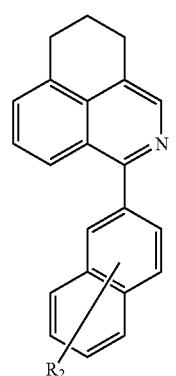
L64 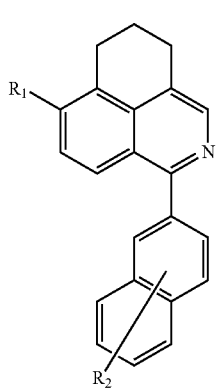
L65 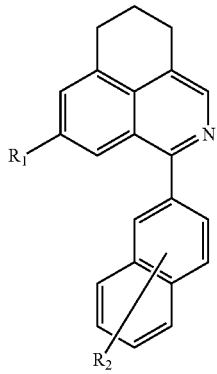
L66 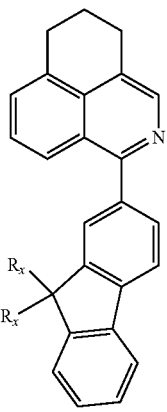
L67 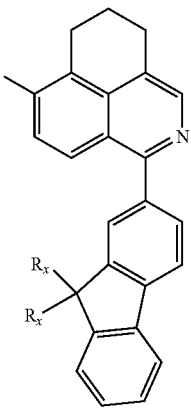
L68 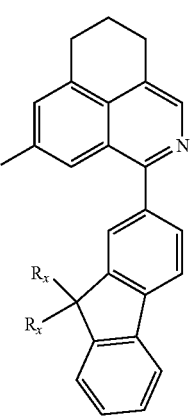

| | |
|---|---|
| L69 | L75 |
| L70 | L76 |
| L71 | L77 |
| L72 | L78 |
| L73 | L79 |
| L74 | L80 |

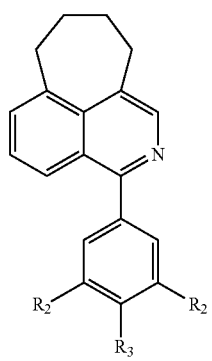 L81
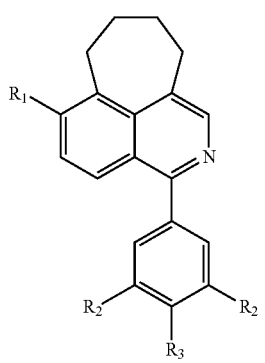 L82
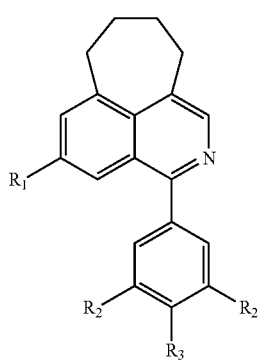 L83
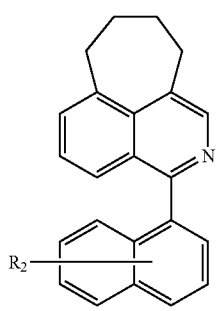 L84
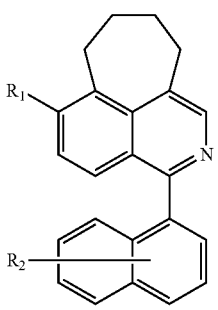 L85
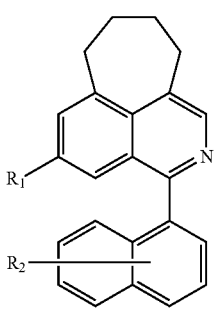 L86
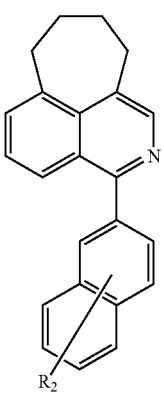 L87
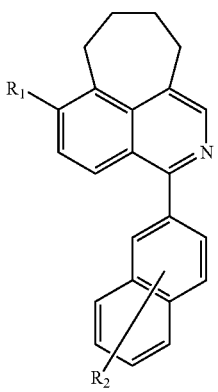 L88

L89 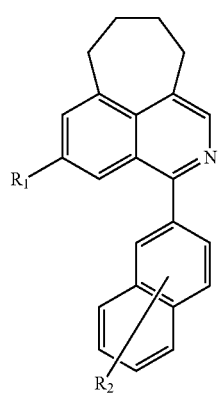
L90 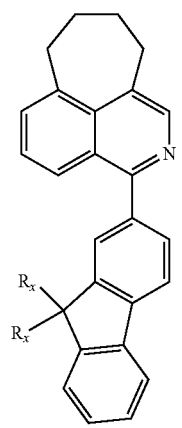
L91 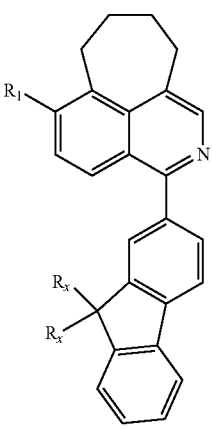
L92 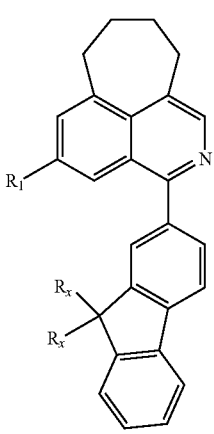
L93 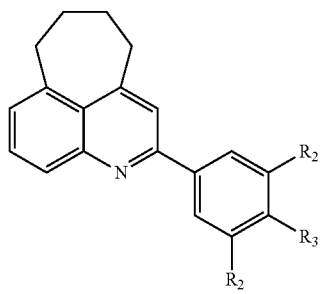
L94 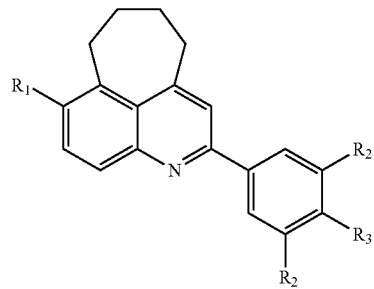
L95 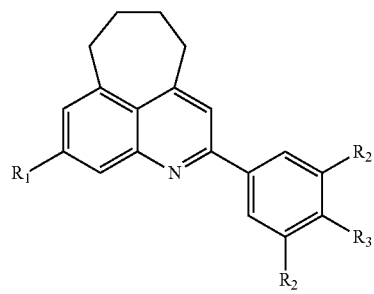
L96 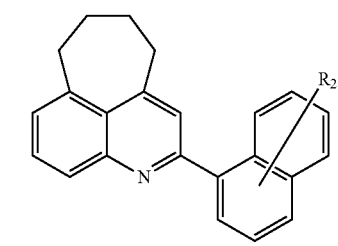
L97 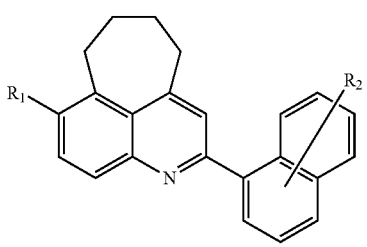
L98 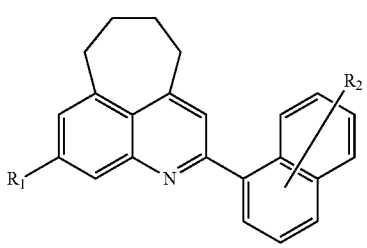

eV>$E_T$≥2.0 eV contains at least one group selected from the group consisting of the following groups represented by formulas X-1 to X-13:

4. The organic electroluminescent material according to claim 1, wherein the organic compound A with 3.0

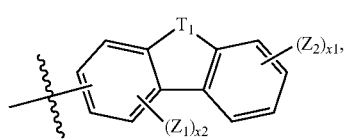
X-13

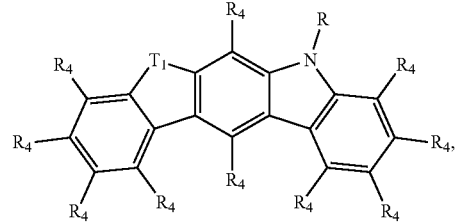
X-14 wherein $Z_1$ and $Z_2$ are each independently selected from the group consisting of deuterium, a halogen atom, a hydroxy group, a nitrile group, a nitro group, an amino group, an amidine group, a hydrazine group, a hydrazone group, a carboxy group, a carboxylate group, a sulfonic acid group, a sulfonate group, a phosphoric acid group, a phosphate group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_6$-$C_{60}$ aryl group, a $C_6$-$C_{60}$ fused ring aryl group, a $C_6$-$C_{60}$ aryloxy group, a $C_6$-$C_{60}$ arylsulfide group, and a $C_2$-$C_{60}$ heterocyclic aryl group;

x1 represents an integer of 1-4, x2 represents an integer of 1-3, x3 represents 1 or 2, x4 represents an integer of 1-6, and x5 represents an integer of 1-5;

$T_1$ is selected from —B(R')—, —N(R')—, —P(R')—, —O—, —S—, —Se—, —S(=O)—, —S(O$_2$)—, —C(R'R")—, —Si(R'R")— or —Ge(R'R")—, wherein R' and R" are each independently selected from the group consisting of a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_6$-$C_{60}$ aryl group, a $C_1$-$C_{10}$ alkyl-containing $C_6$-$C_{60}$ aryl group, a $C_1$-$C_{10}$ alkyl-containing $C_6$-$C_{60}$ aryloxy group, and a $C_1$-$C_{10}$ alkyl-containing $C_6$-$C_{60}$ arylthio group; and R' and R" are optionally fused or joined to form a ring; and

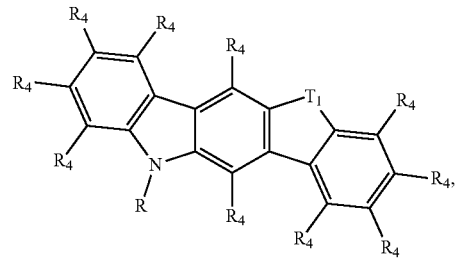
X-15

represents the connection of a substituent to the main structure.

5. The organic electroluminescent material according to claim 4, wherein the organic compound A with 3.0 eV>$E_T$≥2.0 eV contains a group formed by bonding at least one group selected from the group consisting of the groups of formulas X-1 to X-13 to an indenocarbazolyl group, an indolocarbazolyl group or a carbazolyl group directly or via a bridging group, wherein the indenocarbazolyl group, indolocarbazolyl group and carbazolyl groups are optionally substituted with one or more $Ar_1$ groups;

the indenocarbazolyl group, indolocarbazolyl group, and carbazolyl group are selected from the group consisting of the following structures represented by formulas X-14 to X-21:

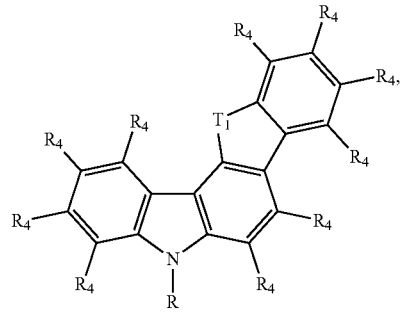
X-16

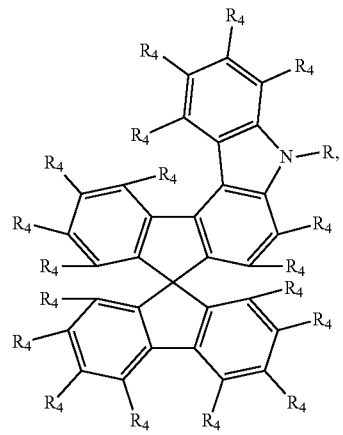
X-17

-continued

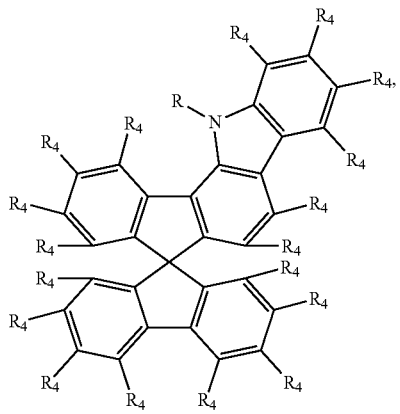
X-18

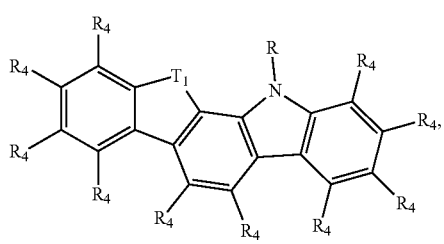
X-19

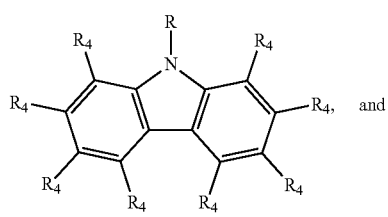
X-20
and

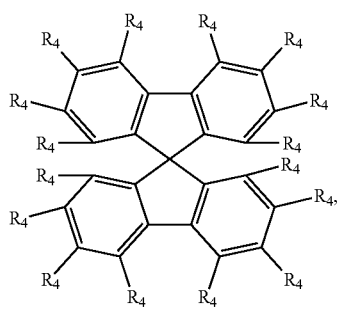
X-21 wherein each R₄ is independently selected from the group consisting of a hydrogen atom, a deuterium atom, an alkyl group, a cycloalkyl group, a heteroalkyl group, an aralkyl group, an alkoxy group, an aryloxy group, an amino group, a silyl group, an alkenyl group, a cycloalkenyl group, a heteroalkenyl group, an alkynyl group, an aryl group, and a heterocyclic aryl group;

R represents a bridge bond or bridging group connected to X-1 to X-13, and the bridge bond or bridging group is connected to the X-1 to X-13.

6. An organic electroluminescent device, comprising the organic electroluminescent material of claim 1.

7. A method for manufacturing the organic electroluminescent device of claim 6, wherein at least one layer is applied by means of a sublimation method, and/or at least one layer is applied by means of an organic vapor deposition method or carrier gas sublimation, and/or at least one layer is applied from a solution by means of spin coating or by means of a printing method.

8. The organic electroluminescent material according to claim 1, wherein the mass percentage of the organic compound A to the compound B is 99:1 to 80:20, preferably 99:1 to 90:10, particularly preferably 99:1 to 95:5.

9. The organic electroluminescent material according to claim 1, wherein the metal M is Ir or Pt; and the compound B represented by the formula $M(LA)_x(LB)_y(LC)_z$ is Ir(LA)(LB)(LC), Ir(LA)₂(LB), Ir(LA)(LB)₂, Ir(LA)₂(LC), Ir(LA)₃, Pt(LA)(LB) or Pt(LA)(LC).

10. The organic electroluminescent material according to claim 1, wherein the LB is selected from the group consisting of LB1 to LB44:

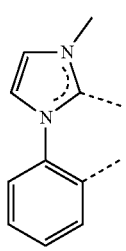
LB1

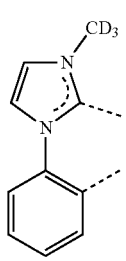
LB2

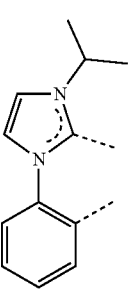
LB3

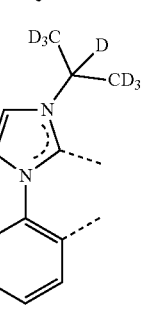
LB4

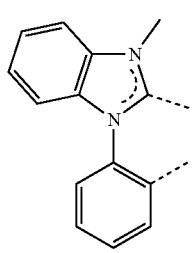
LB5

263
-continued
LB6 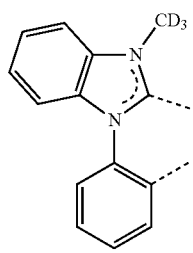
LB7 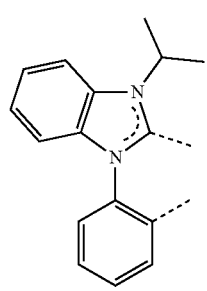
LB8 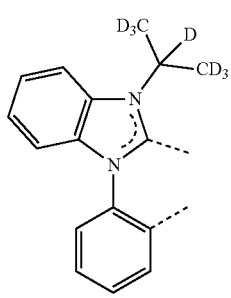
LB9 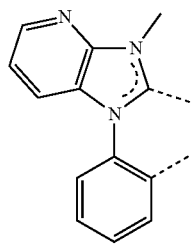
LB10 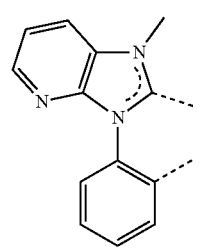
LB11 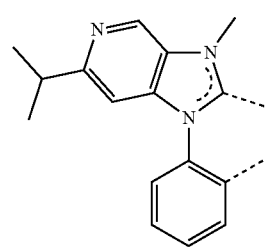
264
-continued
LB12 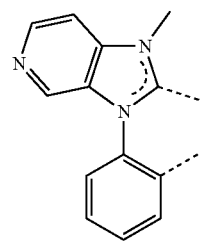
LB13 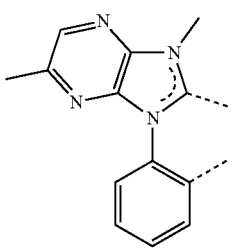
LB14 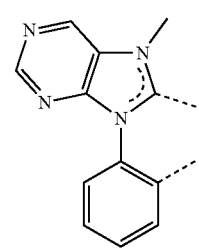
LB15 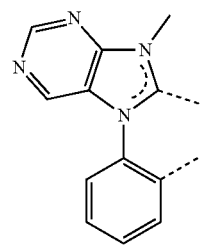
LB16 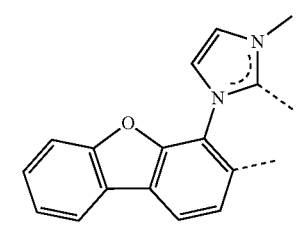
LB17 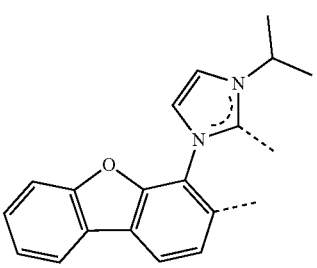

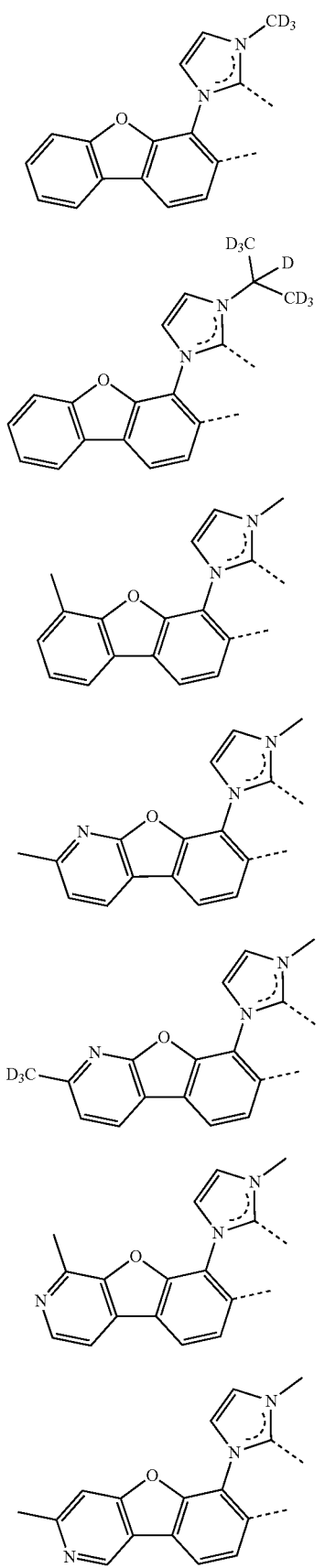

LB31 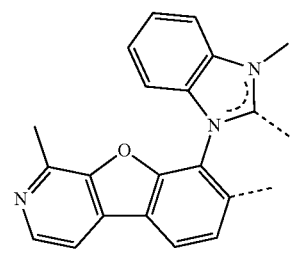
LB32 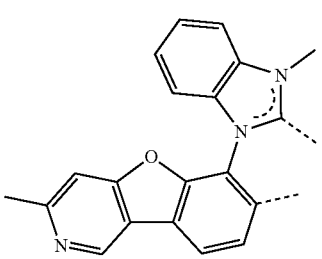
LB33 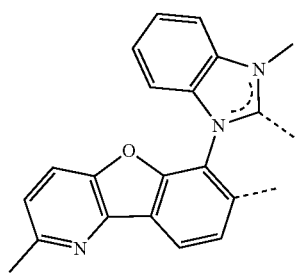
LB34 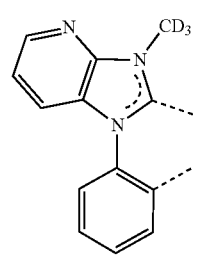
LB35 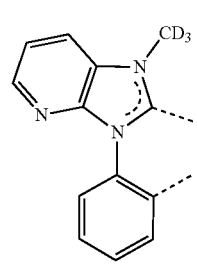
LB36 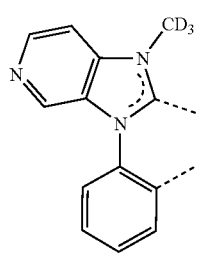
LB37 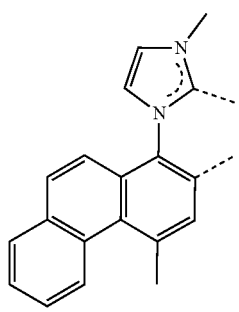
LB38 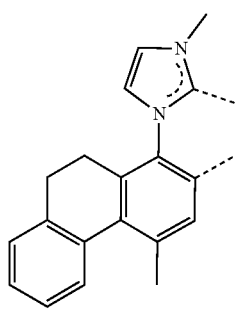
LB39 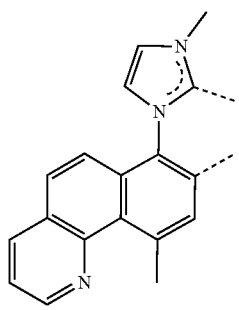
LB40 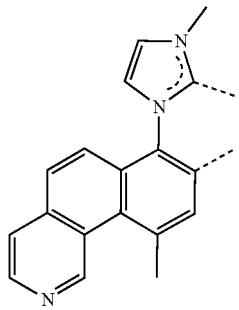

269
-continued
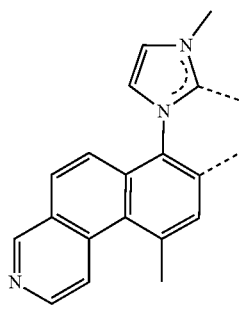
LB41
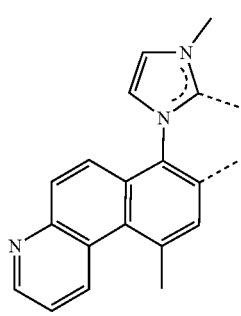
LB42
270
-continued
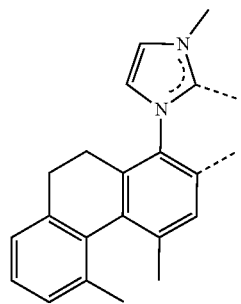
LB43
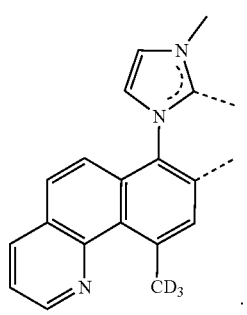
LB44
11. The organic electroluminescent material according to claim 1, wherein the LC is selected from the group consisting LC1 to LC48 below:
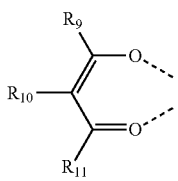
| Compound $L_C$ | $R_9$ | $R_{10}$ | $R_{11}$ |
| --- | --- | --- | --- |
| LC1 | —CH₃ | H | —CH₃ |
| LC2 | —CH(CH₃)₂ | H | —CH(CH₃)₂ |
| LC3 | —C(CH₃)₃ | H | —C(CH₃)₃ |
| LC4 | —CH₂CH(CH₃)₂ | H | —CH₂CH(CH₃)₂ |
| LC5 | —CH(CH₂CH₃)₂ | H | —CH(CH₂CH₃)₂ |

-continued

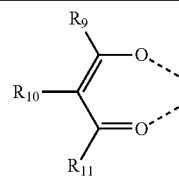

| Compound $L_C$ | $R_9$ | $R_{10}$ | $R_{11}$ |
|---|---|---|---|
| LC6 | cyclopentyl | H | cyclopentyl |
| LC7 | cyclohexyl | H | cyclohexyl |
| LC8 | isopropyl-CH- (with methyl branch) | H | isopropyl-CH- (with methyl branch) |
| LC9 | 4-methylcyclohexyl | H | 4-methylcyclohexyl |
| LC10 | 4-cyclopentylcyclohexyl | H | 4-cyclopentylcyclohexyl |
| LC11 | 4-cyclohexylcyclohexyl | H | 4-cyclohexylcyclohexyl |
| LC12 | 4,4-dimethylcyclohexyl | H | 4,4-dimethylcyclohexyl |
| LC13 | 4,4-diethylcyclohexyl | H | 4,4-diethylcyclohexyl |
| LC14 | $-CH(CF_3)_2$ | H | $-CH(CF_3)_2$ |
| LC15 | 4-($CF_3$)cyclohexyl | H | 4-($CF_3$)cyclohexyl |
| LC16 | 4,4-bis($CF_3$)cyclohexyl | H | 4,4-bis($CF_3$)cyclohexyl |
| LC17 | $-CH_3$ | $-CH_3$ | $-CH_3$ |

-continued

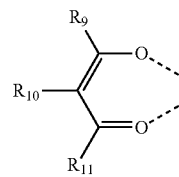

| Compound L_C | R_9 | R_10 | R_11 |
|---|---|---|---|
| LC18 | isopropyl | —CH₃ | isopropyl |
| LC19 | tert-butyl | —CH₃ | tert-butyl |
| LC20 | isobutyl | —CH₃ | isobutyl |
| LC21 | sec-butyl (1-ethylpropyl-like, 3-pentyl) | —CH₃ | 3-pentyl |
| LC22 | cyclopentyl | —CH₃ | cyclopentyl |
| LC23 | cyclohexyl | —CH₃ | cyclohexyl |
| LC24 | 2,4-dimethyl-3-pentyl | —CH₃ | 2,4-dimethyl-3-pentyl |
| LC25 | 4-methylcyclohexyl | —CH₃ | 4-methylcyclohexyl |
| LC26 | 4-cyclopentylcyclohexyl | —CH₃ | 4-cyclopentylcyclohexyl |
| LC27 | 4-cyclohexylcyclohexyl | —CH₃ | 4-cyclohexylcyclohexyl |
| LC28 | 4,4-dimethylcyclohexyl | —CH₃ | 4,4-dimethylcyclohexyl |

-continued

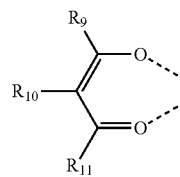

| Compound $L_C$ | $R_9$ | $R_{10}$ | $R_{11}$ |
|---|---|---|---|
| LC29 | 4,4-diethylcyclohexyl | —CH$_3$ | 4,4-diethylcyclohexyl |
| LC30 | —CH(CF$_3$)$_2$ | —CH$_3$ | —CH(CF$_3$)$_2$ |
| LC31 | 4-CF$_3$-cyclohexyl | —CH$_3$ | 4-CF$_3$-cyclohexyl |
| LC32 | 4,4-bis(CF$_3$)cyclohexyl | —CH$_3$ | 4,4-bis(CF$_3$)cyclohexyl |
| LC33 | —CH$_3$ | phenyl | —CH$_3$ |
| LC34 | isopropyl | phenyl | isopropyl |
| LC35 | tert-butyl | phenyl | tert-butyl |
| LC36 | isobutyl | phenyl | isobutyl |
| LC37 | 3-pentyl | phenyl | 3-pentyl |
| LC38 | cyclopentyl | phenyl | cyclopentyl |
| LC39 | cyclohexyl | phenyl | cyclohexyl |

-continued
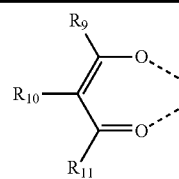
| Compound $L_C$ | $R_9$ | $R_{10}$ | $R_{11}$ |
|---|---|---|---|
| LC40 | 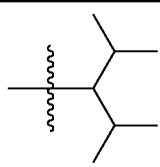 | 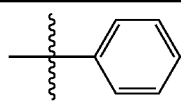 | 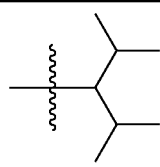 |
| LC41 | 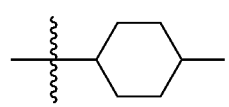 | 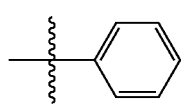 | 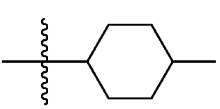 |
| LC42 | 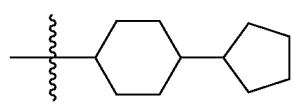 | 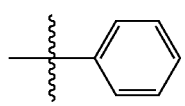 | 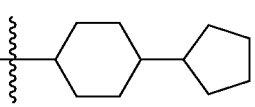 |
| LC43 | 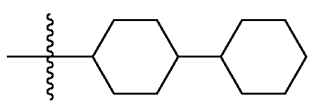 [SMILES: *C1CCC(C2CCCCC2)CC1] | 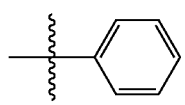 | 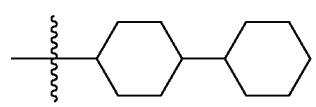 |
| LC44 | 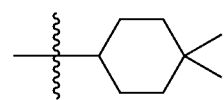 [SMILES: *C1CCC(C)(C)CC1] | 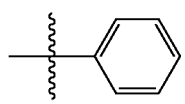 | 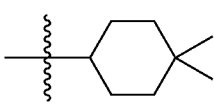 |
| LC45 | 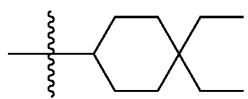 [SMILES: *C1CCC(CC)(CC)CC1] | 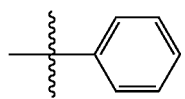 [SMILES: *c1ccccc1] | 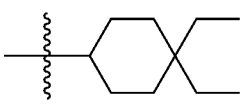 |
| LC46 | 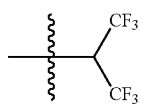 | 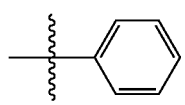 | 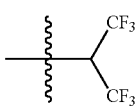 |
| LC47 | 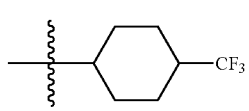 | 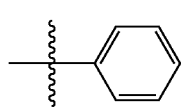 | 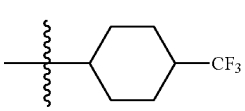 |
| LC48 | 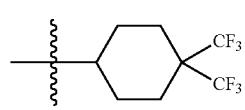 | 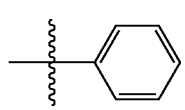 | 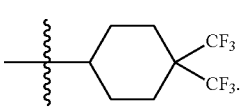 |
* * * * *